United States Patent
McLaurin et al.

(10) Patent No.: US 11,677,468 B2
(45) Date of Patent: *Jun. 13, 2023

(54) LASER BASED WHITE LIGHT SOURCE CONFIGURED FOR COMMUNICATION

(71) Applicant: KYOCERA SLD Laser, Inc., Goleta, CA (US)

(72) Inventors: Melvin McLaurin, Santa Barbara, CA (US); James W. Raring, Santa Barbara, CA (US); Paul Rudy, Manhattan Beach, CA (US); Vlad Novotny, Los Gatos, CA (US)

(73) Assignee: KYOCERA SLD Laser, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/667,303

(22) Filed: Feb. 8, 2022

(65) Prior Publication Data

US 2022/0255623 A1 Aug. 11, 2022

Related U.S. Application Data

(63) Continuation of application No. 17/108,550, filed on Dec. 1, 2020, now Pat. No. 11,277,204, which is a
(Continued)

(51) Int. Cl.
*H04B 10/116* (2013.01)
*H01S 5/343* (2006.01)
(Continued)

(52) U.S. Cl.
CPC ....... *H04B 10/116* (2013.01); *G02B 27/0916* (2013.01); *H01S 5/005* (2013.01);
(Continued)

(58) Field of Classification Search
None
See application file for complete search history.

(56) References Cited

U.S. PATENT DOCUMENTS 4,318,058 A 3/1982 Mito et al.
4,341,592 A 7/1982 Shortes et al.
(Continued)

FOREIGN PATENT DOCUMENTS

CN 1452254 A 10/2003
CN 1655371 A 8/2005
(Continued)

OTHER PUBLICATIONS

"Pulse (Signal Processing)", Available Online at: https://en.wikipedia.org/w/index.php?title=Pulse (signal processing)&oldid=861631480, Accessed from Internet on: Apr. 17, 2019, 2 pages.
(Continued)

*Primary Examiner* — Jai M Lee
(74) *Attorney, Agent, or Firm* — Kilpatrick Townsend & Stockton LLP

(57) ABSTRACT

A packaged integrated white light source configured for illumination and communication or sensing comprises one or more laser diode devices. An output facet configured on the laser diode device outputs a laser beam of first electromagnetic radiation with a first peak wavelength. The first wavelength from the laser diode provides at least a first carrier channel for a data or sensing signal.

22 Claims, 39 Drawing Sheets

Related U.S. Application Data continuation of application No. 16/783,513, filed on Feb. 6, 2020, now Pat. No. 10,880,005, which is a continuation of application No. 15/719,455, filed on Sep. 28, 2017, now Pat. No. 10,771,155.

(51) Int. Cl.

| | | |
|---|---|---|
| *G02B 27/09* | (2006.01) | |
| *H04B 10/50* | (2013.01) | |
| *H01S 5/40* | (2006.01) | |
| *H01S 5/02251* | (2021.01) | |
| *H01S 5/00* | (2006.01) | |
| *H01S 5/22* | (2006.01) | |
| *H04B 10/572* | (2013.01) | |
| *H01L 33/00* | (2010.01) | |
| *H04B 10/564* | (2013.01) | |
| *H04B 10/524* | (2013.01) | |
| *H04B 10/60* | (2013.01) | |
| *H01S 5/02212* | (2021.01) | |
| *H01S 5/02* | (2006.01) | |
| *H01S 5/10* | (2021.01) | |
| *H01S 5/32* | (2006.01) | |
| *H01S 5/02216* | (2021.01) | |
| *H01S 5/20* | (2006.01) | |
| *H01S 5/026* | (2006.01) | |
| *H01S 5/042* | (2006.01) | |
| *H04B 10/114* | (2013.01) | |
| *H01S 5/02326* | (2021.01) | |
| *H01S 5/02345* | (2021.01) | |

(52) U.S. Cl.
CPC ........ *H01S 5/0087* (2021.01); *H01S 5/02251* (2021.01); *H01S 5/34333* (2013.01); *H01S 5/4012* (2013.01); *H04B 10/502* (2013.01); *H01L 33/0045* (2013.01); *H01S 5/0071* (2013.01); *H01S 5/0202* (2013.01); *H01S 5/0203* (2013.01); *H01S 5/026* (2013.01); *H01S 5/02212* (2013.01); *H01S 5/02216* (2013.01); *H01S 5/02326* (2021.01); *H01S 5/02345* (2021.01); *H01S 5/04254* (2019.08); *H01S 5/04256* (2019.08); *H01S 5/1039* (2013.01); *H01S 5/2009* (2013.01); *H01S 5/22* (2013.01); *H01S 5/2201* (2013.01); *H01S 5/3202* (2013.01); *H01S 5/4031* (2013.01); *H01S 5/4087* (2013.01); *H01S 5/4093* (2013.01); *H04B 10/114* (2013.01); *H04B 10/1141* (2013.01); *H04B 10/5057* (2013.01); *H04B 10/524* (2013.01); *H04B 10/564* (2013.01); *H04B 10/572* (2013.01); *H04B 10/60* (2013.01)

(56) References Cited

U.S. PATENT DOCUMENTS

| | | | |
|---|---|---|---|
| 4,823,402 A | 4/1989 | Brooks | |
| 4,860,687 A | 8/1989 | Frijlink | |
| 4,911,102 A | 3/1990 | Manabe et al. | |
| 4,982,445 A | 1/1991 | Grant et al. | |
| 5,331,654 A | 7/1994 | Jewell et al. | |
| 5,334,277 A | 8/1994 | Nakamura | |
| 5,366,953 A | 11/1994 | Char et al. | |
| 5,527,417 A | 6/1996 | Iida et al. | |
| 5,532,858 A | 7/1996 | Hirohashi et al. | |
| 5,607,899 A | 3/1997 | Yoshida et al. | |
| 5,632,812 A | 5/1997 | Hirabayashi | |
| 5,647,945 A | 7/1997 | Matsuse et al. | |
| 5,696,389 A | 12/1997 | Ishikawa et al. | |
| 5,821,555 A | 10/1998 | Saito et al. | |
| 5,888,907 A | 3/1999 | Tomoyasu et al. | |
| 5,917,634 A | 6/1999 | Otobe | |
| 5,917,643 A | 6/1999 | Watanabe et al. | |
| 5,926,493 A | 7/1999 | O'Brien et al. | |
| 5,951,923 A | 9/1999 | Horie et al. | |
| 6,069,394 A | 5/2000 | Hashimoto et al. | |
| 6,072,197 A | 6/2000 | Horino et al. | |
| 6,147,953 A | 11/2000 | Duncan | |
| 6,153,010 A | 11/2000 | Kiyoku et al. | |
| 6,167,169 A | 12/2000 | Brinkman et al. | |
| 6,195,381 B1 | 2/2001 | Botez et al. | |
| 6,239,454 B1 | 5/2001 | Glew et al. | |
| 6,283,597 B1 | 9/2001 | Jorke | |
| 6,379,985 B1 | 4/2002 | Cervantes et al. | |
| 6,451,157 B1 | 9/2002 | Hubacek | |
| 6,489,636 B1 | 12/2002 | Goetz et al. | |
| 6,586,762 B2 | 7/2003 | Kozaki | |
| 6,624,916 B1 | 9/2003 | Green et al. | |
| 6,635,904 B2 | 10/2003 | Goetz et al. | |
| 6,639,925 B2 | 10/2003 | Niwa et al. | |
| 6,680,959 B2 | 1/2004 | Tanabe et al. | |
| 6,734,461 B1 | 5/2004 | Shiomi et al. | |
| 6,755,932 B2 | 6/2004 | Masuda et al. | |
| 6,809,781 B2 | 10/2004 | Setlur et al. | |
| 6,814,811 B2 | 11/2004 | Ose | |
| 6,833,564 B2 | 12/2004 | Shen et al. | |
| 6,858,081 B2 | 2/2005 | Biwa et al. | |
| 6,858,882 B2 | 2/2005 | Tsuda et al. | |
| 6,920,166 B2 | 7/2005 | Akasaka et al. | |
| 7,009,199 B2 | 3/2006 | Hall | |
| 7,019,325 B2 | 3/2006 | Li et al. | |
| 7,033,858 B2 | 4/2006 | Chai et al. | |
| 7,053,413 B2 | 5/2006 | D'Evelyn et al. | |
| 7,063,741 B2 | 6/2006 | D'Evelyn et al. | |
| 7,098,077 B2 | 8/2006 | Huang et al. | |
| 7,128,849 B2 | 10/2006 | Setlur et al. | |
| 7,154,599 B2 | 12/2006 | Adams et al. | |
| 7,220,324 B2 | 5/2007 | Baker et al. | |
| 7,303,630 B2 | 12/2007 | Motoki et al. | |
| 7,312,156 B2 | 12/2007 | Granneman et al. | |
| 7,323,723 B2 | 1/2008 | Ohtsuka et al. | |
| 7,338,828 B2 | 3/2008 | Imer et al. | |
| 7,358,542 B2 | 4/2008 | Radkov et al. | |
| 7,358,543 B2 | 4/2008 | Chua et al. | |
| 7,390,359 B2 | 6/2008 | Miyanaga et al. | |
| 7,470,555 B2 | 12/2008 | Matsumura | |
| 7,483,466 B2 | 1/2009 | Uchida et al. | |
| 7,483,468 B2 | 1/2009 | Tanaka | |
| 7,489,441 B2 | 2/2009 | Scheible et al. | |
| 7,491,984 B2 | 2/2009 | Koike et al. | |
| 7,555,025 B2 | 6/2009 | Yoshida | |
| 7,598,104 B2 | 10/2009 | Teng et al. | |
| 7,691,658 B2 | 4/2010 | Kaeding et al. | |
| 7,709,284 B2 | 5/2010 | Iza et al. | |
| 7,727,332 B2 | 6/2010 | Habel et al. | |
| 7,733,571 B1 | 6/2010 | Li | |
| 7,749,326 B2 | 7/2010 | Kim et al. | |
| 7,806,078 B2 | 10/2010 | Yoshida | |
| 7,858,408 B2 | 12/2010 | Mueller et al. | |
| 7,862,761 B2 | 1/2011 | Okushima et al. | |
| 7,923,741 B1 | 4/2011 | Zhai et al. | |
| 7,939,354 B2 | 5/2011 | Kyono et al. | |
| 7,968,864 B2 | 6/2011 | Akita et al. | |
| 8,017,932 B2 | 9/2011 | Okamoto et al. | |
| 8,044,412 B2 | 10/2011 | Murphy et al. | |
| 8,124,996 B2 | 2/2012 | Raring et al. | |
| 8,126,024 B1 | 2/2012 | Raring | |
| 8,143,148 B1 | 3/2012 | Raring et al. | |
| 8,148,801 B2 | 4/2012 | D'Evelyn | |
| 8,242,522 B1 | 8/2012 | Raring | |
| 8,247,887 B1 | 8/2012 | Raring et al. | |
| 8,252,662 B1 | 8/2012 | Poblenz et al. | |
| 8,254,425 B1 | 8/2012 | Raring | |
| 8,259,769 B1 | 9/2012 | Raring et al. | |
| 8,284,810 B1 | 10/2012 | Sharma et al. | |
| 8,294,179 B1 | 10/2012 | Raring | |
| 8,314,429 B1 | 11/2012 | Raring et al. | |
| 8,351,478 B2 | 1/2013 | Raring et al. | |
| 8,355,418 B2 | 1/2013 | Raring et al. | |

(56) References Cited

U.S. PATENT DOCUMENTS

| | | |
|---|---|---|
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 8,509,275 B1 | 8/2013 | Raring et al. |
| 8,582,038 B1 | 11/2013 | Raring et al. |
| 8,717,505 B1 | 5/2014 | Raring et al. |
| 8,730,410 B1 | 5/2014 | Raring et al. |
| 8,749,719 B2 | 6/2014 | Raring et al. |
| 8,773,598 B2 | 7/2014 | Raring et al. |
| 9,013,638 B2 | 4/2015 | Raring et al. |
| 9,019,437 B2 | 4/2015 | Raring et al. |
| 9,071,772 B2 | 6/2015 | Raring et al. |
| 9,100,590 B2 | 8/2015 | Raring et al. |
| 9,125,254 B2 | 9/2015 | Chemel et al. |
| 9,128,190 B1 | 9/2015 | Ulrich et al. |
| 9,379,525 B2 | 6/2016 | McLaurin et al. |
| 9,447,933 B2 * | 9/2016 | Onishi .................. B82Y 20/00 |
| 9,787,963 B2 | 10/2017 | Novotny et al. |
| 9,809,153 B2 | 11/2017 | Park et al. |
| 9,945,530 B2 | 4/2018 | Hager et al. |
| 10,009,107 B2 | 6/2018 | Segura et al. |
| 10,047,918 B2 * | 8/2018 | Su ............................ F21V 9/32 |
| 10,222,474 B1 | 3/2019 | Raring et al. |
| 10,243,102 B2 | 3/2019 | Khatibzadeh et al. |
| 10,771,155 B2 | 9/2020 | McLaurin et al. |
| 10,783,543 B1 | 9/2020 | Mantyla et al. |
| 10,784,960 B2 | 9/2020 | McLaurin et al. |
| 10,873,395 B2 | 12/2020 | McLaurin et al. |
| 10,880,005 B2 | 12/2020 | McLaurin et al. |
| 11,121,772 B2 | 9/2021 | Mclaurin et al. |
| 11,153,011 B2 | 10/2021 | McLaurin et al. |
| 11,277,204 B2 * | 3/2022 | McLaurin ............ H04B 10/502 |
| 2001/0043381 A1 | 11/2001 | Green et al. |
| 2001/0048114 A1 | 12/2001 | Morita et al. |
| 2002/0027933 A1 | 3/2002 | Tanabe et al. |
| 2002/0081060 A1 | 6/2002 | Margalit et al. |
| 2002/0105986 A1 | 8/2002 | Yamasaki |
| 2002/0109886 A1 | 8/2002 | Barbier et al. |
| 2002/0167701 A1 | 11/2002 | Hirata |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0009678 A1 | 1/2003 | Cole et al. |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 | 7/2003 | Biwa et al. |
| 2003/0160859 A1 | 8/2003 | Roddy et al. |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0012027 A1 | 1/2004 | Keller et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0208602 A1 | 10/2004 | Plante |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0247323 A1 | 12/2004 | Morioka et al. |
| 2004/0262624 A1 | 12/2004 | Akita et al. |
| 2005/0040384 A1 | 2/2005 | Tanaka et al. |
| 2005/0040416 A1 | 2/2005 | Lee et al. |
| 2005/0072986 A1 | 4/2005 | Sasaoka |
| 2005/0158967 A1 | 7/2005 | Huang et al. |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0286591 A1 | 12/2005 | Lee |
| 2006/0018661 A1 | 1/2006 | Green et al. |
| 2006/0030738 A1 | 2/2006 | Vanmaele et al. |
| 2006/0033009 A1 | 2/2006 | Kobayashi et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0078031 A1 | 4/2006 | Govorkov et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0216416 A1 | 9/2006 | Sumakeris et al. |
| 2006/0256482 A1 | 11/2006 | Araki et al. |
| 2006/0284790 A1 | 12/2006 | Tegreene et al. |
| 2006/0288928 A1 | 12/2006 | Eom et al. |
| 2007/0019960 A1 | 1/2007 | Kuwata et al. |
| 2007/0053695 A1 | 3/2007 | Margaritis |
| 2007/0081857 A1 | 4/2007 | Yoon |
| 2007/0086916 A1 | 4/2007 | LeBoeuf et al. |
| 2007/0093073 A1 | 4/2007 | Farrell, Jr. et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0147032 A1 | 6/2007 | Furukawa et al. |
| 2007/0153866 A1 | 7/2007 | Shchegrov et al. |
| 2007/0163490 A1 | 7/2007 | Habel et al. |
| 2007/0166853 A1 | 7/2007 | Guenther et al. |
| 2007/0184637 A1 | 8/2007 | Haskell et al. |
| 2007/0190758 A1 | 8/2007 | Kaeding et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0268950 A1 | 11/2007 | Spinelli et al. |
| 2007/0273290 A1 | 11/2007 | Ashdown et al. |
| 2007/0280320 A1 | 12/2007 | Feezell et al. |
| 2008/0006831 A1 | 1/2008 | Ng |
| 2008/0029152 A1 | 2/2008 | Milshtein et al. |
| 2008/0069568 A1 | 3/2008 | Dolcetta et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0143970 A1 | 6/2008 | Harbers et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0212981 A1 * | 9/2008 | Yamada ............ H04B 10/1141 398/202 |
| 2008/0217745 A1 | 9/2008 | Miyanaga et al. |
| 2008/0232085 A1 | 9/2008 | Luettgens et al. |
| 2008/0232416 A1 | 9/2008 | Okamoto et al. |
| 2008/0251020 A1 | 10/2008 | Franken et al. |
| 2008/0273563 A1 | 11/2008 | Schmidt et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0310845 A1 | 12/2008 | Xu |
| 2008/0315179 A1 | 12/2008 | Kim et al. |

(56) References Cited

U.S. PATENT DOCUMENTS

| | | |
|---|---|---|
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0103923 A1 | 4/2009 | Hosomi et al. |
| 2009/0128028 A1 | 5/2009 | Hildenbrand et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0162071 A1 | 6/2009 | Refai et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0269067 A1* | 10/2009 | Kihara .......... H04J 14/02 398/79 |
| 2009/0273005 A1 | 11/2009 | Lin |
| 2009/0273850 A1 | 11/2009 | Wo et al. |
| 2009/0299197 A1 | 12/2009 | Antonelli et al. |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0044718 A1 | 2/2010 | Hanser et al. |
| 2010/0067088 A1 | 3/2010 | Novotny et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0151194 A1 | 6/2010 | D'Evelyn |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0044701 A1 | 2/2011 | Schenk et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164884 A1 | 7/2011 | Yamada et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0217044 A1 | 9/2011 | Kang et al. |
| 2011/0222149 A1 | 9/2011 | Saito et al. |
| 2011/0247556 A1 | 10/2011 | Raring et al. |
| 2011/0273906 A1 | 11/2011 | Nichol et al. |
| 2011/0286484 A1 | 11/2011 | Raring et al. |
| 2012/0019788 A1 | 1/2012 | Katou et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0230006 A1 | 9/2012 | Guo |
| 2012/0257901 A1* | 10/2012 | Yamada .......... H04B 10/116 398/189 |
| 2012/0314398 A1 | 12/2012 | Raring et al. |
| 2013/0022064 A1 | 1/2013 | Raring et al. |
| 2013/0258689 A1 | 10/2013 | Takahira et al. |
| 2013/0313516 A1 | 11/2013 | David et al. |
| 2013/0314613 A1 | 11/2013 | Raring et al. |
| 2013/0314614 A1 | 11/2013 | Raring et al. |
| 2014/0126200 A1 | 5/2014 | Kelchner et al. |
| 2014/0226079 A1 | 8/2014 | Raring et al. |
| 2014/0253697 A1 | 9/2014 | Raring et al. |
| 2014/0267937 A1 | 9/2014 | Raring et al. |
| 2014/0270793 A1 | 9/2014 | Bradford |
| 2014/0293139 A1 | 10/2014 | Raring et al. |
| 2015/0023668 A1 | 1/2015 | Spaulding et al. |
| 2015/0049457 A1 | 2/2015 | Kroell |
| 2015/0103404 A1 | 4/2015 | Rudy et al. |
| 2015/0124433 A1 | 5/2015 | Onishi et al. |
| 2015/0168715 A1 | 6/2015 | Vigna et al. |
| 2015/0176778 A1 | 6/2015 | Schwaiger et al. |
| 2015/0176811 A1* | 6/2015 | Schwaiger .......... F21K 9/64 362/84 |
| 2015/0211724 A1* | 7/2015 | Goutain .......... F21V 29/83 362/84 |
| 2015/0233536 A1 | 8/2015 | Krames et al. |
| 2015/0285457 A1* | 10/2015 | Erdl .......... G02B 27/0933 362/513 |
| 2015/0375672 A1 | 12/2015 | Takahashi |
| 2016/0087406 A1* | 3/2016 | Wierer, Jr. .......... H01S 5/0087 372/44.01 |
| 2016/0131321 A1 | 5/2016 | Yamanaka et al. |
| 2016/0172309 A1 | 6/2016 | Gong et al. |
| 2016/0341384 A1 | 11/2016 | Hoshino |
| 2016/0348856 A1 | 12/2016 | Owada |
| 2016/0366380 A1 | 12/2016 | Okamoto |
| 2016/0372893 A1 | 12/2016 | McLaurin et al. |
| 2017/0051883 A1 | 2/2017 | Raring et al. |
| 2017/0113599 A1 | 4/2017 | Park et al. |
| 2017/0163946 A1 | 6/2017 | Komanduri et al. |
| 2017/0269279 A1 | 9/2017 | Wyatt |
| 2018/0087722 A1* | 3/2018 | Ooi .......... H04B 10/116 |
| 2018/0196139 A1 | 7/2018 | Brown et al. |
| 2018/0216811 A1 | 8/2018 | Fukakusa et al. |
| 2018/0277035 A1 | 9/2018 | Komanduri et al. |
| 2019/0033627 A1 | 1/2019 | Shim et al. |
| 2019/0054851 A1 | 2/2019 | Kim et al. |
| 2019/0078858 A1 | 3/2019 | Miller et al. |
| 2019/0097722 A1 | 3/2019 | McLaurin et al. |
| 2019/0113200 A1 | 4/2019 | Murakami |
| 2019/0145587 A1* | 5/2019 | Dursun .......... H05B 33/14 250/458.1 |
| 2019/0283661 A1* | 9/2019 | Hechtfischer .......... B60Q 1/085 |
| 2019/0326988 A1 | 10/2019 | McLaurin et al. |
| 2019/0334618 A1 | 10/2019 | McLaurin et al. |
| 2019/0346677 A1 | 11/2019 | Tanabe et al. |
| 2020/0403696 A1 | 12/2020 | McLaurin et al. |

FOREIGN PATENT DOCUMENTS

| | | |
|---|---|---|
| CN | 1668947 A | 9/2005 |
| CN | 1953197 A | 4/2007 |
| CN | 110459951 A | 11/2019 |
| EP | 3457592 A1 | 3/2019 |
| JP | 07162081 A | 6/1995 |
| JP | 2002009402 A | 1/2002 |
| JP | 3287770 B2 | 6/2002 |
| JP | 2002185082 A | 6/2002 |
| JP | 2004503923 A | 2/2004 |
| JP | 2004152841 A | 5/2004 |
| JP | 2004186527 A | 7/2004 |
| JP | 2004-282389 A | 10/2004 |
| JP | 2004535733 A | 11/2004 |
| JP | 2004-363756 A | 12/2004 |
| JP | 2005502895 A | 1/2005 |
| JP | 2006091285 A | 4/2006 |
| JP | 2006120923 A | 5/2006 |
| JP | 2007068398 A | 3/2007 |
| JP | 2007173467 A | 7/2007 |

(56) References Cited

FOREIGN PATENT DOCUMENTS

| | | | |
|---|---|---|---|
| JP | 2007529910 A | 10/2007 | |
| JP | 2008-092303 A | 4/2008 | |
| JP | 2008193057 A | 8/2008 | |
| JP | 2008198952 A | 8/2008 | |
| JP | 2008543089 A | 11/2008 | |
| JP | 2008311640 A | 12/2008 | |
| JP | 2009021506 A | 1/2009 | |
| JP | 2009506527 A | 2/2009 | |
| JP | 2009158893 A | 7/2009 | |
| JP | 2013-021458 A | 1/2013 | |
| JP | 2013-030631 A | 2/2013 | |
| JP | 2014-049369 A | 3/2014 | |
| JP | 2015154074 A | 8/2015 | |
| JP | 2020-536372 A | 12/2020 | |
| JP | 3238262 U | 7/2022 | |
| WO | 2008041521 A1 | 4/2008 | |
| WO | 2010120819 A1 | 10/2010 | |
| WO | 2012016033 A1 | 2/2012 | |
| WO | 2014013639 A1 | 1/2014 | |
| WO | 2017031446 A1 | 2/2017 | |
| WO | 2017062725 A1 | 4/2017 | |
| WO | 2019067416 A1 | 4/2019 | |
| WO | 2021/011787 A1 | 1/2021 | |

OTHER PUBLICATIONS

"RP Photonics Encyclopedia", Available online at: https://www.rp-photonics.com/ultraviolet_lasers.html, Accessed from Internet on: Apr. 15, 2019, 6 pages.

"Technical Note: Beam Shaping with Cylindrical Lenses", Newport, Available online at: https://www.newport.com/n/beam-shaping-with-cylindrical-lenses, Accessed from Internet on: May 25, 2019, pp. 1-2.

U.S. Appl. No. 12/789,303 , "Non-Final Office Action", dated Sep. 24, 2012, 20 pages.

U.S. Appl. No. 12/789,303 , "Notice of Allowance", dated Dec. 21, 2012, 5 pages.

U.S. Appl. No. 13/678,101 , "Notice of Allowance", dated Jan. 24, 2014, 10 pages.

U.S. Appl. No. 13/678,122 , "Notice of Allowance", dated Mar. 4, 2014, 18 pages.

U.S. Appl. No. 13/739,961 , "Notice of Allowance", dated Dec. 10, 2013, 13 pages.

U.S. Appl. No. 14/035,045 , "Notice of Allowance", dated Jan. 13, 2014, 9 pages.

U.S. Appl. No. 14/199,672 , "Non-Final Office Action", dated Oct. 8, 2014, 7 pages.

U.S. Appl. No. 14/199,672 , "Notice of Allowance", dated Feb. 2, 2015, 5 pages.

U.S. Appl. No. 14/262,208 , "Non-Final Office Action", dated Dec. 22, 2014, 10 pages.

U.S. Appl. No. 14/262,208 , "Notice of Allowance", dated Apr. 23, 2015, 5 pages.

U.S. Appl. No. 14/307,214 , "Notice of Allowance", dated Feb. 27, 2015, 10 pages.

U.S. Appl. No. 15/719,455 , "Final Office Action", dated Nov. 8, 2019, 28 pages.

U.S. Appl. No. 15/719,455 , "Non-Final Office Action", dated Apr. 12, 2019, 37 pages.

U.S. Appl. No. 15/719,455 , "Notice of Allowability", dated Aug. 7, 2020, 2 pages.

U.S. Appl. No. 15/719,455 , "Notice of Allowance", dated Apr. 22, 2020, 11 pages.

U.S. Appl. No. 15/719,455 , "Restriction Requirement", dated Oct. 17, 2018, 8 pages.

U.S. Appl. No. 15/954,463 , "Final Office Action", dated Mar. 3, 2020, 44 pages.

U.S. Appl. No. 15/954,463 , "Non-Final Office Action", dated Nov. 13, 2019, 42 pages.

U.S. Appl. No. 15/954,463 , "Non-Final Office Action", dated May 30, 2019, 48 pages.

U.S. Appl. No. 15/954,463 , "Notice of Allowability", dated Nov. 18, 2020, 2 pages.

U.S. Appl. No. 15/954,463 , "Notice of Allowance", dated Aug. 12, 2020, 10 pages.

U.S. Appl. No. 15/954,463 , "Restriction Requirement", dated Jan. 8, 2019, 6 pages.

U.S. Appl. No. 15/954,493 , "Final Office Action", dated Dec. 14, 2020, 36 pages.

U.S. Appl. No. 15/954,493 , "Final Office Action", dated Mar. 3, 2020, 39 pages.

U.S. Appl. No. 15/954,493 , "Non-Final Office Action", dated Nov. 12, 2019, 37 pages.

U.S. Appl. No. 15/954,493 , "Non-Final Office Action", dated Apr. 25, 2019, 40 pages.

U.S. Appl. No. 15/954,493 , "Non-Final Office Action", dated Jul. 22, 2020, 40 pages.

U.S. Appl. No. 15/954,493 , "Notice of Allowability", dated Aug. 10, 2021, 2 pages.

U.S. Appl. No. 15/954,493 , "Notice of Allowance", dated Apr. 28, 2021, 11 pages.

U.S. Appl. No. 15/954,493 , "Restriction Requirement", dated Jan. 24, 2019, 6 pages.

U.S. Appl. No. 16/783,513 , "Non-Final Office Action", dated Jun. 23, 2020, 30 pages.

U.S. Appl. No. 16/783,513 , "Notice of Allowability", dated Oct. 15, 2020, 2 pages.

U.S. Appl. No. 16/783,513 , "Notice of Allowance", dated Aug. 24, 2020, 10 pages.

U.S. Appl. No. 16/783,543 , "Notice of Allowability", dated Aug. 26, 2020, 2 pages.

U.S. Appl. No. 16/783,543 , "Notice of Allowance", dated May 20, 2020, 12 pages.

U.S. Appl. No. 16/992,029 , "Non-Final Office Action", dated Mar. 1, 2021, 16 pages.

U.S. Appl. No. 16/992,029 , "Notice of Allowability", dated Sep. 15, 2021, 2 pages.

U.S. Appl. No. 16/992,029 , "Notice of Allowance", dated Jun. 17, 2021, 8 pages.

U.S. Appl. No. 17/108,550 , "Non-Final Office Action", dated Jul. 15, 2021, 26 pages.

U.S. Appl. No. 17/108,550 , "Notice of Allowability", dated Feb. 10, 2022, 2 pages.

U.S. Appl. No. 17/108,550 , "Notice of Allowance", dated Nov. 5, 2021, 9 pages.

Abare et al., "Cleaved and Etched Facet Nitride Laser Diodes", Institute of Electrical and Electronics Engineers Journal of Selected Topics in Quantum Electronics, vol. 4, No. 3, May-Jun. 1998, pp. 505-509.

Adesida et al., "Characteristics of Chemically Assisted Ion Beam Etching of Gallium Nitride", Applied Physics Letters, vol. 65, No. 7, Aug. 15, 1994, pp. 889-891.

Alrasheedi , "A Low-Cost, Man-Portable Free-Space Optics Communication Device for Ethernet Applications", Naval Postgraduate School—Thesis, Dec. 2005, 85 pages.

Aoki et al., "InGaAs/InGaAsP MQW Electroabsorption Modulator Integrated with a DFB Laser Fabricated by Band-Gap Energy Control Selective Area MOCVD", Institute of Electrical and Electronics Engineers Journal of Quantum Electronics, vol. 29, No. 6, Jun. 1993, pp. 2088-2096.

Asano et al., "100-mW Kink-Free Blue-Violet Laser Diodes with Low Aspect Ratio", Institute of Electrical and Electronics Engineers Journal of Quantum Electronics, vol. 39, No. 1, Jan. 2003, pp. 135-140.

Bernardini et al., "Spontaneous Polarization and Piezoelectric Constants of III-V Nitrides", Physical Review B, vol. 56, No. 16, Oct. 15, 1997, pp. R10024-R10027.

Caneau et al., "Studies on the Selective OMVPE of (Ga,In)/(As,P)", Journal of Crystal Growth, vol. 124, Nov. 1, 1992, pp. 243-248.

Chen et al., "Growth and Optical Properties of Highly Uniform and Periodic InGaN Nanostructures", Advanced Materials, vol. 19, No. 13, Dec. 2007, pp. 1707-1710.

(56) References Cited

OTHER PUBLICATIONS

Chi et al., "Phosphorous Diffuser Diverged Blue Laser Diode for Indoor Lighting and Communication", Scientific Reports, vol. 5, Available Online at: https://www.nature.com/articles/srep18690.pdf, Dec. 21, 2015, 9 pages.
Choi et al., "Heteroepitaxial Growth of GaN on Unconventional Templates and Layer-Transfer Techniques for Large-Area, Flexible/Stretchable Light-Emitting Diodes", Wiley Online Library, Dec. 20, 2015, pp. 1-17.
Conant, "Micromachined Mirrors", Kluwer Academic Publishers, 2003, 4 pages.
D'Evelyn et al., "Bulk GaN Crystal Growth by the High-Pressure Ammonothermal Method", Journal of Crystal Growth, vol. 300, No. 1, Jan. 26, 2007, pp. 11-16.
EP18862528.9, "Extended European Search Report", dated Jun. 4, 2021, 11 pages.
Founta et al., "Anisotropic Morphology of Nonpolar a-Plane GaN Quantum Dots and Quantum Wells", Journal of Applied Physics, vol. 102, No. 7, Oct. 2, 2007, pp. 074304-1-074304-6.
Franssila, "Tools for CVD and Epitaxy", Introduction to Microfabrication, Jun. 2004, pp. 329-336.
Fujii et al., "Increase in the Extraction Efficiency of GaN-Based Light-Emitting Diodes Via Surface Roughening", Applied Physics Letters, vol. 84, No. 6, Feb. 9, 2004, pp. 855-857.
Funato et al., "Blue, Green, and Amber InGaN/GaN Light-Emitting Diodes on Semipolar {1122} GaN Bulk Substrates", Journal of Japanese Applied Physics, vol. 45, No. 26, Jun. 30, 2006, pp. L659-L662.
Funato et al., "Monolithic Polychromatic Light-Emitting Diodes Based on InGaN Microfacet Quantum Wells Toward Tailor-Made Solid-State Lighting", Applied Physics Express, vol. 1, No. 1, Jan. 17, 2008, pp. 011106-1-011106-3.
Gardner et al., "Blue-Emitting InGaN—GaN Double-Heterostructure Light-Emitting Diodes Reaching Maximum Quantum Efficiency Above 200 A/cm2", Applied Physics Letters, vol. 91, No. 24, Dec. 12, 2007, pp. 243506-1-243506-3.
Hiramatsu et al., "Selective Area Growth and Epitaxial Lateral Overgrowth of GaN by Metalorganic Vapor Phase Epitaxy and Hydride Vapor Phase Epitaxy", Materials Science and Engineering B, vol. 59, Nos. 1-3, May 6, 1999, pp. 104-111.
Iso et al., "High Brightness Blue InGaN/GaN Light Emitting Diode on Nonpolar m-Plane Bulk GaN Substrate", Japanese Journal of Applied Physics, vol. 46, No. 40, 2007, pp. L960-L962.
Kendall et al., "Energy Savings Potential of Solid State Lighting in General Lighting Applications", Report for the Department of Energy, Apr. 2001, 35 pages.
Khan et al., "Cleaved Cavity Optically Pumped InGaN—GaN Laser Grown on Spinel Substrates", Applied Physics Letters, vol. 69, No. 16, Oct. 14, 1996, pp. 2418-2420.
Kim et al., "Improved Electroluminescence on Nonpolar m-Plane InGaN/GaN Qantum Wells LEDs", Physica Status Solidi, vol. 1, No. 3, Apr. 12, 2007, pp. 125-127.
Kuramoto et al., "Novel Ridge-Type InGaN Multiple-Quantum-Well Laser Diodes Fabricated by Selective Area Re-Growth on n-GaN Substrates", Journal of Japanese Applied Physics, vol. 40, Sep. 2001, pp. L925-L927.
Lee et al., "2 Gbit/s Data Transmission From An Unfiltered Laser-Based Phosphor-Converted White Lighting Communication System", Optics Express, vol. 23, No. 23, Nov. 16, 2015, pp. 29779-29787.
Lee et al., "Modeling of Reflection-Type Laser-Driven White Lighting Considering Phosphor Particles and Surface Topography", The Optical Society Publishing, vol. 23, Issue 15, 2015, pp. 18872-18887.
Lin et al., "Influence of Separate Confinement Heterostructure Layer on Carrier Distribution in InGaAsP Laser Diodes with Nonidentical Multiple Quantum Wells", Japanese Journal of Applied Physics, vol. 43, No. 10, Oct. 8, 2004, pp. 7032-7035.

Masui et al., "Electrical Characteristics of Nonpolar InGaN-Based Light-Emitting Diodes Evaluated at Low Temperature", Japanese Journal of Applied Physics, vol. 46, No. 11, Nov. 6, 2007, pp. 7309-7310.
Michiue et al., "Recent Development of Nitride LEDs and LDs", Proceedings of Society of Photo-Optical Instrumentation Engineers, vol. 7216, Feb. 16, 2009, pp. 72161Z-1-72161Z-6.
Nakamura et al., "InGaN/GaN/AlGaN-Based Laser Diodes with Modulation-Doped Strained-Layer Superlattices Grown on an Epitaxially Laterally Overgrown GaN Substrate", Applied Physics Letters, vol. 72, No. 2, Jan. 12, 1998, pp. 211-213.
Nam et al., "Lateral Epitaxial Overgrowth of GaN Films on SiO2 Areas Via Metalorganic Vapor Phase Epitaxy", Journal of Electronic Materials, vol. 27, No. 4, Apr. 1, 1998, pp. 233-237.
Okamoto et al., "Continuous-Wave Operation of m-Plane InGaN Multiple Quantum Well Laser Diodes", The Japan Society of Applied Physics, vol. 46, No. 9, Feb. 23, 2007, pp. L187-L189.
Okamoto et al., "High-Efficiency Continuous-Wave Operation of Blue-Green Laser Diodes Based on Nonpolar m-Plane Gallium Nitride", Applied Physics Express, vol. 1, No. 7, Jul. 2008, pp. 072201-1-072201-3.
Okamoto et al., "Pure Blue Laser Diodes Based on Nonpolar m-Plane Gallium Nitride with InGaN Waveguiding Layers", Journal of Japanese Applied Physics, vol. 46, No. 35, Sep. 7, 2007, pp. L820-L822.
Okubo, "Nichia Develops Blue-Green Semiconductor Laser w/488nm Wavelength", Available Online at: http://techon.nikkeibp.co.jp/english/NEWS_EN/20080122/146009/, Jan. 22, 2008, pp. 1-3.
Park, "Crystal Orientation Effects on Electronic Properties of Wurtzite InGaN/GaN Quantum Wells", Journal of Applied Physics, vol. 91, No. 12, Jun. 15, 2002, pp. 9904-9908.
PCT/US2009/046786, "International Search Report and Written Opinion", dated May 13, 2010, 8 pages.
PCT/US2009/047107, "International Search Report and Written Opinion", dated Sep. 29, 2009, 10 pages.
PCT/US2009/052611, "International Search Report and Written Opinion", dated Sep. 29, 2009, 11 pages.
PCT/US2010/030939, "International Search Report and Written Opinion", dated Jun. 16, 2010, 10 pages.
PCT/US2010/049172, "International Search Report and Written Opinion", dated Nov. 17, 2010, 8 pages.
PCT/US2011/037792, "International Search Report and Written Opinion", dated Sep. 8, 2011, 9 pages.
PCT/US2011/060030, "International Search Report and Written Opinion", dated Mar. 21, 2012, 8 pages.
PCT/US2016/055920, "International Search Report and Written Opinion", dated Nov. 3, 2016, 13 pages.
PCT/US2018/052589, "International Preliminary Report on Patentability", dated Apr. 9, 2020, 10 pages.
PCT/US2018/052589, "International Search Report and Written Opinion", dated Mar. 8, 2019, 13 pages.
PCT/US2018/052589, "Invitation to Pay Additional Fees and, Where Applicable, Protest Fee", dated Jan. 9, 2019, 2 pages.
Pengwang et al., "Scanning Micromirror Platform Based on MEMS Technology for Medical for Medical Application", Micromachines, vol. 7, No. 24, Feb. 6, 2016, pp. 1-29.
Purvis, "Changing the Crystal Face of Gallium Nitride", The Advance Semiconductor Magazine, III-VS Review, vol. 18, No. 8, Nov. 2005, 3 pages.
Retamal et al., "4-Gbit/s Visible Light Communication Link Based on 16-QAM OFDM Transmission Over Remote Phosphor-Film Converted White Light by Using Blue Laser Diode", The Optical Society, vol. 23, No. 26, 2015, pp. 33656-33666.
Romanov et al., "Strain-Induced Polarization in Wurtzite III-Nitride Semipolar Layers", Journal of Applied Physics, vol. 100, No. 2, Jul. 2006, pp. 023522-1-023522-10.
Sato et al., "High Power and High Efficiency Green Light Emitting Diode on Free-Standing Semipolar (1122) Bulk GaN Substrate", Physica Status Solidi, vol. 1, No. 4, Jun. 15, 2007, pp. 162-164.
Sato et al., "Optical Properties of Yellow Light-Emitting-Diodes Grown on Semipolar (1122) Bulk GaN Substrates", Applied Physics Letter, vol. 92, No. 22, Jun. 5, 2008, pp. 221110-1-221110-3.

(56) References Cited

OTHER PUBLICATIONS

Schmidt et al., "Demonstration of Nonpolar M-Plane InGaN/GaN Laser Diodes", Japanese Journal of Applied Physics, vol. 46, No. 9, Feb. 23, 2007, pp. L190-L191.

Schmidt et al., "High Power and High External Efficiency m-plane InGaN Light Emitting Diodes", Japanese Journal of Applied Physics, vol. 46, No. 7, 2007, pp. L126-L128.

Schoedl et al., "Facet Degradation of GaN Heterostructure Laser Diodes", Journal of Applied Physics, vol. 97, No. 12, Jun. 16, 2005, pp. 123102-1-123102-8.

Schremer et al., "Progress in Etched Facet Technology for GaN and Blue Lasers", Proceedings of Society of Photo-Optical Instrumentation Engineers, vol. 6473, Feb. 2007, pp. 64731F-1-64731F-8.

Shchekin et al., "High Performance Thin-Film Flip-Chip InGaN—GaN Light-Emitting Diodes", Applied Physics Letters, vol. 89, No. 7, Aug. 16, 2006, pp. 071109-1-071109-3.

Shen et al., "Auger Recombination in InGaN Measured by Photoluminescence", Applied Physics Letters, vol. 91, No. 14, Oct. 1, 2007, pp. 141101-1-141101-3.

Shen et al., "Semipolar InGan-Based Superluminescent Diodes for Solid-State Lighting and Visible Light Communications", Proc. of SPIE, vol. 10104, Available Online at: https://repository.kaust.edu.sa/bitstream/handle/10754/623329/101041U.pdf?sequence=1, Feb. 16, 2017, 10 pages.

Sizov et al., "500-Nm Optical Gain Anisotropy of Semipolar (1122) InGaN Quantum Wells", Applied Physics Express, vol. 2, No. 7, Jun. 19, 2009, pp. 071001-1-071001-3.

Tomiya et al., "Dislocation Related Issues in the Degradation of GaN-Based Laser Diodes", Institute of Electrical and Electronics Engineers Journal of Selected Topics in Quantum Electronics, vol. 10, No. 6, Nov.-Dec. 2004, pp. 1277-1286.

Tyagi et al., "High Brightness Violet InGaN/GaN Light Emitting Diodes on Semipolar (1011) Bulk GaN Substrates", Japanese Journal of Applied Physics, vol. 46, No. 7, Feb. 9, 2007, pp. L129-L131.

Tyagi et al., "Semipolar (1011) InGaN/GaN Laser Diodes on Bulk GaN Substrates", Japanese Journal of Applied Physics, vol. 46, No. 19, May 11, 2007, pp. L444-L445.

Uchida et al., "Recent Progress in High-Power Blue-Violet Lasers", Institute of Electrical and Electronics Engineers Journal of Selected Topics in Quantum Electronics, vol. 9, No. 5, Sep.-Oct. 2003, pp. 1252-1259.

Velez et al., "GaN Superluminescent Diodes and their Applications", Institute of Electrical and Electronics Engineers Photonics Conference, 2016, pp. 593-594.

Waltereit et al., "Nitride Semiconductors Free of Electrostatic Fields for Efficient White Light-Emitting Diodes", Nature, vol. 406, Aug. 24, 2000, pp. 865-868.

Wierer et al., "High-Power AlGaInN Flip-Chip Light-Emitting Diodes", Applied Physics Letters, vol. 78, No. 22, May 28, 2001, pp. 3379-3381.

Yamaguchi, "Anisotropic Optical Matrix Elements in Strained GaN-Quantum Wells with Various Substrate Orientations", Physical Status Solidi, vol. 5, No. 6, May 13, 2008, pp. 2329-2332.

Ye et al., "5V Compatible Two-Axis PZT Driven MEMS Scanning Mirror with Mechanical Leverage Structure for Miniature LiDAR Application", Multidisciplinary Digital Publishing Institute, Sensors, vol. 17, No. 521, Mar. 5, 2017, 13 pages.

Yoshizumi et al., "Continuous-Wave Operation of 520 nm Green InGaN-Based Laser Diodes on Semi-Polar (2021) GaN Substrates", Applied Physics Express, vol. 2, No. 9, Aug. 21, 2009, pp. 092101-1-092101-3.

Yu et al., "Multiple Wavelength Emission from Semipolar InGaN/GaN Quantum Wells Selectively Grown by MOCVD", Quantum Electronics and Laser Science Conference, May 2007, 2 pages.

Zhong et al., "Demonstration of High Power Blue-Green Light Emitting Diode on Semipolar (1122) Bulk GaN Substrate", Electronics Letters, vol. 43, No. 15, Jul. 19, 2007, 2 pages.

Zhong et al., "High Power and High Efficiency Blue Light Emitting Diode on Freestanding Semipolar (1011) Bulk GaN Substrate", Applied Physics Letter, vol. 90, No. 23, Jun. 5, 2007, pp. 233504-1-233504-3.

European Search Opinion for Application No. 18 862 528.9-1206, dated Mar. 27, 2023, 8 pages.

* cited by examiner

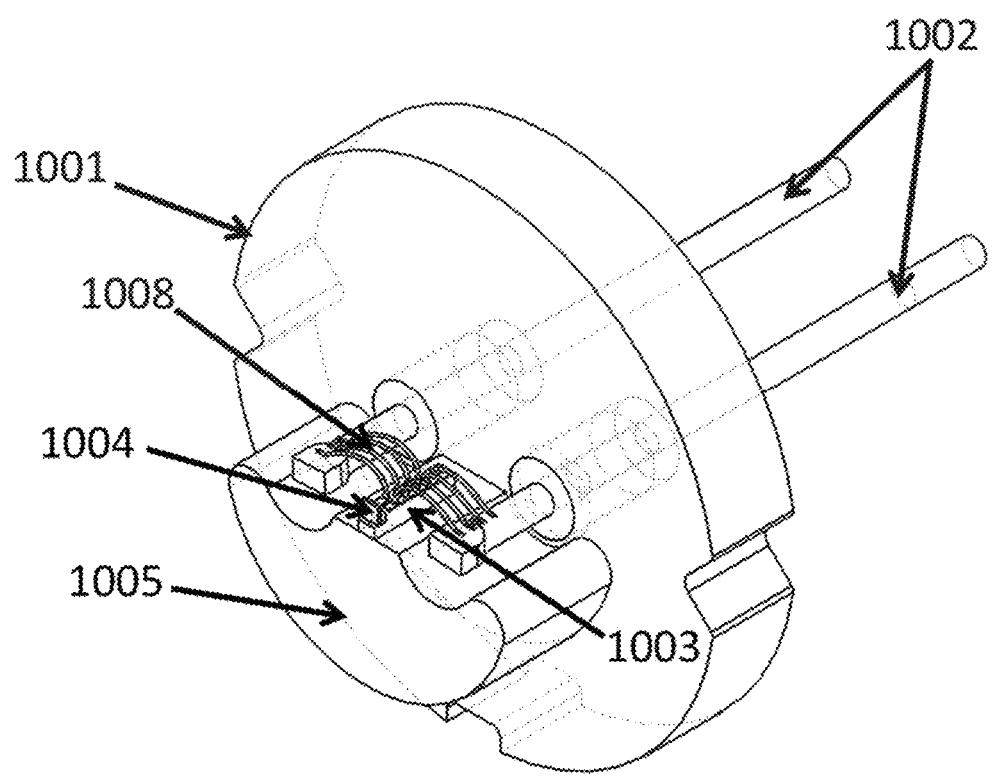
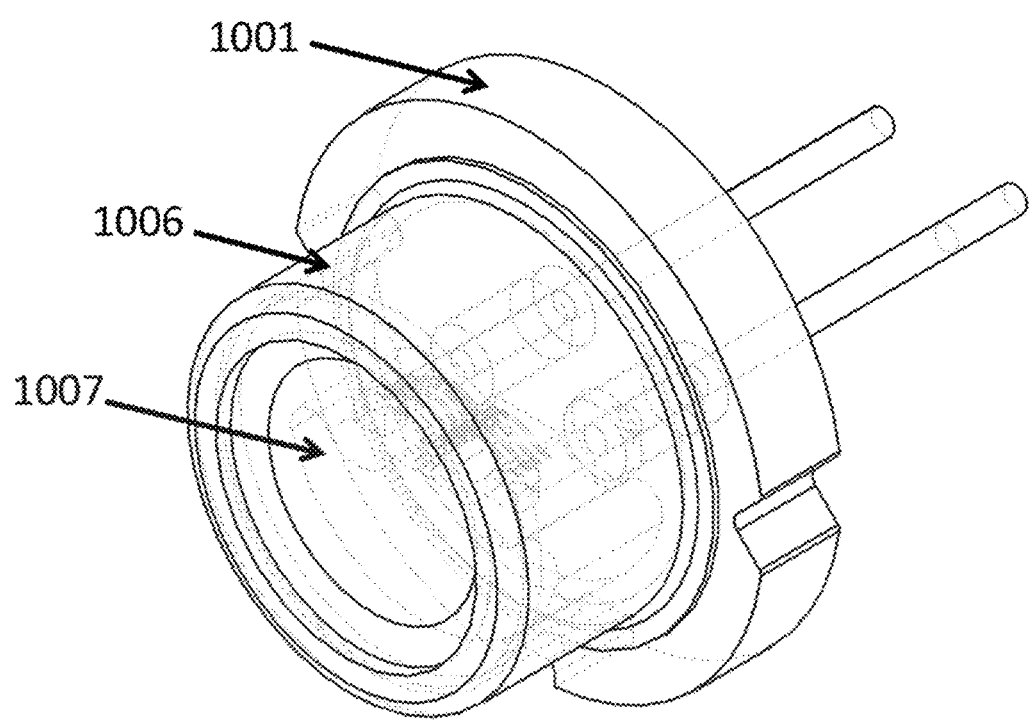
Figure 13A

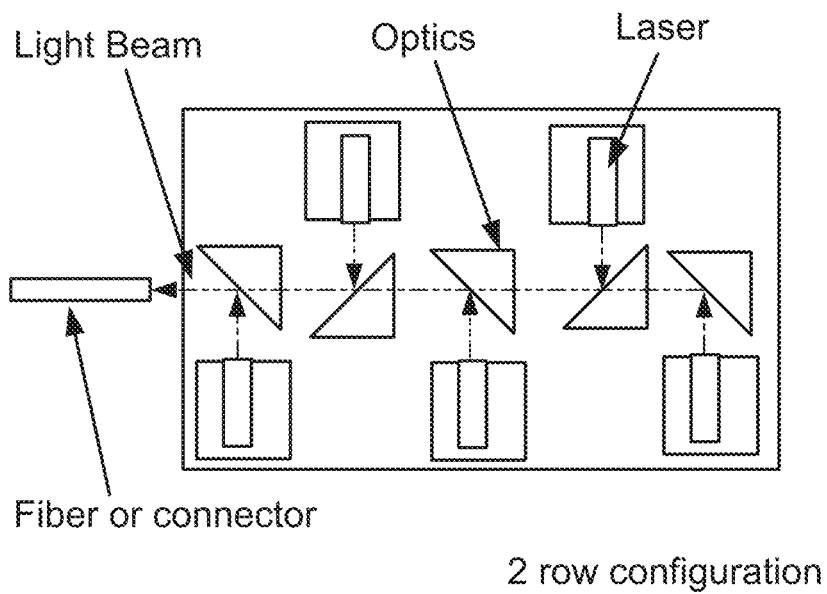
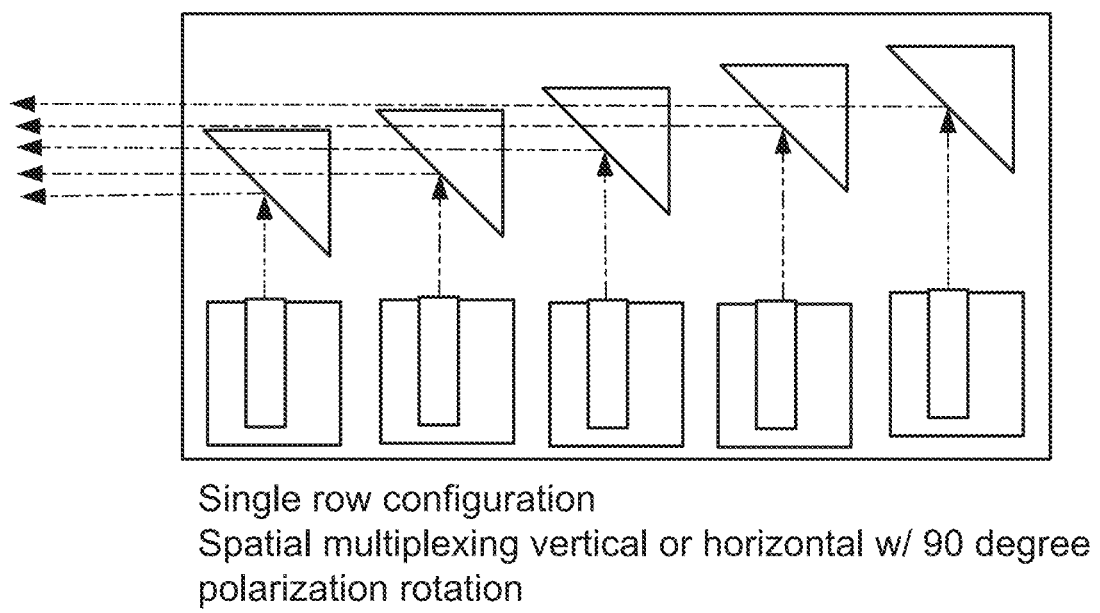
Figure 16

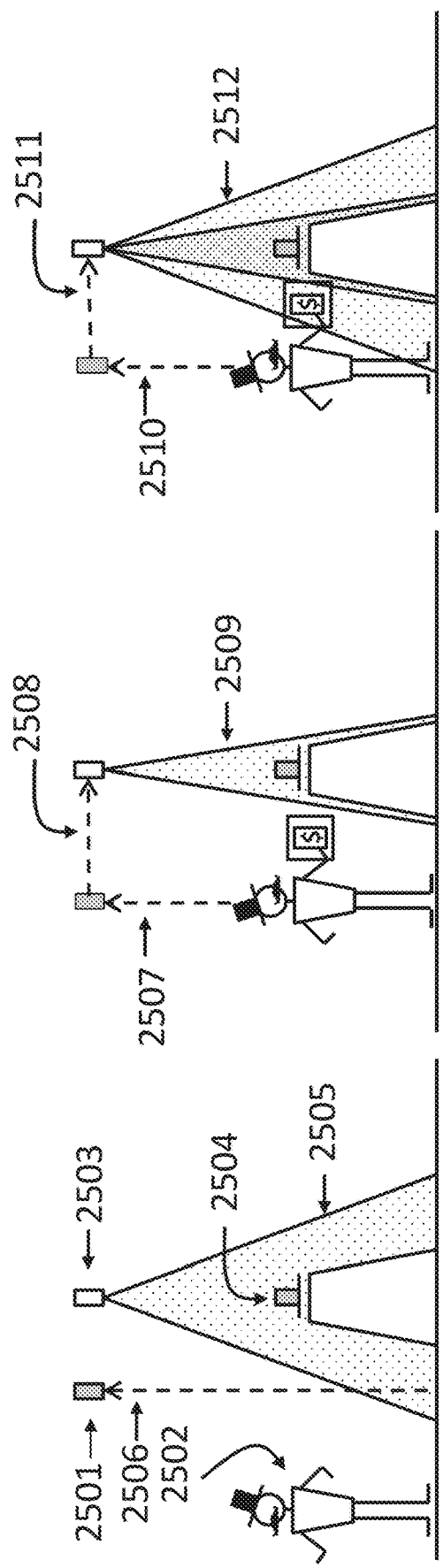

LASER BASED WHITE LIGHT SOURCE CONFIGURED FOR COMMUNICATION

CROSS REFERENCE TO RELATED APPLICATION

The present application is a continuation of U.S. application Ser. No. 17/108,550, filed Dec. 1, 2020, which is a continuation of U.S. application Ser. No. 16/783,513, filed Feb. 6, 2020, which is a continuation of U.S. application Ser. No. 15/719,455, filed Sep. 28, 2017, the entire contents of which are incorporated by reference herein for all purposes.

BACKGROUND

In the late 1800's, Thomas Edison invented the light bulb. The conventional light bulb, commonly called the "Edison bulb," has been used for over one hundred years for a variety of applications including lighting and displays. The conventional light bulb uses a tungsten filament enclosed in a glass bulb sealed in a base, which is screwed into a socket. The socket is coupled to an AC power or DC power source. The conventional light bulb can be found commonly in houses, buildings, and outdoor lightings, and other areas requiring light or displays. Unfortunately, drawbacks exist with the conventional light bulb:

The conventional light bulb dissipates more than 90% of the energy used as thermal energy.

The conventional light bulb routinely fails due to thermal expansion and contraction of the filament element.

The conventional light bulb emits light over a broad spectrum, much of which is not perceived by the human eye.

The conventional light bulb emits in all directions, which is undesirable for applications requiring strong directionality or focus, e.g. projection displays, optical data storage, etc.

To overcome some of the drawbacks of the conventional light bulb, several alternatives have been developed including fluorescent lamps, Mercury vapor lamps, sodium vapor lamps, other high-intensity discharge (HID) lamps, gas discharge lamps such as neon lamps, among others. These lamp technologies in general suffer from similar problems to Edison lamps as well as having their own unique drawbacks. For example, fluorescent lamps require high voltages to start, which can be in the range of a thousand volts for large lamps, and also emit highly non-ideal spectra that are dominated by spectral lines.

In the past decade, solid state lighting has risen in importance due to several key advantages it has over conventional lighting technology. Solid state lighting is lighting derived from semiconductor devices such as diodes which are designed and optimized to emit photons. Due to the high efficiency, long lifetimes, low cost, and non-toxicity offered by solid state lighting technology, light emitting diodes (LED) have rapidly emerged as the illumination technology of choice. An LED is a two-lead semiconductor light source typically based on a p-i-n junction diode, which emits electromagnetic radiation when activated. The emission from an LED is spontaneous and is typically in a Lambertian pattern. When a suitable voltage is applied to the leads, electrons and holes recombine within the device releasing energy in the form of photons. This effect is called electroluminescence, and the color of the light is determined by the energy band gap of the semiconductor.

Appearing as practical electronic components in 1962 the earliest LEDs emitted low-intensity infrared light. Infrared LEDs are still frequently used as transmitting elements in remote-control circuits, such as those in remote controls for a wide variety of consumer electronics. The first visible-light LEDs were also of low intensity, and limited to red. Modern LEDs are available across the visible, ultraviolet, and infrared wavelengths, with very high brightness.

The earliest blue and violet gallium nitride (GaN)-based LEDs were fabricated using a metal-insulator-semiconductor structure due to a lack of p-type GaN. The first p-n junction GaN LED was demonstrated by Amano et al. using the LEEBI treatment to obtain p-type GaN in 1989. They obtained the current-voltage (I-V) curve and electroluminescence of the LEDs, but did not record the output power or the efficiency of the LEDs. Nakamura et al. demonstrated the p-n junction GaN LED using the low-temperature GaN buffer and the LEEBI treatment in 1991 with an output power of 42 µW at 20 mA. The first p-GaN/n-InGaN/n-GaN DH blue LEDs were demonstrated by Nakamura et al. in 1993. The LED showed a strong band-edge emission of InGaN in a blue wavelength regime with an emission wavelength of 440 nm under a forward biased condition. The output power and the EQE were 125 µW and 0.22%, respectively, at a forward current of 20 mA. In 1994, Nakamura et al. demonstrated commercially available blue LEDs with an output power of 1.5 mW, an EQE of 2.7%, and the emission wavelength of 450 nm. On Oct. 7, 2014, the Nobel Prize in Physics was awarded to Isamu Akasaki, Hiroshi Amano and Shuji Nakamura for "the invention of efficient blue light-emitting diodes which has enabled bright and energy-saving white light sources" or, less formally, LED lamps.

By combining GaN-based LEDs with wavelength converting materials such as phosphors, solid-state white light sources were realized. This technology utilizing GaN-based LEDs and phosphor materials to produce white light is now illuminating the world around us as a result of the many advantages over incandescent light sources including lower energy consumption, longer lifetime, improved physical robustness, smaller size, and faster switching. LEDs are now used in applications as diverse as aviation lighting, automotive headlamps, advertising, general lighting, traffic signals, and camera flashes. LEDs have allowed new text, video displays, and sensors to be developed, while their high switching rates can be very useful in communications technology. LEDs, however, are not the only solid-state light source and may not be preferable light sources for certain lighting applications. Alternative solid state light sources utilizing stimulated emission, such as laser diodes (LDs) or super-luminescent light emitting diodes (SLEDs), provide many unique features advantageously over LEDs.

In 1960, the laser was demonstrated by Theodore H. Maiman at Hughes Research Laboratories in Malibu. This laser utilized a solid-state flash lamp-pumped synthetic ruby crystal to produce red laser light at 694 nm. Early visible laser technology comprised lamp pumped infrared solid state lasers with the output wavelength converted to the visible using specialty crystals with nonlinear optical properties. For example, a green lamp pumped solid state laser had 3 stages: electricity powers lamp, lamp excites gain crystal which lases at 1064 nm, 1064 nm goes into frequency conversion crystal which converts to visible 532 nm. The resulting green and blue lasers were called "lamped pumped solid state lasers with second harmonic generation" (LPSS with SHG) had wall plug efficiency of ~1%, and were more efficient than Ar-ion gas lasers, but were still too inefficient, large, expensive, fragile for broad deployment outside of specialty scientific and medical applications. To improve the efficiency of these visible lasers, high power diode (or semiconductor) lasers were utilized. These "diode pumped solid state lasers with SHG" (DPSS with SHG) had 3 stages: electricity powers 808 nm diode laser, 808 nm excites gain crystal, which lases at 1064 nm, 1064 nm goes into frequency conversion crystal which converts to visible 532 nm. As high power laser diodes evolved and new specialty SHG crystals were developed, it became possible to directly convert the output of the infrared diode laser to produce blue and green laser light output. These "directly doubled diode lasers" or SHG diode lasers had 2 stages: electricity powers 1064 nm semiconductor laser, 1064 nm goes into frequency conversion crystal which converts to visible 532 nm green light. These lasers designs are meant to improve the efficiency, cost and size compared to DPSS-SHG lasers, but the specialty diodes and crystals required make this challenging today.

SUMMARY

Solid-state laser light sources, due to the narrowness of their spectra which enables efficient spectral filtering, high modulation rates, and short carrier lifetimes, smaller in size, and far greater surface brightness compared to LEDs, can be more preferable as visible light sources as a means of transmitting information with high bandwidth in many applications including lighting fixtures, lighting systems, displays, projectors and the like. Advancements of new GaN-based blue laser technology based on improved processes have substantially reduced manufacture cost and opened opportunities for utilizing the modulated laser signal and the light spot directly to measure and or interact with the surrounding environment, transmit data to other electronic systems, and respond dynamically to inputs from various sensors. Such applications are herein referred to as "smart lighting" applications to be disclosed throughout the specification herein.

The present invention provides system, apparatus configured with various sensor-based feedback loops integrated with gallium and nitrogen containing laser diodes based on a transferred gallium and nitrogen containing material laser process and methods of manufacture and use thereof. Merely by examples, the invention provides remote and integrated smart laser lighting devices and methods, projection display and spatially dynamic lighting devices and methods, LIDAR, LiFi, and visible light communication devices and methods, and various combinations of above in applications of general lighting, commercial lighting and display, automotive lighting and communication, defense and security, industrial processing, and internet communications, and others.

In an aspect, this invention provides novel uses and configurations of gallium and nitrogen containing laser diodes in communication systems such as visible light communication systems such as Li-Fi systems, communications using the convergence of lighting and display with static or dynamic spatial patterning using beam shaping elements such as MEMS scanning mirrors, and communications triggered by integrated sensor feedback. Specific embodiments of this invention employ a transferred gallium and nitrogen containing material process for fabricating laser diodes or other gallium and nitrogen containing devices enabling benefits over conventional fabrication technologies.

In an embodiment, the present disclosure provides a light source configured for visible light communication. The light source includes a controller comprising a modem and a driver. The modem is configured to receive a data signal. The controller is configured to generate one or more control signals to operate the driver to generate a driving current and a modulation signal based on the data signal. Additionally, the light source includes a light emitter configured as a pump-light device comprised of a gallium and nitrogen containing material and an optical cavity. The optical cavity includes an optical waveguide region and one or more facet regions. The optical cavity is configured with electrodes to supply the driving current based on at least one of the one or more control signals to the gallium and nitrogen containing material. The driving current provides an optical gain to an electromagnetic radiation propagating in the optical waveguide region. The electromagnetic radiation is outputted through at least one of the one or more facet regions as a directional electromagnetic radiation characterized by a first peak wavelength in the ultra-violet or blue wavelength regime. The directional electromagnetic radiation is modulated to carry the data signal using the modulation signal provided by the driver. The light source further includes a pathway configured to direct, filter, or split the directional electromagnetic radiation. Furthermore, the light source includes a wavelength converter optically coupled to the pathway to receive the directional electromagnetic radiation from the pump-light device. The wavelength converter is configured to convert at least a fraction of the directional electromagnetic radiation with the first peak wavelength to at least a second peak wavelength that is longer than the first peak wavelength and to output a white-color spectrum comprising at least the second peak wavelength and partially the first peak wavelength. Moreover, the light source includes a beam shaper configured to direct the white-color spectrum for illuminating a target of interest and transmitting the data signal through at least the fraction of the directional electromagnetic radiation with the first peak wavelength to a receiver at the target of interest.

Optionally, as used herein, the term "modem" refers to a communication device. The device can also include a variety of other data receiving and transferring devices for wireless, wired, cable, or optical communication links, and any combination thereof. In an example, the device can include a receiver with a transmitter, or a transceiver, with suitable filters and analog front ends. In an example, the device can be coupled to a wireless network such as a meshed network, including Zigbee, Zeewave, and others. In an example, the wireless network can be based upon a 802.11 wireless standard or equivalents. In an example, the wireless device can also interface to telecommunication networks, such as 3G, LTE, 5G, and others. In an example, the device can interface into a physical layer such as Ethernet or others. The device can also interface with an optical communication including a laser coupled to a drive device or an amplifier. Of course, there can be other variations, modifications, and alternatives.

Optionally, the pump-light device includes a laser diode device. Optionally, the pump-light device includes a superluminescent diode (SLED) device.

Optionally, the laser diode device includes a carrier chip singulated from a carrier substrate. Additionally, the laser diode device includes one or more epitaxial material die transferred to the carrier substrate from a substrate. The epitaxial material includes an n-type cladding region, an active region including at least one active layer overlying the n-type cladding region, and a p-type cladding region overlying the active layer region. Furthermore, the laser diode device includes one or more laser diode stripe regions formed in the epitaxial material die.

Optionally, the directional electromagnetic radiation with the first peak wavelength includes a violet spectrum with the first peak wavelength in a range of 380-420 nm, and/or a blue spectrum with the first peak wavelength in a range of 420-480 nm.

Optionally, the output of the driver includes at least a driving current for controlling an intensity of the directional electromagnetic radiation emitted from the pump-light device and a modulation signal of a pre-defined format based on either amplitude modulation or frequency modulation based on the data signal.

Optionally, the directional electromagnetic radiation includes multiple pulse-modulated light signals at a modulation frequency range selected from about 50 MHz to 300 MHz, 300 MHz to 1 GHz, and 1 GHz to 100 GHz based on the data signal.

Optionally, the white-color spectrum includes the multiple pulse-modulated light signals modulated based on the data signal carried by at least a fraction of the directional electromagnetic radiation from the light emitter.

Optionally, the wavelength converter includes a phosphor material configured as in a reflection mode to have a surface receiving the directional electromagnetic radiation in an incident angle The white-color spectrum is a combination of a spectrum of the second peak wavelength converted by the phosphor material, a fraction of the directional electromagnetic radiation with the first peak wavelength reflected from the surface of the phosphor material, and a fraction of the directional electromagnetic radiation scattered from interior of the phosphor material.

Optionally, the wavelength converter includes a phosphor material configured as in a transmission mode to receive the directional electromagnetic radiation passed through. The white-color spectrum is a combination of a fraction of the directional electromagnetic radiation not absorbed by the phosphor material and a spectrum of the second peak wavelength converted by the phosphor material.

Optionally, the wavelength converter includes a plurality of wavelength converting regions that respectively convert blue or violet wavelength regime to a predominantly red spectrum, or a predominantly green spectrum, and/or a predominantly blue spectrum with a longer peak wavelength than the first peak wavelength of the directional electromagnetic radiation.

Optionally, the beam shaper includes a plurality of color-specific optical elements for independently manipulating the predominantly red spectrum, the predominantly green spectrum, and the predominantly blue spectrum for transmitting to different targets of interests carrying different streams of the data signal for different receivers.

Optionally, the beam shaper includes one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus the white-color spectrum to at least modify an angular distribution thereof.

Optionally, the beam shaper is configured to direct the white-color spectrum as an illumination source for illuminating the target of interest along a preferred direction.

Optionally, the light source includes a beam steering device wherein the beam steering device is configured to direct the white-color spectrum for dynamically scanning a spatial range around the target of interest.

Optionally, the pathway includes an optical fiber to guide the directional electromagnetic radiation to the wavelength converter member disposed remotely to generate the white-color spectrum. Optionally, the pathway includes a waveguide for guide the directional electromagnetic radiation to the wavelength converter member. Optionally, the pathway includes free-space optics devices.

Optionally, the receiver at the target of interest comprises a photodiode, avalanche photodiode, photomultiplier tube, and one or more band-pass filters to detect pulse-modulated light signals at a modulation frequency range of about 50 MHz to 100 GHz, the receiver being coupled to a modem configured to decode the light signals into binary data.

In another aspect, the present invention provides gallium and nitrogen based lasers light sources configured for one or more predetermined light characteristic responses such as a light movement response, a light color response, a light brightness response, or other responses. Specific embodiments of this invention employ a transferred gallium and nitrogen containing material process for fabricating laser diodes or other gallium and nitrogen containing devices enabling benefits over conventional fabrication technologies.

In another embodiment, the present disclosure provides an integrated light source for communication and dynamic spatial illumination. The integrated light source includes a modem configured for receiving data signals and a laser modulation driver coupled to the modem to generate a driving current and provide a modulation format based on the data signals. Additionally, the integrated light source includes a laser device driven by the driving current to emit a laser light with a first peak wavelength modulated according to the modulation format. The integrated light source further includes an optical pathway for guiding the laser light. Furthermore, the integrated light source includes a wavelength converting element configured to couple with the optical pathway to receive the laser light with a first peak wavelength and reemit a white-color light excited by converting a fraction of the laser light with the first peak wavelength to a spectrum with a second peak wavelength longer than the first peak wavelength and combining the fraction of fraction of the laser light with a first peak wavelength and the spectrum with the second peak wavelength. The white-color light carries the data signal in the modulation format. Moreover, the integrated light source includes a beam shaping optical element configured to collimate the white-color light and a beam steering optical element configured to receive one or more voltage and current signals generated by a beam steering driver based on input information to dynamically scan the white-color light to provide patterned illuminations to multiple areas and simultaneously transmit the data signals to different receivers at the multiple areas.

Optionally, the modulation format based on the data signal includes one selected from double-sideband modulation (DSB), double-sideband modulation with carrier (DSB-WC), double-sideband suppressed-carrier transmission (DSB-SC), double-sideband reduced carrier transmission (DSB-RC), single-sideband modulation (SSB, or SSB-AM), single-sideband modulation with carrier (SSB-WC), single-sideband modulation suppressed carrier modulation (SSB-SC), vestigial sideband modulation (VSB, or VSB-AM), quadrature amplitude modulation (QAM), pulse amplitude modulation (PAM), phase-shift keying (PSK), frequency-shift keying (FSK), continuous phase modulation (CPM), minimum-shift keying (MSK), Gaussian minimum-shift keying (GMSK), continuous-phase frequency-shift keying (CPFSK), orthogonal frequency-division multiplexing (OFDM), and discrete multitone (DMT).

Optionally, the wavelength converting element is disposed via a thermal conductor material on a submount structure commonly supporting the laser device. The wavelength converting element includes a phosphor material selected for absorbing at least partially one of the violet spectrum, the blue spectrum, the green spectrum, and the red spectrum to reemit a broader spectrum with a peak wavelength respectively longer than the peak wavelength of the wavelength ranges of violet spectrum, the blue spectrum, the green spectrum, and the red spectrum.

Optionally, the beam steering optical element further is selected from one of a micro-electromechanical system (MEMS) mirror, a digital light processing (DLP) chip, a digital mirror device (DMD), and a liquid crystal on silicon (LCOS) chip for steering, patterning, or pixelating the white-color light.

Optionally, the integrated light source further includes a controller having an interface configured as a user input dial, switch, or joystick mechanism or a feedback loop module for receiving input information to activate the MEMS mirror, or DLP chip, or DMD, or LCOS chip. The input information includes an illumination spatial pattern inputted by user or a dynamically varying illumination spatial pattern updated from sensor feedback. The beam steering optical element further is configured to spatially modulate and dynamically direct the white-color light based on the input information to provide spatially modulated illumination onto a first area of a target surface or into first direction of a target space in a first period and onto a second area of the target surface or into a second direction of a target space in a second period, and to independently transmit the data signals to a first receiver at the first area or downstream in the first direction in the first period and to a second receiver at the second area or downstream in the second direction in the second period.

Optionally, the integrated light source further includes a reflector disposed at downstream of the white-color light. The reflector is a parabolic reflector to reflect and propagate a collimated beam along an axis thereof.

Optionally, the integrated light source further includes a lens used to collimate the white-color light into a projected beam. The lens includes an aspheric lens positioned the wavelength converting element to collimate the white-color light.

Optionally, the integrated light source further includes a housing having an aperture for dynamically outputting the white-color light. The housing is configured to have a common submount to support at least the laser device, the wavelength converting element, and the beam steering optical element. The housing includes one of a TO canister package, a butterfly package, a chip and phosphor on submount (CPoS) package, a surface mount device (SMD) type package.

In yet another embodiment, the present disclosure provides a dynamic light source with color and brightness control for visible light communication. The dynamic light source includes a modem configured to receive digital information for communication. Additionally, the dynamic light source includes a laser driver configured to generate a driving current and at least one modulation signal based on the digital information. The dynamic light source further includes a laser device configured to be driven by the driving current to emit a laser beam with a first peak wavelength in a color range of violet or blue spectrum. The laser beam is modulated by the at least one modulation signal to carry the digital information. Furthermore, the dynamic light source includes a beam shaping optical element configured to dynamically direct the laser beam with a varying angle through an aperture into a pathway. The dynamic light source further includes a wavelength converting member comprising at least two color phosphor regions spatially distributed to respectively receive the laser beam with different angle outputted from the pathway and configured to convert a fraction of the laser beam with the first peak wavelength to at least two color spectra respectively by the at least two color phosphor regions. Each of the at least two color spectra includes a second peak wavelength longer than the first peak wavelength but varying with the fraction of the laser beam being absorbed by each of the at least two color phosphor regions. The at least two color spectra are respectively combined with remaining fraction of the laser beam with the first peak wavelength to reemit an output light beam of a broader spectrum with a dynamically varied color point. The dynamic light source also includes a beam steering optical element configured to spatially direct the output light beam. Moreover, the dynamic light source includes a beam steering driver configured to generate control signals based on input information for the beam steering optical element to dynamically scan the output light beam to provide spatially modulated illumination with dynamically varied color point onto one or more of multiple target areas or into one or more of multiple target directions in one or more selected periods while simultaneously transmit digital information to a receiver in one or more of multiple target areas or one or more of multiple target directions in one or more selected periods.

Optionally, the laser device includes one or more laser diodes for emitting the laser beam with the first peak wavelength in violet spectrum ranging from 380 to 420 nm or in blue spectrum ranging from 420 to 480 nm.

Optionally, the at least two color phosphor regions of the wavelength converting member include a first phosphor material configured to absorb a first ratio of the laser beam with the first peak wavelength in the violet spectrum and convert to a first color spectrum with a second wavelength longer than the first peak wavelength to emit the output light beam with a first color point, a second phosphor material configured to absorb a second ratio of the laser beam with the first peak wavelength in the blue spectrum and convert to a second color spectrum with a second wavelength longer than the first peak wavelength to emit the output light beam with a second color point, a third phosphor material configured to absorb a third ratio of the laser beam with the first peak wavelength in the violet or blue spectrum and convert to a third color spectrum with a second wavelength longer than the first peak wavelength to emit the output light beam with a third color point.

Optionally, the dynamic light source further includes a second beam shaping optical element configured to collimate and direct the output light beam by at least modifying an angular distribution thereof. The second beam shaping optical element includes one or a combination of several optical devices including slow axis collimating lens, fast axis collimating lens, aspheric lens, ball lens, total internal reflector (TIR) optics, parabolic lens optics, refractive optics, and micro-electromechanical system (MEMS) mirrors.

In an alternative embodiment, the present disclosure provides a dynamic light source with color and brightness control for visible light communication. The dynamic light source includes a modem configured to receive digital information for communication and a laser driver configured to generate one or more driving currents and a modulation signal based on the digital information. Additionally, the dynamic light source includes a laser device configured to be driven by the one or more driving currents to emit at lease a first laser beam with a first peak wavelength in a color range of violet or blue spectrum and a second laser beam with a second peak wavelength longer than the first peak wavelength. At least one of the first laser beam and the second laser beam is modulated by the modulation signal to carry the digital information. The dynamic light source further includes a beam shaping optical element configured to collimate, focus, and dynamically direct the first laser beam and the second laser beam respectively through a pathway. Furthermore, the dynamic light source includes a wavelength converting member configured to receive either the first laser beam or the second laser beam from the pathway and configured to convert a first fraction of the first laser beam with the first peak wavelength to a first spectrum with a third peak wavelength longer than the first peak wavelength or convert a second fraction of the second laser beam with the second peak wavelength to a second spectrum with a fourth peak wavelength longer than the second peak wavelength. The first spectrum and the second spectrum respectively combine with remaining fraction of the first laser beam with the first peak wavelength and the second laser beam with the second peak wavelength to reemit an output light beam of a broader spectrum dynamically varied from a first color point to a second color point. The dynamic light source further includes a beam steering optical element configured to spatially direct the output light beam. Moreover, the dynamic light source includes a beam steering driver configured to generate control signals based on input information for the beam steering optical element to dynamically scan the output light beam to provide spatially modulated illumination with dynamically varied color point onto one or more of multiple target areas or into one or more of multiple target directions in one or more selected periods while simultaneously transmit digital information to a receiver in one or more of multiple target areas or one or more of multiple target directions in one or more selected periods.

Optionally, the laser device includes one or more first laser diodes for emitting the first laser beam with the first peak wavelength in violet spectrum ranging from 380 to 420 nm or blue spectrum ranging from 420 to 480 nm. The one or more first laser diodes include an active region including a gallium and nitrogen containing material configured to be driven by the one or more driving currents. The gallium and nitrogen containing material comprises one or more of GaN, AlN, InN, InGaN, AlGaN, InAlN, InAlGaN.

Optionally, the laser device includes one or more second laser diodes for emitting the second laser beam with the second peak wavelength in red spectrum ranging from 600 nm to 670 nm, or in green spectrum ranging from 480 nm to 550 nm, or a blue spectrum with a longer wavelength than that of the first peak wavelength. The one or more second laser diodes include an active region including a gallium and arsenic containing material configured to be driven by the one or more driving currents.

Optionally, the first laser beam and the second laser beam are independently modulated by the modulation signal to act as independent channels to communicate the digital information.

Optionally, the wavelength converting member includes a first phosphor material selected for absorbing a first ratio of the first laser beam with the first peak wavelength in the violet spectrum and converting to a first spectrum with a second wavelength longer than the first peak wavelength to emit a first output light beam with a first color point, a second phosphor material selected for absorbing partially second ratio of the first laser beam with the first peak wavelength in the blue spectrum and converting to a second spectrum with a second wavelength longer than the first peak wavelength to emit a second output light beam with a second color point, a third phosphor material selected for absorbing a third ratio of the second laser beam with the first peak wavelength in the red spectrum and converting to a third spectrum with a second wavelength longer than the first peak wavelength to emit a third output light beam with a third color point.

Optionally, the beam shaping optical element includes one or a combination of more optical elements selected a list of slow axis collimating lens, fast axis collimating lens, aspheric lens, ball lens, total internal reflector (TIR) optics, parabolic lens optics, refractive optics, and micro-electro-mechanical system (MEMS) mirrors configured to direct, collimate, focus each of the first laser beam and second laser beam with modified angular distributions as incident beams into corresponding first, second, third phosphor material for tuning the first, second, third ratio of the first and second laser beams being converted thereof for dynamically adjusting the first, second, third color point of the respective first, second, third output light beam.

In yet another aspect, the present invention provides gallium and nitrogen based lasers light sources coupled to one or more sensors with a feedback loop or control circuitry to trigger the light source to react with one or more predetermined responses such as a communication response with a VLC signal or dynamic spatial patterning of light, a light movement response, a light color response, a light brightness response, a spatial light pattern response, other response, or a combination of responses. Specific embodiments of this invention employ a transferred gallium and nitrogen containing material process for fabricating laser diodes or other gallium and nitrogen containing devices enabling benefits over conventional fabrication technologies.

In still another embodiment, the present disclosure provides a smart light source configured for visible light communication. The smart light source includes a controller comprising a modem and a driver. The modem is configured to receive data signal and operate the driver to generate a driving current and a modulation signal. Additionally, the smart light source includes a light emitter configured as a pump-light device comprised of a gallium and nitrogen containing material and an optical cavity comprising an optical waveguide region and one or more facet regions. The optical cavity is configured with electrodes to supply the driving current from the driver to the gallium and nitrogen containing material to provide optical gain to an electromagnetic radiation propagating in the optical waveguide region and output a directional electromagnetic radiation through at least one of the one or more facet regions. The directional electromagnetic radiation is characterized by a first peak wavelength in the ultra-violet or blue wavelength regime and modulated to carry the data signal using the modulation signal by the controller. The smart light source further includes a wavelength converter optically coupled to the directional electromagnetic radiation from the pump-light device, wherein the wavelength converter is configured to convert at least a fraction of the directional electromagnetic radiation with the first peak wavelength to at least a second peak wavelength that is longer than the first peak wavelength and to output a white-color spectrum comprising at least the second peak wavelength and partially the first peak wavelength. Furthermore, the smart light source includes a beam shaper configured to collimate and focus a beam of the white-color spectrum to a certain direction or a certain focal point. The smart light source further includes a beam steering element configured to manipulate the beam of the white-color spectrum for illuminating a target of interest and transmitting the data signal through at least the fraction of the directional electromagnetic radiation with the first peak wavelength to a receiver at the target of interest. Moreover, the smart light source includes one or more sensors being configured in a feedback loop circuit coupled to the controller. The one or more sensors are configured to provide one or more feedback currents or voltages based on the various parameters associated with the target of interest detected in real time to the controller with one or more of light movement response, light color response, light brightness response, spatial light pattern response, and data signal communication response being triggered.

Optionally, the wavelength converter includes a phosphor material configured as in a reflection mode to have a surface receiving the directional electromagnetic radiation in an incident angle. The white-color spectrum is a combination of a spectrum of the second peak wavelength converted by the phosphor material, a fraction of the directional electromagnetic radiation with the first peak wavelength reflected from the surface of the phosphor material, and a fraction of the directional electromagnetic radiation scattered from interior of the phosphor material.

Optionally, the wavelength converter includes a phosphor material configured as in a transmission mode to receive the directional electromagnetic radiation passed through. The white-color spectrum is a combination of a fraction of the directional electromagnetic radiation not absorbed by the phosphor material and a spectrum of the second peak wavelength converted by the phosphor material.

Optionally, the wavelength converter includes a plurality of wavelength converting regions that respectively convert blue or violet wavelength regime to a predominantly red spectrum, or a predominantly green spectrum, and/or a predominantly blue spectrum with a longer peak wavelength than the first peak wavelength of the directional electromagnetic radiation.

Optionally, the beam steering element includes a plurality of color-specific optical elements for independently manipulating the predominantly red spectrum, the predominantly green spectrum, and the predominantly blue spectrum for transmitting to different targets of interests carrying different streams of the data signal for different receivers.

Optionally, the beam steering element is configured to manipulate and direct the beam of the white-color spectrum as an illumination source with spatial modulation for illuminating a surface at the target of interest along a preferred direction.

Optionally, the beam steering element further is configured to direct the white-color spectrum for dynamically scanning a spatial range around the target of interest.

Optionally, the one or more sensors include one or a combination of multiple of sensors selected from microphone, geophone, motion sensor, radio-frequency identification (RFID) receivers, hydrophone, chemical sensors including a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video cameras, transducer, image sensor, infrared sensor, radar, SONAR, LIDAR.

Optionally, the one or more sensors is configured in the feedback loop circuit to provide a feedback current or voltage to tune a control signal for operating the driver to adjust brightness and color of the directional electromagnetic radiation from the light-emitter.

Optionally, the one or more sensors is configured in the feedback loop circuit to provide a feedback current or voltage to tune a control signal for operating the beam steering optical element to adjust a spatial position and pattern illuminated by the beam of the white-color spectrum.

Optionally, the one or more sensors is configured in the feedback loop circuit to send a feedback current or voltage back to the controller to change the driving current and the modulation signal for changing the data signal to be communicated through at least a fraction of the directional electromagnetic radiation modulated by the modulation signal.

Optionally, the controller further is configured to provide control signals to tune the beam shaper for dynamically modulating the white-color spectrum based on feedback from the one or more sensors.

Optionally, the controller is a microprocessor disposed in a smart phone, a smart watch, a computerized wearable device, a tablet computer, a laptop computer, a vehicle-built-in computer, a drone.

Optionally, the beam steering element further is configured to independently transmit the data signal to different receivers in different direction in different period synchronized with the spatial modulation of the white-color spectrum illuminated into the particular direction.

Optionally, the beam steering element includes an optical device selected from one of a micro-electromechanical system (MEMS) mirror, a digital light processing (DLP) chip, a digital mirror device (DMD), and a liquid crystal on silicon (LCOS) chip for steering, patterning, or pixelating the white-color spectrum.

Optionally, the MEMS mirror is configured to produce high deflection angles more than 10 degrees, low in power consumption of less than 100 mW, and high scan frequencies capable of producing HD resolution.

Optionally, the MEMS mirror is configured to perform resonant operation for vector pointing and provide high reflectivity of >80% for high power operation.

Optionally, the beam steering element includes a 2-dimensional array of micro-mirrors to steer, pattern, and/or pixelate a beam of the white-color light by reflecting from corresponding pixels at a predetermined angle to turn each pixel on or off.

Optionally, the 2-dimensional array of micro-mirrors is formed on a silicon chip configured for providing dynamic spatial modulation of the beam of white-color spectrum.

Optionally, the beam steering element further is configured to spatially modulate and dynamically direct the white-color light based on the input information to provide spatially modulated illumination onto a first area of a target surface or into first direction of a target space in a first period and onto a second area of the target surface or into a second direction of a target space in a second period, and to independently transmit the data signals to a first receiver at the first area or downstream in the first direction in the first period and to a second receiver at the second area or downstream in the second direction in the second period.

Optionally, each of the first receiver and the second receiver comprises a photodiode, avalanche photodiode, photomultiplier tube, and one or more band-pass filters to detect pulse-modulated light signals, and is coupled to a modem configured to decode the light signals into binary data.

In yet still another embodiment, the present disclosure provides a smart light source with spatial illumination and color dynamic control. The smart light source includes a microcontroller for generating one or more control signals and a laser device configured to be driven by at least one of the one or more control signals to emit a laser beam with a first peak wavelength in a color range of violet or blue spectrum. The laser beam is modulated by the at least one modulation signal to carry the digital information. Additionally, the smart light source includes a beam shaping optical element configured to dynamically direct the laser beam with a varying angle through an aperture into a pathway. The smart light source further includes a wavelength converting member comprising at least two color phosphor regions spatially distributed to respectively receive the laser beam with different angle outputted from the pathway and configured to convert a fraction of the laser beam with the first peak wavelength to at least two color spectra respectively by the at least two color phosphor regions. Each of the at least two color spectra includes a second peak wavelength longer than the first peak wavelength but varying with the fraction of the laser beam being absorbed by each of the at least two color phosphor regions. The at least two color spectra are respectively combined with remaining fraction of the laser beam with the first peak wavelength to reemit an output light beam of a broader spectrum with a dynamically varied color point. Furthermore, the smart light source includes a beam steering optical element configured to spatially direct the output light beam. Moreover, the light source includes a beam steering driver coupled to the microcontroller to receive some of the one or more control signals based on input information for the beam steering optical element to dynamically scan the output light beam substantially in white color to provide spatially modulated illumination and selectively direct one or more of the multiple laser beams with the first peak wavelengths in different color ranges onto one or more of multiple target areas or into one or more of multiple target directions in one or more selected periods.

In yet still an alternative embodiment, the present disclosure provides a smart light source with spatially modulated illumination. The smart light source includes a controller configured to receive input information for generating one or more control signals. The smart light source further includes a light emitter configured as a pump-light device comprised of a gallium and nitrogen containing material and an optical cavity; the optical cavity comprising an optical waveguide region and one or more facet regions. The optical cavity is configured with electrodes to supply a driving current based on at least one of the one or more control signals to the gallium and nitrogen containing material. The driving current provides an optical gain to an electromagnetic radiation propagating in the optical waveguide region. The electromagnetic radiation is outputted through at least one of the one or more facet regions as a directional electromagnetic radiation characterized by a first peak wavelength in the ultra-violet or blue wavelength regime. Furthermore, the smart light source includes a beam shaper configured to collimate and focus the directional electromagnetic radiation to a certain direction and focal point and a wavelength converter optically coupled to the directional electromagnetic radiation from the pump-light device. The wavelength converter is configured to absorb at least a fraction of the directional electromagnetic radiation with the first peak wavelength to excite a spectrum with a second peak wavelength that is longer than the first peak wavelength and to reemit an output electromagnetic radiation with a broader spectrum comprising at least the second peak wavelength and partially the first peak wavelength. The smart light source further includes a beam steering optical element configured to manipulate the output electromagnetic radiation for providing spatially modulated illuminations onto a target area or into a target direction. Moreover, the smart light source includes one or more sensors being configured in a feedback loop circuit coupled to the controller. The one or more sensors are configured to provide one or more feedback currents or voltages based on the various parameters associated with the target of interest detected in real time to the controller with one or more of light movement response, light color response, light brightness response, spatial light pattern response, and data signal communication response being triggered.

In yet still another alternative embodiment, the present disclosure provides a smart light system with color and brightness dynamic control. The smart light system includes a microcontroller configured to receive input information for generating one or more control signals. Additionally, the smart light system includes a laser device configured to be driven by at least one of the one or more control signals to emit at lease a first laser beam with a first peak wavelength in a color range of violet or blue spectrum and a second laser beam with a second peak wavelength longer than the first peak wavelength. The smart light system further includes a pathway configured to dynamically guide the first laser beam and the second laser beam. Furthermore, the smart light system includes a wavelength converting member configured to receive either the first laser beam or the second laser beam from the pathway and configured to convert a first fraction of the first laser beam with the first peak wavelength to a first spectrum with a third peak wavelength longer than the first peak wavelength or convert a second fraction of the second laser beam with the second peak wavelength to a second spectrum with a fourth peak wavelength longer than the second peak wavelength. The first spectrum and the second spectrum respectively combine with remaining fraction of the first laser beam with the first peak wavelength and the second laser beam with the second peak wavelength to reemit an output light beam of a broader spectrum dynamically varied from a first color point to a second color point. The smart light system includes a beam shaping optical element configured to collimate and focus the output light beam and a beam steering optical element configured to direct the output light beam. Moreover, the smart light system includes a beam steering driver coupled to the microcontroller to receive some of the one or more control signals based on input information for the beam steering optical element to dynamically scan the output light beam substantially in white color to provide spatially modulated illumination and selectively direct one or more of the multiple laser beams with the first peak wavelengths in different color ranges onto one or more of multiple target areas or into one or more of multiple target directions in one or more selected periods. Even further, the smart light system includes one or more sensors being configured in a feedback loop circuit coupled to the controller. The one or more sensors are configured to provide one or more feedback currents or voltages based on the various parameters associated with the target of interest detected in real time to the controller with one or more of light movement response, light color response, light brightness response, spatial light pattern response, and data signal communication response being triggered.

Merely by way of example, the present invention can be applied to applications such as white lighting, white spot lighting, flash lights, automobile headlights, all-terrain vehicle lighting, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like.

BRIEF DESCRIPTION OF THE FIGURES

The following drawings are merely examples for illustrative purposes according to various disclosed embodiments and are not intended to limit the scope of the present invention.

FIG. 13A is a schematic diagram of a laser based white light source operating in transmission mode and housed in a TO canister style package according to an embodiment of the present invention.

FIG. 16 is a simplified diagram illustrating a plurality of laser bars configured with optical combiners according to embodiments of the present invention.

FIG. 27A is a schematic representation of a use case for some embodiments of the present invention where the output spatial distribution of light intensity and color are altered in a predetermined way based on the input from a sensor.

FIG. 27B is a schematic representation of a use case for some embodiments of the present invention where the output spatial distribution of light intensity is altered in a predetermined way based on the input from a sensor.

FIG. 27C is a schematic representation of a use case for some embodiments of the present invention where the output spatial distribution of the light spectrum is altered in a predetermined way based on the input from a sensor.

DETAILED DESCRIPTION

The present invention provides system, apparatus configured with various sensor-based feedback loops integrated with gallium and nitrogen containing laser diodes based on a transferred gallium and nitrogen containing material laser process and methods of manufacture and use thereof. Merely by examples, the invention provides remote and integrated smart laser lighting devices and methods, projection display and spatially dynamic lighting devices and methods, LIDAR, LiFi, and visible light communication devices and methods, and various combinations of above in applications of general lighting, commercial lighting and display, automotive lighting and communication, defense and security, industrial processing, and internet communications, and others.

Figure 1:
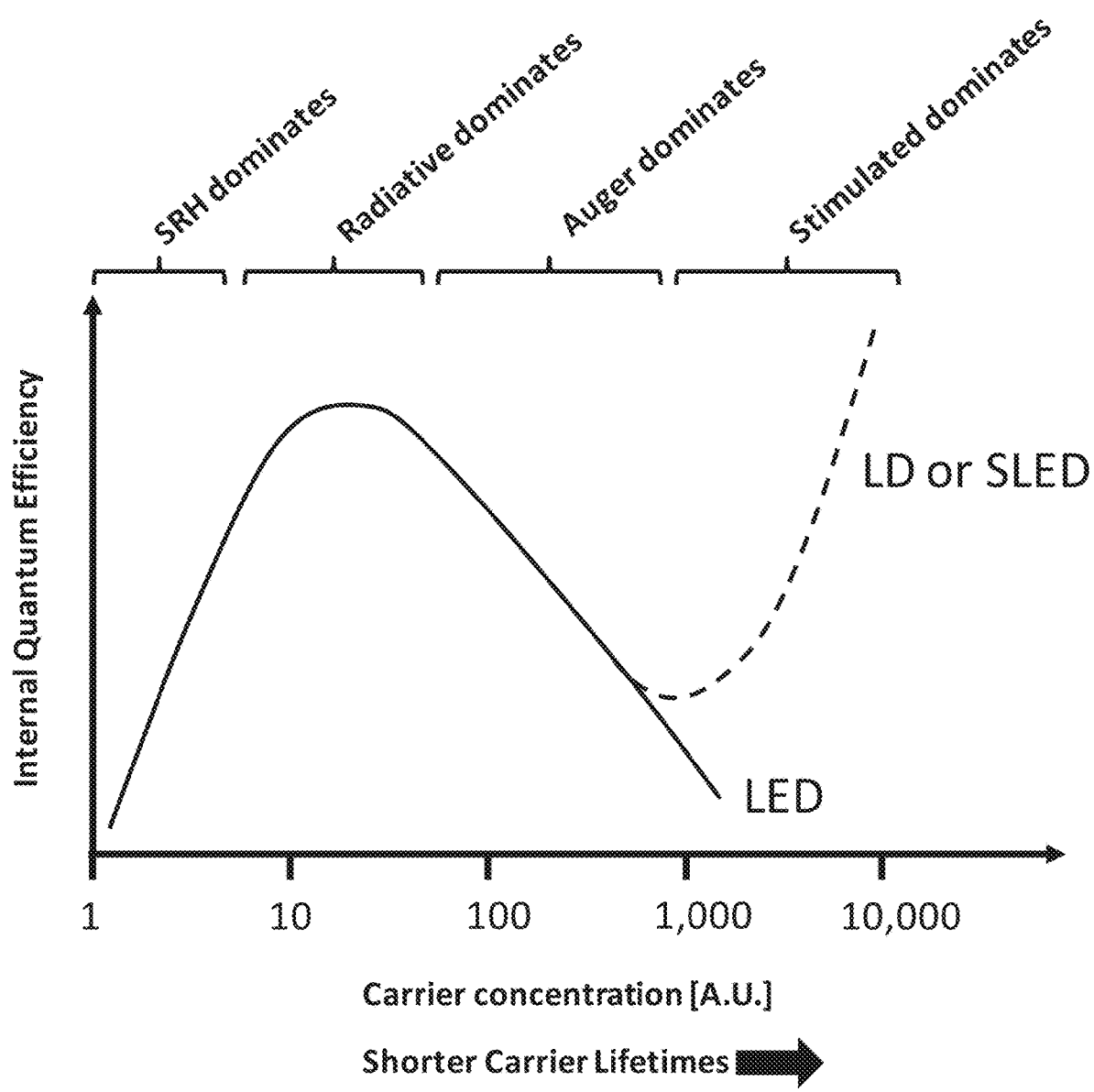
FIG. 1 is a schematic diagram showing dependence of internal quantum efficiency in a laser diode on carrier concentration in the light emitting layers of the device.
Figure 2:
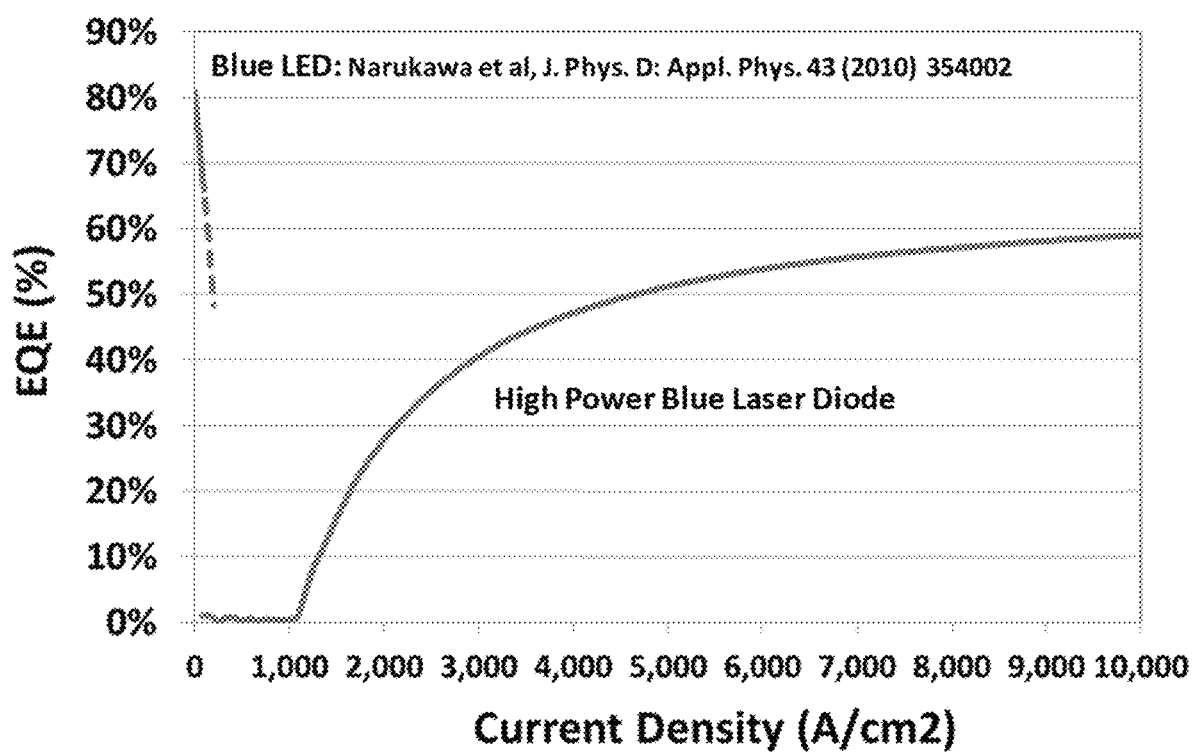
FIG. 2 is a plot of external quantum efficiency as a function of current density for a high power blue laser diode compared to the high power blue light emitting diode.

As background, while LED-based light sources offer great advantages over incandescent based sources, there are still challenges and limitations associated with LED device physics. The first limitation is the so called "droop" phenomenon that plagues GaN based LEDs. The droop effect leads to power rollover with increased current density, which forces LEDs to hit peak external quantum efficiency at very low current densities in the 10-200 A/cm$^2$ range. FIG. 1 shows a schematic diagram of the relationship between internal quantum efficiency [IQE] and carrier concentration in the light emitting layers of a light emitting diode [LED] and light-emitting devices where stimulated emission is significant such as laser diodes [LDs] or super-luminescent LEDs. IQE is defined as the ratio of the radiative recombination rate to the total recombination rate in the device. At low carrier concentrations Shockley-Reed-Hall recombination at crystal defects dominates recombination rates such that IQE is low. At moderate carrier concentrations, spontaneous radiative recombination dominates such that IQE is relatively high. At high carrier concentrations, non-radiative auger recombination dominates such that IQE is again relatively low. In devices such as LDs or SLEDs, stimulated emission at very high carrier densities leads to a fourth regime where IQE is relatively high. FIG. 2 shows a plot of the external quantum efficiency [EQE] for a typical blue LED and for a high power blue laser diode. EQE is defined as the product of the IQE and the fraction of generated photons that are able to exit the device. While the blue LED achieves a very high EQE at very low current densities, it exhibits very low EQE at high current densities due to the dominance of auger recombination at high current densities. The LD, however, is dominated by stimulated emission at high current densities, and exhibits very high EQE. At low current densities, the LD has relatively poor EQE due to reabsorption of photons in the device. Thus, to maximize efficiency of the LED based light source, the current density must be limited to low values where the light output is also limited. The result is low output power per unit area of LED die [flux], which forces the use large LED die areas to meet the brightness requirements for most applications. For example, a typical LED based light bulb will require 3 mm² to 30 mm² of epi area.

A second limitation of LEDs is also related to their brightness, more specifically it is related to their spatial brightness. A conventional high brightness LED emits ~1 W per mm² of epi area. With some advances and breakthrough perhaps this can be increased up to 5-10× to 5-10 W per mm² of epi area. Finally, LEDs fabricated on conventional c-plane GaN suffer from strong internal polarization fields, which spatially separate the electron and hole wave functions and lead to poor radiative recombination efficiency. Since this phenomenon becomes more pronounced in InGaN layers with increased indium content for increased wavelength emission, extending the performance of UV or blue GaN-based LEDs to the blue-green or green regime has been difficult.

An exciting new class of solid-state lighting based on laser diodes is rapidly emerging. Like an LED, a laser diode is a two-lead semiconductor light source that that emits electromagnetic radiation. However, unlike the output from an LED that is primarily spontaneous emission, the output of a laser diode is comprised primarily of stimulated emission. The laser diode contains a gain medium that functions to provide emission through the recombination of electron-hole pairs and a cavity region that functions as a resonator for the emission from the gain medium. When a suitable voltage is applied to the leads to sufficiently pump the gain medium, the cavity losses are overcome by the gain and the laser diode reaches the so-called threshold condition, wherein a steep increase in the light output versus current input characteristic is observed. At the threshold condition, the carrier density clamps and stimulated emission dominates the emission. Since the droop phenomenon that plagues LEDs is dependent on carrier density, the clamped carrier density within laser diodes provides a solution to the droop challenge. Further, laser diodes emit highly directional and coherent light with orders of magnitude higher spatial brightness than LEDs. For example, a commercially available edge emitting GaN-based laser diode can reliably produce about 2 W of power in an aperture that is 15 μm wide by about 0.5 μm tall, which equates to over 250,000 W/mm². This spatial brightness is over 5 orders of magnitude higher than LEDs or put another way, 10,000 times brighter than an LED.

Based on essentially all the pioneering work on GaN LEDs, visible laser diodes based on GaN technology have rapidly emerged over the past 20 years. Currently the only viable direct blue and green laser diode structures are fabricated from the wurtzite AlGaInN material system. The manufacturing of light emitting diodes from GaN related materials is dominated by the heteroepitaxial growth of GaN on foreign substrates such as Si, SiC and sapphire. Laser diode devices operate at such high current densities that the crystalline defects associated with heteroepitaxial growth are not acceptable. Because of this, very low defect-density, free-standing GaN substrates have become the substrate of choice for GaN laser diode manufacturing. Unfortunately, such bulk GaN substrates are costly and not widely available in large diameters. For example, 2" diameter is the most common laser-quality bulk GaN c-plane substrate size today with recent progress enabling 4" diameter, which are still relatively small compared to the 6" and greater diameters that are commercially available for mature substrate technologies. Further details of the present invention can be found throughout the present specification and more particularly below.

Additional benefits are achieved over pre-existing techniques using the present invention. In particular, the present invention enables a cost-effective white light source. In a specific embodiment, the present optical device can be manufactured in a relatively simple and cost effective manner. Depending upon the embodiment, the present apparatus and method can be manufactured using conventional materials and/or methods according to one of ordinary skill in the art. In some embodiments of this invention the gallium and nitrogen containing laser diode source is based on c-plane gallium nitride material and in other embodiments the laser diode is based on nonpolar or semipolar gallium and nitride material. In one embodiment the white source is configured from a chip on submount (CoS) with an integrated phosphor on the submount to form a chip and phosphor on submount (CPoS) white light source. In some embodiments intermediate submount members may be included. In some embodiments the laser diode and the phosphor member are supported by a common support member such as a package base. In this embodiment there could be submount members or additional support members included between the laser diode and the common support member. Similarly there could be submount members or additional support members included between the phosphor member and the common support member.

In various embodiments, the laser device and phosphor device are co-packaged or mounted on a common support member with or without intermediate submounts and the phosphor materials are operated in a transmissive mode, a reflective mode, or a side-pumped mode to result in a white emitting laser-based light source. In additional various embodiments, the electromagnetic radiation from the laser device is remotely coupled to the phosphor device through means such as free space coupling or coupling with a waveguide such as a fiber optic cable or other solid waveguiding material, and wherein the phosphor materials are operated in a transmissive mode, a reflective mode, or a side-pumped mode to result in a white emitting laser-based light source. Merely by way of example, the invention can be applied to applications such as white lighting, white spot lighting, flash lights, automobile headlights, all-terrain vehicle lighting, flash sources such as camera flashes, light sources used in recreational sports such as biking, surfing, running, racing, boating, light sources used for drones, planes, robots, other mobile or robotic applications, safety, counter measures in defense applications, multi-colored lighting, lighting for flat panels, medical, metrology, beam projectors and other displays, high intensity lamps, spectroscopy, entertainment, theater, music, and concerts, analysis fraud detection and/or authenticating, tools, water treatment, laser dazzlers, targeting, communications, LiFi, visible light communications (VLC), sensing, detecting, distance detecting, Light Detection And Ranging (LIDAR), transformations, transportations, leveling, curing and other chemical treatments, heating, cutting and/or ablating, pumping other optical devices, other optoelectronic devices and related applications, and source lighting and the like.

Laser diodes are ideal as phosphor excitation sources. With a spatial brightness (optical intensity per unit area) greater than 10,000 times higher than conventional LEDs and the extreme directionality of the laser emission, laser diodes enable characteristics unachievable by LEDs and other light sources. Specifically, since the laser diodes output beams carrying over 1 W, over 5 W, over 10 W, or even over 100 W can be focused to very small spot sizes of less than 1 mm in diameter, less than 500 μm in diameter, less than 100 μm in diameter, or even less than 50 μm in diameter, power densities of over 1 W/mm$^2$, 100 W/mm$^2$, or even over 2,500 W/mm$^2$ can be achieved. When this very small and powerful beam of laser excitation light is incident on a phosphor material the ultimate point source of white light can be achieved. Assuming a phosphor conversion ratio of 200 lumens of emitted white light per optical watt of excitation light, a 5 W excitation power could generate 1000 lumens in a beam diameter of 100 µm, or 50 µm, or less. Such a point source is game changing in applications such as spotlighting or range finding where parabolic reflectors or lensing optics can be combined with the point source to create highly collimated white light spots that can travel drastically higher distances than ever possible before using LEDs or bulb technology.

In some embodiments of the present invention the gallium and nitrogen containing light emitting device may not be a laser device, but instead may be configured as a superluminescent diode or superluminescent light emitting diode (SLED) device. For the purposes of this invention, a SLED device and laser diode device can be used interchangeably. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. The advantage of a SLED device is that SLED it can combine the unique properties of high optical emission power and extremely high spatial brightness of laser diodes that make them ideal for highly efficient long throw illumination and high brightness phosphor excitation applications with a broad spectral width of (>5 nm) that provides for an improved eye safety and image quality in some cases. The broad spectral width results in a low coherence length similar to an LED. The low coherence length provides for an improved safety such has improved eye safety. Moreover, the broad spectral width can drastically reduce optical distortions in display or illumination applications. As an example, the well-known distortion pattern referred to as "speckle" is the result of an intensity pattern produced by the mutual interference of a set of wavefronts on a surface or in a viewing plane. The general equations typically used to quantify the degree of speckle are inversely proportional to the spectral width. In the present specification, both a laser diode (LD) device and a superluminescent light emitting diode (SLED) device are sometimes simply referred to "laser device".

A gallium and nitrogen containing laser diode (LD) or super luminescent light emitting diode (SLED) may include at least a gallium and nitrogen containing device having an active region and a cavity member and are characterized by emitted spectra generated by the stimulated emission of photons. In some embodiments a laser device emitting red laser light, i.e. light with wavelength between about 600 nm to 750 nm, are provided. These red laser diodes may include at least a gallium phosphorus and arsenic containing device having an active region and a cavity member and are characterized by emitted spectra generated by the stimulated emission of photons. The ideal wavelength for a red device for display applications is ~635 nm, for green ~530 nm and for blue 440-470 nm. There may be tradeoffs between what colors are rendered with a display using different wavelength lasers and also how bright the display is as the eye is more sensitive to some wavelengths than to others.

In some embodiments according to the present invention, multiple laser diode sources are configured to be excite the same phosphor or phosphor network. Combining multiple laser sources can offer many potential benefits according to this invention. First, the excitation power can be increased by beam combining to provide a more powerful excitation spit and hence produce a brighter light source. In some embodiments, separate individual laser chips are configured within the laser-phosphor light source. By including multiple lasers emitting 1 W, 2 W, 3 W, 4 W, 5 W or more power each, the excitation power can be increased and hence the source brightness would be increased. For example, by including two 3 W lasers exciting the same phosphor area, the excitation power can be increased to 6 W for double the white light brightness. In an example where about 200 lumens of white are generated per 1 watt of laser excitation power, the white light output would be increased from 600 lumens to 1200 lumens. Beyond scaling the power of each single laser diode emitter, the total luminous flux of the white light source can be increased by continuing to increasing the total number of laser diodes, which can range from 10 s, to 100 s, and even to 1000 s of laser diode emitters resulting in 10 s to 100 s of kW of laser diode excitation power. Scaling the number of laser diode emitters can be accomplished in many ways such as including multiple lasers in a co-package, spatial beam combining through conventional refractive optics or polarization combining, and others. Moreover, laser diode bars or arrays, and minibars can be utilized where each laser chip includes many adjacent laser diode emitters. For example, a bar could include from 2 to 100 laser diode emitters spaced from about 10 microns to about 400 microns apart. Similarly, the reliability of the source can be increased by using multiple sources at lower drive conditions to achieve the same excitation power as a single source driven at more harsh conditions such as higher current and voltage.

A additional advantage of combining the emission from multiple laser diode emitters is the potential for a more circular spot by rotating the first free space diverging elliptical laser beam by 90 degrees relative to the second free space diverging elliptical laser beam and overlapping the centered ellipses on the phosphor. Alternatively, a more circular spot can be achieved by rotating the first free space diverging elliptical laser beam by 180 degrees relative to the second free space diverging elliptical laser beam and off-centered overlapping the ellipses on the phosphor to increase spot diameter in slow axis diverging direction. In another configuration, more than 2 lasers are included and some combination of the above described beam shaping spot geometry shaping is achieved. A third and important advantage is that multiple color lasers in an emitting device can significantly improve color quality (CRI and CQS) by improving the fill of the spectra in the violet/blue and cyan region of the visible spectrum. For example, two or more blue excitation lasers with slightly detuned wavelengths (e.g. 5 nm, 10 nm, 15 nm, etc.) can be included to excite a yellow phosphor and create a larger blue spectrum.

As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other variations, modifications, and alternatives.

The laser diode device can be fabricated on a conventional orientation of a gallium and nitrogen containing film or substrate (e.g., GaN) such as the polar c-plane, on a nonpolar orientation such as the m-plane, or on a semipolar orientation such as the {30-31}, {20-21}, {30-32}, {11-22}, {10-11}, {30-3-1}, {20-2-1}, {30-3-2}, or offcuts of any of these polar, nonpolar, and semipolar planes within +/−10 degrees towards a c-plane, and/or +/−10 degrees towards an a-plane, and/or +/−10 degrees towards an m-plane. In some embodiments, a gallium and nitrogen containing laser diode laser diode includes a gallium and nitrogen containing substrate. The substrate member may have a surface region on the polar {0001} plane (c-plane), nonpolar plane (m-plane, a-plane), and semipolar plain ({11-22}, {10-1-1}, {20-21}, {30-31}) or other planes of a gallium and nitrogen containing substrate. The laser device can be configured to emit a laser beam characterized by one or more wavelengths from about 390 nm to about 540 nm.

Figure 3:
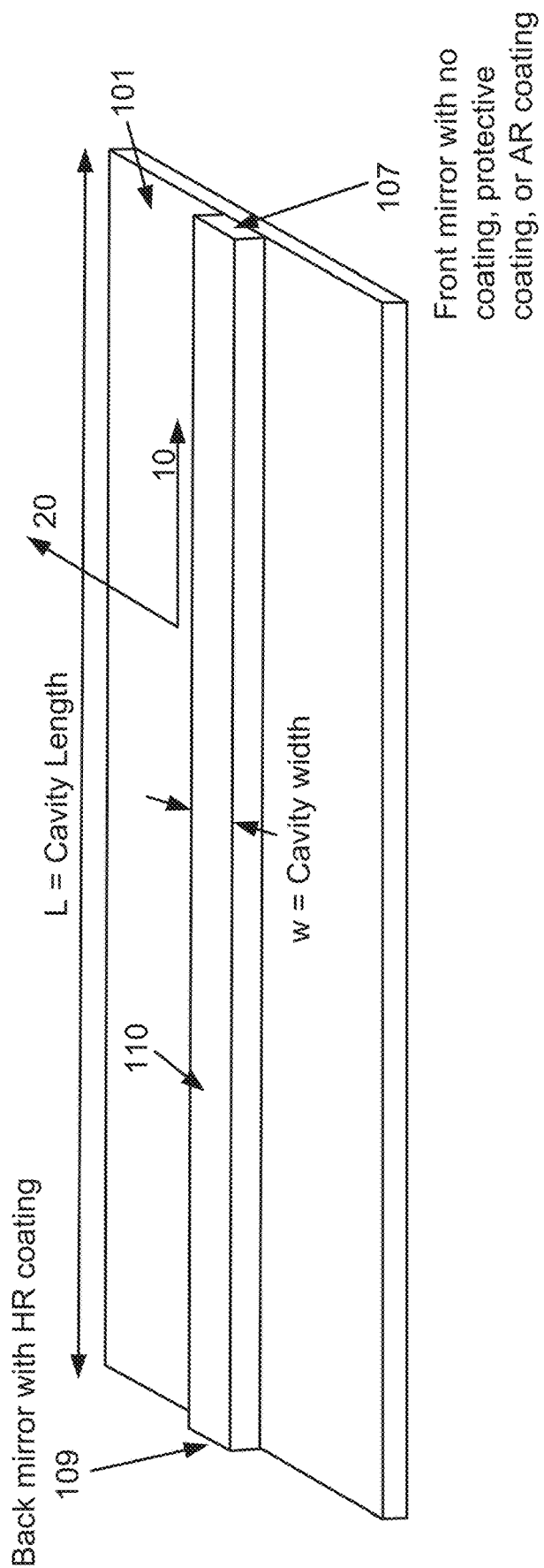
FIG. 3 is a simplified schematic diagram of a laser diode formed on a gallium and nitrogen containing substrate with the cavity aligned in a direction ended with cleaved or etched mirrors according to some embodiments of the present invention.

FIG. 3 is a simplified schematic diagram of a laser diode formed on a gallium and nitrogen containing substrate with the cavity aligned in a direction ended with cleaved or etched mirrors according to some embodiments of the present invention. In an example, the substrate surface 101 is a polar c-plane and the laser stripe region 110 is characterized by a cavity orientation substantially in an m-direction 10, which is substantially normal to an a-direction 20, but can be others such as cavity alignment substantially in the a-direction. The laser strip region 110 has a first end 107 and a second end 109 and is formed on an m-direction on a {0001} gallium and nitrogen containing substrate having a pair of cleaved or etched mirror structures, which face each other. In another example, the substrate surface 101 is a semipolar plane and the laser stripe region 110 is characterized by a cavity orientation substantially in a projection of a c-direction 10, which is substantially normal to an a-direction 20, but can be others such as cavity alignment substantially in the a-direction. The laser strip region 110 has a first end 107 and a second end 109 and is formed on a semipolar substrate such as a {40-41}, {30-31}, {20-21}, {40-4-1}, {30-3-1}, {20-2-1}, {20-21}, or an offcut of these planes within +/−5 degrees from the c-plane and a-plane gallium and nitrogen containing substrate. Optionally, the gallium nitride substrate member is a bulk GaN substrate characterized by having a nonpolar or semipolar crystalline surface region, but can be others. The bulk GaN substrate may have a surface dislocation density below $10^5$ cm$^{-2}$ or $10^5$ to $10^7$ cm$^{-2}$. The nitride crystal or wafer may include $Al_xIn_yGa_{1-x-y}N$, where $0 \leq x, y, x+y \leq 1$. In one specific embodiment, the nitride crystal includes GaN. In a embodiments, the GaN substrate has threading dislocations, at a concentration between about $10^5$ cm$^{-2}$ and about $10^8$ cm$^{-2}$, in a direction that is substantially orthogonal or oblique with respect to the surface.

The exemplary laser diode devices in FIG. 3 have a pair of cleaved or etched mirror structures 109 and 107, which face each other. The first cleaved or etched facet 109 includes a reflective coating and the second cleaved or etched facet 107 includes no coating, an antireflective coating, or exposes gallium and nitrogen containing material. The first cleaved or etched facet 109 is substantially parallel with the second cleaved or etched facet 107. The first and second cleaved facets 109 and 107 are provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. The reflective coating is selected from silicon dioxide, hafnia, and titania, tantalum pentoxide, zirconia, aluminum oxide, aluminum nitride, and aluminum oxynitride including combinations, and the like. Depending upon the design, the mirror surfaces can also include an anti-reflective coating.

In a specific embodiment, the method of facet formation includes subjecting the substrates to a laser for pattern formation. In a preferred embodiment, the pattern is configured for the formation of a pair of facets for a ridge lasers. In a preferred embodiment, the pair of facets faces each other and is in parallel alignment with each other. In a preferred embodiment, the method uses a UV (355 nm) laser to scribe the laser bars. In a specific embodiment, the laser is configured on a system, which allows for accurate scribe lines configured in a different patterns and profiles. In an embodiment, the laser scribing can be performed on the back-side, front-side, or both depending upon the application. Of course, there can be other variations, modifications, and alternatives.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 µm deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as nonradiative recombination centers and hence reduce the catastrophic optical mirror damage (COMD) threshold. CAIBE is known to provide very smooth and low damage sidewalls due to the chemical nature of the etch, while it can provide highly vertical etches due to the ability to tilt the wafer stage to compensate for any inherent angle in etch.

The laser stripe region 110 is characterized by a length and width. The length ranges from about 50 µm to about 3000 µm, but is preferably between about 10 µm and about 400 µm, between about 400 µm and about 800 µm, or about 800 µm and about 1600 µm, but could be others. The stripe also has a width ranging from about 0.5 µm to about 50 µm, but is preferably between about 0.8 µm and about 2.5 µm for single lateral mode operation or between about 2.5 µm and about 50 µm for multi-lateral mode operation, but can be other dimensions. In a specific embodiment, the present device has a width ranging from about 0.5 µm to about 1.5 µm, a width ranging from about 1.5 µm to about 3.0 µm, a width ranging from about 3.0 µm to about 50 µm, and others. In a specific embodiment, the width is substantially constant in dimension, although there may be slight variations. The width and length are often formed using a masking and etching process, which are commonly used in the art.

The laser stripe region 110 is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which includes the n-type electrical contact. The n-type electrical contact may be deposited by thermal evaporation, electron beam evaporation, electroplating, sputtering, or another suitable technique.

In a specific embodiment, the laser device may emit red light with a center wavelength between 600 nm and 750 nm. Such a device may include layers of varying compositions of $Al_xIn_yGa_{1-x-y}As_zP_{1-z}$, where x+y≤1 and z≤1. The red laser device includes at least an n-type and p-type cladding layer, an n-type SCH of higher refractive index than the n-type cladding, a p-type SCH of higher refractive index than the p-type cladding and an active region where light is emitted. In a specific embodiment, the laser stripe is provided by an etching process selected from dry etching or wet etching. In a preferred embodiment, the etching process is dry, but can be others. The device also has an overlying dielectric region, which exposes the contact region. In a specific embodiment, the dielectric region is an oxide such as silicon dioxide, but can be others. Of course, there can be other variations, modifications, and alternatives. The laser stripe region is characterized by a length and width. The length ranges from about 50 µm to about 3000 µm, but is preferably between 10 µm and 400 µm, between about 400 µm and 800 µm, or about 800 µm and 1600 µm, but could be others such as greater than 1600 µm. The stripe region also has a width ranging from about 0.5 µm to about 80 µm, but is preferably between 0.8 µm and 2.5 µm for single lateral mode operation or between 2.5 µm and 60 µm for multi-lateral mode operation, but can be other dimensions. The laser strip region has a first end and a second end having a pair of cleaved or etched mirror structures, which face each other. The first facet includes a reflective coating and the second facet includes no coating, an antireflective coating, or exposes gallium and nitrogen containing material. The first facet is substantially parallel with the second cleaved or etched facet.

Given the high gallium and nitrogen containing substrate costs, difficulty in scaling up gallium and nitrogen containing substrate size, the inefficiencies inherent in the processing of small wafers, and potential supply limitations it becomes extremely desirable to maximize utilization of available gallium and nitrogen containing substrate and overlying epitaxial material. In the fabrication of lateral cavity laser diodes, it is typically the case that minimum die size is determined by device components such as the wire bonding pads or mechanical handling considerations, rather than by laser cavity widths. Minimizing die size is critical to reducing manufacturing costs as smaller die sizes allow a greater number of devices to be fabricated on a single wafer in a single processing run. The current invention is a method of maximizing the number of devices which can be fabricated from a given gallium and nitrogen containing substrate and overlying epitaxial material by spreading out the epitaxial material onto a carrier wafer via a die expansion process.

Similar to an edge emitting laser diode, a SLED is typically configured as an edge-emitting device wherein the high brightness, highly directional optical emission exits a waveguide directed outward from the side of the semiconductor chip. SLEDs are designed to have high single pass gain or amplification for the spontaneous emission generated along the waveguide. However, unlike laser diodes, they are designed to provide insufficient feedback to in the cavity to achieve the lasing condition where the gain equals the total losses in the waveguide cavity. In a typical example, at least one of the waveguide ends or facets is designed to provide very low reflectivity back into the waveguide. Several methods can be used to achieve reduced reflectivity on the waveguide end or facet. In one approach an optical coating is applied to at least one of the facets, wherein the optical coating is designed for low reflectivity such as less than 1%, less than 0.1%, less than 0.001%, or less than 0.0001% reflectivity. In another approach for reduced reflectivity the waveguide ends are designed to be tilted or angled with respect to the direction of light propagation such that the light that is reflected back into the chip does not constructively interfere with the light in the cavity to provide feedback. The tilt angle must be carefully designed around a null in the reflectivity versus angle relationship for optimum performance. The tilted or angled facet approach can be achieved in a number of ways including providing an etched facet that is designed with an optimized angle lateral angle with respect to the direction of light propagation. The angle of the tilt is pre-determined by the lithographically defined etched facet patter. Alternatively, the angled output could be achieved by curving and/or angling the waveguide with respect to a cleaved facet that forms on a pre-determined crystallographic plane in the semiconductor chip. Another approach to reduce the reflectivity is to provide a roughened or patterned surface on the facet to reduce the feedback to the cavity. The roughening could be achieved using chemical etching and/or a dry etching, or with an alternative technique. Of course there may be other methods for reduced feedback to the cavity to form a SLED device. In many embodiments a number of techniques can be used in combination to reduce the facet reflectivity including using low reflectivity coatings in combination with angled or tilted output facets with respect to the light propagation.

In a specific embodiment on a nonpolar Ga-containing substrate, the device is characterized by a spontaneously emitted light is polarized in substantially perpendicular to the c-direction. In a preferred embodiment, the spontaneously emitted light is characterized by a polarization ratio of greater than 0.1 to about 1 perpendicular to the c-direction. In a preferred embodiment, the spontaneously emitted light characterized by a wavelength ranging from about 430 nanometers to about 470 nm to yield a blue emission, or about 500 nanometers to about 540 nanometers to yield a green emission, and others. For example, the spontaneously emitted light can be violet (e.g., 395 to 420 nanometers), blue (e.g., 420 to 470 nm); green (e.g., 500 to 540 nm), or others. In a preferred embodiment, the spontaneously emitted light is highly polarized and is characterized by a polarization ratio of greater than 0.4. In another specific embodiment on a semipolar {20-21} Ga-containing substrate, the device is also characterized by a spontaneously emitted light is polarized in substantially parallel to the a-direction or perpendicular to the cavity direction, which is oriented in the projection of the c-direction.

In a specific embodiment, the present invention provides an alternative device structure capable of emitting 501 nm and greater light in a ridge laser embodiment. The device is provided with the following epitaxially grown elements:

- an n-GaN or n-AlGaN cladding layer with a thickness from 100 nm to 3000 nm with Si doping level of $5\times10^{17}$ cm$^{-3}$ to $3\times10^{18}$ cm$^{-3}$;
- an n-side SCH layer comprised of InGaN with molar fraction of indium of between 2% and 15% and thickness from 20 nm to 250 nm;
- a single quantum well or a multiple quantum well active region comprised of at least two 2.0 nm to 8.5 nm InGaN quantum wells separated by 1.5 nm and greater, and optionally up to about 12 nm, GaN or InGaN barriers;
- a p-side SCH layer comprised of InGaN with molar a fraction of indium of between 1% and 10% and a thickness from 15 nm to 250 nm or an upper GaN-guide layer;
- an electron blocking layer comprised of AlGaN with molar fraction of aluminum of between 0% and 22% and thickness from 5 nm to 20 nm and doped with Mg;
- a p-GaN or p-AlGaN cladding layer with a thickness from 400 nm to 1500 nm with Mg doping level of $2\times10^{17}$ cm$^{-3}$ to $2\times10^{19}$ cm-3; and
- a p++-GaN contact layer with a thickness from 20 nm to 40 nm with Mg doping level of $1\times10^{19}$ cm$^{-3}$ to $1\times10^{21}$ cm$^{-3}$.

A gallium and nitrogen containing laser diode laser device may also include other structures, such as a surface ridge architecture, a buried heterostructure architecture, and/or a plurality of metal electrodes for selectively exciting the active region. For example, the active region may include first and second gallium and nitrogen containing cladding layers and an indium and gallium containing emitting layer positioned between the first and second cladding layers. A laser device may further include an n-type gallium and nitrogen containing material and an n-type cladding material overlying the n-type gallium and nitrogen containing material. In a specific embodiment, the device also has an overlying n-type gallium nitride layer, an active region, and an overlying p-type gallium nitride layer structured as a laser stripe region. Additionally, the device may also include an n-side separate confinement hetereostructure (SCH), p-side guiding layer or SCH, p-AlGaN EBL, among other features. In a specific embodiment, the device also has a p++ type gallium nitride material to form a contact region. In a specific embodiment, the p++ type contact region has a suitable thickness and may range from about 10 nm 50 nm, or other thicknesses. In a specific embodiment, the doping level can be higher than the p-type cladding region and/or bulk region. In a specific embodiment, the p++ type region has doping concentration ranging from about $10^{19}$ to $10^{21}$ Mg/am$^3$, and others. The p++ type region preferably causes tunneling between the semiconductor region and overlying metal contact region. In a specific embodiment, each of these regions is formed using at least an epitaxial deposition technique of metal organic chemical vapor deposition (MOCVD), molecular beam epitaxy (MBE), or other epitaxial growth techniques suitable for GaN growth. In a specific embodiment, the epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

Figure 4:
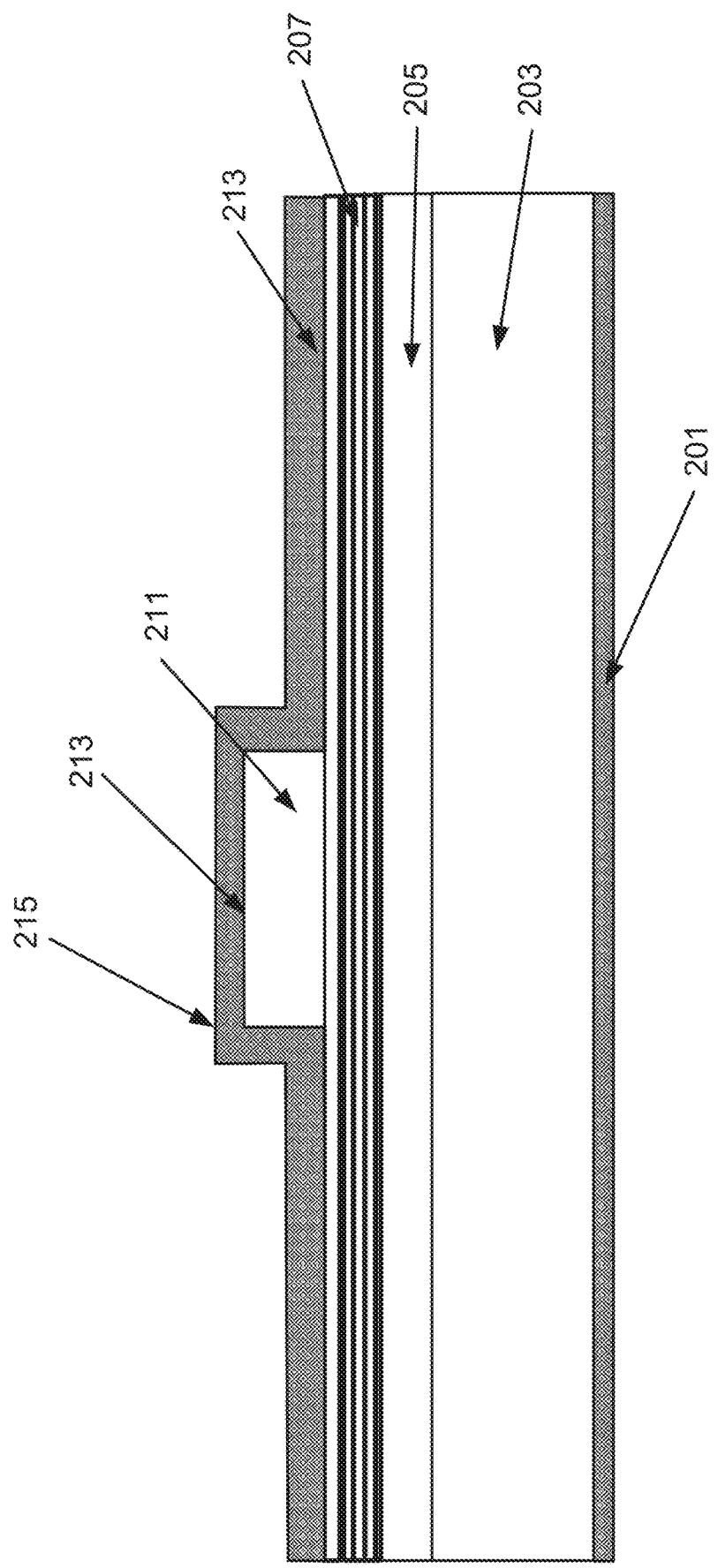
FIG. 4 is a cross-sectional view of a laser device according to an embodiment of the present invention.

FIG. 4 is a cross-sectional view of a laser device 200 according to some embodiments of the present disclosure. As shown, the laser device includes gallium nitride substrate 203, which has an underlying n-type metal back contact region 201. For example, the substrate 203 may be characterized by a semipolar or nonpolar orientation. The device also has an overlying n-type gallium nitride layer 205, an active region 207, and an overlying p-type gallium nitride layer structured as a laser stripe region 209. Each of these regions is formed using at least an epitaxial deposition technique of MOCVD, MBE, or other epitaxial growth techniques suitable for GaN growth. The epitaxial layer is a high quality epitaxial layer overlying the n-type gallium nitride layer. In some embodiments the high quality layer is doped, for example, with Si or O to form n-type material, with a dopant concentration between about $10^{16}$ cm$^{-3}$ and $10^{20}$ cm$^{-3}$.

An n-type $Al_uIn_vGa_{1-u-v}N$ layer, where $0\leq u$, v, $u+v\leq 1$, is deposited on the substrate. The carrier concentration may lie in the range between about $10^{16}$ cm$^{-3}$ and $10^{20}$ cm$^{-3}$. The deposition may be performed using MOCVD or MBE.

For example, the bulk GaN substrate is placed on a susceptor in an MOCVD reactor. After closing, evacuating, and back-filling the reactor (or using a load lock configuration) to atmospheric pressure, the susceptor is heated to a temperature between about 1000 and about 1200 degrees Celsius in the presence of a nitrogen-containing gas. The susceptor is heated to approximately 900 to 1200 degrees Celsius under flowing ammonia. A flow of a gallium-containing metalorganic precursor, such as trimethylgallium (TMG) or triethylgallium (TEG) is initiated, in a carrier gas, at a total rate between approximately 1 and 50 standard cubic centimeters per minute (sccm). The carrier gas may include hydrogen, helium, nitrogen, or argon. The ratio of the flow rate of the group V precursor (ammonia) to that of the group III precursor (trimethylgallium, triethylgallium, trimethylindium, trimethylaluminum) during growth is between about 2000 and about 12000. A flow of disilane in a carrier gas, with a total flow rate of between about 0.1 sccm and 10 sccm, is initiated.

In one embodiment, the laser stripe region is p-type gallium nitride layer 209. The laser stripe is provided by a dry etching process, but wet etching can be used. The dry etching process is an inductively coupled process using chlorine bearing species or a reactive ion etching process using similar chemistries. The chlorine bearing species are commonly derived from chlorine gas or the like. The device also has an overlying dielectric region, which exposes a contact region 213. The dielectric region is an oxide such as silicon dioxide or silicon nitride, and a contact region is coupled to an overlying metal layer 215. The overlying metal layer is preferably a multilayered structure containing gold and platinum (Pt/Au), palladium and gold (Pd/Au), or nickel gold (Ni/Au), or a combination thereof. In some embodiments, barrier layers and more complex metal stacks are included.

Active region 207 preferably includes one to ten quantum well regions or a double heterostructure region for light emission. Following deposition of the n-type $Al_u In_v Ga_{1-u-v}N$ layer to achieve a desired thickness, an active layer is deposited. The quantum wells are preferably InGaN with GaN, AlGaN, InAlGaN, or InGaN barrier layers separating them. In other embodiments, the well layers and barrier layers include $Al_w In_x Ga_{1-w-x}N$ and $Al_y In_z Ga_{1-y-z}N$, respectively, where $0 \leq w$, x, y, z, w+x, y+z$\leq 1$, where w<u, y and/or x>v, z so that the bandgap of the well layer(s) is less than that of the barrier layer(s) and the n-type layer. The well layers and barrier layers each have a thickness between about 1 nm and about 20 nm. The composition and structure of the active layer are chosen to provide light emission at a preselected wavelength. The active layer may be left undoped (or unintentionally doped) or may be doped n-type or p-type.

The active region can also include an electron blocking region, and a separate confinement heterostructure. The electron-blocking layer may include $Al_s In_t Ga_{1-s-t}N$, where $0 \leq s$, t, s+t$\leq 1$, with a higher bandgap than the active layer, and may be doped p-type. In one specific embodiment, the electron blocking layer includes AlGaN. In another embodiment, the electron blocking layer includes an AlGaN/GaN super-lattice structure, comprising alternating layers of AlGaN and GaN, each with a thickness between about 0.2 nm and about 5 nm.

As noted, the p-type gallium nitride or aluminum gallium nitride structure is deposited above the electron blocking layer and active layer(s). The p-type layer may be doped with Mg, to a level between about $10^{16}$ cm$^{-3}$ and $10^{22}$ cm$^{-3}$, with a thickness between about 5 nm and about 1000 nm. The outermost 1-50 nm of the p-type layer may be doped more heavily than the rest of the layer, so as to enable an improved electrical contact. The device also has an overlying dielectric region, for example, silicon dioxide, which exposes the contact region 213.

The metal contact is made of suitable material such as silver, gold, aluminum, nickel, platinum, rhodium, palladium, chromium, or the like. The contact may be deposited by thermal evaporation, electron beam evaporation, electroplating, sputtering, or another suitable technique. In a preferred embodiment, the electrical contact serves as a p-type electrode for the optical device. In another embodiment, the electrical contact serves as an n-type electrode for the optical device. The laser devices illustrated in FIG. 3 and FIG. 4 and described above are typically suitable for relative low-power applications.

In various embodiments, the present invention realizes high output power from a diode laser is by widening a portions of the laser cavity member from the single lateral mode regime of 1.0-3.0 µm to the multi-lateral mode range 5.0-20 µm. In some cases, laser diodes having cavities at a width of 50 µm or greater are employed.

The laser stripe length, or cavity length ranges from 100 to 3000 µm and employs growth and fabrication techniques such as those described in U.S. patent application Ser. No. 12/759,273, filed Apr. 13, 2010, which is incorporated by reference herein. As an example, laser diodes are fabricated on nonpolar or semipolar gallium containing substrates, where the internal electric fields are substantially eliminated or mitigated relative to polar c-plane oriented devices. It is to be appreciated that reduction in internal fields often enables more efficient radiative recombination. Further, the heavy hole mass is expected to be lighter on nonpolar and semipolar substrates, such that better gain properties from the lasers can be achieved.

Optionally, FIG. 4 illustrates an example cross-sectional diagram of a gallium and nitrogen based laser diode device. The epitaxial device structure is formed on top of the gallium and nitrogen containing substrate member 203. The substrate member may be n-type doped with O and/or Si doping. The epitaxial structures will contain n-side layers 205 such as an n-type buffer layer comprised of GaN, AlGaN, AlINGaN, or InGaN and n-type cladding layers comprised of GaN, AlGaN, or AlInGaN. The n-typed layers may have thickness in the range of 0.3 µm to about 3 µm or to about 5 µm and may be doped with an n-type carriers such as Si or O to concentrations between $1 \times 10^{16}$ cm$^{-3}$ to $1 \times 10^{19}$ cm$^{-3}$. Overlying the n-type layers is the active region and waveguide layers 207. This region could contain an n-side waveguide layer or separate confinement heterostructure (SCH) such as InGaN to help with optical guiding of the mode. The InGaN layer be comprised of 1 to 15% molar fraction of InN with a thickness ranging from about 30 nm to about 250 nm and may be doped with an n-type species such as Si. Overlying the SCH layer is the light emitting regions which could be comprised of a double heterostructure or a quantum well active region. A quantum well active region could be comprised of 1 to 10 quantum wells ranging in thickness from 1 nm to 20 nm comprised of InGaN. Barrier layers comprised of GaN, InGaN, or AlGaN separate the quantum well light emitting layers. The barriers range in thickness from 1 nm to about 25 nm. Overlying the light emitting layers are optionally an AlGaN or InAlGaN electron blocking layer with 5% to about 35% AlN and optionally doped with a p-type species such as Mg. Also optional is a p-side waveguide layer or SCH such as InGaN to help with optical guiding of the mode. The InGaN layer be comprised of 1 to 15% molar fraction of InN with a thickness ranging from 30 nm to about 250 nm and may be doped with an p-type species such as Mg. Overlying the active region and optional electron blocking layer and p-side waveguide layers is a p-cladding region and a p++ contact layer. The p-type cladding region is comprised of GaN, AlGaN, AlINGaN, or a combination thereof. The thickness of the p-type cladding layers is in the range of 0.3 µm to about 2 µm and is doped with Mg to a concentration of between $1 \times 10^{16}$ cm$^{-3}$ to $1 \times 10^{19}$ cm$^{-3}$. A ridge 211 is formed in the p-cladding region for lateral confinement in the waveguide using an etching process selected from a dry etching or a wet etching process. A dielectric material 213 such as silicon dioxide or silicon nitride or deposited on the surface region of the device and an opening is created on top of the ridge to expose a portion of the p++ GaN layer. A p-contact 215 is deposited on the top of the device to contact the exposed p++ contact region. The p-type contact may be comprised of a metal stack containing a of Au, Pd, Pt, Ni, Ti, or Ag and may be deposited with electron beam deposition, sputter deposition, or thermal evaporation. A n-contact 201 is formed to the bottom of the substrate member. The n-type contact may be comprised of a metal stack containing Au, Al, Pd, Pt, Ni, Ti, or Ag and may be deposited with electron beam deposition, sputter deposition, or thermal evaporation.

In multiple embodiments according to the present invention, the device layers include a super-luminescent light emitting diode or SLED. In all applicable embodiments a SLED device can be interchanged with or combined with laser diode devices according to the methods and architectures described in this invention. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode.

SLEDs are designed to have high single pass gain or amplification for the spontaneous emission generated along the waveguide. The SLED device would also be engineered to have a low internal loss, preferably below 1 cm$^{-1}$, however SLEDs can operate with internal losses higher than this. In the ideal case, the emitting facet reflectivity would be zero, however in practical applications a reflectivity of zero is difficult to achieve and the emitting facet reflectivity is designs to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide the most flexibility for facet angle determination. Alternatively, a very common method to achieve an angled output for reduced constructive interference in the cavity would to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet.

The spectra emitted by SLEDs differ from lasers in several ways. While a SLED device does produce optical gain in the laterally guided modes, the reduced optical feedback at the emitting facet results in a broader and more continuous emission spectra. For example, in a Fabry-Perot (FP) laser, the reflection of light at the ends of the waveguide limits the wavelengths of light that can experience gain to those that result in constructive interference, which is dependent on the length of the cavity. The spectra of a FP laser is thus a comb, with peaks and valleys corresponding to the longitudinal modes and with an envelope defined by the gain media and transverse modes supported by the cavity. Moreover, in a laser, feedback from emitting facet ensures that one of the transverse modes will reach threshold at a finite current density. When this happens, a subset of the longitudinal modes will dominate the spectra. In a SLED, the optical feedback is suppressed, which reduces the peak to valley height of the comb in the gain spectra and also pushes out thresholds to higher current densities. A SLED then will be characterized by a relatively broad (>5 nm) and incoherent spectrum, which has advantages for spectroscopy, eye safety and reduced speckle. As an example, the well-known distortion pattern referred to as "speckle" is the result of an intensity pattern produced by the mutual interference of a set of wavefronts on a surface or in a viewing plane. The general equations typically used to quantify the degree of speckle are inversely proportional to the spectral width.

It is also possible for the laser diode or SLED ridge, or in the case of a gain-guided device the electrically injected region, would not be of uniform width. The purpose of this would be to produce a wave-guide or cavity of larger width at one or both ends. This has two main advantages over a ridge or injected region of uniform width. Firstly, the waveguide can be shaped such that the resulting cavity can only sustain a single lateral mode while allowing the total area of the device to be significantly larger than that achievable in a device having a waveguide of uniform width. This increases the achievable optical power achievable in a device with a single lateral mode. Secondly, this allows for the cross-sectional area of the optical mode at the facets to be significantly larger than in a single-mode device having a waveguide of uniform width. Such a configuration reduces the optical power density of the device at the facet, and thereby reduces the likelihood that operation at high powers will result in optical damage to the facets. Single lateral mode devices may have some advantages in spectroscopy or in visible light communication where the single later mode results in a significant reduction in spectral width relative to a multi-lateral mode device with a wide ridge of uniform width. This would allow for more laser devices of smaller differences in center wavelength to be included in the same VLC emitter as the spectra would overlap less and be easier to demultiplex with filtered detectors. Optionally, both multi-mode and single-mode lasers would have significantly narrower spectra relative to LEDs with spectra of the same peak wavelength.

In an embodiment, the LD or SLED device is characterized by a ridge with non-uniform width. The ridge is comprised by a first section of uniform width and a second section of varying width. The first section has a length between 100 and 500 μm long, though it may be longer. The first section has a width of between 1 and 2.5 μm, with a width preferably between 1 and 1.5 μm. The second section of the ridge has a first end and a second end. The first end connects with the first section of the ridge and has the same width as the first section of the ridge. The second end of the second section of the ridge is wider than the first section of the ridge, with a width between 5 and 50 µm and more preferably with a width between 15 and 35 µm. The second section of the ridge waveguide varies in width between its first and second end smoothly. In some embodiments the second derivative of the ridge width versus length is zero such that the taper of the ridge is linear. In some embodiments, the second derivative is chosen to be positive or negative. In general the rate of width increase is chosen such that the ridge does not expand in width significantly faster than the optical mode. In specific embodiments, the electrically injected area is patterned such that only a part of the tapered portion of the waveguide is electrically injected.

In an embodiment, multiple laser dice emitting at different wavelengths are transferred to the same carrier wafer in close proximity to one another; preferably within one millimeter of each other, more preferably within about 200 micrometers of each other and most preferably within about 50 µm of each other. The laser die wavelengths are chosen to be separated in wavelength by at least twice the full width at half maximum of their spectra. For example, three dice, emitting at 440 nm, 450 nm and 460 nm, respectively, are transferred to a single carrier chip with a separation between die of less than 50 µm and die widths of less than 50 µm such that the total lateral separation, center to center, of the laser light emitted by the die is less than 200 µm. The closeness of the laser die allows for their emission to be easily coupled into the same optical train or fiber optic waveguide or projected in the far field into overlapping spots. In a sense, the lasers can be operated effectively as a single laser light source.

Such a configuration offers an advantage in that each individual laser light source could be operated independently to convey information using for example frequency and phase modulation of an RF signal superimposed on DC offset. The time-averaged proportion of light from the different sources could be adjusted by adjusting the DC offset of each signal. At a receiver, the signals from the individual laser sources would be demultiplexed by use of notch filters over individual photodetectors that filter out both the phosphor derived component of the white light spectra as well as the pump light from all but one of the laser sources. Such a configuration would offer an advantage over an LED based visible light communication (VLC) source in that bandwidth would scale easily with the number of laser emitters. Of course, a similar embodiment with similar advantages could be constructed from SLED emitters.

After the laser diode chip fabrication as described above, the laser diode can be mounted to a submount. In some examples the submount is comprised of AlN, SiC, BeO, diamond, or other materials such as metals, ceramics, or composites. The submount can be the common support member wherein the phosphor member of the CPoS would also be attached. Alternatively, the submount can be an intermediate submount intended to be mounted to the common support member wherein the phosphor material is attached. The submount member may be characterized by a width, length, and thickness. In an example wherein the submount is the common support member for the phosphor and the laser diode chip the submount would have a width and length ranging in dimension from about 0.5 mm to about 5 mm or to about 15 mm and a thickness ranging from about 150 µm to about 2 mm. In the example wherein the submount is an intermediate submount between the laser diode chip and the common support member it could be characterized by width and length ranging in dimension from about 0.5 mm to about 5 mm and the thickness may range from about 50 µm to about 500 µm. The laser diode is attached to the submount using a bonding process, a soldering process, a gluing process, or a combination thereof. In one embodiment the submount is electrically isolating and has metal bond pads deposited on top. The laser chip is mounted to at least one of those metal pads. The laser chip can be mounted in a p-side down or a p-side up configuration. After bonding the laser chip, wire bonds are formed from the chip to the submount such that the final chip on submount (CoS) is completed and ready for integration.

Figure 5:
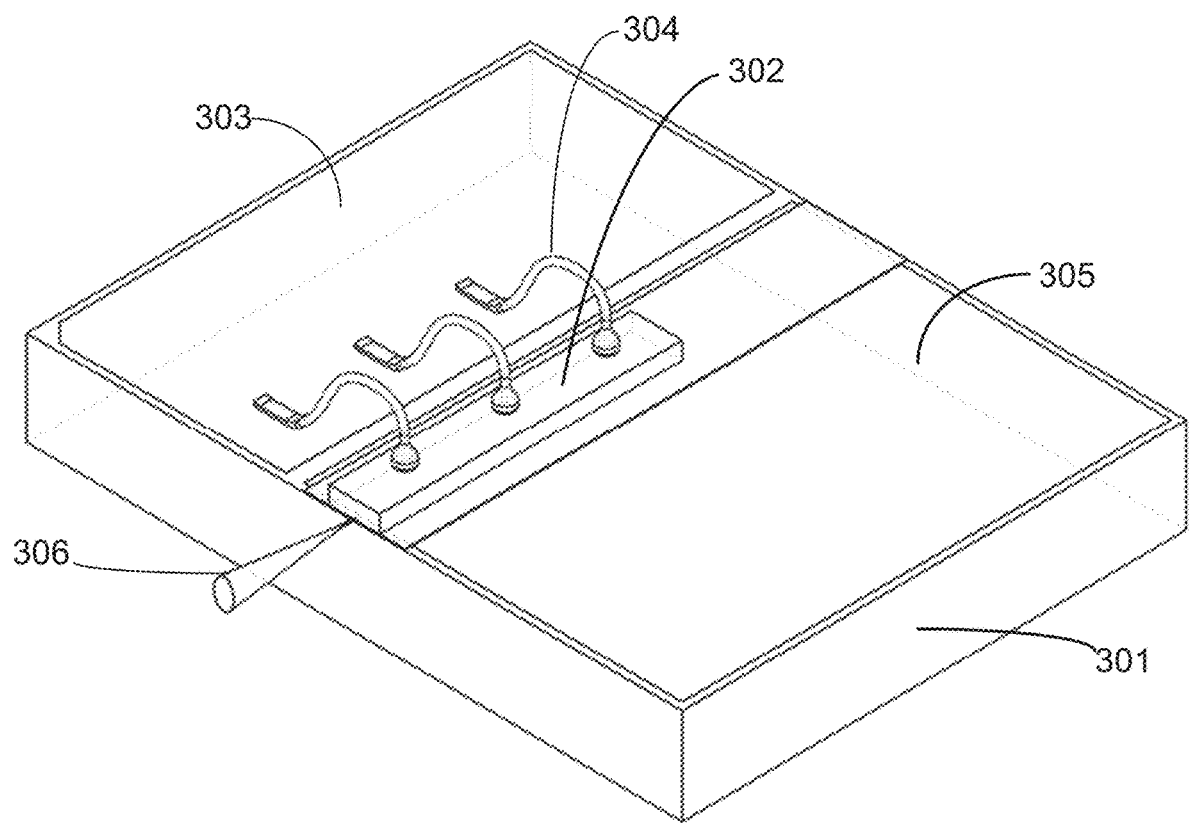
FIG. 5 is a schematic diagram illustrating a chip on submount (CoS) based on a conventional laser diode formed on gallium and nitrogen containing substrate technology according to an embodiment of the present invention.

A schematic diagram illustrating a CoS based on a conventional laser diode formed on gallium and nitrogen containing substrate technology according to this present invention is shown in FIG. 5. The CoS is comprised of submount material 301 configured to act as an intermediate material between a laser diode chip 302 and a final mounting surface. The submount is configured with electrodes 303 and 305 that may be formed with deposited metal layers such as Au. In one example, Ti/Pt/Au is used for the electrodes. Wirebonds 304 are configured to couple the electrical power from the electrodes 303 and 305 on the submount to the laser diode chip to generate a laser beam output 306 from the laser diode. The electrodes 303 and 305 are configured for an electrical connection to an external power source such as a laser driver, a current source, or a voltage source. Wirebonds 304 can be formed on the electrodes to couple electrical power to the laser diode device and activate the laser.

In another embodiment, the gallium and nitrogen containing laser diode fabrication includes an epitaxial release step to lift off the epitaxially grown gallium and nitrogen layers and prepare them for transferring to a carrier wafer which could include the submount after laser fabrication. The transfer step requires precise placement of the epitaxial layers on the carrier wafer to enable subsequent processing of the epitaxial layers into laser diode devices. The attachment process to the carrier wafer could include a wafer bonding step with a bond interface comprised of metal-metal, semiconductor-semiconductor, glass-glass, dielectric-dielectric, or a combination thereof.

In yet another preferred variation of this CPoS white light source, a process for lifting-off gallium and nitrogen containing epitaxial material and transferring it to the common support member can be used to attach the gallium and nitrogen containing laser epitaxial material to a submount member. In this embodiment, the gallium and nitrogen epitaxial material is released from the gallium and nitrogen containing substrate it was epitaxially grown on. As an example, the epitaxial material can be released using a photoelectrochemical (PEC) etching technique. It is then transferred to a submount material using techniques such as wafer bonding wherein a bond interface is formed. For example, the bond interface can be comprised of a Au—Au bond. The submount material preferably has a high thermal conductivity such as SiC, wherein the epitaxial material is subsequently processed to form a laser diode with a cavity member, front and back facets, and electrical contacts for injecting current. After laser fabrication is complete, a phosphor material is introduced onto the submount to form an integrated white light source. The phosphor material may have an intermediate material positioned between the submount and the phosphor. The intermediate material may be comprised of a thermally conductive material such as copper. The phosphor material can be attached to the submount using conventional die attaching techniques using solders such as AuSn solder, but can be other techniques such as SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/m-K and electrical conductivity of about 16 μΩcm whereas pressureless sintered Ag can have a thermal conductivity of about 125 W/m-K and electrical conductivity of about 4 μΩcm, or pressured sintered Ag can have a thermal conductivity of about 250 W/m-K and electrical conductivity of about 2.5 μΩcm. Due to the extreme change in melt temperature from paste to sintered form, (260° C.-900° C.), processes can avoid thermal load restrictions on downstream processes, allowing completed devices to have very good and consistent bonds throughout. Optimizing the bond for the lowest thermal impedance is a key parameter for heat dissipation from the phosphor, which is critical to prevent phosphor degradation and thermal quenching of the phosphor material. The benefits of using this embodiment with lifted-off and transferred gallium and nitrogen containing material are the reduced cost, improved laser performance, and higher degree of flexibility for integration using this technology.

In this embodiment, gallium and nitrogen containing epitaxial layers are grown on a bulk gallium and nitrogen containing substrate. The epitaxial layer stack includes at least a sacrificial release layer and the laser diode device layers overlying the release layers. Following the growth of the epitaxial layers on the bulk gallium and nitrogen containing substrate, the semiconductor device layers are separated from the substrate by a selective wet etching process such as a PEC etch configured to selectively remove the sacrificial layers and enable release of the device layers to a carrier wafer. In one embodiment, a bonding material is deposited on the surface overlying the semiconductor device layers. A bonding material is also deposited either as a blanket coating or patterned on the carrier wafer. Standard lithographic processes are used to selectively mask the semiconductor device layers. The wafer is then subjected to an etch process such as dry etch or wet etch processes to define via structures that expose the sacrificial layers on the sidewall of the mesa structure. As used herein, the term mesa region or mesa is used to describe the patterned epitaxial material on the gallium and nitrogen containing substrate and prepared for transferring to the carrier wafer. The mesa region can be any shape or form including a rectangular shape, a square shape, a triangular shape, a circular shape, an elliptical shape, a polyhedron shape, or other shape. The term mesa shall not limit the scope of the present invention.

Following the definition of the mesa, a selective etch process is performed to fully or partially remove the sacrificial layers while leaving the semiconductor device layers intact. The resulting structure includes undercut mesas comprised of epitaxial device layers. The undercut mesas correspond to dice from which semiconductor devices will be formed on. In some embodiments a protective passivation layer can be employed on the sidewall of the mesa regions to prevent the device layers from being exposed to the selective etch when the etch selectivity is not perfect. In other embodiments a protective passivation is not needed because the device layers are not sensitive to the selective etch or measures are taken to prevent etching of sensitive layers such as shorting the anode and cathode. The undercut mesas corresponding to device dice are then transferred to the carrier wafer using a bonding technique wherein the bonding material overlying the semiconductor device layers is joined with the bonding material on the carrier wafer. The resulting structure is a carrier wafer comprising gallium and nitrogen containing epitaxial device layers overlying the bonding region.

In a preferred embodiment PEC etching is deployed as the selective etch to remove the a sacrificial layers. PEC is a photo-assisted wet etch technique that can be used to etch GaN and its alloys. The process involves an above-band-gap excitation source and an electrochemical cell formed by the semiconductor and the electrolyte solution. In this case, the exposed (Al,In,Ga)N material surface acts as the anode, while a metal pad deposited on the semiconductor acts as the cathode. The above-band-gap light source generates electron-hole pairs in the semiconductor. Electrons are extracted from the semiconductor via the cathode while holes diffuse to the surface of material to form an oxide. Since the diffusion of holes to the surface requires the band bending at the surface to favor a collection of holes, PEC etching typically works only for n-type material although some methods have been developed for etching p-type material. The oxide is then dissolved by the electrolyte resulting in wet etching of the semiconductor. Different types of electrolyte including HCl, KOH, and $HNO_3$ have been shown to be effective in PEC etching of GaN and its alloys. The etch selectivity and etch rate can be optimized by selecting a favorable electrolyte. It is also possible to generate an external bias between the semiconductor and the cathode to assist with the PEC etching process.

Figure 6:
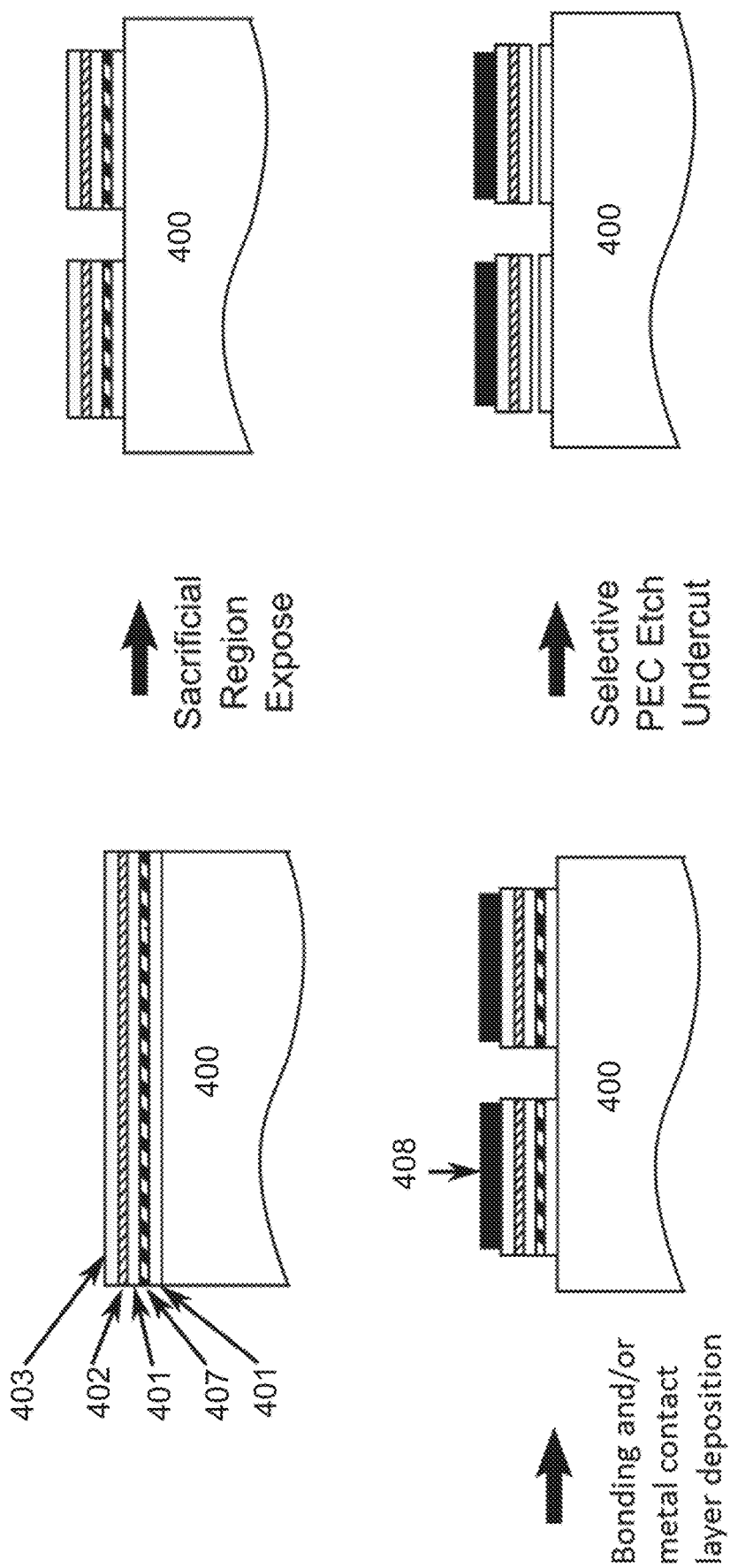
FIG. 6 is a simplified diagram illustrating a process of preparing an epitaxial wafer according to some embodiments of the present invention.

The preparation of the epitaxy wafer is shown in FIG. 6. A substrate 400 is overlaid by a buffer layer 401, a selectively removable sacrificial layer 407, another buffer layer 401, a collection of device layers 402 and a contact layer 103. The sacrificial region is exposed by etching of vias that extend below the sacrificial layer 407 and segment the layers 401, 402, 403, and 407 into mesas. A layer composed of bonding media 408 is deposited overlaying the mesas. In some embodiments the bonding layer 408 is deposited before the sacrificial layer 407 is exposed. Finally the sacrificial layer 407 is removed via a selective process. This process requires the inclusion of a buried sacrificial region, which can be PEC etched selectively by bandgap. For GaN based semiconductor devices, InGaN layers such as quantum wells have been shown to be an effective sacrificial region during PEC etching. The first step depicted in FIG. 6 is a top down etch to expose the sacrificial layers, followed by a bonding metal deposition as shown in FIG. 6. With the sacrificial region exposed a bandgap selective PEC etch is used to undercut the mesas. In one embodiment, the bandgaps of the sacrificial region and all other layers are chosen such that only the sacrificial region will absorb light, and therefore etch, during the PEC etch. Another embodiment of the invention involving light emitting devices uses a sacrificial region with a higher bandgap than the active region such that both layers are absorbing during the bandgap PEC etching process.

Sacrificial layers for lift-off of the substrate via photochemical etching would incorporate at a minimum a low-bandgap or doped layer that would absorb the pump light and have enhanced etch rate relative to the surrounding material. The sacrificial layer 407 can be deposited epitaxially and their alloy composition and doping of these can be selected such that hole carrier lifetime and diffusion lengths are high. Defects that reduce hole carrier lifetimes and diffusion length must can be avoided by growing the sacrificial layers under growth conditions that promote high material crystalline quality. An example of a sacrificial layer would be InGaN layers that absorb at the wavelength of an external light source. An etch stop layer designed with very low etch rate to control the thickness of the adjacent material remaining after substrate removal can also be incorporated to allow better control of the etch process. The etch properties of the etch stop layer can be controlled solely by or a combination of alloy composition and doping. A potential etch stop layer would an AlGaN or GaN layer with a bandgap higher than the external light source. Another potential etch stop layer is a highly doped n-type AlGaN or GaN layer with reduce minority carrier diffusion lengths and lifetime thereby dramatically reducing the etch rate of the etch stop material.

In some embodiments PEC etching is achieved without the use of an active region protecting layer by electrically shorting the p-side of the laser diode pn-junction to the n-side. Etching in the PEC process is achieved by the dissolution of AlInGaN materials at the wafer surface when holes are transferred to the etching solution. These holes are then recombined in the solution with electrons extracted at the cathode metal interface with the etching solution. Charge neutrality is therefore achieved. Selective etching is achieved by electrically shorting the anode to the cathode. Electron hole pairs generated in the device light emitting layers are swept out of the light emitting layers by the electric field of the of the p-n junction. Since holes are swept out of the active region, there is little or no etching of the light emitting layer. The buildup of carriers produces a potential difference that drives carriers through the metal interconnects that short the anode and cathode where they recombine. The flat band conditions in the sacrificial region result in a buildup of holes that result in rapid etching of the sacrificial layers. In one embodiment, the metal interconnects to short the anode and cathode can be used as anchor regions to mechanically hold the gallium and nitrogen containing mesas in place prior to the bonding step.

The relative etch rates of the sacrificial and active regions are determined by a number of factors, but primarily it is determined by the density of holes found in the active region at steady state. If the metal interconnects or anchors are very resistive, or if either the cathode or anode electrical contacts to the p-type and n-type, respectively, cladding regions are too resistive or have large Schottky barriers then it is possible for carriers to accumulate on either side of the p-n junction. These carriers will produce an electric field that acts against the field in the depletion region and will reduce the magnitude of the field in the depletion region until the rate of photo-generated carrier drift out of the active region is balanced by the recombination rate of carriers via the metal layers shorting the cathode and anode. Some recombination will take place via photochemical etching, and since this scales with the density of holes in the active region it is preferable to prevent the buildup of a photo-induced bias across the active region.

In one embodiment thermocompression bonding is used to transfer the gallium and nitrogen epitaxial semiconductor layers to the carrier wafer. In this embodiment thermocompression bonding involves bonding of the epitaxial semiconductor layers to the carrier wafer at elevated temperatures and pressures using a bonding media 408 disposed between the epitaxial layers and handle wafer. The bonding media 408 may be comprised of a number of different layers, but typically contain at least one layer (the bonding layer 408) that is composed of a relatively ductile material with a high surface diffusion rate. In many cases this material is comprised of Au, Al or Cu. The bonding media 408 may also include layers disposed between the bonding layer and the epitaxial materials or handle wafer that promote adhesion. For example an Au bonding layer on a Si wafer may result in diffusion of Si to the bonding interface, which would reduce the bonding strength. Inclusion of a diffusion barrier such as silicon oxide or nitride would limit this effect. Relatively thin layers of a second material may be applied on the top surface of the bonding layer in order to promote adhesion between the bonding layers disposed on the epitaxial material and handle. Some bonding layer materials of lower ductility than gold (e.g. Al, Cu etc.) or which are deposited in a way that results in a rough film (for example electrolytic deposition) may require planarization or reduction in roughness via chemical or mechanical polishing before bonding, and reactive metals may require special cleaning steps to remove oxides or organic materials that may interfere with bonding.

Thermocompressive bonding can be achieved at relatively low temperatures, typically below 500° C. and above 200° C. Temperatures should be high enough to promote diffusivity between the bonding layers at the bonding interface, but not so high as to promote unintentional alloying of individual layers in each metal stack. Application of pressure enhances the bond rate, and leads to some elastic and plastic deformation of the metal stacks that brings them into better and more uniform contact. Optimal bond temperature, time and pressure will depend on the particular bond material, the roughness of the surfaces forming the bonding interface and the susceptibility to fracture of the handle wafer or damage to the device layers under load.

The bonding interface need not be composed of the totality of the wafer surface. For example, rather than a blanket deposition of bonding metal, a lithographic process could be used to deposit metal in discontinuous areas separated by regions with no bonding metal. This may be advantageous in instances where defined regions of weak or no bonding aid later processing steps, or where an air gap is needed. One example of this would be in removal of the GaN substrate using wet etching of an epitaxially grown sacrificial layer. To access the sacrificial layer one must etch vias into either of the two surfaces of the epitaxial wafer, and preserving the wafer for re-use is most easily done if the vias are etched from the bonded side of the wafer. Once bonded, the etched vias result in channels that can conduct etching solution from the edges to the center of the bonded wafers, and therefore the areas of the substrate comprising the vias are not in intimate contact with the handle wafer such that a bond would form.

The bonding media can also be an amorphous or glassy material bonded either in a reflow process or anodically. In anodic bonding the media is a glass with high ion content where mass transport of material is facilitated by the application of a large electric field. In reflow bonding the glass has a low melting point, and will form contact and a good bond under moderate pressures and temperatures. All glass bonds are relatively brittle, and require the coefficient of thermal expansion of the glass to be sufficiently close to the bonding partner wafers (i.e. the GaN wafer and the handle). Glasses in both cases could be deposited via vapor deposition or with a process involving spin on glass. In both cases the bonding areas could be limited in extent and with geometry defined by lithography or silk-screening process.

Gold-gold metallic bonding is used as an example in this work, although a wide variety of oxide bonds, polymer bonds, wax bonds, etc., are potentially suitable. Submicron alignment tolerances are possible using commercial available die bonding equipment. In another embodiment of the invention the bonding layers can be a variety of bonding pairs including metal-metal, oxide-oxide, soldering alloys, photoresists, polymers, wax, etc. Only epitaxial die which are in contact with a bond bad on the carrier wafer will bond. Sub-micron alignment tolerances are possible on commercially available die or flip chip bonders.

In an example, an oxide is overlaid on an exposed planar n-type or p-type gallium and nitrogen containing material or over an exposed planar n-type or p-type gallium and nitrogen containing material using direct wafer bonding of the surface of the gallium and nitrogen containing material to the surface of a carrier wafer comprised primarily of an oxide or a carrier wafer with oxide layers disposed on them. In both cases the oxide surface on the carrier wafer and the exposed gallium and nitrogen containing material are cleaned to reduce the amount of hydrocarbons, metal ions and other contaminants on the bonding surfaces. The bonding surfaces are then brought into contact and bonded at elevated temperature under applied pressure. In some cases the surfaces are treated chemically with acids, bases or plasma treatments to produce a surface that yields a weak bond when brought into contact with the oxide surface. For example the exposed surface of the gallium containing material may be treated to form a thin layer of gallium oxide, which being chemically similar to the oxide bonding surface will bond more readily. Furthermore the oxide and now gallium oxide terminated surface of the gallium and nitrogen containing material may be treated chemically to encourage the formation of dangling hydroxyl groups (among other chemical species) that will form temporary or weak chemical or van der Waals bonds when the surfaces are brought into contact, which are subsequently made permanent when treated at elevated temperatures and elevated pressures.

In an alternative example, an oxide material is deposited overlying the device layer mesa region to form a bond region. The carrier wafer is also prepared with an oxide layer to form a bond region. The oxide layer overlying the carrier wafer could be patterned or could be a blanket layer. The oxide surface on the carrier wafer and the oxide surface overlying the mesa device layer mesa regions are cleaned to reduce the amount of hydrocarbons, metal ions and other contaminants on the bonding surfaces. The bonding surfaces are then brought into contact and bonded at elevated temperature under applied pressure. In one embodiment, a chemical mechanical polish (CMP) process is used to planarize the oxide surface and make them smooth to improve the resulting bond. In some cases the surfaces are treated chemically with acids, bases or plasma treatments to produce a surface that yields a weak bond when brought into contact with the oxide surface. Bonding is performed at elevated temperatures and elevated pressures.

In another embodiment the bonding media could be a dielectric material such as silicon dioxide or silicon nitride. Such a bonding media may be desirable where low conductivity is desired at the bond interface to achieve properties such as reduced device capacitance to enable increased frequency operation. The bond media comprising the bond interface can be comprised of many other materials such as oxide-oxide pair, semiconductor-semiconductor pair, spin-on-glass, soldering alloys, polymers, photoresists, wax, or a combination thereof.

The carrier wafer can be chosen based on any number of criteria including but not limited to cost, thermal conductivity, thermal expansion coefficients, size, electrical conductivity, optical properties, and processing compatibility. The patterned epitaxy wafer, or donor, is prepared in such a way as to allow subsequent selective release of bonded epitaxy regions, here-in referred to as die. The patterned carrier wafer is prepared such that bond pads are arranged in order to enable the selective area bonding process. The bonding material can be a variety of media including but not limited to metals, polymers, waxes, and oxides. These wafers can be prepared by a variety of process flows, some embodiments of which are described below. In the first selective area bond step, the epitaxy wafer is aligned with the pre-patterned bonding pads on the carrier wafer and a combination of pressure, heat, and/or sonication is used to bond the mesas to the bonding pads.

In some embodiments of the invention the carrier wafer is another semiconductor material, a metallic material, or a ceramic material. Some potential candidates include silicon, gallium arsenide, sapphire, silicon carbide, diamond, gallium nitride, AlN, polycrystalline AlN, indium phosphide, germanium, quartz, copper, copper tungsten, gold, silver, aluminum, stainless steel, or steel.

In some embodiments, the carrier wafer is selected based on size and cost. For example, ingle crystal silicon wafers are available in diameters up to 300 mm or 12 inch, and are most cost effective. By transferring gallium and nitrogen epitaxial materials from 2" gallium and nitrogen containing bulk substrates to large silicon substrates of 150 mm, 200 mm, or 300 mm diameter the effective area of the semiconductor device wafer can be increases by factors of up to 36 or greater. This feature of this invention allows for high quality gallium and nitrogen containing semiconductor devices to be fabricated in mass volume leveraging the established infrastructure in silicon foundries.

In some embodiments of the invention, the carrier wafer material is chosen such that it has similar thermal expansion properties to group-III nitrides, high thermal conductivity, and is available as large area wafers compatible with standard semiconductor device fabrication processes. The carrier wafer is then processed with structures enabling it to also act as the submount for the semiconductor devices. Singulation of the carrier wafers into individual die can be accomplished either by sawing, cleaving, or a scribing and breaking process. By combining the functions of the carrier wafer and finished semiconductor device submount the number of components and operations needed to build a packaged device is reduced, thereby lowering the cost of the final semiconductor device significantly.

In an example, the carrier wafer is a solid material with thermal conductivity greater than 100 W/m-K. In an example, the common substrate is preferably a solid material with thermal conductivity greater than 200 W/m-K. In an example, the common substrate is preferably a solid material with thermal conductivity greater than 400 W/m-K. In an example, the common substrate is preferably a solid material with electrical insulator with electrical resistivity greater than $1 \times 10^6$ ohm-cm. In an example, the common substrate is preferably a solid material with thin film material providing electrical $1 \times 10^6$ ohm-cm. In an example, the common substrate selected from one or more of $Al_2O_3$, AlN, SiC, BeO and diamond. In an example, the common substrate is preferably comprised of crystalline SiC. In an example, the common substrate is preferably comprised of crystalline SiC with a thin film of $Si_3N_4$ deposited onto the top surface. In an example, the common substrate contains metal traces providing electrically conductive connections between the one or more laser diodes. In an example, the common substrate contains metal traces providing thermally conductive connections between the one or more laser diodes and the common substrate.

Figure 7:
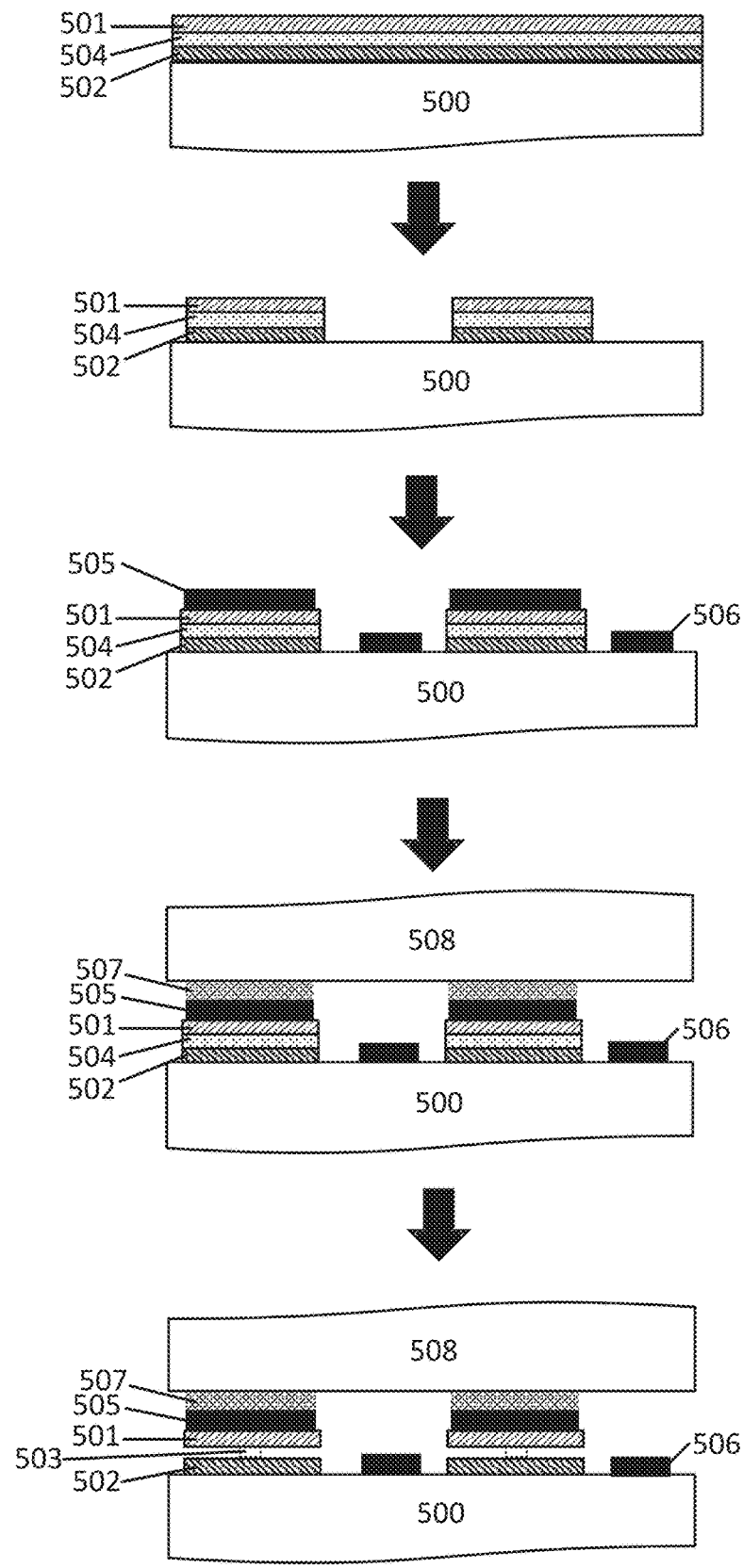
FIG. 7 is a schematic diagram illustrating a process comprised of first forming the bond between an epitaxial material formed on the gallium and nitrogen containing substrate and then subjecting a sacrificial release material to the PEC etch process to release the gallium and nitrogen containing substrate according to some embodiments of the present invention.

In one embodiment of this invention, the bonding of the semiconductor device epitaxial material to the carrier wafer process can be performed prior to the selective etching of the sacrificial region and subsequent release of the gallium and nitrogen containing substrate. FIG. 7 is a schematic illustration of a process comprised of first forming the bond between the gallium and nitrogen containing epitaxial material formed on the gallium and nitrogen containing substrate and then subjecting a sacrificial release material to the PEC etch process to release the gallium and nitrogen containing substrate. In this embodiment, an epitaxial material is deposited on the gallium and nitrogen containing substrate, such as a GaN substrate, through an epitaxial deposition process such as metal organic chemical vapor deposition (MOCVD), molecular beam epitaxy (MBE), or other. The epitaxial material includes at least a sacrificial release layer and a device layers. In some embodiments a buffer layer is grown on between the substrate surface region and the sacrificial release region. Referring to FIG. 7, substrate wafer 500 is overlaid by a buffer layer 502, a selectively etchable sacrificial layer 504 and a collection of device layers 501. The bond layer 505 is deposited along with a cathode metal 506 that will be used to facilitate the photoelectrochemical etch process for selectively removing the sacrificial layer 504.

In a preferred embodiment of this invention, the bonding process is performed after the selective etching of the sacrificial region. This embodiment offers several advantages. One advantage is easier access for the selective etchant to uniformly etch the sacrificial region across the semiconductor wafer comprising a bulk gallium and nitrogen containing substrate such as GaN and bulk gallium and nitrogen containing epitaxial device layers. A second advantage is the ability to perform multiple bond steps. In one example, the "etch-then-bond" process flow can be deployed where the mesas are retained on the substrate by controlling the etch process such that not all parts of the sacrificial layer is removed. Referring to FIG. 7, a substrate wafer 500 is overlaid by a buffer layer 502, a selectively etchable sacrificial layer 504 and a collection of device layers 501. A bond layer 505 is deposited along with a cathode metal 506 that will be used to facilitate the photoelectrochemical etch process for selectively removing the sacrificial layer 504. The selective etch process is carried out to the point where only a small fraction of the sacrificial layer 504 is remaining, such that multiple mesas or mesa regions are formed and retained on the substrate, but the unetched portions of the sacrificial layer 504 are easily broken during or after the mesas are bonded to a carrier wafer 508.

A critical challenge of the etch-then-bond embodiment is mechanically supporting the undercut epitaxial device layer mesa region from spatially shifting prior to the bonding step. If the mesas shift the ability to accurately align and arrange them to the carrier wafer will be compromised, and hence the ability to manufacture with acceptable yields. This challenge mechanically fixing the mesa regions in place prior to bonding can be achieved in several ways. In a preferred embodiment anchor regions 503 are used to mechanically support the mesas to the gallium and nitrogen containing substrate prior to the bonding step wherein they are releases from the gallium and nitrogen containing substrate 500 and transferred to the carrier wafer 508.

Anchor regions are special features that can be designed into the photo masks which attach the undercut device layers 501 to the buffer layer 502 of the gallium and nitrogen containing substrate 500, but which are too large to themselves be undercut, or which due to the design of the mask contain regions 503 where the sacrificial layers 504 are not removed or these features may be composed of metals or dielectrics that are resistant to the etch. These features act as anchors, preventing the undercut device layers 501 from detaching from the substrate 500 and prevent the device layers 501 from spatially shifting. This anchor attachment to the substrate can also be achieved by incompletely removing the sacrificial layer 504, such that there is a tenuous connection between the undercut device layers 501 and the substrate which can be broken during bonding. The surfaces of the bonding material 507 on the carrier wafer 508 and the device wafer 500 are then brought into contact and a bond is formed which is stronger than the attachment of the undercut device layers 501 to the material in the anchor regions 503 of the sacrificial layers 504. After bonding, the separation of the carrier wafer 508 and device wafer 500 transfers the device layers 501 to the carrier wafer 508.

Other than typical GaN based laser devices, undercut AlInGaAsP based laser devices can be produced in a manner similar to GaN based laser diodes described in this invention. There are a number of wet etches that etch some AlInGaAsP alloys selectively. In one embodiment, an AlGaAs or AlGaP sacrificial layer could be grown clad with GaAs etch stop layers. When the composition of $Al_xGa_{1-x}As$ and $Al_xGa_{1-x}P$ is high (x>0.5) AlGaAs can be etched with almost complete selectivity (i.e. etch rate of AlGaAs>$10^6$ times that of GaAs) when etched with HF. InGaP and AlInP with high InP and AlP compositions can be etched with HCl selectively relative to GaAs. GaAs can be etched selectively relative to AlGaAs using $C_6H_8O_7{:}H_2O_2{:}H_2O$. There are a number of other combinations of sacrificial layer, etch-stop layer and etch chemistry which are widely known to those knowledgeable in the art of micromachining AlInGaAsP alloys.

In an embodiment, the AlInGaAsP device layers are exposed to the etch solution which is chosen along with the sacrificial layer composition such that only the sacrificial layers experience significant etching. The active region can be prevented from etching during the compositionally selective etch using an etch resistant protective layer, such as like silicon dioxide, silicon nitride, metals or photoresist among others, on the sidewall. This step is followed by the deposition of a protective insulating layer on the mesa sidewalls, which serves to block etching of the active region during the later sacrificial region undercut etching step. A second top down etch is then performed to expose the sacrificial layers and bonding metal is deposited. With the sacrificial region exposed a compositionally selective etch is used to undercut the mesas. At this point, the selective area bonding process is used to continue fabricating devices. The device layers should be separated from the sacrificial layers by a layer of material that is resistant to etching. This is to prevent etching into the device layers after partially removing the sacrificial layers.

In one embodiment the anchor region is formed by features that are wider than the device layer mesas such that the sacrificial region in these anchor regions is not fully removed during the undercut of the device layers. In one example the mesas are retained on the substrate by deposition of an etch-resistant material acting as an anchor by connecting the mesas to the substrate. In this example a substrate wafer is overlaid by a buffer layer, a selectively etchable sacrificial layer and a collection of device layers. The bond layer is deposited along with a cathode metal that will be used to facilitate the photoelectrochemical etch process for selectively removing the sacrificial layer. A layer of etch resistant material, which may be composed of metal, ceramic, polymer or a glass, is deposited such that it connects to both the mesa and the substrate. The selective etch process is carried out such that the sacrificial layer is fully removed and only the etch-resistant layer connects the mesa to the substrate.

In another example of anchor techniques, the mesas are retained on the substrate by use of an anchor composed of epitaxial material. In this example a substrate wafer is overlaid by a buffer layer, a selectively etchable sacrificial layer and a collection of device layers. The bond layer is deposited along with a cathode metal that will be used to facilitate the photoelectrochemical etch process for selectively removing the sacrificial layer. The anchor is shaped such that during the etch, a small portion of the sacrificial layer remains unetched and creates a connection between the undercut mesa and the substrate wafer.

In one embodiment the anchors are positioned either at the ends or sides of the undercut die such that they are connected by a narrow undercut region of material. In this example the narrow connecting material is far from the bond metal and is design such that the undercut material cleaves at the connecting material rather than across the die. This has the advantage of keeping the entire width of the die undamaged, which would be advantageous. In another embodiment, geometric features are added to the connecting material to act as stress concentrators and the bond metal is extended onto the narrow connecting material. The bond metal reinforces the bulk of the connecting material. Adding these features increases the control over where the connection will cleave. These features can be triangles, circles, rectangles or any deviation that provides a narrowing of the connecting material or a concave profile to the edge of the connecting material.

In another embodiment the anchors are of small enough lateral extent that they may be undercut, however a protective coating is used to prevent etch solution from accessing the sacrificial layers in the anchors. This embodiment is advantageous in cases when the width of the die to be transferred is large. Unprotected anchors would need to be larger to prevent complete undercutting, which would reduce the density of die and reduce the utilization efficiency of epitaxial material.

In another embodiment, the anchors are located at the ends of the die and the anchors form a continuous strip of material that connects to all or a plurality of die. This configuration is advantageous since the anchors can be patterned into the material near the edge of wafers or lithographic masks where material utilization is otherwise poor. This allows for utilization of device material at the center of the pattern to remain high even when die sizes become large.

In a preferred embodiment the anchors are formed by depositing separate regions of an etch-resistant material that adheres well to the epitaxial and substrate material. These regions overlay a portion of the semiconductor device layer mesa and some portion of the structure, such as the substrate, that will not be undercut during the etch process. These regions form a continuous connection, such that after the semiconductor device layer mesa is completely undercut they provide a mechanical support preventing the semiconductor device layer mesa from detaching from the substrate. Metal layers are then deposited on the top of semiconductor device layer mesa, the sidewall of the semiconductor device layer mesa and the bottom of the etched region surrounding the mesa such that a continuous connection is formed. As an example, the metal layers could include about 20 nm of titanium to provide good adhesion and be capped with about 500 nm of gold, but of course the choice of metal and the thicknesses could be others. In an example, the length of the semiconductor device die sidewall coated in metal is about 1 nm to about 40 nm, with the upper thickness being less than the width of the semiconductor device die such that the sacrificial layer is etched completely in the region near the metal anchor where access to the sacrificial layer by etchant will be limited.

The mesa regions can be formed by dry or wet chemical etching, and in one example would include at least a p++ GaN contact layer, a p-type cladding layer comprised of GaN, AlGaN, or InAlGaN, light emitting layers such as quantum wells separated by barriers, waveguiding layers such as InGaN layers, and the a n-type cladding layers comprised of GaN, AlGaN, or InAlGaN, the sacrificial layer (504), and a portion of the n-type GaN epitaxial layer beneath the sacrificial layer. A p-contact metal is first deposited on the p++ GaN contact layer in order to form a high quality electrical contact with the p-type cladding. A second metal stack is then patterned and deposited on the mesa, overlaying the p-contact metal. The second metal stack consists of an n-contact metal, forming a good electrical contact with the n-type GaN layer beneath the sacrificial layer, as well as a relatively thick metal layer that acts as both the mesa bond pad 505 and the cathode metal stack 506. The bond/cathode metal also forms a thick layer overlaying the edge of the mesa and providing a continuous connection between the mesa top and the substrate. After the sacrificial layer 504 is removed by selective photochemical etching the thick metal provides mechanical support to retain the mesa in position on the GaN wafer until the bonding to (the bond material 507 of) the carrier wafer 508 is carried out.

The use of metal anchors have several advantages over the use of anchors made from the epitaxial device material. The first is density of the transferrable mesas on the donor wafer (500) containing the epitaxial semiconductor device layers and the gallium and nitrogen containing bulk substrate. Anchors made from the epitaxial material must be large enough to not be fully undercut by the selective etch, or they must be protected somehow with a passivation layer. The inclusion of a large feature that is not transferred will reduce the density of mesas in two dimensions on the epitaxial device wafer. The use of metal anchors is preferable because the anchors are made from a material that is resistant to etch and therefore can be made with small dimensions that do not impact mesa density. The second advantage is that it simplifies the processing of the mesas because a separate passivation layer is no longer needed to isolate the active region from the etch solution. Removing the active region protecting layer reduces the number of fabrication steps while also reducing the size of the mesa required.

In a particular embodiment, the cathode metal stack 506 also includes metal layers intended to increase the strength of the metal anchors. For example the cathode metal stack might consist of 100 nm of Ti to promote adhesion of the cathode metal stack and provide a good electrical contact to the n-type cladding. The cathode metal stack 506 could then incorporate a layer of tungsten, which has an elastic modulus on the order of four times higher than gold. Incorporating the tungsten would reduce the thickness of gold required to provide enough mechanical support to retain the mesas after they are undercut by the selective etch.

In another embodiment of the invention the sacrificial region is completely removed by PEC etching and the mesa remains anchored in place by any remaining defect pillars. PEC etching is known to leave intact material around defects which act as recombination centers. Additional mechanisms by which a mesa could remain in place after a complete sacrificial etch include static forces or Van der Waals forces. In one embodiment the undercutting process is controlled such that the sacrificial layer is not fully removed.

In a preferred embodiment, the semiconductor device epitaxy material with the underlying sacrificial region is fabricated into a dense array of mesas on the gallium and nitrogen containing bulk substrate with the overlying semiconductor device layers. The mesas are formed using a patterning and a wet or dry etching process wherein the patterning includes a lithography step to define the size and pitch of the mesa regions. Dry etching techniques such as reactive ion etching, inductively coupled plasma etching, or chemical assisted ion beam etching are candidate methods. Alternatively, a wet etch can be used. The etch is configured to terminate at or below a sacrificial region below the device layers. This is followed by a selective etch process such as PEC to fully or partially etch the exposed sacrificial region such that the mesas are undercut. This undercut mesa pattern pitch will be referred to as the 'first pitch'. The first pitch is often a design width that is suitable for fabricating each of the epitaxial regions on the substrate, while not large enough for the desired completed semiconductor device design, which often desire larger non-active regions or regions for contacts and the like. For example, these mesas would have a first pitch ranging from about 5 µm to about 500 µm or to about 5000 µm. Each of these mesas is a 'die'.

In a preferred embodiment, these dice are transferred to a carrier wafer at a second pitch using a selective bonding process such that the second pitch on the carrier wafer is greater than the first pitch on the gallium and nitrogen containing substrate. In this embodiment the dice are on an expanded pitch for so called "die expansion". In an example, the second pitch is configured with the dice to allow each die with a portion of the carrier wafer to be a semiconductor device, including contacts and other components. For example, the second pitch would be about 50 µm to about 1000 µm or to about 5000 µm, but could be as large at about 3-10 mm or greater in the case where a large semiconductor device chip is required for the application. The larger second pitch could enable easier mechanical handling without the expense of the costly gallium and nitrogen containing substrate and epitaxial material, allow the real estate for additional features to be added to the semiconductor device chip such as bond pads that do not require the costly gallium and nitrogen containing substrate and epitaxial material, and/or allow a smaller gallium and nitrogen containing epitaxial wafer containing epitaxial layers to populate a much larger carrier wafer for subsequent processing for reduced processing cost. For example, a 4 to 1 die expansion ratio would reduce the density of the gallium and nitrogen containing material by a factor of 4, and hence populate an area on the carrier wafer 4 times larger than the gallium and nitrogen containing substrate. This would be equivalent to turning a 2" gallium and nitrogen substrate into a 4" carrier wafer. In particular, the present invention increases utilization of substrate wafers and epitaxy material through a selective area bonding process to transfer individual die of epitaxy material to a carrier wafer in such a way that the die pitch is increased on the carrier wafer relative to the original epitaxy wafer. The arrangement of epitaxy material allows device components which do not require the presence of the expensive gallium and nitrogen containing substrate and overlying epitaxy material often fabricated on a gallium and nitrogen containing substrate to be fabricated on the lower cost carrier wafer, allowing for more efficient utilization of the gallium and nitrogen containing substrate and overlying epitaxy material.

Figure 8:
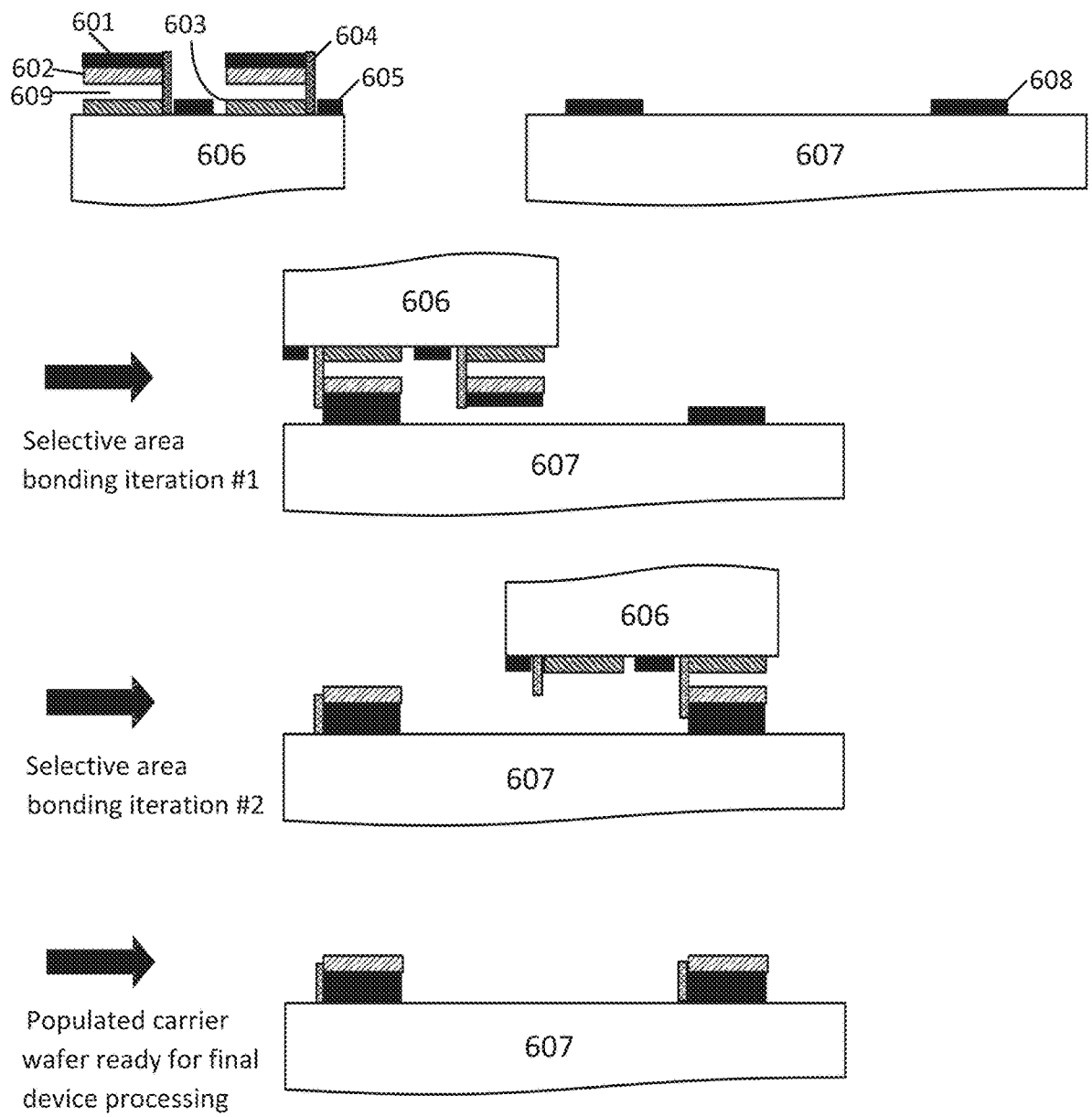
FIG. 8 is a schematic representation of the die expansion process with selective area bonding according to some embodiments of the present invention.

FIG. 8 is a schematic representation of the die expansion process with selective area bonding according to the present invention. A device wafer is prepared for bonding in accordance with an embodiment of this invention. The device wafer consists of a substrate 606, buffer layers 603, a fully removed sacrificial layer 609, device layers 602, bonding media 601, cathode metal 605, and an anchor material 604. The sacrificial layer 609 is removed in the PEC etch with the anchor material 604 is retained. The mesa regions formed in the gallium and nitrogen containing epitaxial wafer form dice of epitaxial material and release layers defined through processing. Individual epitaxial material die are formed at first pitch. A carrier wafer is prepared consisting of the carrier wafer substrate 607 and bond pads 608 at second pitch. The substrate 606 is aligned to the carrier wafer 607 such that a subset of the mesa on the gallium and nitrogen containing substrate 606 with a first pitch aligns with a subset of bond pads 608 on the carrier wafer 607 at a second pitch. Since the first pitch is greater than the second pitch and the mesas will include device die, the basis for die expansion is established. The bonding process is carried out and upon separation of the substrate from the carrier wafer 607 the subset of mesas on the substrate 606 are selectively transferred to the carrier wafer 607. The process is then repeated with a second set of mesas and bond pads 608 on the carrier wafer 607 until the carrier wafer 607 is populated fully by epitaxial mesas. The gallium and nitrogen containing epitaxy substrate 201 can now optionally be prepared for reuse.

In the example depicted in FIG. 8, one quarter of the epitaxial dice on the epitaxy wafer 606 are transferred in this first selective bond step, leaving three quarters on the epitaxy wafer 606. The selective area bonding step is then repeated to transfer the second quarter, third quarter, and fourth quarter of the epitaxial die to the patterned carrier wafer 607. This selective area bond may be repeated any number of times and is not limited to the four steps depicted in FIG. 8. The result is an array of epitaxial die on the carrier wafer 607 with a wider die pitch than the original die pitch on the epitaxy wafer 606. The die pitch on the epitaxial wafer 606 will be referred to as pitch 1, and the die pitch on the carrier wafer 607 will be referred to as pitch 2, where pitch 2 is greater than pitch 1.

In one embodiment the bonding between the carrier wafer and the gallium and nitrogen containing substrate with epitaxial layers is performed between bonding layers that have been applied to the carrier and the gallium and nitrogen containing substrate with epitaxial layers. The bonding layers can be a variety of bonding pairs including metal-metal, oxide-oxide, soldering alloys, photoresists, polymers, wax, etc. Only epitaxial dice which are in contact with a bond bad 608 on the carrier wafer 607 will bond. Sub-micron alignment tolerances are possible on commercial die bonders. The epitaxy wafer 606 is then pulled away, breaking the epitaxy material at a weakened epitaxial release layer 609 such that the desired epitaxial layers remain on the carrier wafer 607. Herein, a 'selective area bonding step' is defined as a single iteration of this process.

In one embodiment, the carrier wafer 607 is patterned in such a way that only selected mesas come in contact with the metallic bond pads 608 on the carrier wafer 607. When the epitaxy substrate 606 is pulled away the bonded mesas break off at the weakened sacrificial region, while the un-bonded mesas remain attached to the epitaxy substrate 606. This selective area bonding process can then be repeated to transfer the remaining mesas in the desired configuration. This process can be repeated through any number of iterations and is not limited to the two iterations depicted in FIG. 8. The carrier wafer can be of any size, including but not limited to about 2 inch, 3 inch, 4 inch, 6 inch, 8 inch, and 12 inch. After all desired mesas have been transferred, a second bandgap selective PEC etching can be optionally used to remove any remaining sacrificial region material to yield smooth surfaces. At this point standard semiconductor device processes can be carried out on the carrier wafer. Another embodiment of the invention incorporates the fabrication of device components on the dense epitaxy wafers before the selective area bonding steps.

In an example, the present invention provides a method for increasing the number of gallium and nitrogen containing semiconductor devices which can be fabricated from a given epitaxial surface area; where the gallium and nitrogen containing epitaxial layers overlay gallium and nitrogen containing substrates. The gallium and nitrogen containing epitaxial material is patterned into die with a first die pitch; the die from the gallium and nitrogen containing epitaxial material with a first pitch is transferred to a carrier wafer to form a second die pitch on the carrier wafer; the second die pitch is larger than the first die pitch.

In an example, each epitaxial device die is an etched mesa with a pitch of between about 1 µm and about 100 µm wide or between about 100 µm and about 500 µm wide or between about 500 µm and about 3000 µm wide and between about 100 and about 3000 µm long. In an example, the second die pitch on the carrier wafer is between about 100 µm and about 200 µm or between about 200 µm and about 1000 µm or between about 1000 µm and about 3000 µm. In an example, the second die pitch on the carrier wafer is between about 2 times and about 50 times larger than the die pitch on the epitaxy wafer. In an example, semiconductor LED devices, laser devices, or electronic devices are fabricated on the carrier wafer after epitaxial transfer. In an example, the semiconductor devices contain GaN, AlN, InN, InGaN, AlGaN, InAlN, and/or InAlGaN. In an example, the gallium and nitrogen containing material are grown on a polar, nonpolar, or semipolar plane. In an example, one or multiple semiconductor devices are fabricated on each die of epitaxial material. In an example, device components which do not require epitaxy material are placed in the space between epitaxy die.

In one embodiment, device dice are transferred to a carrier wafer such that the distance between die is expanded in both the transverse as well as lateral directions. This can be achieved by spacing bond pads on the carrier wafer with larger pitches than the spacing of device die on the substrate.

In another embodiment of the invention device dice from a plurality of epitaxial wafers are transferred to the carrier wafer such that each design width on the carrier wafer contains dice from a plurality of epitaxial wafers. When transferring dice at close spacing from multiple epitaxial wafers, it is important for the un-transferred dice on the epitaxial wafer to not inadvertently contact and bond to die already transferred to the carrier wafer. To achieve this, epitaxial dice from a first epitaxial wafer are transferred to a carrier wafer using the methods described above. A second set of bond pads are then deposited on the carrier wafer and are made with a thickness such that the bonding surface of the second pads is higher than the top surface of the first set of transferred die. This is done to provide adequate clearance for bonding of the dice from the second epitaxial wafer. A second epitaxial wafer transfers a second set of dice to the carrier wafer. Finally, the semiconductor devices are fabricated and passivation layers are deposited followed by electrical contact layers that allow each die to be individually driven. The dice transferred from the first and second substrates are spaced at a pitch which is smaller than the second pitch of the carrier wafer. This process can be extended to transfer of dice from any number of epitaxial substrates, and to transfer of any number of devices per dice from each epitaxial substrate.

Figure 9:
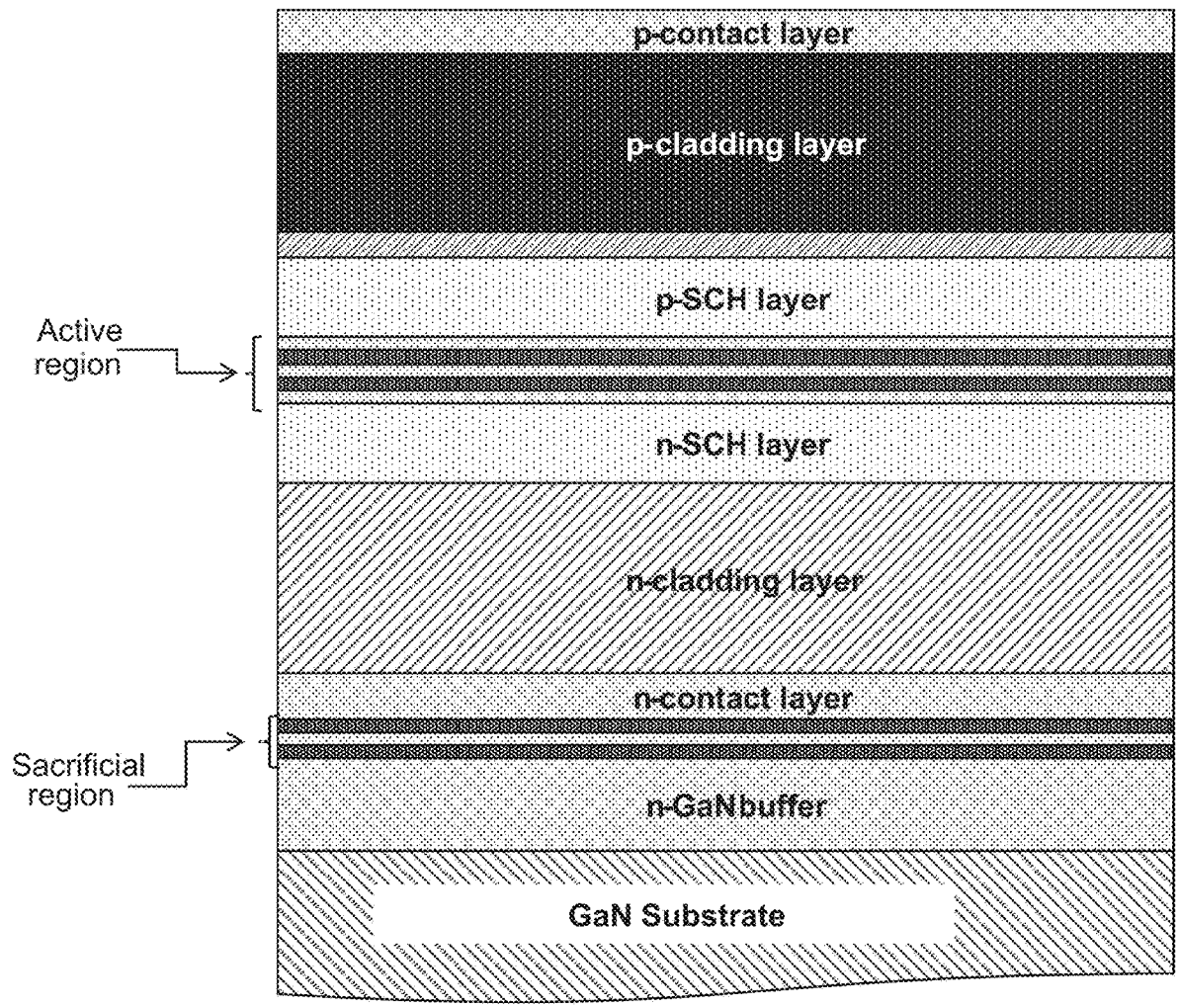
FIG. 9 is an exemplary epitaxial structure for a laser diode device according to an embodiment of the present invention.

An example of an epitaxial structure for a laser diode device according to this invention is shown in FIG. 9. In this embodiment, an n-GaN buffer layer followed by a sacrificial layer is grown along with an n-contact layer that will be exposed after transfer. Overlaying the n-contact layer are n-cladding layers, an n-side separate confinement heterostructure (n-SCH) layer, an active region, a p-side separate confinement heterostructure (p-SCH) layer, a p-cladding layer, and a p-contact region. In one example of this embodiment an n-type GaN buffer layer is grown on a c-plane oriented, bulk-GaN wafer. In another example the substrate is comprised of a semipolar or nonpolar orientation. Overlaying the buffer layer is a sacrificial layer comprised by InGaN wells separated by GaN barriers with the well composition and thickness chosen to result in the wells absorbing light at wavelengths shorter than 450 nm, though in some embodiments the absorption edge would be as short as 400 nm and in other embodiments as long as 520 nm. Overlaying the sacrificial layer is an n-type contact layer consisting of GaN doped with silicon at a concentration of $5\times10^{18}$ cm$^{-3}$, but can be other doping levels in the range between $5\times10^{17}$ and $1\times10^{19}$ cm$^{-3}$. Overlaying the contact layer is an n-type cladding layer comprised of GaN or AlGaN layer with a thickness of 1 micron with an average composition of 4% AlN, though in other embodiments the thickness may range from 0.25 to 2 µm with an average composition of 0-8% AlN. Overlaying the n-cladding is an n-type wave-guiding or separate confinement heterostructure (SCH) layer that helps provide index contrast with the cladding to improve confinement of the optical modes. The nSCH is InGaN with a composition of 4% InN and has a thickness of 100 nm, though in other embodiments the InGaN nSCH may range from 20 to 300 nm in thickness and from 0-8% InN and may be composed of several layers of varying composition and thickness. Overlaying the n-SCH are light emitting quantum well layers consisting of two 3.5 nm thick $In_{0.15}Ga_{0.85}N$ quantum wells separated by 4 nm thick GaN barriers, though in other embodiments there may 1 to 7 light emitting quantum well layers consisting of 1 nm to 6 nm thick quantum wells separated by GaN or InGaN barriers of 1 nm to 25 nm thick. Overlaying the light emitting layers is an optional InGaN pSCH with a composition of 4% InN and has a thickness of 100 nm, though in other embodiments the nSCH may range from 20 to 300 nm in thickness and from 0-8% InN and may be composed of several layers of varying composition and thickness. Overlaying the pSCH is an optional AlGaN electron blocking layer (EBL) with a composition of 10% AlN, though in other embodiments the AlGaN EBL composition may range from 0% to 30% AlN. Overlaying the EBL a p-type cladding comprised of GaN or AlGaN layer with a thickness of 0.8 micron with an average composition of 4% AlN, though in other embodiments the thickness may range from 0.25 to 2 µm with an average composition of 0-8% AlN. The p-cladding is terminated at the free surface of the crystal with a highly doped p++ or p-contact layer that enables a high quality electrical p-type contact to the device.

Once the laser diode epitaxial structure has been transferred to the carrier wafer as described in this invention, wafer level processing can be used to fabricate the dice into laser diode devices. The wafer process steps may be similar to those described in this specification for more conventional laser diodes. For example, in many embodiments the bonding media and dice will have a total thickness of less than about 7 µm, making it possible to use standard photoresist, photoresist dispensing technology and contact and projection lithography tools and techniques to pattern the wafers. The aspect ratios of the features are compatible with deposition of thin films, such as metal and dielectric layers, using evaporators, sputter and CVD deposition tools.

The laser diode device may have laser stripe region formed in the transferred gallium and nitrogen containing epitaxial layers. In the case where the laser is formed on a polar c-plane, the laser diode cavity can be aligned in the m-direction with cleaved or etched mirrors. Alternatively, in the case where the laser is formed on a semipolar plane, the laser diode cavity can be aligned in a projection of a c-direction. The laser strip region has a first end and a second end and is formed on a gallium and nitrogen containing substrate having a pair of cleaved mirror structures, which face each other. The first cleaved facet includes a reflective coating and the second cleaved facet includes no coating, an antireflective coating, or exposes gallium and nitrogen containing material. The first cleaved facet is substantially parallel with the second cleaved facet. The first and second cleaved facets are provided by a scribing and breaking process according to an embodiment or alternatively by etching techniques using etching technologies such as reactive ion etching (RIE), inductively coupled plasma etching (ICP), or chemical assisted ion beam etching (CAIBE), or other method. Typical gases used in the etching process may include Cl and/or $BCl_3$. The first and second mirror surfaces each include a reflective coating. The coating is selected from silicon dioxide, hafnia, and titania, tantalum pentoxide, zirconia, including combinations, and the like. Depending upon the design, the mirror surfaces can also include an anti-reflective coating.

In a specific embodiment, the method of facet formation includes subjecting the substrates to a laser for pattern formation. In a preferred embodiment, the pattern is configured for the formation of a pair of facets for a ridge lasers. In a preferred embodiment, the pair of facets faces each other and is in parallel alignment with each other. In a preferred embodiment, the method uses a UV (355 nm) laser to scribe the laser bars. In a specific embodiment, the laser is configured on a system, which allows for accurate scribe lines configured in a different patterns and profiles. In some embodiments, the laser scribing can be performed on the backside, front-side, or both depending upon the application. Of course, there can be other variations, modifications, and alternatives.

By aligning the device dice such that the intended plane of the facet is coplanar with an easily cleaved plane of the single-crystal carrier wafer. Mechanical or laser scribes can then be used, as described above, to guide and initiate cleavage in the carrier wafer such that it is located properly with respect to the laser die and carrier wafer patterns. Zincblende, cubic and diamond-lattice crystals work well for cleaved carriers with several sets of orthogonal cleavage planes (e.g. [110], [001], etc.). Singulation of the carrier wafers into individual die can be accomplished either by sawing or cleaving. In the case of singulation using cleaving the same cleavage planes and techniques can be used as described for facet formation.

In a specific embodiment, the method uses backside laser scribing or the like. With backside laser scribing, the method preferably forms a continuous line laser scribe that is perpendicular to the laser bars on the backside of the GaN substrate. In a specific embodiment, the laser scribe is generally about 15-20 µm deep or other suitable depth. Preferably, backside scribing can be advantageous. That is, the laser scribe process does not depend on the pitch of the laser bars or other like pattern. Accordingly, backside laser scribing can lead to a higher density of laser bars on each substrate according to a preferred embodiment. In a specific embodiment, backside laser scribing, however, may lead to residue from the tape on the facets. In a specific embodiment, backside laser scribe often requires that the substrates face down on the tape. With front-side laser scribing, the backside of the substrate is in contact with the tape. Of course, there can be other variations, modifications, and alternatives.

It is well known that etch techniques such as chemical assisted ion beam etching (CAIBE), inductively coupled plasma (ICP) etching, or reactive ion etching (RIE) can result in smooth and vertical etched sidewall regions, which could serve as facets in etched facet laser diodes. In the etched facet process a masking layer is deposited and patterned on the surface of the wafer. The etch mask layer could be comprised of dielectrics such as silicon dioxide ($SiO_2$), silicon nitride ($Si_xN_y$), a combination thereof or other dielectric materials. Further, the mask layer could be comprised of metal layers such as Ni or Cr, but could be comprised of metal combination stacks or stacks comprising metal and dielectrics. In another approach, photoresist masks can be used either alone or in combination with dielectrics and/or metals. The etch mask layer is patterned using conventional photolithography and etch steps. The alignment lithography could be performed with a contact aligner or stepper aligner. Such lithographically defined mirrors provide a high level of control to the design engineer. After patterning of the photoresist mask on top of the etch mask is complete, the patterns in then transferred to the etch mask using a wet etch or dry etch technique. Finally, the facet pattern is then etched into the wafer using a dry etching technique selected from CAIBE, ICP, RIE and/or other techniques. The etched facet surfaces must be highly vertical of between about 87 and about 93 degrees or between about 89 and about 91 degrees from the surface plane of the wafer. The etched facet surface region must be very smooth with root mean square roughness values of less than about 50 nm, 20 nm, 5 nm, or 1 nm. Lastly, the etched must be substantially free from damage, which could act as non-radiative recombination centers and hence reduce the COMD threshold. CAIBE is known to provide very smooth and low damage sidewalls due to the chemical nature of the etch, while it can provide highly vertical etches due to the ability to tilt the wafer stage to compensate for any inherent angle in etch.

In specific embodiments, multiple regions of epitaxial device material are transferred to a carrier wafer from one or more donor wafers such that the regions of epitaxial device material die are positioned closely, with separation distances of less than 50 to 100 µm. For example, epitaxial device dice from two or more blue emitting laser diode epitaxial donor wafers could be transferred to a carrier wafer such that each "chip" region of the carrier consists of one epitaxial device die from each donor. The transferred die could then be processed on the carrier wafer to form laser diodes or SLEDs such that each "chip" consists of two or more independently controllable laser or SLED devices emitting at the wavelengths associated with the original donor wafers. Such a configuration is advantageous over conventional laser and SLED device structures in that the multiple emitters can be arrayed much more closely in this configuration then they could be by bonding conventional device chips to a submount. Typically, conventional device chips are on the order of 100 μm or more in width, with the minimum width constrained by the need for wire bonds and other means of electrical access to the devices. A conventionally made, multi-color emitter would therefore require at a minimum 3-4 times as much lateral width as one made as described above.

In a specific embodiment, the plurality of donor epitaxial wafers may be comprised of device layers emitting at substantially different wavelengths. For example, a blue device emitting at around 450 nm may be bonded adjacent to both a green device emitting at around 530 nm and a red device made from AlInGaAsP layers emitting at around 630 nm. Such a configuration would result in a controllable light source emitting combinations or red, green and blue light that could be used for illumination or the generation of images.

In an embodiment, the device layers include a superluminescent light emitting diode or SLED. A SLED is in many ways similar to an edge emitting laser diode; however the emitting facet of the device is designed so as to have a very low reflectivity. A SLED is similar to a laser diode as it is based on an electrically driven junction that when injected with current becomes optically active and generates amplified spontaneous emission (ASE) and gain over a wide range of wavelengths. When the optical output becomes dominated by ASE there is a knee in the light output versus current (LI) characteristic wherein the unit of light output becomes drastically larger per unit of injected current. This knee in the LI curve resembles the threshold of a laser diode, but is much softer. A SLED would have a layer structure engineered to have a light emitting layer or layers clad above and below with material of lower optical index such that a laterally guided optical mode can be formed. The SLED would also be fabricated with features providing lateral optical confinement. These lateral confinement features may consist of an etched ridge, with air, vacuum, metal or dielectric material surrounding the ridge and providing a low optical-index cladding. The lateral confinement feature may also be provided by shaping the electrical contacts such that injected current is confined to a finite region in the device. In such a "gain guided" structure, dispersion in the optical index of the light emitting layer with injected carrier density provides the optical-index contrast needed to provide lateral confinement of the optical mode. The emission spectral width is typically substantially wider (>5 nm) than that of a laser diode and offer advantages with respect to reduced image distortion in displays, increased eye safety, and enhanced capability in measurement and spectroscopy applications.

SLEDs are designed to have high single pass gain or amplification for the spontaneous emission generated along the waveguide. The SLED device would also be engineered to have a low internal loss, preferably below 1 cm$^{-1}$, however SLEDs can operate with internal losses higher than this. In the ideal case, the emitting facet reflectivity would be zero, however in practical applications a reflectivity of zero is difficult to achieve and the emitting facet reflectivity is designs to be less than 1%, less than 0.1%, less than 0.001%, or less than 0.0001% reflectivity. Reducing the emitting facet reflectivity reduces feedback into the device cavity, thereby increasing the injected current density at which the device will begin to lase. Very low reflectivity emitting facets can be achieved by a combination of addition of anti-reflection coatings and by angling the emitting facet relative to the SLED cavity such that the surface normal of the facet and the propagation direction of the guided modes are substantially non-parallel. In general, this would mean a deviation of more than 1-2 degrees. In practice, the ideal angle depends in part on the anti-reflection coating used and the tilt angle must be carefully designed around a null in the reflectivity versus angle relationship for optimum performance. Tilting of the facet with respect to the propagation direction of the guided modes can be done in any direction relative to the direction of propagation of the guided modes, though some directions may be easier to fabricate depending on the method of facet formation. Etched facets provide high flexibility for facet angle determination. Alternatively, a very common method to achieve an angled output for reduced constructive interference in the cavity would to curve and/or angle the waveguide with respect to a cleaved facet that forms on a pre-determined crystallographic plane in the semiconductor chip. In this configuration the angle of light propagation is off-normal at a specified angle designed for low reflectivity to the cleaved facet. A low reflectivity facet may also be formed by roughening the emitting facet in such a way that light extraction is enhanced and coupling of reflected light back into the guided modes is limited. SLEDs are applicable to all embodiments according to the present invention and the device can be used interchangeably with laser diode device when applicable.

The laser stripe is characterized by a length and width. The length ranges from about 50 μm to about 3000 μm, but is preferably between about 10 μm and about 400 μm, between about 400 μm and about 800 μm, or about 800 μm and about 1600 μm, but could be others such as greater than 1600 μm. The stripe also has a width ranging from about 0.5 μm to about 50 μm, but is preferably between about 0.8 μm and about 2.5 μm for single lateral mode operation or between about 2.5 μm and about 80 μm for multi-lateral mode operation, but can be other dimensions. In a specific embodiment, the present device has a width ranging from about 0.5 μm to about 1.5 μm, a width ranging from about 1.5 μm to about 3.0 μm, a width ranging from about 3.0 μm to about 360 μm, and others. In a specific embodiment, the width is substantially constant in dimension, although there may be slight variations. The width and length are often formed using a masking and etching process, which are commonly used in the art.

The laser stripe is provided by an etching process selected from dry etching or wet etching. The device also has an overlying dielectric region, which exposes a p-type contact region. Overlying the contact region is a contact material, which may be metal or a conductive oxide or a combination thereof. The p-type electrical contact may be deposited by thermal evaporation, electron beam evaporation, electroplating, sputtering, or another suitable technique. Overlying the polished region of the substrate is a second contact material, which may be metal or a conductive oxide or a combination thereof and which includes the n-type electrical contact. The n-type electrical contact may be deposited by thermal evaporation, electron beam evaporation, electroplating, sputtering, or another suitable technique.

Figure 10:
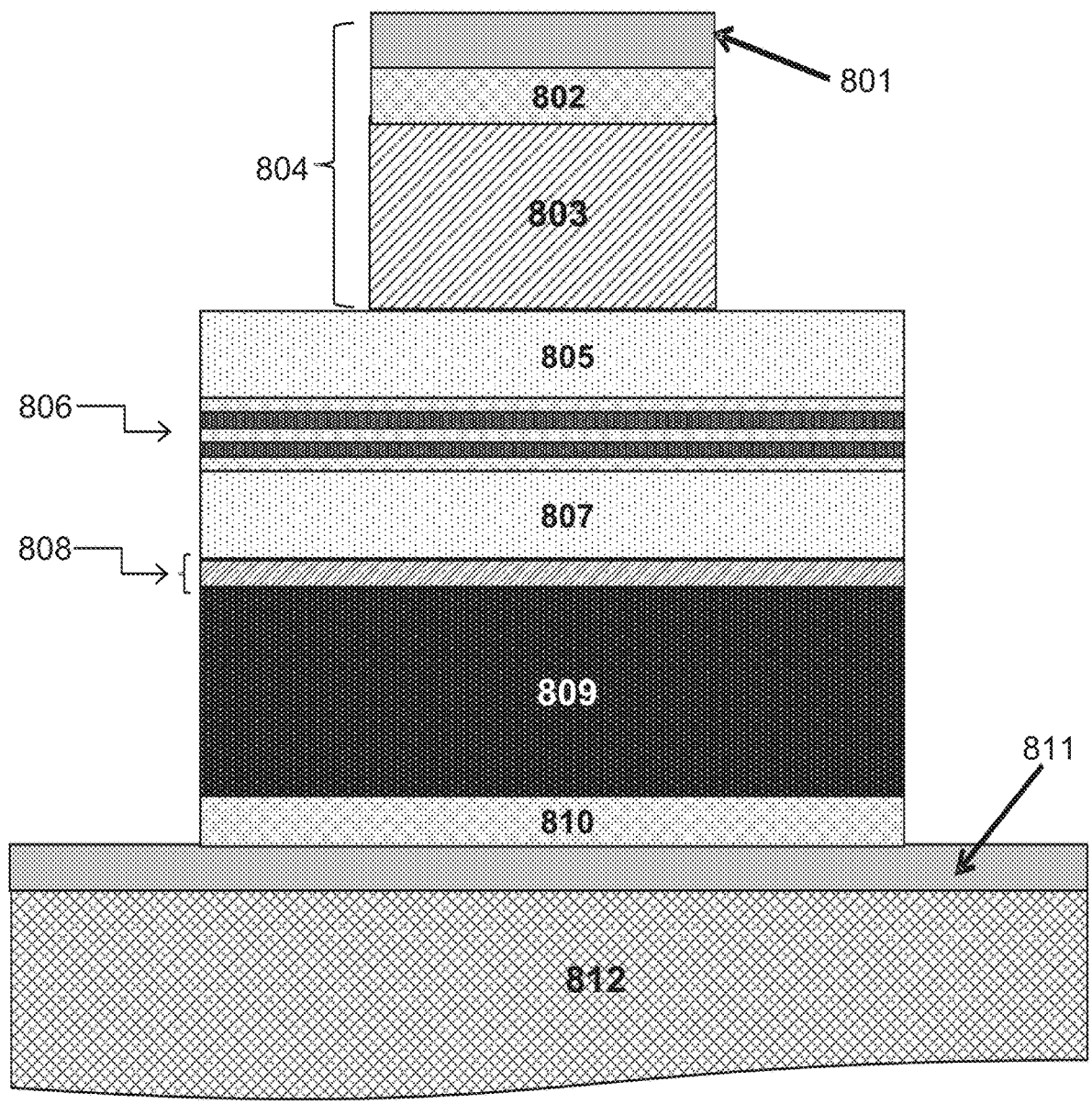
FIG. 10 is an example of a processed laser diode cross-section according to an embodiment of the present invention.

An example of a processed laser diode cross-section according to one embodiment of the present invention is shown in FIG. 10. In this example an n-contact 801 is formed on top of n-type gallium and nitrogen contact layer 802 and n-type cladding layer 803 that have been etched to form a ridge waveguide 804. The n-type cladding layer 803 overlies an n-side waveguide layer or separate confinement heterostructure (SCH) layer 805 and the n-side SCH overlies an active region 806 that contains light emitting layers such as quantum wells. The active region overlies an optional p-side SCH layer 807 and an electron blocking layer (EBL) 808. The optional p-side SCH layer overlies the p-type cladding 809 and a p-contact layer 810. Underlying the p-contact layer 810 is a metal stack 811 that contains the p-type contact and bond metal used to attach the transferred gallium and nitrogen containing epitaxial layers to the carrier wafer 812.

Once the laser diodes have been fully processed within the gallium and nitrogen containing layers that have been transferred to the carrier wafer, the carrier wafer must be diced. Several techniques can be used to dice the carrier wafer and the optimal process will depend on the material selection for the carrier wafer. As an example, for Si, InP, or GaAs carrier wafers that cleave very easily, a cleaving process can be used wherein a scribing and breaking process using conventional diamond scribe techniques may be most suitable. For harder materials such as GaN, AlN, SiC, sapphire, or others where cleaving becomes more difficult a laser scribing and breaking technique may be most suitable. In other embodiments a sawing process may be the most optimal way to dice the carrier wafer into individual laser chips. In a sawing process a rapidly rotating blade with hard cutting surfaces like diamond are used, typically in conjunction with spraying water to cool and lubricate the blade. Example saw tools used to commonly dice wafers include Disco saws and Accretech saws.

By choosing a carrier wafer material such as AlN, BeO, diamond, or SiC that is suitable as a submount between the laser chip and the mounting surface, the diced laser chip on the carrier wafer is in itself a chip on submount (CoS). This wafer level packaging features is a strong benefit of the lifted-off and transferred gallium and nitrogen containing epitaxial layer embodiment of this invention. The submount can be the common support member wherein the phosphor member of the CPoS would also be attached. Alternatively, the submount can be an intermediate submount intended to be mounted to the common support member wherein the phosphor material is attached. The submount member is characterized by a width, length, and thickness. In one example wherein the submount is the common support member for the phosphor and the laser diode, the submount would likely have a length ranging in dimension from about 0.5 mm to about 3 mm or about 5 mm, a width ranging from about 0.3 mm to about 1 mm or from about 1 mm to 3 mm, and a thickness from about 200 µm to about 1 mm. In tan example wherein the submount is an intermediate submount between the laser diode and the common support member it may be characterized by length ranging in dimension from about 0.5 mm to about 2 mm, a width ranging from about 150 µm to about 1 mm, and the thickness may ranging from about 50 µm to about 500 µm.

Figure 11:
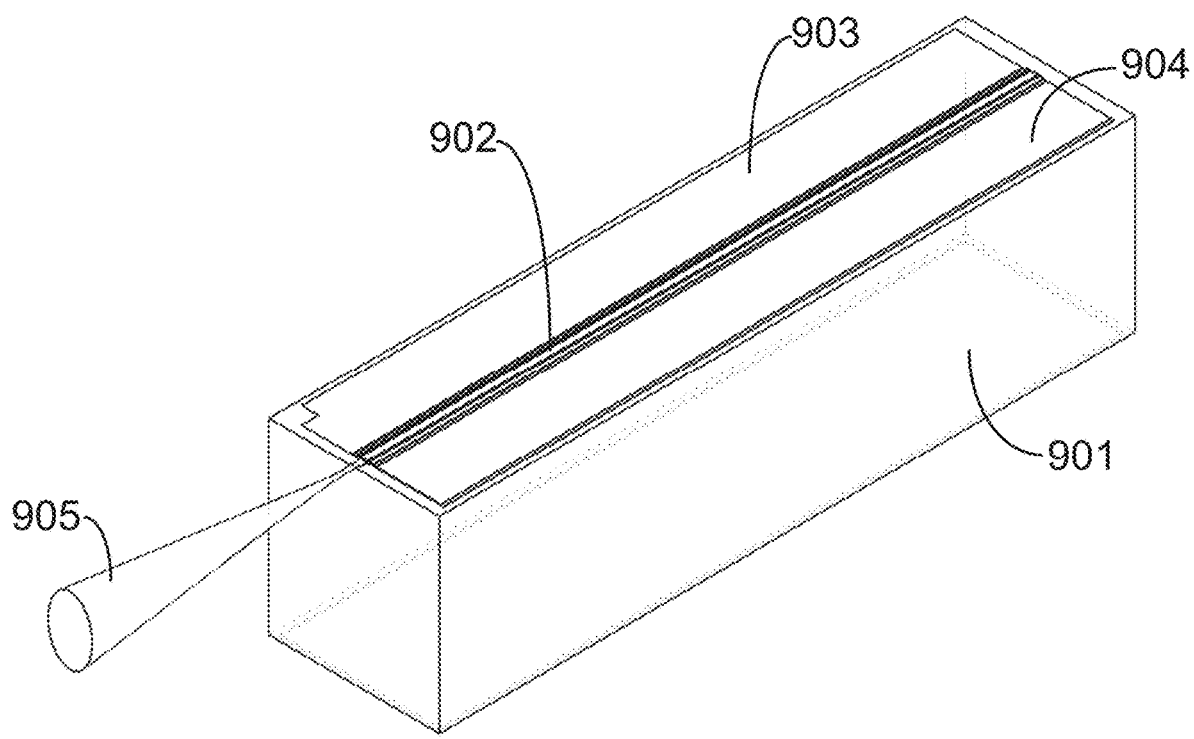
FIG. 11 is a schematic diagram illustrating a CoS based on lifted off and transferred epitaxial gallium and nitrogen containing layers according to an embodiment of this present invention.

A schematic diagram illustrating a CoS based on lifted off and transferred epitaxial gallium and nitrogen containing layers according to this present invention is shown in FIG. 11. The CoS is comprised of submount material 901 configured from the carrier wafer with the transferred epitaxial material with a laser diode configured within the epitaxy 902. Electrodes 903 and 904 are electrically coupled to the n-side and the p-side of the laser diode device and configured to transmit power from an external source to the laser diode to generate a laser beam output 905 from the laser diode. The electrodes are configured for an electrical connection to an external power source such as a laser driver, a current source, or a voltage source. Wirebonds can be formed on the electrodes to couple the power to the laser diode device. This integrated CoS device with transferred epitaxial material offers advantages over the conventional configuration such as size, cost, and performance due to the low thermal impedance.

Further process and device description for this embodiment describing laser diodes formed in gallium and nitrogen containing epitaxial layers that have been transferred from the native gallium and nitrogen containing substrates are described in U.S. patent application Ser. No. 14/312,427 and U.S. Patent Publication No. 2015/0140710, which are incorporated by reference herein. As an example, this technology of GaN transfer can enable lower cost, higher performance, and a more highly manufacturable process flow.

In some embodiments, the carrier wafer can be selected to provide an ideal submount material for the integrated CPoS white light source. That is, the carrier wafer serving as the laser diode submount would also serve as the common support member for the laser diode and the phosphor to enable an ultra-compact CPoS integrated white light source. In one example, the carrier wafer is formed from silicon carbide (SiC). SiC is an ideal candidate due to its high thermal conductivity, low electrical conductivity, high hardness and robustness, and wide availability. In other examples AlN, diamond, GaN, InP, GaAs, or other materials can be used as the carrier wafer and resulting submount for the CPoS. In one example, the laser chip is diced out such that there is an area in front of the front laser facet intended for the phosphor. The phosphor material would then be bonded to the carrier wafer and configured for laser excitation according to this embodiment.

After fabrication of the laser diode on a submount member, in a embodiments of this invention the construction of the integrated white source would proceed to integration of the phosphor with the laser diode and common support member. Phosphor selection is a key consideration within the laser based integrated white light source. The phosphor must be able to withstand the extreme optical intensity and associated heating induced by the laser excitation spot without severe degradation. Important characteristics to consider for phosphor selection include:

A high conversion efficiency of optical excitation power to white light lumens. In the example of a blue laser diode exciting a yellow phosphor, a conversion efficiency of over 150 lumens per optical watt, or over 200 lumens per optical watt, or over 300 lumens per optical watt is desired.

A high optical damage threshold capable of withstanding 1-20 W of laser power in a spot comprising a diameter of 1 mm, 500 µm, 200 µm, 100 µm, or even 50 µm.

High thermal damage threshold capable of withstanding temperatures of over 150° C., over 200° C., or over 300° C. without decomposition.

A low thermal quenching characteristic such that the phosphor remains efficient as it reaches temperatures of over 150° C., 200° C., or 250° C.

A high thermal conductivity to dissipate the heat and regulate the temperature. Thermal conductivities of greater than 3 W/m-K, greater than 5 W/m-K, greater than 10 W/m-K, and even greater than 15 W/m-K are desirable.

A proper phosphor emission color for the application.

A suitable porosity characteristic that leads to the desired scattering of the coherent excitation without unacceptable reduction in thermal conductivity or optical efficiency.

A proper form factor for the application. Such form factors include, but are not limited to blocks, plates, disks, spheres, cylinders, rods, or a similar geometrical element. Proper choice will be dependent on whether phosphor is operated in transmissive or reflective mode and on the absorption length of the excitation light in the phosphor.

A surface condition optimized for the application. In an example, the phosphor surfaces can be intentionally roughened for improved light extraction.

In a preferred embodiment, a blue laser diode operating in the 420 nm to 480 nm wavelength range would be combined with a phosphor material providing a yellowish emission in the 560 nm to 580 nm range such that when mixed with the blue emission of the laser diode a white light is produced. For example, to meet a white color point on the black body line the energy of the combined spectrum may be comprised of about 30% from the blue laser emission and about 70% from the yellow phosphor emission. In other embodiments phosphors with red, green, yellow, and even blue emission can be used in combination with the laser diode excitation sources in the violet, ultra-violet, or blue wavelength range to produce a white light with color mixing. Although such white light systems may be more complicated due to the use of more than one phosphor member, advantages such as improved color rendering could be achieved.

In an example, the light emitted from the laser diodes is partially converted by the phosphor element. In an example, the partially converted light emitted generated in the phosphor element results in a color point, which is white in appearance. In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

The phosphor material can be operated in a transmissive mode, a reflective mode, or a combination of a transmissive mode and reflective mode, or other modes. The phosphor material is characterized by a conversion efficiency, a resistance to thermal damage, a resistance to optical damage, a thermal quenching characteristic, a porosity to scatter excitation light, and a thermal conductivity. In a preferred embodiment the phosphor material is comprised of a yellow emitting YAG material doped with Ce with a conversion efficiency of greater than 100 lumens per optical watt, greater than 200 lumens per optical watt, or greater than 300 lumens per optical watt, and can be a polycrystalline ceramic material or a single crystal material.

In some embodiments of the present invention, the environment of the phosphor can be independently tailored to result in high efficiency with little or no added cost. Phosphor optimization for laser diode excitation can include high transparency, scattering or non-scattering characteristics, and use of ceramic phosphor plates. Decreased temperature sensitivity can be determined by doping levels. A reflector can be added to the backside of a ceramic phosphor, reducing loss. The phosphor can be shaped to increase in-coupling, increase out-coupling, and/or reduce back reflections. Surface roughening is a well-known means to increase extraction of light from a solid material. Coatings, mirrors, or filters can be added to the phosphors to reduce the amount of light exiting the non-primary emission surfaces, to promote more efficient light exit through the primary emission surface, and to promote more efficient in-coupling of the laser excitation light. Of course, there can be additional variations, modifications, and alternatives.

In some embodiments, certain types of phosphors will be best suited in this demanding application with a laser excitation source. As an example, ceramic yttrium aluminum garnets (YAG) doped with $Ce^{3+}$ ions, or YAG based phosphors can be ideal candidates. They are doped with species such as Ce to achieve the proper emission color and are often comprised of a porosity characteristic to scatter the excitation source light, and nicely break up the coherence in laser excitation. As a result of its cubic crystal structure the YAG:Ce can be prepared as a highly transparent single crystal as well as a polycrystalline bulk material. The degree of transparency and the luminescence are depending on the stoichiometric composition, the content of dopant, and entire processing and sintering route. The transparency and degree of scattering centers can be optimized for a homogenous mixture of blue and yellow light. The YAG:Ce can be configured to emit a green emission. In some embodiments the YAG can be doped with Eu to emit a red emission.

In a preferred embodiment according to this invention, the white light source is configured with a ceramic polycrystalline YAG:Ce phosphors comprising an optical conversion efficiency of greater than 100 lumens per optical excitation watt, of greater than 200 lumens per optical excitation watt, or even greater than 300 lumens per optical excitation watt. Additionally, the ceramic YAG:Ce phosphors is characterized by a temperature quenching characteristics above 150° C., above 200° C., or above 250° C. and a high thermal conductivity of 5-10 W/m-K to effectively dissipate heat to a heat sink member and keep the phosphor at an operable temperature.

In another preferred embodiment according to this invention, the white light source is configured with a single crystal phosphor (SCP) such as YAG:Ce. In one example the $Ce:Y_3Al_5O_{12}$ SCP can be grown by the Czochralski technique. In this embodiment according the present invention the SCP based on YAG:Ce is characterized by an optical conversion efficiency of greater than 100 lumens per optical excitation watt, of greater than 200 lumens per optical excitation watt, or even greater than 300 lumens per optical excitation watt. Additionally, the single crystal YAG:Ce phosphors is characterized by a temperature quenching characteristics above 150° C., above 200° C., or above 300° C. and a high thermal conductivity of 8-20 W/m-K to effectively dissipate heat to a heat sink member and keep the phosphor at an operable temperature. In addition to the high thermal conductivity, high thermal quenching threshold, and high conversion efficiency, the ability to shape the phosphors into tiny forms that can act as ideal "point" sources when excited with a laser is an attractive feature.

In some embodiments the YAG:Ce can be configured to emit a yellow emission. In alternative or the same embodiments a YAG:Ce can be configured to emit a green emission. In yet alternative or the same embodiments the YAG can be doped with Eu to emit a red emission. In some embodiments a LuAG is configured for emission. In alternative embodiments, silicon nitrides or aluminum-oxi-nitrides can be used as the crystal host materials for red, green, yellow, or blue emissions.

In an alternative embodiment, a powdered single crystal or ceramic phosphor such as a yellow phosphor or green phosphor is included. The powdered phosphor can be dispensed on a transparent member for a transmissive mode operation or on a solid member with a reflective layer on the back surface of the phosphor or between the phosphor and the solid member to operate in a reflective mode. The phosphor powder may be held together in a solid structure using a binder material wherein the binder material is preferable in inorganic material with a high optical damage threshold and a favorable thermal conductivity. The phosphor power may be comprised of colored phosphors and configured to emit a white light when excited by and combined with the blue laser beam or excited by a violet laser beam. The powdered phosphors could be comprised of YAG, LuAG, or other types of phosphors.

In one embodiment of the present invention the phosphor material contains a yttrium aluminum garnet host material and a rare earth doping element, and others. In an example, the wavelength conversion element is a phosphor which contains a rare earth doping element, selected from one of Ce, Nd, Er, Yb, Ho, Tm, Dy and Sm, combinations thereof, and the like. In an example, the phosphor material is a high-density phosphor element. In an example, the high-density phosphor element has a density greater than 90% of pure host crystal. Cerium (III)-doped YAG (YAG:$Ce^{3+}$, or $Y_3Al_5O_{12}$:$Ce^{3+}$) can be used wherein the phosphor absorbs the light from the blue laser diode and emits in a broad range from greenish to reddish, with most of output in yellow. This yellow emission combined with the remaining blue emission gives the "white" light, which can be adjusted to color temperature as warm (yellowish) or cold (bluish) white. The yellow emission of the $Ce^{3+}$:YAG can be tuned by substituting the cerium with other rare earth elements such as terbium and gadolinium and can even be further adjusted by substituting some or all of the aluminum in the YAG with gallium.

In alternative examples, various phosphors can be applied to this invention, which include, but are not limited to organic dyes, conjugated polymers, semiconductors such as AlInGaP or InGaN, yttrium aluminum garnets (YAGs) doped with $Ce^{3+}$ ions $(Y_{1-a}Gd_a)_3(Al_{1-b}Ga_b)_5O_{12}$:$Ce^{3+}$, $SrGa_2S_4$:$Eu^{2+}$, SrS:$Eu^{2+}$, terbium aluminum based garnets (TAGs) ($Tb_3Al_5O_5$), colloidal quantum dot thin films containing CdTe, ZnS, ZnSe, ZnTe, CdSe, or CdTe.

In further alternative examples, some rare-earth doped SiAlONs can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. In an alternative example, green and yellow SiAlON phosphor and a red $CaAlSiN_3$-based (CASN) phosphor may be used.

In yet a further example, white light sources can be made by combining near ultraviolet emitting laser diodes with a mixture of high efficiency europium based red and blue emitting phosphors plus green emitting copper and aluminum doped zinc sulfide (ZnS:Cu,Al).

In an example, a phosphor or phosphor blend can be selected from a of (Y, Gd, Tb, Sc, Lu, La)$_3$(Al, Ga, In)$_5O_{12}$: $Ce^{3+}$, $SrGa_2S_4$:$Eu^{2+}$, SrS:$Eu^{2+}$, and colloidal quantum dot thin films comprising CdTe, ZnS, ZnSe, ZnTe, CdSe, or CdTe. In an example, a phosphor is capable of emitting substantially red light, wherein the phosphor is selected from a of the group consisting of $(Gd,Y,Lu,La)_2O_3$:$Eu^{3+}$, $Bi^{3+}$; $(Gd,Y,Lu,La)_2O_2S$:$Eu^{3+}$, $Bi^{3+}$; $(Gd,Y,Lu,La)VO_4$:$Eu^{3+}$, $Bi^{3+}$; $Y_2(O,S)_3$:$Eu^{3+}$; $Ca_{1-x}Mo_{1-y}Si_yO_4$: where 0.05<x<0.5, 0<y<0.1; $(Li,Na,K)_5Eu(W,Mo)O_4$; (Ca,Sr)S: $Eu^{2+}$; $SrY_2S_4$:$Eu^{2+}$; $CaLa_2S_4$:$Ce^{3+}$; (Ca,Sr)S:$Eu^{2+}$; $3.5MgOx0.5MgF_2xGeO_2$:$Mn^{4+}$ (MFG); (Ba,Sr,Ca) $Mg_xP_2O_7$:$Eu^{2+}$, $Mn^{2+}$; $(Y,Lu)_2WO_6$:$Eu^{3+}$, $Mo^{6+}$; (Ba,Sr, Ca)$_3$ $Mg_xSi_2O_8$:$Eu^{2+}$, $Mn^{2+}$, wherein 1<x<2; $(RE_{1-y}Ce_y)$ $Mg_{2-x}Li_xSi_{3-x}P_xO_{12}$, where RE is at least one of Sc, Lu, Gd, Y, and Tb, 0.0001<x<0.1 and 0.001<y<0.1; (Y, Gd, Lu, La)$_{2-x}Eu_xW_{1-y}Mo_yO_6$, where 0.5<x<1.0, 0.01<y<1.0; $(SrCa)_{1-x}Eu_xSi_5N_8$, where 0.01<x<0.3; $SrZnO_2$:$Sm^{+3}$; $M_mO_nX$, wherein M is selected from the group of Sc, Y, a lanthanide, an alkali earth metal and mixtures thereof; X is a halogen; 1<m<3; and 1<n<4, and wherein the lanthanide doping level can range from 0.1 to 40% spectral weight; and $Eu^{3+}$ activated phosphate or borate phosphors; and mixtures thereof. Further details of other phosphor species and related techniques can be found in U.S. Pat. No. 8,956,894, in the name of Raring et al. issued Feb. 17, 2015, and titled "White light devices using non-polar or semipolar gallium containing materials and phosphors", which is commonly owned, and hereby incorporated by reference herein.

In some embodiments of the present invention, ceramic phosphor materials are embedded in a binder material such as silicone. This configuration is typically less desirable because the binder materials often have poor thermal conductivity, and thus get very hot wherein the rapidly degrade and even burn. Such "embedded" phosphors are often used in dynamic phosphor applications such as color wheels where the spinning wheel cools the phosphor and spreads the excitation spot around the phosphor in a radial pattern.

Sufficient heat dissipation from the phosphor is a critical design consideration for the integrated white light source based on laser diode excitation. Specifically, the optically pumped phosphor system has sources of loss in the phosphor that result is thermal energy and hence must be dissipated to a heat-sink for optimal performance. The two primary sources of loss are the Stokes loss which is a result of converting photons of higher energy to photons of lower energy such that difference in energy is a resulting loss of the system and is dissipated in the form of heat. Additionally, the quantum efficiency or quantum yield measuring the fraction of absorbed photons that are successfully re-emitted is not unity such that there is heat generation from other internal absorption processes related to the non-converted photons. Depending on the excitation wavelength and the converted wavelength, the Stokes loss can lead to greater than 10%, greater than 20%, and greater than 30%, and greater loss of the incident optical power to result in thermal power that must be dissipated. The quantum losses can lead to an additional 10%, greater than 20%, and greater than 30%, and greater of the incident optical power to result in thermal power that must be dissipated. With laser beam powers in the 1 W to 100 W range focused to spot sizes of less than 1 mm in diameter, less than 500 μm in diameter, or even less than 100 μm in diameter, power densities of over 1 W/mm$^2$, 100 W/mm$^2$, or even over 2,500 W/mm$^2$ can be generated. As an example, assuming that the spectrum is comprised of 30% of the blue pump light and 70% of the converted yellow light and a best case scenario on Stokes and quantum losses, we can compute the dissipated power density in the form of heat for a 10% total loss in the phosphor at 0.1 W/mm$^2$, 10 W/mm$^2$, or even over 250 W/mm$^2$. Thus, even for this best case scenario example, this is a tremendous amount of heat to dissipate. This heat generated within the phosphor under the high intensity laser excitation can limit the phosphor conversion performance, color quality, and lifetime.

For optimal phosphor performance and lifetime, not only should the phosphor material itself have a high thermal conductivity, but it should also be attached to the submount or common support member with a high thermal conductivity joint to transmit the heat away from the phosphor and to a heat-sink. In this invention, the phosphor is either attached to the common support member as the laser diode as in the CPoS or is attached to an intermediate submount member that is subsequently attached to the common support member. Candidate materials for the common support member or intermediate submount member are SiC, AlN, BeO, diamond, copper, copper tungsten, sapphire, aluminum, or others. The interface joining the phosphor to the submount member or common support member must be carefully considered. The joining material should be comprised of a high thermal conductivity material such as solder (or other) and be substantially free from voids or other defects that can impede heat flow. In some embodiments, glue materials can be used to fasten the phosphor. Ideally the phosphor bond interface will have a substantially large area with a flat surface on both the phosphor side and the support member sides of the interface.

In the present invention, the laser diode output beam must be configured to be incident on the phosphor material to excite the phosphor. In some embodiments the laser beam may be directly incident on the phosphor and in other embodiments the laser beam may interact with an optic, reflector, waveguide, or other object to manipulate the beam prior to incidence on the phosphor. Examples of such optics include, but are not limited to ball lenses, aspheric collimator, aspheric lens, fast or slow axis collimators, dichroic mirrors, turning mirrors, optical isolators, but could be others.

In some embodiments, the apparatus typically has a free space with a non-guided laser beam characteristic transmitting the emission of the laser beam from the laser device to the phosphor material. The laser beam spectral width, wavelength, size, shape, intensity, and polarization are configured to excite the phosphor material. The beam can be configured by positioning it at the precise distance from the phosphor to exploit the beam divergence properties of the laser diode and achieve the desired spot size. In one embodiment, the incident angle from the laser to the phosphor is optimized to achieve a desired beam shape on the phosphor. For example, due to the asymmetry of the laser aperture and the different divergent angles on the fast and slow axis of the beam the spot on the phosphor produced from a laser that is configured normal to the phosphor would be elliptical in shape, typically with the fast axis diameter being larger than the slow axis diameter. To compensate this, the laser beam incident angle on the phosphor can be optimized to stretch the beam in the slow axis direction such that the beam is more circular on phosphor. In other embodiments free space optics such as collimating lenses can be used to shape the beam prior to incidence on the phosphor. The beam can be characterized by a polarization purity of greater than 50% and less than 100%. As used herein, the term "polarization purity" means greater than 50% of the emitted electromagnetic radiation is in a substantially similar polarization state such as the transverse electric (TE) or transverse magnetic (TM) polarization states, but can have other meanings consistent with ordinary meaning.

The white light apparatus also has an electrical input interface configured to couple electrical input power to the laser diode device to generate the laser beam and excite the phosphor material. In an example, the laser beam incident on the phosphor has a power of less than 0.1 W, greater than 0.1 W, greater than 0.5 W, greater than 1 W, greater than 5 W, greater than 10 W, or greater than 20 W. The white light source configured to produce greater than 1 lumen, 10 lumens, 100 lumens, 1000 lumens, 10,000 lumens, or greater of white light output.

The support member is configured to transport thermal energy from the at least one laser diode device and the phosphor material to a heat sink. The support member is configured to provide thermal impedance of less than 10 degrees Celsius per watt, less than 5 degrees Celsius per watt, or less than 3 degrees Celsius per watt of dissipated power characterizing a thermal path from the laser device to a heat sink. The support member is comprised of a thermally conductive material such as copper with a thermal conductivity of about 400 W/(m-K), aluminum with a thermal conductivity of about 200 W/(mK), 4H—SiC with a thermal conductivity of about 370 W/(m-K), 6H—SiC with a thermal conductivity of about 490 W/(m-K), AlN with a thermal conductivity of about 230 W/(m-K), a synthetic diamond with a thermal conductivity of about >1000 W/(m-K), sapphire, or other metals, ceramics, or semiconductors. The support member may be formed from a growth process such as SiC, AlN, or synthetic diamond, and then mechanically shaped by machining, cutting, trimming, or molding. Alternatively the support member may be formed from a metal such as copper, copper tungsten, aluminum, or other by machining, cutting, trimming, or molding.

Currently, solid state lighting is dominated by systems utilizing blue or violet emitting light emitting diodes (LEDs) to excite phosphors which emit a broader spectrum. The combined spectrum of the so called pump LEDs and the phosphors can be optimized to yield white light spectra with controllable color point and good color rendering index. Peak wall plug efficiencies for state of the art LEDs are quite high, above 70%, such that LED based white lightbulbs are now the leading lighting technology for luminous efficacy. As laser light sources, especially high-power blue laser diodes made from gallium and nitrogen containing material based novel manufacture processes, have shown many advantageous functions on quantum efficiency, power density, modulation rate, surface brightness over conventional LEDs. This opens up the opportunity to use lighting fixtures, lighting systems, displays, projectors and the like based on solid-state light sources as a means of transmitting information with high bandwidth using visible light. It also enables utilizing the modulated laser signal or direct laser light spot manipulation to measure and or interact with the surrounding environment, transmit data to other electronic systems and respond dynamically to inputs from various sensors. Such applications are herein referred to as "smart lighting" applications.

In some embodiments, the present invention provides novel uses and configurations of gallium and nitrogen containing laser diodes in communication systems such as visible light communication systems. More specifically the present invention provides communication systems related to smart lighting applications with gallium and nitrogen based lasers light sources coupled to one or more sensors with a feedback loop or control circuitry to trigger the light source to react with one or more predetermined responses and combinations of smart lighting and visible light communication. In these systems, light is generated using laser devices which are powered by one or more laser drivers. In some embodiments, individual laser devices are used and optical elements are provided to combine the red, green and blue spectra into a white light spectrum. In other embodiments, blue or violet laser light is provided by a laser source and is partially or fully converted by a wavelength converting element into a broader spectrum of longer wavelength light such that a white light spectrum is produced.

The blue or violet laser devices illuminate a wavelength converting element which absorbs part of the pump light and reemits a broader spectrum of longer wavelength light. The light absorbed by the wavelength converting element is referred to as the "pump" light. The light engine is configured such that some portion of both light from the wavelength converting element and the unconverted pump light are emitted from the light-engine. When the non-converted, blue pump light and the longer wavelength light emitted by the wavelength converting element are combined, they may form a white light spectrum. In an example, the partially converted light emitted generated in the wavelength conversion element results in a color point, which is white in appearance. In an example, the color point of the white light is located on the Planckian blackbody locus of points. In an example, the color point of the white light is located within du'v' of less than 0.010 of the Planckian blackbody locus of points. In an example, the color point of the white light is preferably located within du'v' of less than 0.03 of the Planckian blackbody locus of points.

In an example, the wavelength conversion element is a phosphor which contains garnet host material and a doping element. In an example, the wavelength conversion element is a phosphor, which contains an yttrium aluminum garnet host material and a rare earth doping element, and others. In an example, the wavelength conversion element is a phosphor which contains a rare earth doping element, selected from one or more of Nd, Cr, Er, Yb, Nd, Ho, Tm Cr, Dy, Sm, Tb and Ce, combinations thereof, and the like. In an example, the wavelength conversion element is a phosphor which contains oxy-nitrides containing one or more of Ca, Sr, Ba, Si, Al with or without rare-earth doping. In an example, the wavelength conversion element is a phosphor which contains alkaline earth silicates such as $M_2SiO_4:Eu^{2+}$ (where M is one or more of $Ba^{2+}$, $Sr^{2+}$ and $Ca^{2+}$). In an example, the wavelength conversion element is a phosphor which contains $Sr_2LaAlO_5:Ce^{3+}$, $Sr_3SiO_5:Ce^{3+}$ or $Mn^{4+}$-doped fluoride phosphors. In an example, the wavelength conversion element is a high-density phosphor element. In an example, the wavelength conversion element is a high-density phosphor element with density greater than 90% of pure host crystal. In an example, the wavelength converting material is a powder. In an example, the wavelength converting material is a powder suspended or embedded in a glass, ceramic or polymer matrix. In an example, the wavelength converting material is a single crystalline member. In an example, the wavelength converting material is a powder sintered to density of greater than 75% of the fully dense material. In an example, the wavelength converting material is a sintered mix of powders with varying composition and/or index of refraction. In an example, the wavelength converting element is one or more species of phosphor powder or granules suspended in a glassy or polymer matrix. In an example, the wavelength conversion element is a semiconductor. In an example, the wavelength conversion element contains quantum dots of semiconducting material. In an example, the wavelength conversion element is comprised by semiconducting powder or granules.

For laser diodes the phosphor may be remote from the laser die, enabling the phosphor to be well heat sunk, enabling high input power density. This is an advantageous configuration relative to LEDs, where the phosphor is typically in contact with the LED die. While remote-phosphor LEDs do exist, because of the large area and wide emission angle of LEDs, remote phosphors for LEDs have the disadvantage of requiring significantly larger volumes of phosphor to efficiently absorb and convert all of the LED light, resulting in white light emitters with large emitting areas and low luminance.

For LEDs, the phosphor emits back into the LED die where the light from the phosphor can be lost due to absorption. For laser diode modules, the environment of the phosphor can be independently tailored to result in high efficiency with little or no added cost. Phosphor optimization for laser diode modules can include highly transparent, non-scattering, ceramic phosphor plates. Decreased temperature sensitivity can be determined by doping levels. A reflector can be added to the backside of a ceramic phosphor, reducing loss. The phosphor can be shaped to increase in-coupling and reduce back reflections. Of course, there can be additional variations, modifications, and alternatives.

For laser diodes, the phosphor or wavelength converting element can be operated in either a transmission or reflection mode. In a transmission mode, the laser light is shown through the wavelength converting element. The white light spectrum from a transmission mode device is the combination of laser light not absorbed by the phosphor and the spectrum emitted by the wavelength converting element. In a reflection mode, the laser light is incident on the first surface of the wavelength converting element. Some fraction of the laser light is reflected off of the first surface by a combination of specular and diffuse reflection. Some fraction of the laser light enters the phosphor and is absorbed and converted into longer wavelength light. The white light spectrum emitted by the reflection mode device is comprised by the spectrum from the wavelength converting element, the fraction of the laser light diffusely reflected from the first surface of the wavelength converting element and any laser light scattered from the interior of the wavelength converting element.

In a specific embodiment, the laser light illuminates the wavelength converting element in a reflection mode. That is, the laser light is incident on and collected from the same side of the wavelength converting element. The element may be heat sunk to the emitter package or actively cooled. Rough surface is for scattering and smooth surface is for specular reflection. In some cases such as with a single crystal phosphor a rough surface with or without an AR coating of the wavelength converting element is provided to get majority of excitation light into phosphor for conversion and Lambertian emission while scattering some of the excitation light from the surface with a similar Lambertian as the emitted converted light. In other embodiments such as ceramic phosphors with internal built-in scattering centers are used as the wavelength converting elements, a smooth surface is provided to allow all laser excitation light into the phosphor where blue and wavelength converted light exits with a similar Lambertian pattern.

In a specific embodiment, the laser light illuminates the wavelength converting element in a transmission mode. That is, the laser light is incident on one side of the element, traverses through the phosphor, is partially absorbed by the element and is collected from the opposite side of the phosphor.

The wavelength converting elements, in general, can themselves contain scattering elements. When laser light is absorbed by the wavelength converting element, the longer wavelength light that is emitted by the element is emitted across a broad range of directions. In both transmission and reflection modes, the incident laser light must be scattered into a similar angular distribution in order to ensure that the resulting white light spectrum is substantially the same when viewed from all points on the collecting optical elements. Scattering elements may be added to the wavelength converting element in order to ensure the laser light is sufficiently scattered. Such scattering elements may include: low index inclusions such as voids, spatial variation in the optical index of the wavelength converting element which could be provided as an example by suspending particles of phosphor in a matrix of a different index or sintering particles of differing composition and refractive index together, texturing of the first or second surface of the wavelength converting element, and the like.

In a specific embodiment, a laser or SLED driver module is provided. For example, the laser driver module generates a drive current, with the drive currents being adapted to drive a laser diode to transmit one or more signals such as digitally encoded frames of images, digital or analog encodings of audio and video recordings or any sequences of binary values. In a specific embodiment, the laser driver module is configured to generate pulse-modulated light signals at a modulation frequency range of about 50 MHz to 300 MHz, 300 MHz to 1 GHz or 1 GHz to 100 GHz. In another embodiment the laser driver module is configured to generate multiple, independent pulse-modulated light signal at a modulation frequency range of about 50 MHz to 300 MHz, 300 MHz to 1 GHz or 1 GHz to 100 GHz. In an embodiment, the laser driver signal can be modulated by an analog voltage or current signal.

Figure 12A:
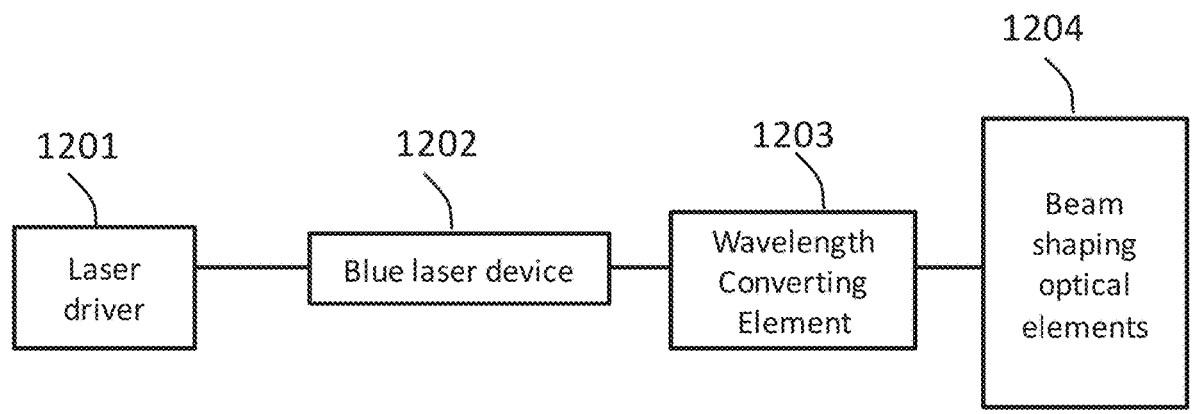
FIG. 12A is a functional block diagram for a laser-based white light source containing a blue pump laser and a wavelength converting element according to an embodiment of the present invention.

FIG. 12A is a functional block diagram for a laser-based white light source containing a blue pump laser and a wavelength converting element according to an embodiment of the present invention. In some embodiments, the white light source is used as a "light engine" for VLC or smart lighting applications. Referring to FIG. 12A, a blue or violet laser device 1202 emitting a spectrum with a center point wavelength between 390 and 480 nm is provided. The light from the blue laser device 1202 is incident on a wavelength converting element 1203 which partially or fully converts the blue light into a broader spectrum of longer wavelength light such that a white light spectrum is produced. A laser driver 1201 is provided which powers the laser device 1202. In some embodiments, one or more beam shaping optical elements 1204 may be provided in order to shape or focus the white light spectrum. Optionally, the one or more beam shaping optical elements 1204 can be one selected from slow axis collimating lens, fast axis collimating lens, aspheric lens, ball lens, total internal reflector (TIR) optics, parabolic lens optics, refractive optics, or a combination of above. In other embodiments, the one or more beam shaping optical elements 1204 can be disposed prior to the laser light incident to the wavelength converting element 1203.

Figure 12B:
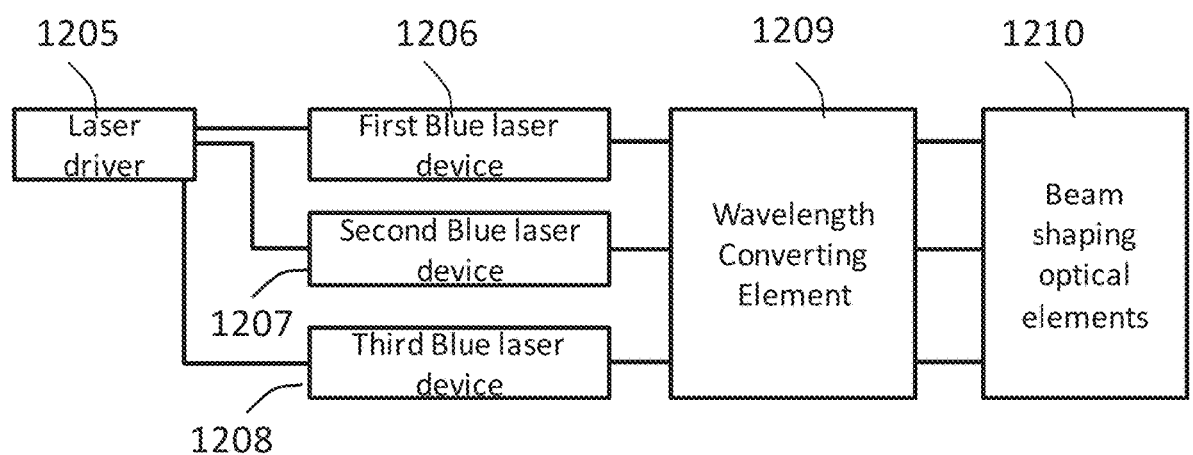
FIG. 12B is a functional block diagram for a laser-based white light source containing multiple blue pump lasers and a wavelength converting element according to another embodiment of the present invention.

FIG. 12B is a functional block diagram for a laser-based white light source containing multiple blue pump lasers and a wavelength converting element according to another embodiment of the present invention. Referring to FIG. 12B, a laser driver 1205 is provided, which delivers a delivers a controlled amount of current at a sufficiently high voltage to operate there laser diodes 1206, 1207 and 1208. The three blue laser devices 1206, 1207 and 1208 are configured to have their emitted light to be incident on a wavelength converting element 1209 in either a transmission or reflection mode. The wavelength converting element 1209 absorbs a part or all blue laser light and emits photons with longer wavelengths. The spectra emitted by the wavelength converting element 1209 and any remaining laser light are collected by beam shaping optical elements 1210, such as lenses or mirrors, which direct the light with a preferred direction and beam shape. Optionally, the wavelength converting element 1209 is a phosphor-based material. Optionally, more than one wavelength converting elements can be used. Optionally, the bean shaping optical elements can be one or a combination of more selected the list of slow axis collimating lens, fast axis collimating lens, aspheric lens, ball lens, total internal reflector (TIR) optics, parabolic lens optics, refractive optics, and others. Optionally, the beam shaping optical element is implemented before the laser light hits the wavelength converting element.

It is to be understood that, in the embodiments, the light engine is not limited to a specific number of laser devices.

FIG. 12B shows a functional diagram for an example of laser-diode-based light engine for VLC or smart lighting applications containing multiple blue or violet laser diodes, for example, a first blue laser diode 1206, a second blue laser diode 1207 and a third blue laser diode 1208 are provided. The light from all three is incident on a wavelength converting element 1209 which partially or fully converts the blue light into a broader spectrum of longer wavelength light such that a white light spectrum is produced. In some embodiments, the laser light engine may contain 2, 4, 5, 6 or more blue or violet laser diodes. In an example, the light engine includes two or more laser or SLED "pump" light-sources emitting with center wavelengths between 380 nm and 480 nm, with the center wavelengths of individual pump light sources separated by at least 5 nm. The spectral width of the laser light source is preferably less than 2 nm, though widths up to 75% of the center wavelength separation would be acceptable. A laser driver 1205 is provided to drive the laser devices and is configured such that one or more of the laser devices are individually addressable and can be powered independently of the rest. In some embodiments, one or more beam shaping optical elements 1210 is provided in order to shape or focus the white light spectrum.

Figure 12C:
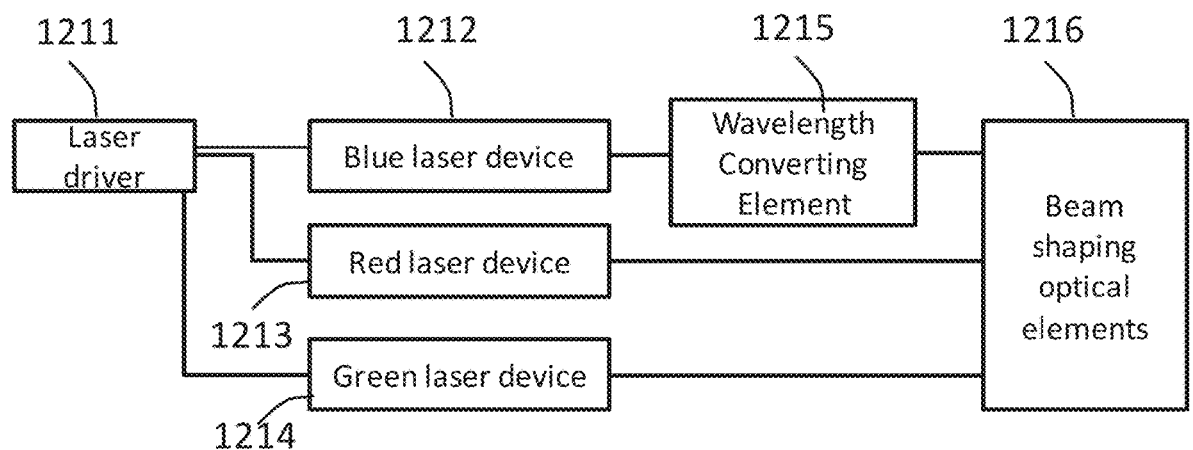
FIG. 12C is a functional block diagram of a laser based white light source containing a blue pump laser, a wavelength converting element, and red and green laser diodes according to yet another embodiment of the present invention.

FIG. 12C is a functional block diagram of a laser based white light source containing a blue pump laser, a wavelength converting element, and red and green laser diodes according to yet another embodiment of the present invention. Referring to FIG. 12C, a laser driver 1211 is provided, which delivers a controlled amount of current at a sufficiently high voltage to operate the laser diodes 1212, 1213 and 1214. A blue laser device 1212 is provided to emit light configured to be incident on a wavelength converting element 1215 in either a transmission or reflection mode. The wavelength converting element 1215 absorbs a part or all of the blue laser light emitted from the blue laser diode 1212 and emits photons with longer wavelengths. Optionally, the wavelength converting element 1215 partially or fully converts the blue light into a broader spectrum of longer wavelength light such that a white light spectrum is produced. In addition, a red light emitting laser diode 1213 and a green light emitting laser diode 1214 are separately provided. In this configuration, the red and green laser lights are not incident on the wavelength converting element 1215, though it is possible for the red and green light to be incident on the wavelength converting element without conversion of the red and green laser light. The spectra emitted by the wavelength converting element 1215 and any remaining laser light from the green and red laser devices are collected by a beam shaping optical elements 1216, such as lenses or mirrors, which direct the light with a preferred direction and beam shape.

In a specific embodiment, the light engine consists of two or more laser or SLED "pump" light-sources emitting with center wavelengths between 380 nm and 480 nm, with the center wavelengths of individual pump light sources separated by at least 5 nm. The spectral width of the laser light source is preferably less than 2 nm, though widths up to 75% of the center wavelength separation would be acceptable. A laser driver 1211 is provided which powers the laser devices and is configured such that the laser devices are individually addressable and can be powered independently of the rest. In some embodiments, one or more beam shaping optical elements 1216 is provided in order to shape or focus the white light spectrum from the wavelength converting element 1215. The beam shaping optical elements 1216 may also be configured to combine the red and green laser light with the white light spectrum. In some embodiments, each of the red and green laser light is also incident on the wavelength converting element 1215 and overlaps spatially with the wavelength converted blue light. The wavelength converting element material 1215 is chosen such that the non-converted (red or green) laser light is scattered with a similar radiation pattern to the wavelength converted blue light, but with minimal loss due to absorption.

In another specific embodiment, the present invention provides light-engine with a wavelength converting element, that can function as a white light source for general lighting and display applications and also as an emitter for visible light communication. The emitter consists of three or more laser or SLED light sources. At least one light source emits a spectrum with a center wavelength in the range of 380-480 nm and acts as a blue light source. At least one light emits a spectrum with a center wavelength in the range of 480-550 nm and acts as a green light source. At least one light emits a spectrum with a center wavelength in the range 600-670 nm and acts as a red light source. Each light source is individually addressable, such that they may be operated independently of one another and act as independent communication channels, or in the case of multiple emitters in the red, green or blue wavelength ranges the plurality of light sources in each range may be addressed collectively, though the plurality of sources in each range are addressable independently of the sources in the other wavelength ranges. One or more of the light sources emitting in the blue range of wavelengths illuminates a wavelength converting element which absorbs part of the pump light and reemits a broader spectrum of longer wavelength light. The light engine is configured such that both light from the wavelength converting element and the plurality of light sources are emitted from the light-engine. This embodiment functions as a light source with tunable color, allowing for a plurality of combinations of red, green and blue light. It also provides a broad white light spectrum via the wavelength converting element as a high CRI white light source, with the red and green channels capable of being overlaid on the broad white light spectrum to dynamically shift the color point.

Optionally, the non-converted laser devices need not have spectra corresponding to red light and green light. For example, the non-converted laser device might emit in the infra-red at wavelengths between 800 nm and 2 microns. For example, such devices could be formed on InP substrates using the InGaAsP material system or formed on GaAs substrates using the InAlGaAsP. Moreover, such laser devices could be formed on the same carrier wafer as the visible blue GaN laser diode source using the epitaxy transfer technology according to this invention. Such a device would be advantageous for communication as the infra-red device, while not adding to the luminous efficacy of the light engine, would provide a non-visible channel for communications. This would allow for data transfer to continue under a broader range of conditions. For example, a VLC-enabled light engine using only visible emitters would be incapable of effectively transmitting data when the light source is nominally turned off as one would find in, for example, a movie theater, conference room during a presentation, a moodily lit restaurant or bar, or a bed-room at night among others. In another example, the non-converted laser device might emit a spectrum corresponding to blue or violet light, with a center wavelength between 390 and 480 nm. In another embodiment, the non-converted blue or violet laser may either be not incident on the wavelength converting element and combined with the white light spectrum in beam shaping and combining optics.

In still another embodiment, the present invention provides a light engine that can function as a white light source for general lighting applications as well as displays and also as an emitter for visible light communication. The emitter consists of at least one or more laser or SLED "pump" light sources emitting with center wavelengths between 380 nm and 480 nm which act as a blue light source. The light engine also contains one or more laser or SLED light sources emitting at non-visible wavelengths longer than 700 nm. One or more of the light sources emitting in the blue range of wavelengths illuminates a wavelength converting element which absorbs part of the pump light and reemits a broader spectrum of longer wavelength light. The light engine is configured such that both light from the wavelength converting element and the plurality of light sources are emitted from the light-engine. Each pump light source is individually addressable, such that they may be operated independently of one another and act as independent communication channels. The wavelength converting element is the same as that previously described. The non-visible light sources are also individually addressable and can be used to transmit data at wavelengths that are not visible to the human eye. In an example, the non-visible lasers or SLEDs may emit at typical telecommunication wavelengths such as between 1.3 and 1.55 microns. In another example, the non-visible lasers or SLEDs may emit spectra with center wavelengths between 800 nm and 2 microns.

Figure 12D:
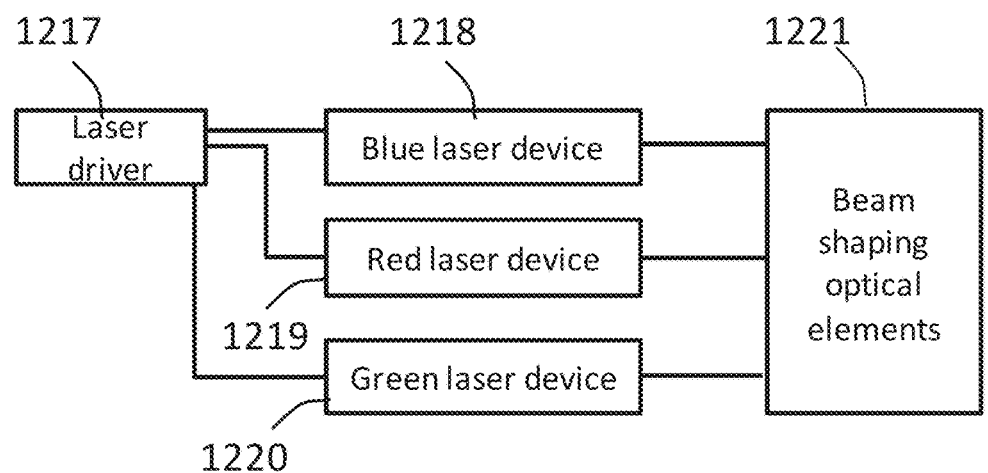
FIG. 12D is a functional block diagram of a laser based white light source containing blue, green and red laser devices and no wavelength converting element according to still another embodiment of the present invention.

FIG. 12D is a functional block diagram of a laser based white light source containing blue, green and red laser devices and no wavelength converting element according to still another embodiment of the present invention. Referring to FIG. 12D, a laser driver 1217 is provided, which delivers a controlled amount of current at a sufficiently high voltage to operate the laser diodes 1218, 1219 and 1220. Optionally, a blue laser device 1218, a red laser device 1219 and a green laser device 1220 are provided. The laser light emitted by each of the three laser devices is collected by beam shaping optical elements 1221, such as lenses or mirrors, which direct the light with a preferred direction and beam shape.

In this embodiment, the blue laser device 1218, the red laser device 1219 and the green laser device 1220 are provided and form the basis for three independently controllable color "channels". A laser driver 1217 is provided which powers the laser devices and is configured such that the three laser devices are individually addressable and can be powered independently of the rest. In some embodiments, one or more beam shaping optical elements 1221 is provided in order to shape or focus the white light spectrum from the wavelength converting element. The beam shaping optical elements 1221 may also be configured to combine the red, green and blue laser light into a single beam with similar divergence and direction of propagation. Optionally, a plurality of laser diodes of each color may be used.

In an embodiment with multiple lasers in any of the color channels the plurality of lasers may be powered collectively, independently or may be configured such that a subset of the devices are powered collectively while another subset are individually addressable by the laser driver. In an example, a laser light engine contains a red, green and blue color channel provided by red, green and blue laser diodes, respectively. The blue channel, for example, is comprised by 4 blue laser diodes with center wavelengths of 420, 450, 450 and 480 nm. The 420 and 480 nm devices are individually addressable by the laser driver and the two 450 nm devices are collectively addressable by the driver, i.e. they cannot be operated independently of one another a different power levels. Such a configuration results in individually controllable "sub channels", which are advantageous for several reasons. Firstly, relative intensities of lasers with varying wavelength may be adjusted to produce a spectrum with a desired color point, such that the color gamut of the light engine is larger than that achievable with a single red, green and blue source. Secondly, different wavelengths of light have been shown to have an effect on the health and function of the human body. In an example application, the ratio of short wavelength to long wavelength blue light could be adjusted by individually controlling the blue laser sources throughout a day so as to limit interference with the natural circadian rhythm due to exposure to short wavelength light at night.

According to an embodiment, the present invention provides a light engine with no wavelength converting element, that can function as a white light source for general lighting applications as well as displays and also as an emitter for visible light communication. The emitter consists of three or more laser or SLED light sources. At least one light source emits a spectrum with a center wavelength in the range of 420-480 nm and acts as a blue light source. At least one light emits a spectrum with a center wavelength in the range of 480-550 nm and acts as a green light source. At least one light emits a spectrum with a center wavelength in the range 600-670 nm and acts as a red light source. The light engine also contains one or more laser or SLED light sources emitting at non-visible wavelengths longer than 700 nm. Each light source is individually addressable, such that they may be operated independently of one another and act as independent communication channels, or in the case of multiple emitters in the red, green or blue wavelength ranges the plurality of light sources in each range may be addressed collectively, though the plurality of sources in each range are addressable independently of the sources in the other wavelength ranges. The non-visible light sources are also individually addressable as a group independently from the light sources of the red, green and blue wavelength ranges, and can be used to transmit data at wavelengths that are not visible to the human eye. In an example, the non-visible lasers or SLEDs may emit at typical telecommunication wavelengths such as between 1.3 and 1.55 microns. In another example, the non-visible lasers or SLEDs may emit spectra with center wavelengths between 800 nm and 1.3 microns. This embodiment functions as a light source with tunable color, allowing for a plurality of combinations of red, green and blue light as well as data transmission at non-visible wavelengths.

According to an embodiment, the present invention provides a light engine with no wavelength converting element, that can function as a white light source for general lighting applications as well as displays and also as an emitter for visible light communication. The emitter consists of three or more laser or SLED light sources. At least one light source emits a spectrum with a center wavelength in the range of 420-480 nm and acts as a blue light source. At least one light emits a spectrum with a center wavelength in the range of 480-550 nm and acts as a green light source. At least one light emits a spectrum with a center wavelength in the range 600-670 nm and acts as a red light source. Each light source is individually addressable, such that they may be operated independently of one another and act as independent communication channels, or in the case of multiple emitters in the red, green or blue wavelength ranges the plurality of light sources in each range may be addressed collectively, though the plurality of sources in each range are addressable independently of the sources in the other wavelength ranges. This embodiment functions as a light source with tunable color, allowing for a plurality of combinations of red, green and blue light with data transmission capability using one or more of the laser devices. In several preferred embodiments, diffuser elements could be used to reduce the coherence and collimation of the laser light source.

In some embodiments, the light engine is provided with a plurality of blue or violet pump lasers which are incident on a first surface of the wavelength converting element. The plurality of blue or violet pump lasers is configured such that each pump laser illuminates a different region of the first surface of the wavelength converting element. In a specific embodiment, the regions illuminated by the pump lasers are not overlapping. In a specific embodiment, the regions illuminated by the pump lasers are partially overlapping. In a specific embodiment, a subset of pump lasers illuminate fully overlapping regions of the first surface of the wavelength converting element while one or more other pump lasers are configured to illuminate either a non-overlapping or partially overlapping region of the first surface of the wavelength converting element. Such a configuration is advantageous because by driving the pump lasers independently of one another the size and shape of the resulting light source can by dynamically modified such that the resulting spot of white light once projected through appropriate optical elements can by dynamically configured to have different sizes and shapes without the need for a moving mechanism.

In an alternative embodiment, the laser or SLED pump light sources and the wavelength converting element are contained in a sealed package provided with an aperture to allow the white light spectrum to be emitted from the package. In specific embodiments, the aperture is covered or sealed by a transparent material, though in some embodiments the aperture may be unsealed. In an example, the package is a TO canister with a window that transmits all or some of the pump and down-converted light. In an example, the package is a TO canister with a window that transmits all or some of the pump and down-converted light.

FIG. 13A is a schematic diagram of a laser based white light source operating in transmission mode and housed in a TO canister style package according to an embodiment of the present invention. Referring to FIG. 13A, the TO canister package includes a base member 1001, a shaped pedestal 1005 and pins 1002. The base member 1001 can be comprised of a metal such as copper, copper tungsten, aluminum, or steel, or other. The pins 1002 are either grounded to the base or are electrically insulated from it and provide a means of electrically accessing the laser device. The pedestal member 1005 is configured to transmit heat from the pedestal to the base member 1001 where the heat is subsequently passed to a heat sink. A cap member 1006 is provided with a window 1007 hermetically sealed. The cap member 1006 itself also is hermetically sealed to the base member 1001 to enclose the laser based white light source in the TO canister package.

A laser device 1003 is provided to be mounted on the pedestal 1005 in a CPoS package such that its emitting facet is aimed at a wavelength converting element 1004. The mounting to the pedestal can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/m-K and electrical conductivity of about 16 μΩcm whereas pressureless sintered Ag can have a thermal conductivity of about 125 W/m-K and electrical conductivity of about 4 μΩcm, or pressured sintered Ag can have a thermal conductivity of about 250 W/m-K and electrical conductivity of about 2.5 μΩcm. Due to the extreme change in melt temperature from paste to sintered form, for example, 260° C.-900° C., processes can avoid thermal load restrictions on downstream processes, allowing completed devices to have very good and consistent bonds throughout. Electrical connections from the p-electrode and n-electrode of the laser diode are made using wire bonds 1008 which connect to the pins 1002. The pins are then electrically coupled to a power source to electrify the white light source and generate white light emission. In this configuration the white light source is not capped or sealed such that is exposed to the open environment.

The laser light emitted from the laser device 1003 shines through the wavelength converting element 1004 and is either fully or partially converted to longer wavelength light. The down-converted light and remaining laser light is then emitted from the wavelength converting element 1004. The CPoS packaged white light source configured in a can type package as shown in FIG. 13A includes an additional cap member 1006 to form a sealed structure around the white light source on the base member 1001. The cap member 1006 can be soldered, brazed, welded, or glue to the base. The cap member 1006 has a transparent window 1007 configured to allow the emitted white light to pass to the outside environment where it can be harnessed in application. The sealing type can be an environmental seal or a hermetic seal, and in an example the sealed package is backfilled with a nitrogen gas or a combination of a nitrogen gas and an oxygen gas. Optionally, the window 1007 and cap member 1006 are joined using epoxy, glue, metal solder, glass frit sealing and friction welding among other bonding techniques appropriate for the window material. Optionally, the cap member 1006 is either crimped onto the header of the base member 1001 or sealed in place using epoxy, glue, metal solder, glass frit sealing and friction welding among other bonding techniques appropriate for the cap material such that a hermetic seal is formed.

The laser devices are configured such that they illuminate the wavelength converting element 1004 and any non-converted pump light is transmitted through the wavelength converting element 1004 and exits the canister through the window 1007 of the cap member 1006. Down-converted light emitted by the wavelength converting element is similarly emitted from the TO canister through the window 1007.

Figure 13B:
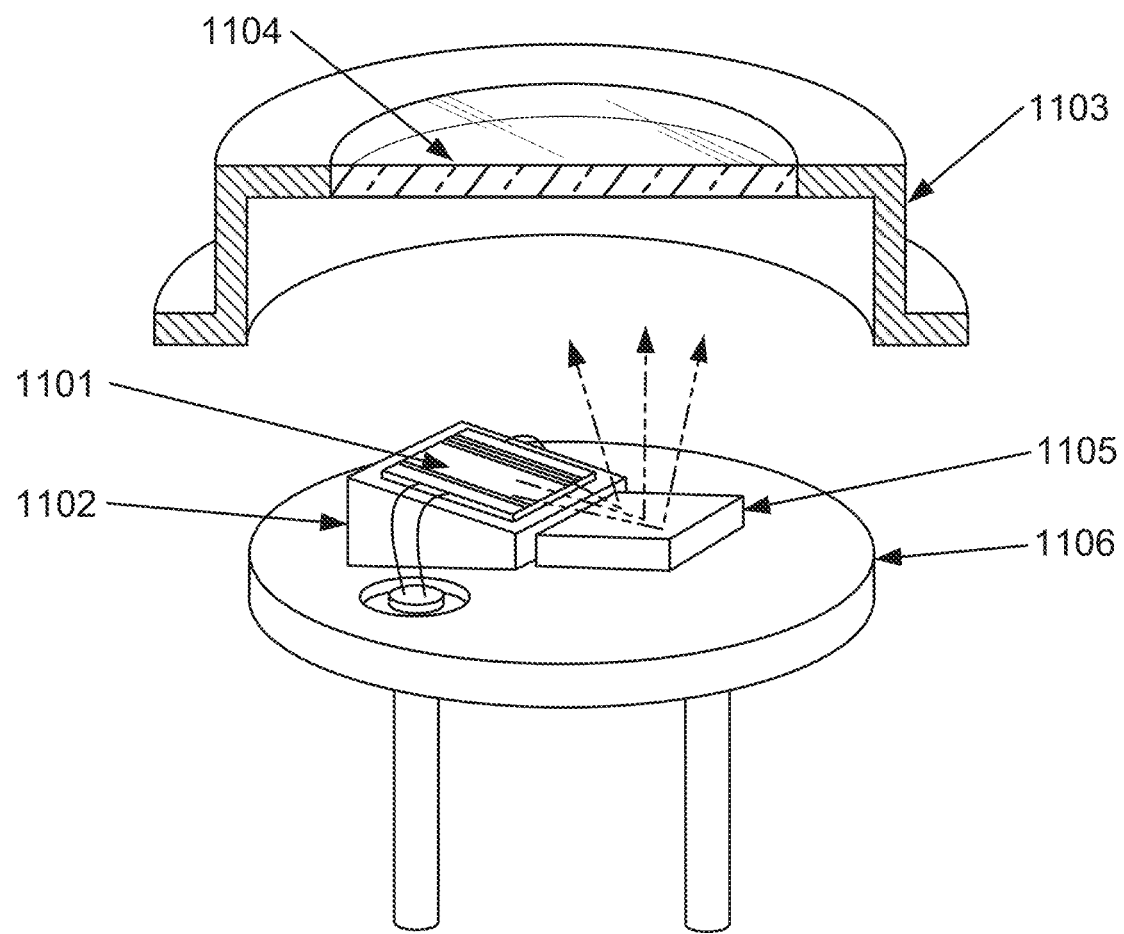
FIG. 13B is a schematic diagram of a laser based white light source operating in reflection mode and housed in a TO canister style package according to another embodiment of the present invention.

In an embodiment, the CPoS light source package is a TO canister with a window that transmits all or some of the pump and down-converted light and the wavelength converting element is illuminated in a reflection mode. FIG. 13B is a schematic diagram of a laser based white light source operating in reflection mode and housed in a TO canister style package according to another embodiment of the present invention. The canister base consists of a header 1106, wedge shaped member 1102 and electrically isolated pins that pass-through the header. The laser devices 1101 and the wavelength converting element 1105 are mounted to the wedge shaped member 1102 and pedestal, respectively, using a thermally conductive bonding media such as silver epoxy or with a solder material, preferably chosen from one or more of AuSn, AgCuSn, PbSn, or In. The package is sealed with a cap 1103 which is fitted with a transparent window 1104. The window 1104 and cap 1103 are joined using epoxy, glue, metal solder, glass frit sealing and friction welding among other bonding techniques appropriate for the window material. The cap 1103 is either crimped onto the header 1106 or sealed in place using epoxy, glue, metal solder, glass frit sealing and friction welding among other bonding techniques appropriate for the cap material such that a hermetic seal is formed. The laser devices are configured such that they illuminate the wavelength converting element 1105 and any non-converted pump light is reflected or scattered from the wavelength converting element 1105 and exits the canister through the cap window 1104. Down-converted light emitted by the wavelength converting element 1105 is similarly emitted from the canister through the window 1104.

Figure 13C:
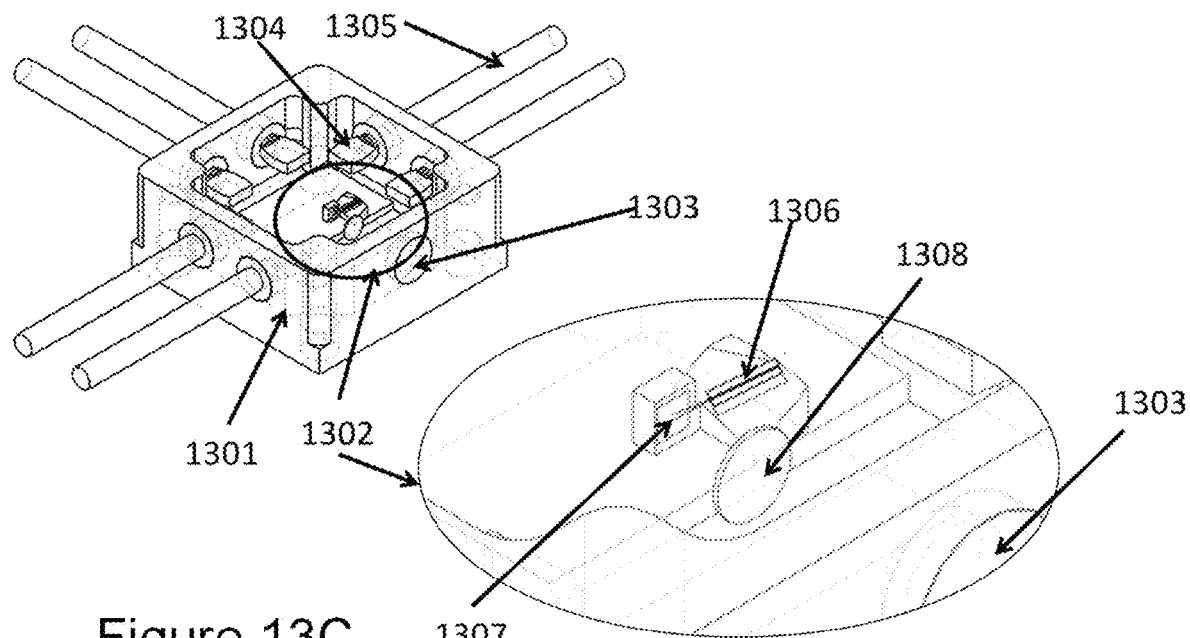
FIG. 13C is a schematic diagram of a laser based white light source operating in reflection mode and housed in a butterfly-like style package according to another embodiment of the present invention.

In another embodiment, a reflective mode integrated white light source is configured in a flat type package with a lens member to create a collimated white beam as illustrated in FIG. 13C. Referring to the FIG. 13C, the flat type package has a base or housing member 1301 with a collimated white light source 1302 mounted to the base and configured to create a collimated white beam to exit a window 1303 configured in the side of the base or housing member. The mounting to the base or housing can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/m-K and electrical conductivity of about 16 μΩcm whereas pressureless sintered Ag can have a thermal conductivity of about 125 W/m-K and electrical conductivity of about 4 μΩcm, or pressured sintered Ag can have a thermal conductivity of about 250 W/m-K and electrical conductivity of about 2.5 μΩcm. Due to the extreme change in melt temperature from paste to sintered form, (260° C.-900° C.), processes can avoid thermal load restrictions on downstream processes, allowing completed devices to have very good and consistent bonds throughout. Electrical connections to the white light source can be made with wire bonds to the feedthroughs 1304 that are electrically coupled to external pins 1305. In this example, the collimated reflective mode white light source 1302 includes the laser diode 1306, the phosphor wavelength converter 1307 configured to accept the laser beam, and a collimating lens such as an aspheric lens 1308 configured in front of the phosphor to collect the emitted white light and form a collimated beam. The collimated beam is directed toward the window 1303 wherein the window region is formed from a transparent material. The transparent material can be a glass, quartz, sapphire, silicon carbide, diamond, plastic, or any suitable transparent material. The external pins 1305 are electrically coupled to a power source to electrify the white light source and generate white light emission. As seen in the FIG. 13C, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, FIG. 13C is merely an example and is intended to illustrate one possible configuration of sealing a white light source.

Figure 13D:
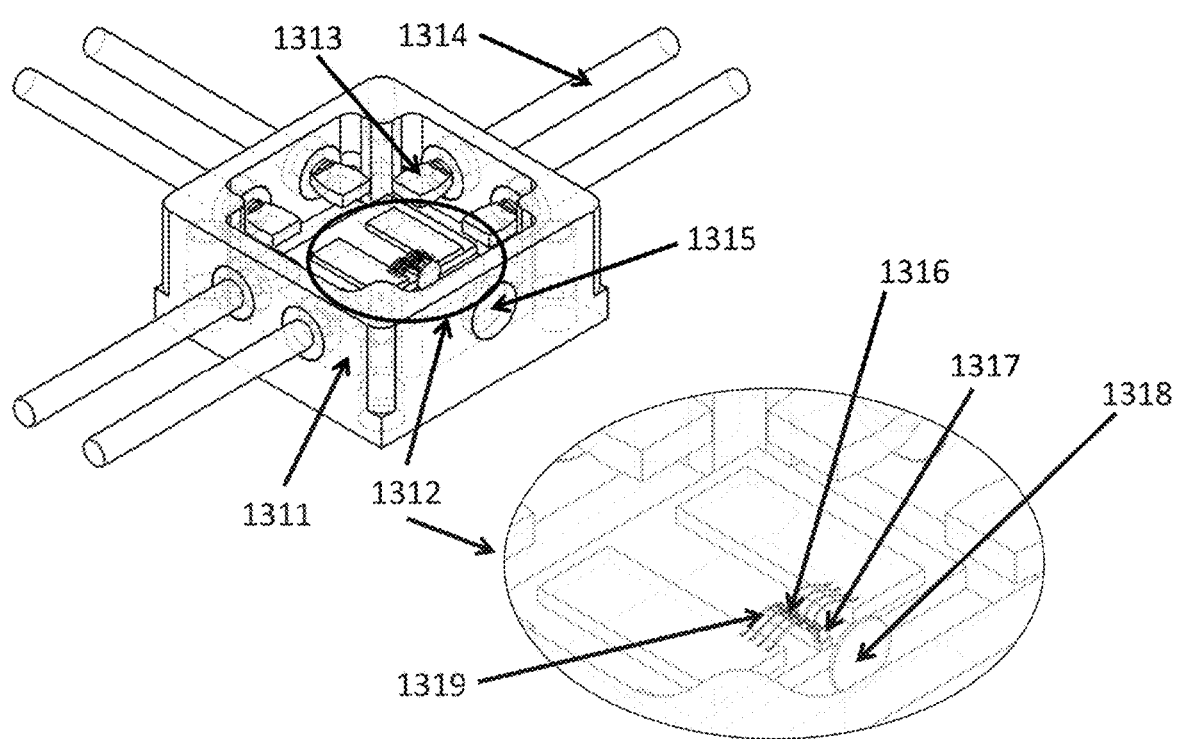
FIG. 13D is a schematic diagram of a laser based white light source operating in transmission mode and housed in a butterfly-like style package according to another embodiment of the present invention.

In one embodiment according to the present invention, a transmissive mode integrated white light source is configured in a flat type package with a lens member to create a collimated white beam as illustrated in FIG. 13D. Referring to the FIG. 13D, the flat type package has a base or housing member 1311 with a collimated white light source 1312 mounted to the base and configured to create a collimated white beam to exit a window 1313 configured in the side of the base or housing member. The mounting to the base or housing can be accomplished using a soldering or gluing technique such as using AuSn solders, SAC solders such as SAC305, lead containing solder, or indium, but can be others. In an alternative embodiment sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/m-K and electrical conductivity of about 16 $\mu\Omega$cm whereas pressureless sintered Ag can have a thermal conductivity of about 125 W/m-K and electrical conductivity of about 4 $\mu\Omega$cm, or pressured sintered Ag can have a thermal conductivity of about 250 W/m-K and electrical conductivity of about 2.5 $\mu\Omega$cm. Due to the extreme change in melt temperature from paste to sintered form, (260° C.-900° C.), processes can avoid thermal load restrictions on downstream processes, allowing completed devices to have very good and consistent bonds throughout. Electrical connections to the white light source can be made with wire bonds to the feedthroughs 1313 that are electrically coupled to external pins 1314. In this example, the collimated transmissive mode white light source 1312 includes the laser diode 1316, the phosphor wavelength converter 1317 configured to accept the laser beam, and a collimating lens such as an aspheric lens 1318 configured in front of the phosphor to collect the emitted white light and form a collimated beam. The collimated beam is directed toward the window 1315 wherein the window region is formed from a transparent material. The transparent material can be a glass, quartz, sapphire, silicon carbide, diamond, plastic, or any suitable transparent material. The external pins 1314 are electrically coupled to a power source to electrify the white light source and generate white light emission. Referring to the FIG. 13D, any number of pins can be included on the flat pack. In this example there are 6 pins and a typical laser diode driver only requires 2 pins, one for the anode and one for the cathode. Thus, the extra pins can be used for additional elements such as safety features like photodiodes or thermistors to monitor and help control temperature. Of course, FIG. 13D is merely an example and is intended to illustrate one possible configuration of sealing a white light source.

In another example, the package can be in a butterfly package type. The butterfly package can either have a window provided in one or more of sides, bottom, and top which transmits the pump and down-converted light. In another example, the laser or SLED pump light source is co-packaged on a common substrate along with the wavelength converting element. A shaped member may be provided separating either the pump light source or the wavelength converting element from the common substrate such that the pump light is incident on the wavelength converting element at some angles which is not parallel to the surface normal of the wavelength covering member. The package can also contain other optical, mechanical and electrical elements. In a specific embodiment, the butterfly package contains lenses for collimating the light emitted by the one or more laser devices. In a specific embodiment, the butterfly package contains one or more MEMS mirrors capable of rotating in one or more axes for directing the laser light.

There are several configurations that enable a remote pumping of phosphor material using one or more laser diode excitation sources. In an embodiment one or more laser diodes are remotely coupled to one or more phosphor members with a free-space optics configuration. That is, at least part of the optical path from the emission of the laser diode to the phosphor member is comprised of a free-space optics setup. In such a free-space optics configuration the optical beam from the laser diode may be shaped using optical elements such as collimating lens including a fast axis collimator, slow axis collimator, aspheric lens, ball lens, or other elements such as glass rods. In other embodiments of a free-space optical pumping the beam may not be shaped and simply directly coupled to the phosphor. In another embodiment a waveguide element is used to couple the optical excitation power from the one or more laser diodes to the phosphor member. The waveguide element includes one or more materials selected from Si, SiN, GaN, GaInP, Oxides, or others.

In another embodiment, an optical fiber is used as the waveguide element wherein on one end of the fiber the electromagnetic radiation from the one or more laser diodes is in-coupled to enter the fiber and on the other end of the fiber the electromagnetic radiation is out-coupled to exit the fiber wherein it is then incident on the phosphor member. The optical fiber could be comprised of a glass material such as silica, a polymer material, or other, and could have a length ranging from 100 $\mu$m to about 100 m or greater.

In alternative examples, the waveguide element could consist of glass rods, optical elements, specialized waveguide architectures such as silicon photonics devices.

Figure 14:
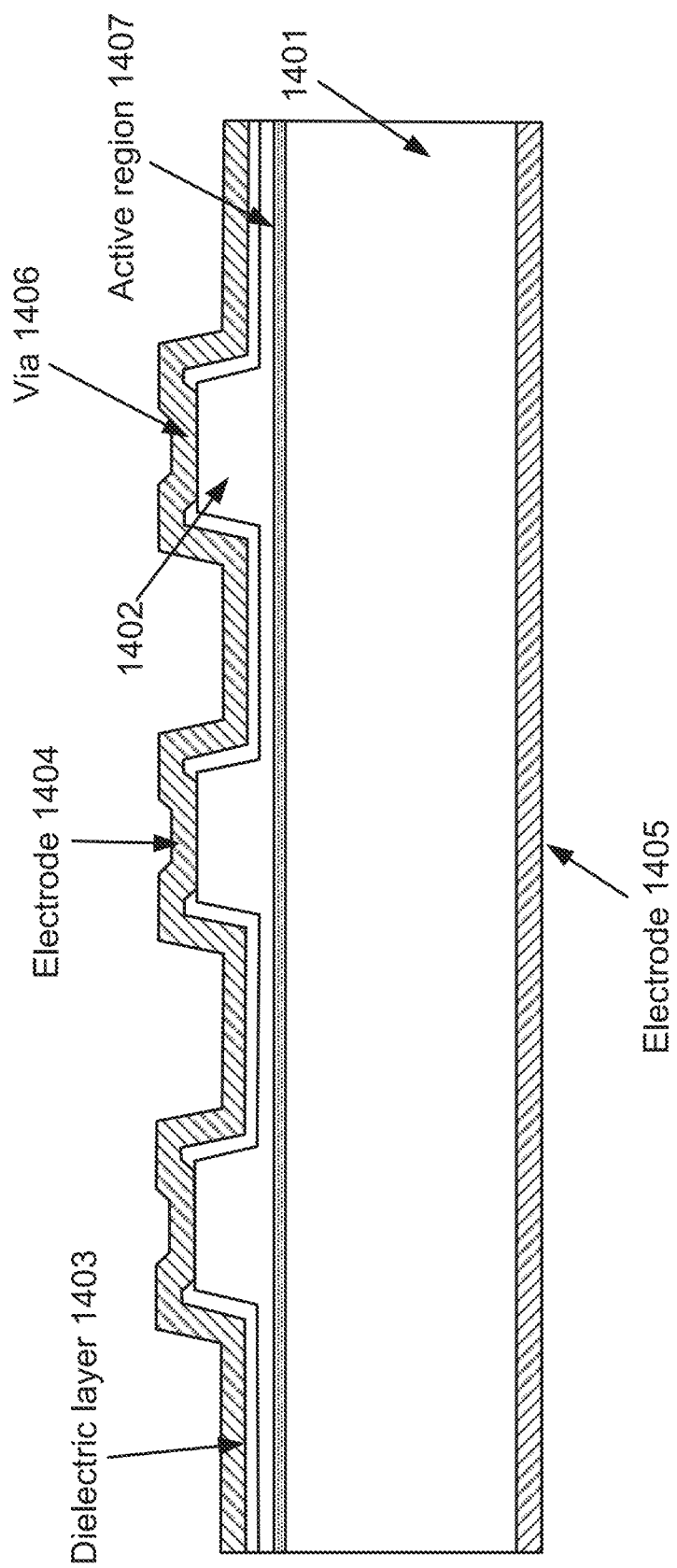
FIG. 14 is a simplified diagram illustrating a front view of a laser device with multiple cavity members according to an embodiment of the present invention.

FIG. 14 is a simplified diagram illustrating a front view of a laser device with multiple cavity members. Referring to FIG. 14, an active region 1407 can be seen as positioned in the substrate 1401. The cavity member 1402 as shown includes a via 306. Vias are provided on the cavity members and opened in a dielectric layer 1403, such as silicon dioxide. The top of the cavity members with vias can be seen as laser ridges, which expose electrode 1404 for an electrical contact. The electrode 1404 includes p-type electrode. In a specific embodiment, a common p-type electrode is deposited over the cavity members and dielectric layer 1403.

The cavity members are electrically coupled to each other by the electrode 1404. The laser diodes, each having an electrical contact through its cavity member, share a common n-side electrode. Depending on the application, the n-side electrode can be electrically coupled to the cavity members in different configurations. In a preferred embodiment, the common n-side electrode is electrically coupled to the bottom side of the substrate. In certain embodiments, n-contact is on the top of the substrate, and the connection is formed by etching deep down into the substrate from the top and then depositing metal contacts. For example, laser diodes are electrically coupled to one another in a parallel configuration. In this configuration, when current is applied to the electrodes, all laser cavities can be pumped relatively equally. Further, since the ridge widths will be relatively narrow in the 1.0 to 5.0 $\mu$m range, the center of the cavity member will be in close vicinity to the edges of the ridge (e.g., via) such that current crowding or non-uniform injection will be mitigated.

It is to be appreciated that the laser device with multiple cavity members has an effective ridge width of n×w, which could easily approach the width of conventional high power lasers having a width in the 10 to 50 µm range. Typical lengths of this multi-stripe laser could range from 400 µm to 2000 µm, but could be as much as 3000 µm. The laser device illustrated in FIG. 14 has a wide range of applications. For example, the laser device can be coupled to a power source and operate at a power level of 0.5 to 10 W. In certain applications, the power source is specifically configured to operate at a power level of greater than 10 W. The operating voltage of the laser device can be less than 5 V, 5.5 V, 6 V, 6.5 V, 7 V, and other voltages. In various embodiments, the wall plug efficiency (e.g., total electrical-to-optical power efficiency) can be 15% or greater, 20% or greater, 25% or greater, 30% or greater, 35% or greater.

Figure 15:
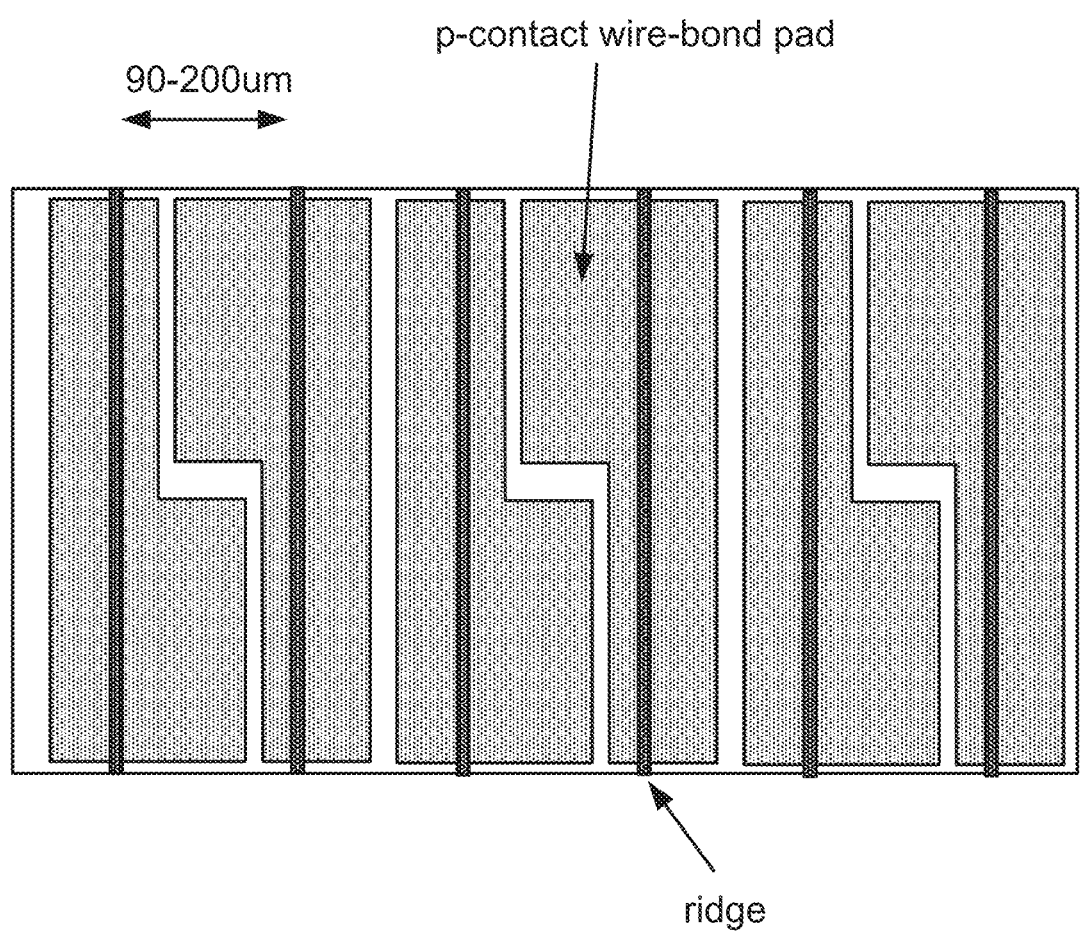
FIG. 15 is a simplified diagram illustrating an individually addressable laser package according to an embodiment of the present invention.

FIG. 15 is a simplified diagram illustrating an individually addressable laser package according to an embodiment of the present invention. The laser bar includes a number of emitters separated by ridge structures. Each of the emitter is characterized by a width of about 90-200 µm, but it is to be understood that other dimensions are possible as well. Each of the laser emitters includes a pad for p-contact wire bond. For example, electrodes can be individually coupled to the emitters so that it is possible to selectively turning a emitter on and off. The individually addressable configuration shown in the FIG. 15 provides numerous benefits. For example, if a laser bar having multiple emitters is not individually addressable, laser bar yield during manufacturing can be a problem, since many individual laser devices need to be good in order for the bar to pass, and that means laser bar yield will be lower than individual emitter yield. In addition, setting up the laser bar with single emitter addressability makes it possible to screen each emitter. In a certain embodiments, a control module is electrically coupled to the laser for individually controlling devices of the laser bar.

FIG. 16 is a simplified diagram illustrating laser bars configured with an optical combiner according to embodiments of the present invention. As shown, the diagram includes a package or enclosure for multiple emitters. Each of the devices is configured on a single ceramic or multiple chips on a ceramic, which are disposed on common heat sink. As shown, the package includes all free optics coupling, collimators, mirrors, spatially or polarization multiplexed for free space output or refocused in a fiber or other waveguide medium. As an example, the package has a low profile and may include a flat pack ceramic multilayer or single layer. The layer may include a copper, a copper tungsten base such as butterfly package or covered CT mount, Q-mount, or others. In a specific embodiment, the laser devices are soldered on CTE matched material with low thermal resistance (e.g., AlN, diamond, diamond compound) and forms a sub-assembled chip on ceramics. The sub-assembled chip is then assembled together on a second material with low thermal resistance such as copper including, for example, active cooling (i.e., simple water channels or micro channels), or forming directly the base of the package equipped with all connections such as pins. The flatpack is equipped with an optical interface such as window, free space optics, connector or fiber to guide the light generated and a cover environmentally protective.

Figure 17:
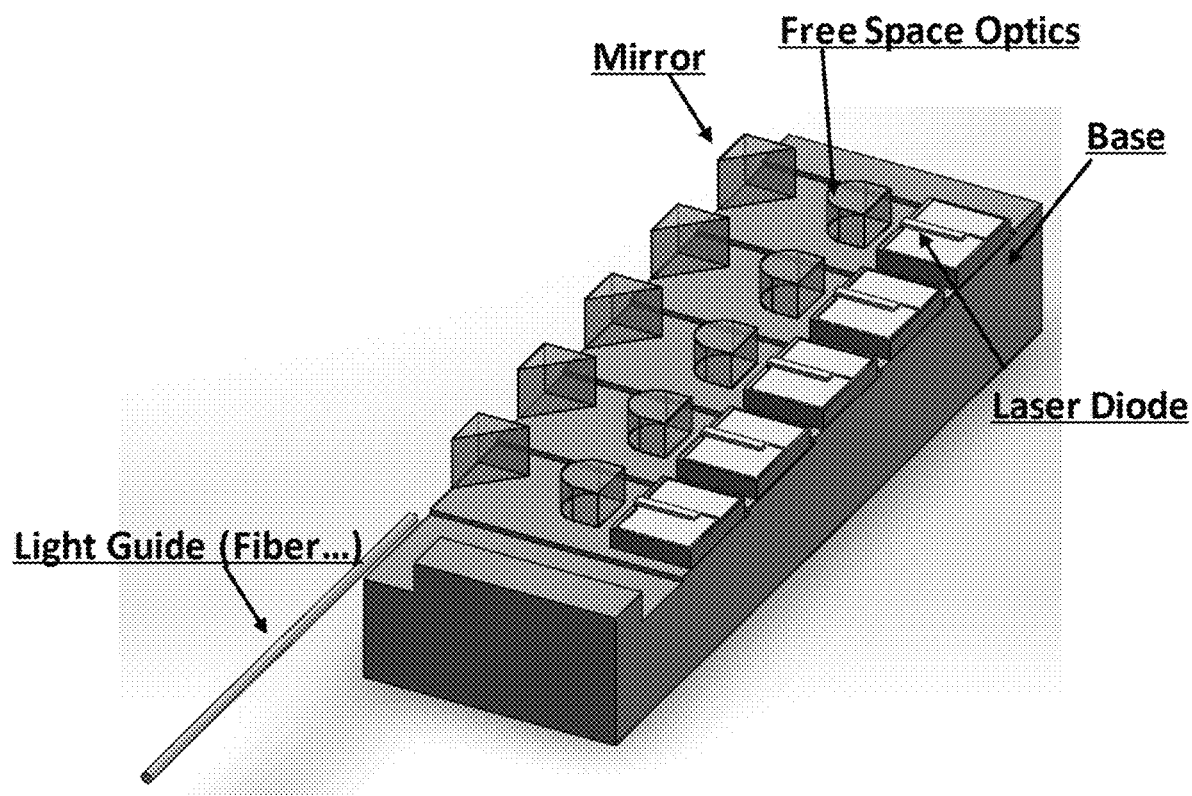
FIG. 17 is a schematic of a free space mirror based laser combiner according to an example of the present invention.

FIG. 17 is an example of a free-space mirror based laser combiner. Individual laser beams are first collimated through free-space optics such as fast axis collimating (FAC) and slow axis collimating (SAC) lenses. Next the collimated laser beams are incident on turning mirrors to change the direction of the laser beams by 90 degrees. This is done for an array of laser diode beams which are combined into one single beam and then coupled into the light guide such as a fiber.

Figure 18A:
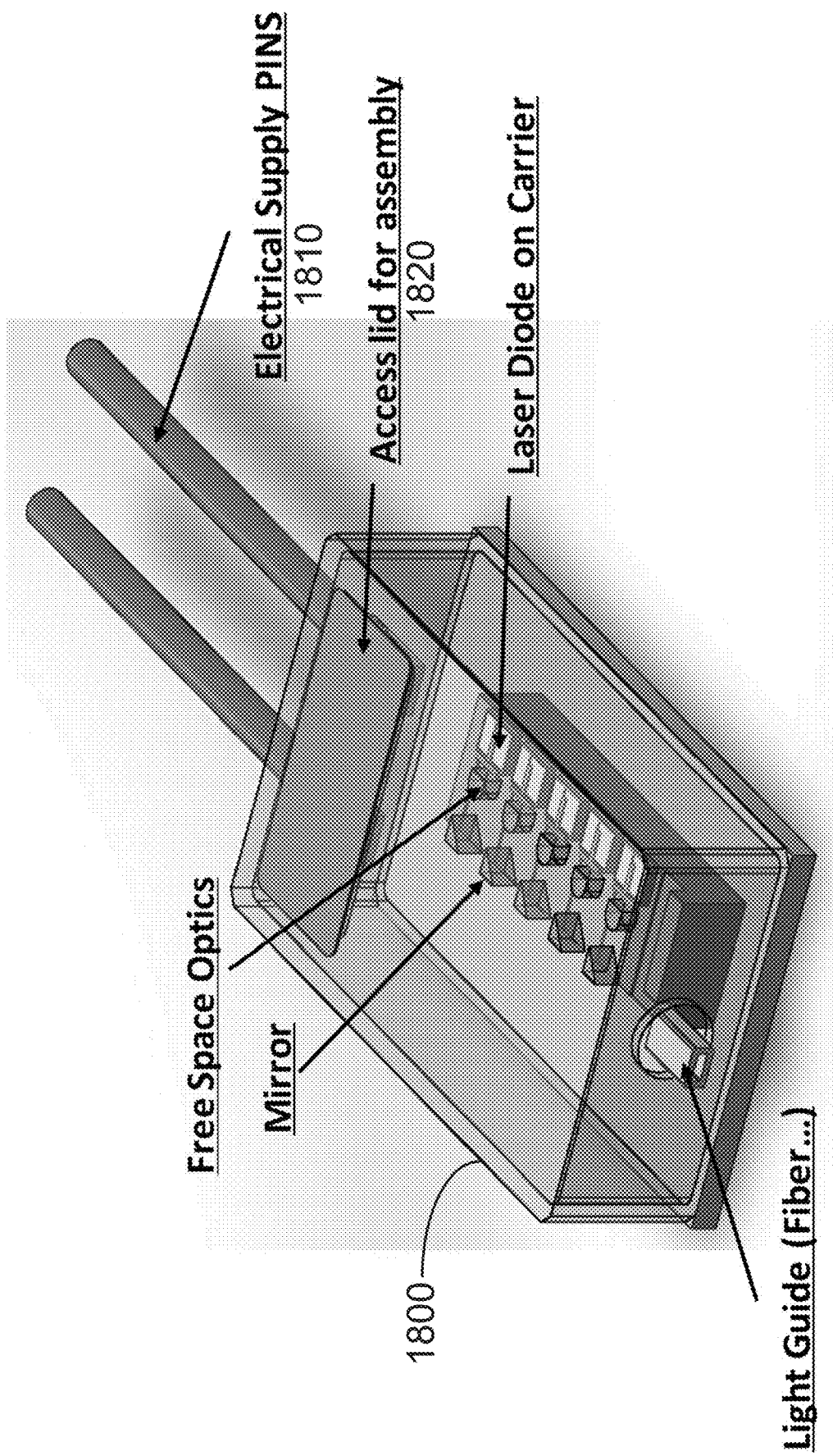
FIG. 18A is a schematic of an enclosed free space laser module according to an example of the present invention.

FIG. 18A is an example of enclosed free space laser module. A case 1800 is used for assembling the free-space mirror based laser combiner of FIG. 17. The laser module includes two electrical supply pins 1810 for providing driving voltages for the laser diodes. The case 1800 includes a hole for a fiber to couple with the light guide output combined from all laser diodes through the series of mirrors. An access lid 1820 is designed for easy access of optical elements in the assembly. A compact plug-and-play design provides a lot of flexibilities and ease of use.

Figure 18B:
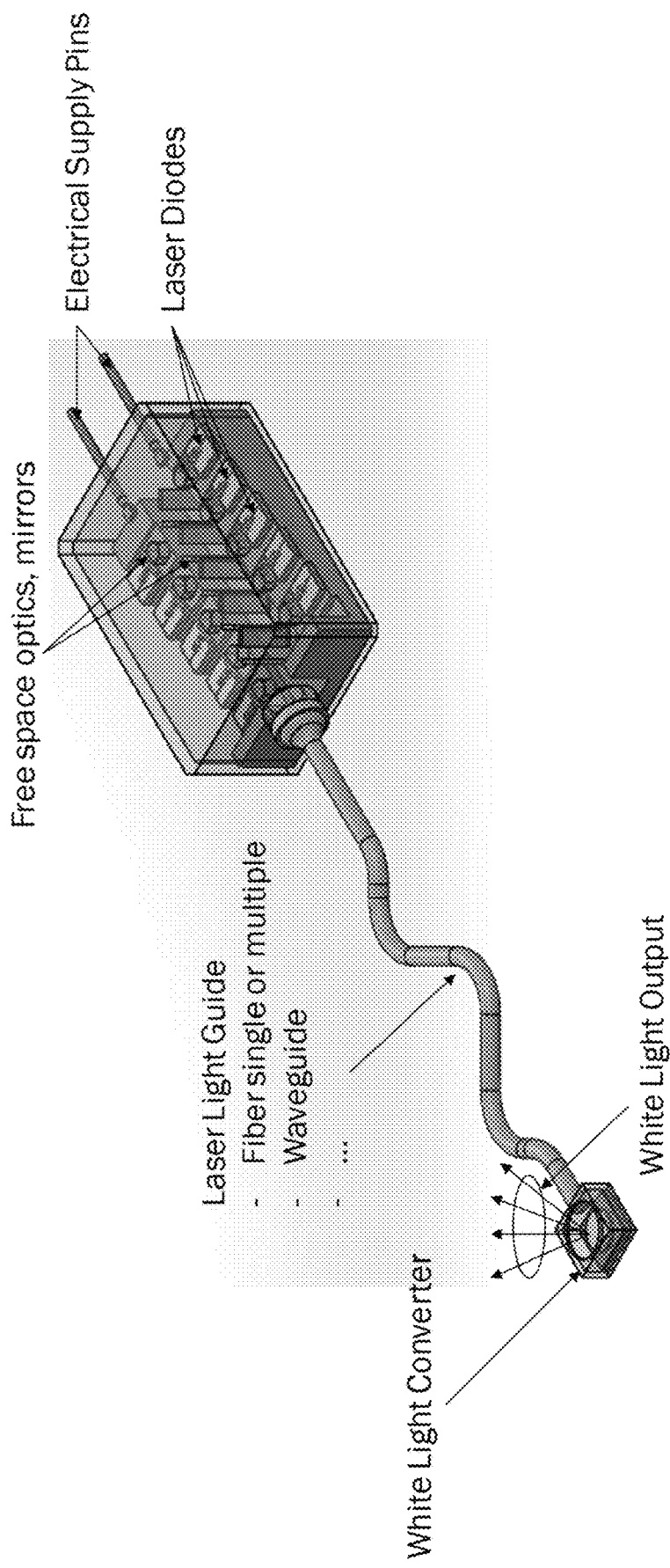
FIG. 18B is a schematic of an enclosed free space multi-chip laser module with an extended delivery fiber plus phosphor converter according to an example of the present invention.

FIG. 18B is a schematic of an enclosed free space multi-chip laser module with an extended delivery fiber plus phosphor converter according to an example of the present invention. As shown, the enclosed free space multi-chip laser module is substantially similar to the one shown in FIG. 18A to produce a laser light beam in violet or blue light spectrum. The multiple laser chips in the package provide substantially high intensity for the light source that is desired for many new applications. Additionally, an extended optical fiber with one end is coupled with the light guide output for further guiding the laser light beam to a desired distance for certain applications up to 100 m or greater. Optionally, the optical fiber can be also replaced by multiple waveguides built in a planar structure for integrating with silicon photonics devices. At the other end of the optical fiber, a phosphor material based wavelength converter may be disposed to receive the laser light, where the violet or blue color laser light is converted to white color light and emitted out through an aperture or collimation device. As a result, a white light source with small size, remote pump, and flexible setup is provided.

In another example, the package is a custom package made from one or more of plastic, metal, ceramics and composites.

In another embodiment, the laser devices are co-packaged on a common substrate along with the wavelength converting element. A shaped member may be provided separating either the laser devices or the wavelength converting element from the common substrate such that the pump light is incident on the wavelength converting element at some angle which is not parallel to the surface normal of the wavelength covering member. Transmission mode configurations are possible, where the laser light is incident on a side of the wavelength converting element not facing the package aperture. The package can also contain other optical, mechanical and electrical elements.

In an embodiment, the common substrate is a solid material with thermal conductivity greater than 100 W/m-K. In an example, the common substrate is preferably a solid material with thermal conductivity greater than 200 W/m-K. In an example, the common substrate is preferably a solid material with thermal conductivity greater than 400 W/m-K. In an example, the common substrate is preferably a solid material with electrical insulator with electrical resistivity greater than $1\times10^6$ Ωcm. In an example, the common substrate is preferably a solid material with thin film material providing electrical $1\times10^6$ Ωcm. In an example, the common substrate selected from one or more of $Al_2O_3$, AlN, SiC, BeO and diamond. In an example, the common substrate is preferably comprised of crystalline SiC. In an example, the common substrate is preferably comprised of crystalline SiC with a thin film of $Si_3N_4$ deposited onto the top surface. In an example, the common substrate contains metal traces providing electrically conductive connections between the one or more laser diodes. In an example, the common substrate contains metal traces providing thermally conductive connections between the one or more laser diodes and the common substrate.

In an embodiment, the common substrate is a composite structure comprised by a plurality or layers or regions of differing composition or electrical conductivity. In an example, the common substrate is a metal-core printed circuit board comprised by a core layer of aluminum or copper surrounded by layers of insulating plastic. Through vias, solder masks and solder pads may be provided. In an example, the common substrate is a ceramic substrate comprised by a ceramic core plate clad in patterned metallic pads for bonding and electrical contact. The ceramic substrate may contain metal filled vias for providing electrical communication between both faces of the ceramic plate. In an example, the common substrate consists of a metal core or slug surrounded by an insulating material such as plastic or ceramic. The surrounding insulating material may contain through vias for electrical communication between the front and back faces of the substrate. The insulating material may also have metallic or otherwise conducting pads patterned on it for wire-bonding.

In an embodiment, the one or more laser diodes are attached to the common substrate with a solder material. In an example, the one or more laser diodes are attached to the metal traces on the common substrate with a solder material, preferably chosen from one or more of AuSn, AgCuSn, PbSn, or In.

In an embodiment, the wavelength conversion material is attached to the common substrate with a solder material. In an example, the wavelength conversion material is attached to the metal traces on the common substrate with a solder material, preferably chosen from one or more of AuSn, AgCuSn, PbSn, or In.

In an example, the wavelength conversion element contains an optically reflective material interposed between the wavelength conversion element and the thermally conductive connection to the common substrate.

In an embodiment, the optically reflective material interposed between the wavelength conversion element and the thermally conductive connection to the common substrate has a reflectivity value of greater than 50%. In an embodiment the optically reflective material interposed between the wavelength conversion element and the thermally conductive connection to the common substrate has a reflectivity value of greater than 80%. In an example, the optically reflective material interposed between the wavelength conversion element and the thermally conductive connection to the common substrate has a reflectivity value of greater than 90%. In an example, optical beam shaping elements are placed between the laser diodes and the wavelength conversion element.

In an embodiment, the wavelength conversion element contains geometrical features aligned to each of the one or more laser diodes. In an example, the wavelength conversion element further contains an optically reflective material on the predominate portion of the edges perpendicular to the common substrate and one or more laser diodes, and where the geometrical features aligned to each of the laser diodes does not contain an optically reflective material. In an example, the common substrate is optically transparent. In an example, the wavelength conversion element is partially attached to the transparent common substrate. In an example, the wavelength converted light is directed through the common substrate. In an example, the wavelength converter contains an optically reflective material on at least the top surface. In an example, the one or more laser diodes and the wavelength conversion element are contained within a sealing element to reduce the exposure to the ambient environment. In an example, the one or more laser diodes and the wavelength conversion element are contained within a sealing element to reduce the exposure to the ambient environment.

Figure 19A:
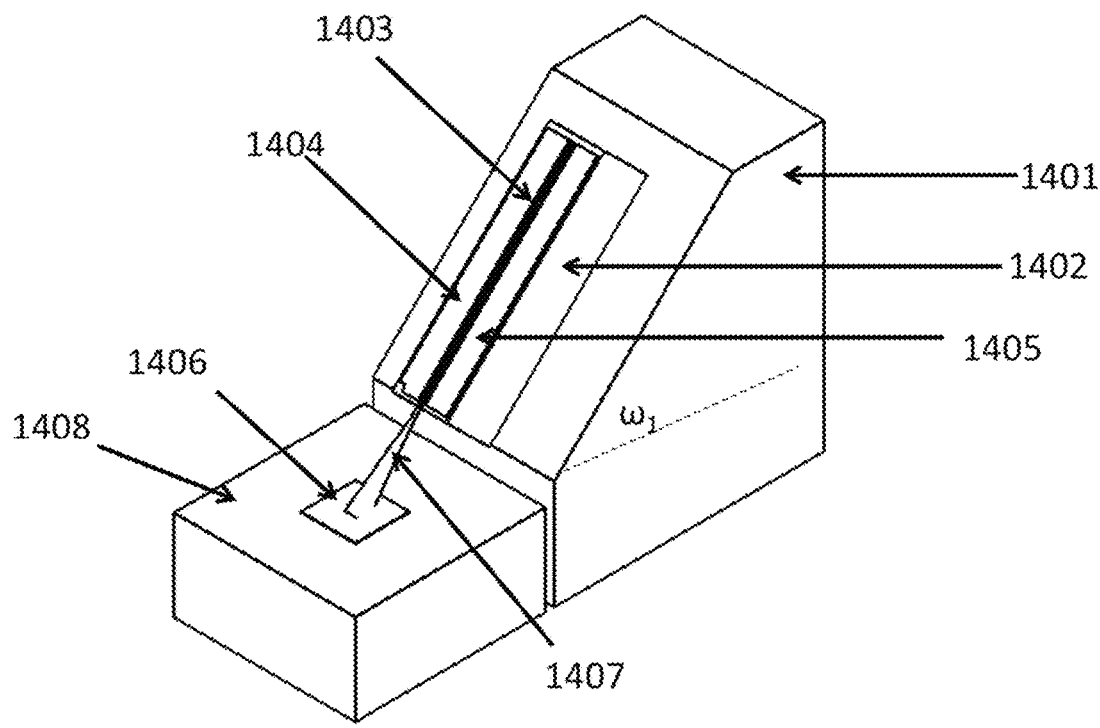
FIG. 19A is a schematic diagram of a laser based white light source operating in reflection mode according to an embodiment of the present invention.

FIG. 19A is a schematic diagram illustrating an off-axis reflective mode embodiment of an integrated laser-phosphor white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based white light device is comprised of a support member 1401 that serves as the support member for the laser diode CoS 1402 formed in transferred gallium and nitrogen containing epitaxial layers 1403. The phosphor material 1406 is mounted on a support member 1408 wherein the support members 1401 and 1408 would be attached to a common support member such as a surface in a package member such as a surface mount package. The laser diode or CoS is configured with electrodes 1404 and 1405 that may be formed with deposited metal layers and combination of metal layers including, but not limited to Au, Pd, Pt, Ni, Al, Ag titanium, or others such as transparent conductive oxides such as indium tin oxide. The laser beam output excites the phosphor material 1406 positioned in front of the output laser facet. The electrodes 1404 and 1405 are configured for an electrical connection to an external power source such as a laser driver, a current source, or a voltage source. Wirebonds can be formed on the electrodes to couple electrical power to the laser diode device to generate a laser beam 1407 output from the laser diode and incident on the phosphor 1406. Of course this is merely an example of a configuration and there could be many variants on this embodiment including but not limited to different shape phosphors, different geometrical designs of the submount, support members, different orientations of the laser output beam with respect to the phosphor, different electrode and electrical designs, and others.

Figure 19B:
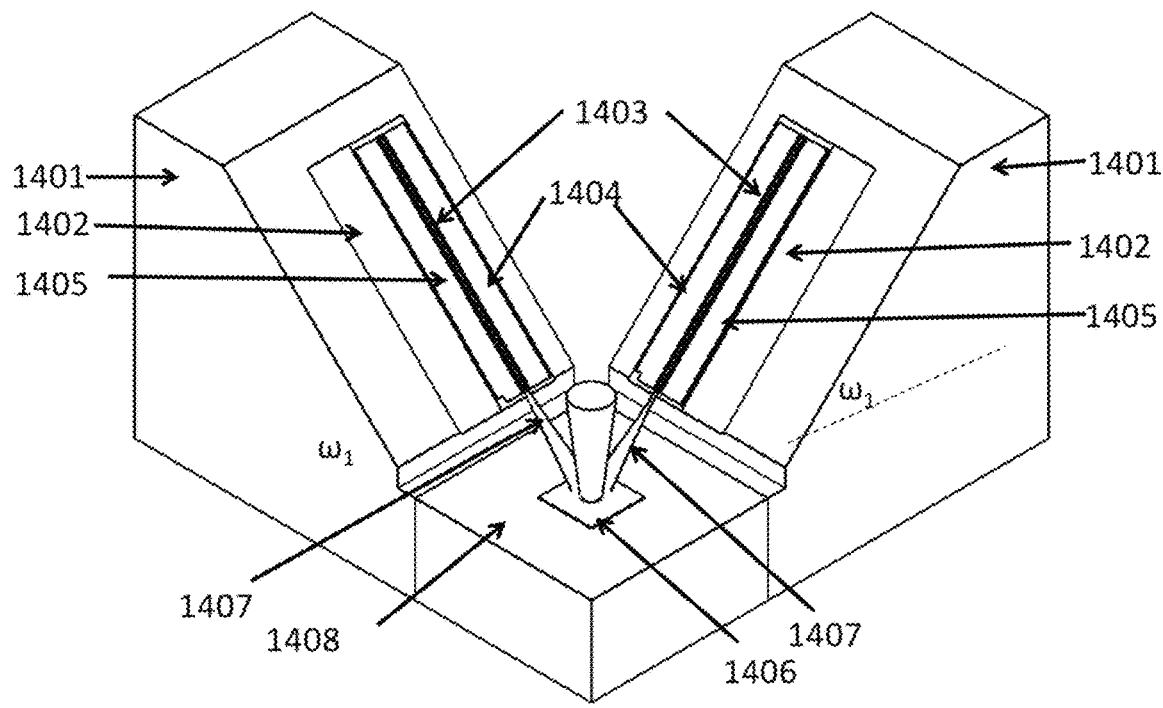
FIG. 19B is a schematic diagram of a laser based white light source operating in reflection mode according to another embodiment of the present invention.

FIG. 19B is a schematic diagram illustrating an off-axis reflective mode phosphor with two laser diode devices embodiment of an integrated laser-phosphor white light source according to the present invention. In this embodiment the gallium and nitrogen containing lift-off and transfer technique is deployed to fabricate a very small and compact submount member with the laser diode chip formed from transferred epitaxy layers. Further, in this example the phosphor is tilted with respect to the fast axis of the laser beam at an angle $\omega_1$. The laser based white light sources is comprised of two or more laser diodes including support members 1401 that serves as the support member for the two laser diodes 1402 formed in transferred gallium and nitrogen containing epitaxial layers 1403. The phosphor material 1406 is mounted on a support member 408 wherein the support members 1401 and 1408 would be attached to a common support member such as a surface in a package member such as a surface mount package. The laser diodes or CoS devices are configured with electrodes 1404 and 1405 that may be formed with deposited metal layers and combination of metal layers including, but not limited to Au, Pd, Pt, Ni, Al, Ag titanium, or others such as transparent conductive oxides such as indium tin oxide. The multiple laser beams 1407 excite the phosphor material 1406 positioned in front of the output laser facet.

Referring to FIG. 19B the laser diode excitation beams 1407 are rotated with respect to each other such that the fast axis of the first beam is aligned with the slow axis of the second beam to form a more circular excitation spot. The electrodes 1404 and 1405 are configured for an electrical connection to an external power source such as a laser driver, a current source, or a voltage source. Wirebonds can be formed on the electrodes to couple electrical power to the laser diode device to generate the multiple laser beams 1407 incident on the phosphor 1406. Of course this is merely an example of a configuration and there could be many variants on this embodiment including but not limited to more than two laser diodes such as three of four laser diodes, different shape phosphors, different geometrical designs of the submount, support members, different orientations of the laser output beam with respect to the phosphor, wiring the laser diodes in series or parallel, different electrode and electrical designs including individually addressable lasers, and others.

Figure 20A:
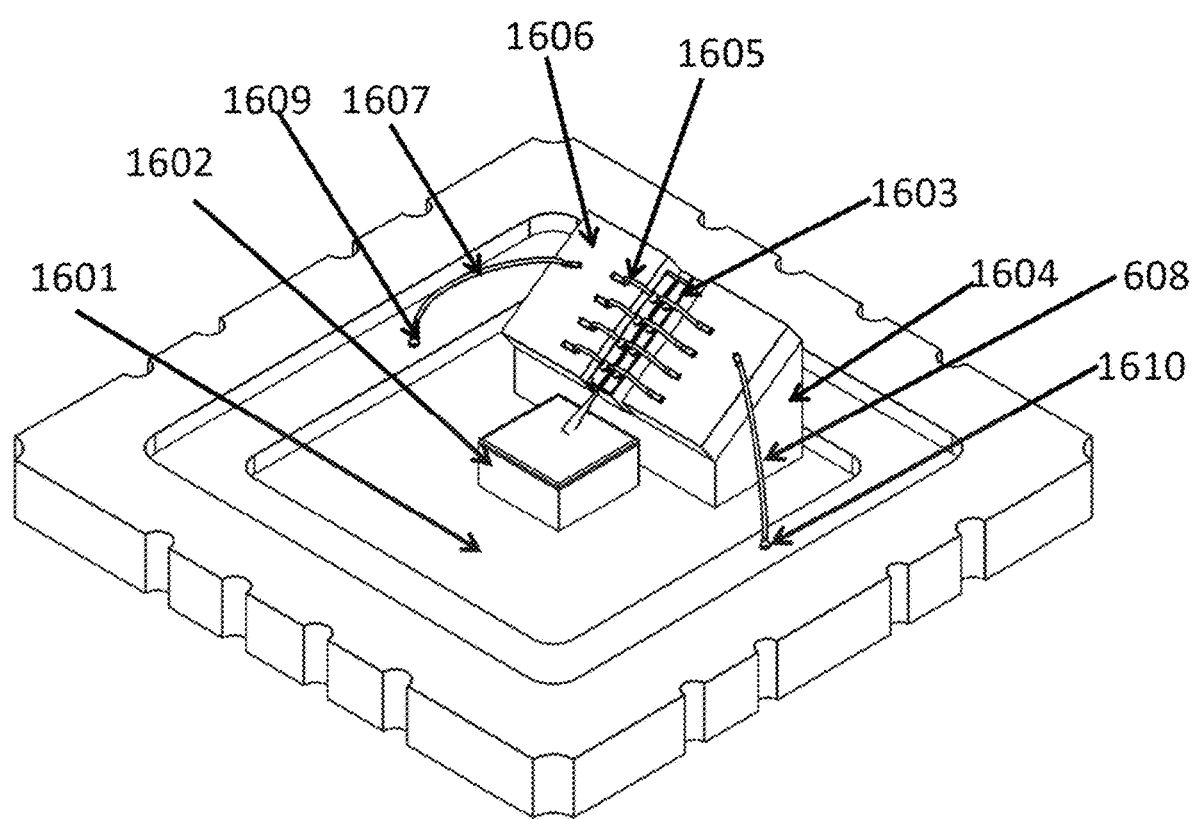
FIG. 20A is a schematic diagram of a laser based white light source operating in reflection mode in a surface mount package according to an embodiment of the present invention.

FIG. 20A is a schematic diagram of an exemplary laser based white light source operating in reflection mode and housed in a surface mount package according to an embodiment of the present invention. Referring to FIG. 20A, a reflective mode white light source is configured in a surface mount device (SMD) type package. The SMD package has a common support base member 1601. The reflective mode phosphor member 1602 is attached to the base member 1601. Optionally, an intermediate submount member may be included between the phosphor member 1602 and the base member 1601. The laser diode 1603 is mounted on an angled support member 1604, wherein the angled support member 1604 is attached to the base member 1601. The base member 1601 is configured to conduct heat away from the white light source and to a heat sink. The base member 1601 is comprised of a thermally conductive material such as copper, copper tungsten, aluminum, SiC, steel, diamond, composite diamond, AlN, sapphire, or other metals, ceramics, or semiconductors.

The mounting to the base member 1601 can be accomplished using a soldering or gluing technique such as using AuSn solders, SAC solders such as SAC305, lead containing solder, or indium, but can be others. Alternatively, sintered Ag pastes or films can be used for the attach process at the interface. Sintered Ag attach material can be dispensed or deposited using standard processing equipment and cycle temperatures with the added benefit of higher thermal conductivity and improved electrical conductivity. For example, AuSn has a thermal conductivity of about 50 W/m-K and electrical conductivity of about 16 $\mu\Omega$cm whereas pressureless sintered Ag can have a thermal conductivity of about 125 W/m-K and electrical conductivity of about 4 $\mu\Omega$cm, or pressured sintered Ag can have a thermal conductivity of about 250 W/m-K and electrical conductivity of about 2.5 $\mu\Omega$cm. Due to the extreme change in melt temperature from paste to sintered form, 260° C.-900° C., processes can avoid thermal load restrictions on downstream processes, allowing completed devices to have very good and consistent bonds throughout. The mounting joint could also be formed from thermally conductive glues, thermal epoxies such as silver epoxy, and other materials.

Electrical connections from the electrodes of the laser diode are made to using wirebonds 1605 to electrode members 1606. Wirebonds 1607 and 1608 are formed to internal feedthroughs 1609 and 1610. The feedthroughs are electrically coupled to external leads. The external leads can be electrically coupled to a power source to electrify the white light source and generate white light emission.

The top surface of the base member 1601 may be comprised of, coated with, or filled with a reflective layer to prevent or mitigate any losses relating from downward directed or reflected light. Moreover, all surfaces within the package including the laser diode and submount member may be enhanced for increased reflectivity to help improve the useful white light output.

In this configuration the white light source is not capped or sealed such that is exposed to the open environment. In some examples of this embodiment of the integrated white light source apparatus, an electrostatic discharge (ESD) protection element such as a transient voltage suppression (TVS) element is included. Of course, FIG. 20A is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 20B:
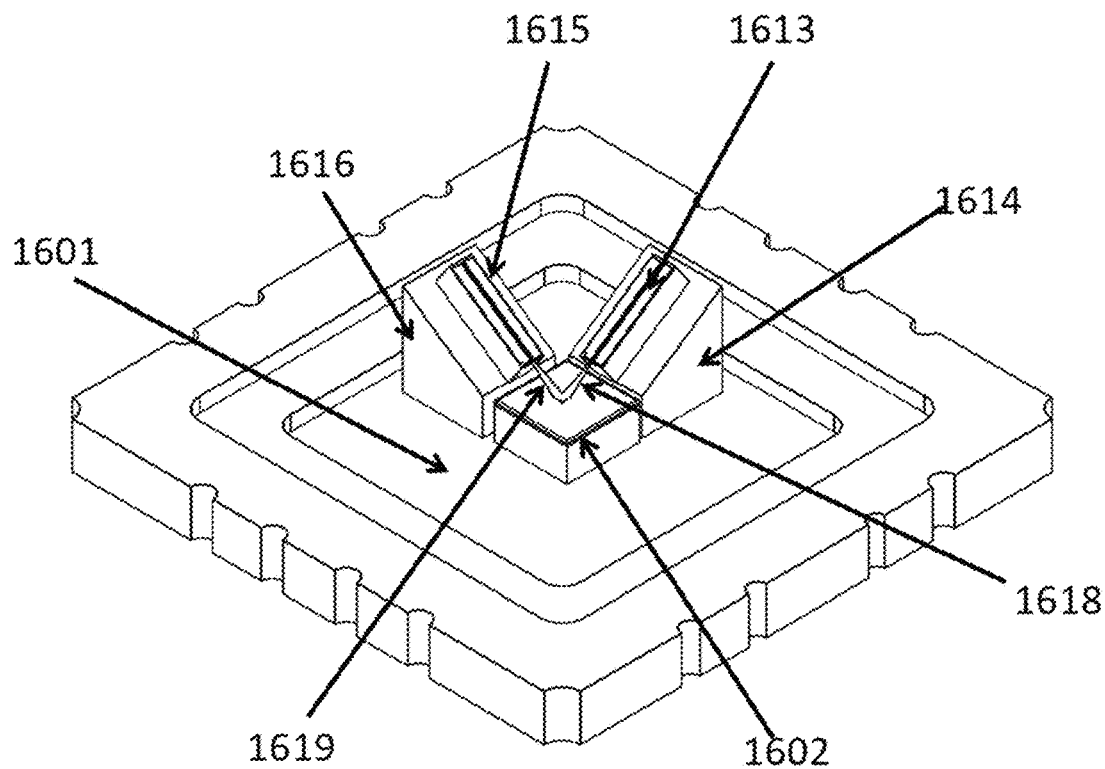
FIG. 20B is a schematic diagram of a laser based white light source operating in reflection mode in a surface mount package according to another embodiment of the present invention.

FIG. 20B is an alternative example of a packaged white light source including 2 laser diode chips according to the present invention. In this example, a reflective mode white light source is configured also in a SMD type package. The SMD package has a base member 1601 with the reflective mode phosphor member 1602 mounted on a support member or on a base member. A first laser diode device 1613 may be mounted on a first support member 1614 or a base member 1601. A second laser diode device 1615 may be mounted on a second support member 1616 or a base member 1601. The support members and base member are configured to conduct heat away from the phosphor member 1602 and laser diode devices 1613 and 1615.

The external leads can be electrically coupled to a power source to electrify the laser diode sources to emit a first laser beam 1618 from the first laser diode device 1613 and a second laser beam 1619 from a second laser diode device 1615. The laser beams are incident on the phosphor member 1602 to create an excitation spot and a white light emission. The laser beams are preferably overlapped on the phosphor member 1602 to create an optimized geometry and/or size excitation spot. For example, the laser beams from the first and second laser diodes are rotated by 90 degrees with respect to each other such that the slow axis of the first laser beam 1618 is aligned with the fast axis of the second laser beam 1619.

The top surface of the base member 1601 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an ESD protection element such as a TVS element is included. Of course, FIG. 20B is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

Figure 20C:
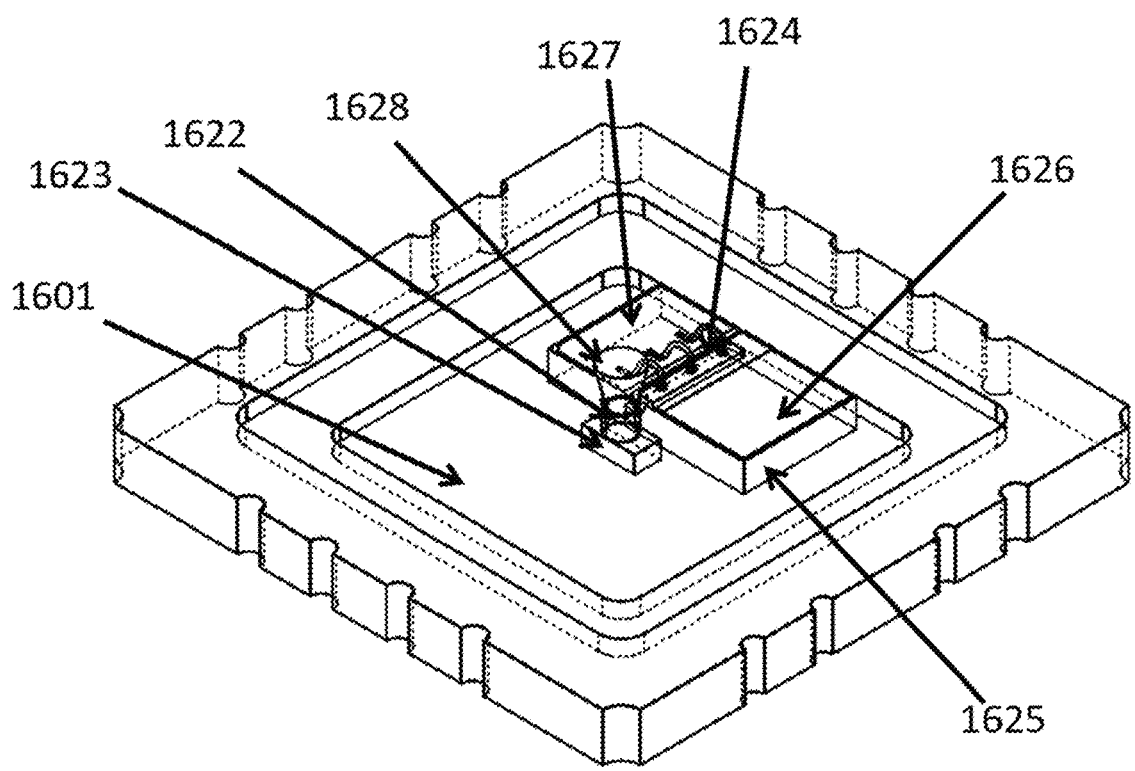
FIG. 20C is a schematic diagram of a laser based white light source operating with side-pumped phosphor in a surface mount package according to another embodiment of the present invention.

FIG. 20C is an alternative example of a packaged white light source according to the present invention. In this example, a reflective mode white light source is configured also in a SMD type package. The SMD package has a base member 1601 serving as a common support member for a side-pumped phosphor member 1622 mounted on a submount or support member 1623 and a laser diode device 1624 mounted on a submount or support member 1625. In some embodiments, the laser diode 1624 and or the phosphor member 1622 may be mounted directly to the base member 1601 of the package. The support members and base member 1601 are configured to conduct heat away from the phosphor member 1622 and laser diode device 1624. The base member 1601 is substantially the same type as that in FIG. 20A and FIG. 20B in the SMD type package.

Electrical connections from the p-electrode and n-electrode can be electrically coupled to 1626 and 1627 electrodes on a submount member 1625 which would then be coupled to internal feedthroughs in the package. The feedthroughs are electrically coupled to external leads. The external leads can be electrically coupled to a power supply source to electrify the laser diode and generate a laser beam incident on the side of the phosphor member 1622. The phosphor member 1622 may preferably be configured for primary white light emission 1628 from the top surface of the phosphor member 1622. The top surface of the base member 1601 may be comprised of, coated with, or filled with a reflective layer to prevent or mitigate any losses relating from downward directed or reflected light. Moreover, all surfaces within the package including the laser diode member and submount member may be enhanced for increased reflectivity to help improve the useful white light output. In this configuration the white light source is not capped or sealed such that is exposed to the open environment. In some examples of this embodiment of the integrated white light source apparatus, an ESD protection element such as a TVS element is included. Of course, the example is FIG. 31e is merely an example and is intended to illustrate one possible simple configuration of a surface mount packaged white light source. Specifically, since surface mount type packages are widely popular for LEDs and other devices and are available off the shelf they could be one option for a low cost and highly adaptable solution.

The white light sources shown in FIGS. 20A, 20B, and 20C can be enclosed in a number of ways to form a light engine. Optionally, the light engine is encapsulated in a molded epoxy or plastic cover (not shown). The molded cover may have a flat top or can be molded to have a curved or spherical surface to aid in light extraction. It is possible for the cover to be pre-molded and glued in place, or to be molded in place from liquid or gel precursors. Because a polymer cover or molded encapsulating material may absorb laser light or down converted light from the wavelength converting element there is a large risk that the encapsulating material will age due to heating and light absorption. When such a material ages, it tends to become more optically absorbing, leading to a runaway process that inevitably leads to device failure. In a laser based device, where the laser devices emit light with a very high brightness and optical flux, this aging effect is expected to be quite severe. It is preferred, then, for a polymer cover to be absent from the region near the emitting facets of the lasers as well as from the path of the laser beams between the laser devices and the wavelength converting element. Optionally, the molded cover does not contact the laser device nor the wavelength converting element nor does it intersect the laser light beams prior to their intersecting the wavelength converting element. Optionally, the molded cover overlays and is in contact with a part or majority of the laser devices and the wavelength converting element, but does not cover the emitting facet of the lasers nor the surface of the wavelength converting element, nor does it intersect the beam path of the laser light between the laser devices and the wavelength converting element. Optionally, the encapsulating material is molded over the device after wire bonding of the laser devices, and no air gaps or voids are included.

In another embodiment, the light engine is encapsulated using a rigid, member such as a ceramic or metal housing. For example, a stamped metal wall could be provided with dimensions close to those of the outer edge of the common substrate. The wall could be attached to the common substrate and an airtight seal formed using epoxy or another glue, metal solder, glass frit sealing and friction welding among other bonding techniques. The top edge of the wall could, for example, be sealed by attaching a transparent cover. The transparent cover may be composed of any transparent material, including silica-containing glass, sapphire, spinel, plastic, diamond and other various minerals. The cover may be attached to the wall using epoxy, glue, metal solder, glass frit sealing and friction welding among other bonding techniques appropriate for the cover material.

In some embodiments the enclosure may be fabricated directly on the common substrate using standard lithographic techniques similar to those used in processing of MEMS devices. Many light emitters such as laser diodes could be fabricated on the same common substrate and, once fabrication is complete, singulated in to separate devices using sawing, laser scribing or a like process.

In several preferred embodiments of the laser based smart lighting invention, the laser based light source is configured for communication. The communication could be intended for biological media such as humans such as pedestrians, consumers, athletes, police officers and other public servants, military, travelers, drivers, commuters, recreation activities, or other living things such as animals, plants, or other living objects. The communication could also be intended for objects such as cars or any type of auto including autonomous examples, airplanes, drones or other aircraft, which could be autonomous, or any wide range of objects such as street signs, roadways, tunnels, bridges, buildings, interior spaces in offices and residential and objects contained within, work areas, sports areas including arenas and fields, stadiums, recreational areas, and any other objects or areas. In some preferred embodiments the smart light source is used in Internet of Things (IoT), wherein the laser based smart light is used to communicate with objects such as household appliances (i.e., refrigerator, ovens, stove, etc), lighting, heating and cooling systems, electronics, furniture such as couches, chairs, tables, beds, dressers, etc., irrigation systems, security systems, audio systems, video systems, etc. Clearly, the laser based smart lights can be configured to communicate with computers, smart phones, tablets, smart watches, augmented reality (AR) components, virtual reality (VR) components, games including game consoles, televisions, and any other electronic devices.

According to some embodiments of the present invention, the laser light source can communicate with various methods. In one preferred method, the smart light is configured as a visible light communication (VLC) system such as a LiFi system wherein at least one spectral component of the electromagnetic radiation in the light source is modulated to encode data such that the light is transmitting data. In some examples, a portion of the visible spectrum is modulated and in other examples a non-visible source such as an infrared or ultraviolet source is included for communication. The modulation pattern or format could be a digital format or an analog format, and would be configured to be received by an object or device. In some embodiments, communication could be executed using a spatial patterning of the light emission from the laser based smart light system. In an embodiment, a micro-display is used to pixelate or pattern the light, which could be done in a rapid dynamic fashion to communicate continuously flowing information or wherein the pattern is periodically changed to a static pattern to communicate a static message that could be updated. Examples of communication could be to inform individuals or crowds about upcoming events, what is contained inside a store, special promotions, provide instructions, education, sales, and safety. In an alternative embodiment, the shape or divergence angle of the emission beam is changed to a spotlight from a diffuse light or vice versa using a micro-display or a tunable lens such as a liquid crystal lens. Examples of communication could be to direct an individual or crowd, to warn about dangers, educate, or promote. In yet another embodiment of laser light based communication, the color of the smart lighting system could be changed from a cool white to a warm white, or even to a single color such as red, green, blue, or yellow, etc.

In general, laser spectra full widths at half max (FWHM) are very narrow, with even high-power devices with many lateral modes participating in lasing having spectra less than 2 nm wide. Blue LEDs typically have FWHMs of 20 nm or more. The narrow width of laser and SLED spectra is advantageous in that very narrow notch filters can be used to separate the laser spectrum from that emitted by the phosphor. More importantly, such narrow spectra allow for a type of wavelength division multiplexing (WDM) where the VLC emitter is comprised by multiple laser sources illuminating a phosphor. The VLC emitter then emits a spectrum consisting of the broad phosphor emission plus the emission from the multiple lasers wherein the lasers could have slightly different wavelengths and be used as separate communication channels. As an example, the VLC receiver for such a VLC light engine could include multiple detectors, each with a "notch" or "band-pass" filter corresponding to the various wavelengths of light in the spectrum from the emitter. Each detector in the VLC receiver, then, collects light from a corresponding laser provided in the VLC light engine, and due to the narrowness of the laser light spectrum there is minimal interference between the laser sources and minimal loss of the laser power at the corresponding detector due to the notch-filters. Such a configuration is advantageous in that it increases the bandwidth of the VLC light engine proportionally to the number of laser devices. In other embodiments, a single detector can be used with a dynamic filtering function that sequentially tunes for each wavelength communication channel.

It is to be understood that in embodiments, the VLC light engine is not limited to a specific number of laser devices. In a specific embodiment, the light engine includes a single laser device acting as a "pump" light-source, and which is either a laser diode or SLED device emitting at a center wavelength between 390 nm and 480 nm. Herein, a "pump" light-source is a laser diode or SLED device that illuminates as wavelength converting element such that a part or all laser light from the laser diode or SLED device is converted into longer wavelength light by the wavelength converting element. The spectral width of the pump light-source is preferably less than 2 nm, though widths up to 20 nm would be acceptable. In another embodiment, the VLC light engine consists of two or more laser or SLED "pump" light-sources emitting with center wavelengths between 380 nm and 480 nm, with the center wavelengths of individual pump light sources separated by at least 5 nm. The spectral width of the laser light source is preferably less than 2 nm, though widths up to 75% of the center wavelength separation would be acceptable. The pump light source illuminates a phosphor which absorbs the pump light and reemits a broader spectrum of longer wavelength light. Each pump light source is individually addressable, such that they may be operated independently of one another and act as independent communication channels.

Encoding of information for communication by the laser or SLED can be accomplished through a variety of methods. Most basically, the intensity of the LD or SLED could be varied to produce an analog or digital representation of an audio signal, video image or picture or any type of information. An analog representation could be one where the amplitude or frequency of variation of the LD or SLED intensity is proportional to the value of the original analog signal.

A primary benefit of the present invention including a laser diode-based or SLED-based lighting systems is that both laser diodes and SLEDs operate with stimulated emission wherein the direct modulation rates are not governed by carrier lifetime such as LEDs, which operate with spontaneous emission. Specifically, the modulation rate or frequency response of LEDs is inversely proportional to the carrier lifetime and proportional to the electrical parasitics [i.e., RC time constant] of the diode and device structure. Since carrier lifetimes are on the order of nanoseconds for LEDs, the frequency response is limited to the MHz range, typically in the 100 s of MHz (i.e., 300-500 MHz). Additionally, since high power or mid power LEDs typically used in lighting require large diode areas on the order of 0.25 to 2 $mm^2$, the intrinsic capacitance of the diode is excessive and can further limit the modulation rate. On the contrary, laser diodes operate under stimulated emission wherein the modulation rates are governed by the photon lifetime, which is on the order of picoseconds, and can enable modulation rates in the GHz range, from about 1 to about 30 GHz depending on the type of laser structure, the differential gain, the active region volume, and optical confinement factor, and the electrical parasitics. As a result, VLC systems based on laser diodes can offer 10×, 100×, and potentially 1000× higher modulation rates, and hence data rates, compared to VLC systems based on LEDs. Since VLC (i.e., LiFi) systems in general can provide higher data rates than WiFi systems, laser based LiFi systems can enable 100× to 10,000× the data rate compared to conventional WiFi systems offering enormous benefits for delivering data in applications demand high data volumes such as where there are a large number of users (e.g., stadiums) and/or where the nature of the data being transferred requires a volume of bits (e.g., gaming).

To maximize the modulation of response of laser diodes, high differential gain, low active region volume, low optical confinement, and low electrical parasitics are desired to enable higher modulation bandwidths. High differential gain can be achieved with optimized active material quality and/or with the use of novel materials such as nonpolar and semipolar GaN. Low active region volume can be achieved with active region designs comprised of few quantum wells such as 1 to 3 quantum wells and thin such as quantum wells such as thicknesses ranging from 2 to 8 nm or from 3 to 6 nm, along with minimized cavity area. To minimize cavity area in edge emitting laser diodes the stripe width and the cavity length can be minimized. In conventional high power [i.e., multi-watt] edge emitting laser diodes the cavity lengths may be longer than 1 mm and up to or greater than 2 mm and the cavity widths typically support multi-lateral modes with dimensions greater than 3 μm, greater than 6 μm, greater than 12 µm, greater than 20 µm, greater than 30 µm, greater than 40 µm, greater than 60 µm, or greater than 80 µm. These multi-lateral mode high power GaN based edge emitting laser diodes have relatively large active areas and thus may have 3 dB frequency response bandwidth limited to less than 3 GHz, less than 5 GHz or less than 10 GHz.

By using narrower cavity or shorter cavity laser architectures, higher bandwidth can be achieved. In some embodiments according to the present invention laser diodes with reduced active area are included in the laser-based smart light device. For example, single lateral mode short-cavity GaN lasers could be included to serve primary function of data transmission along with high power GaN laser to serve primary function of generating white light by exciting one or more wavelength conversion members.

Vertical cavity surface emitting lasers (VCSELs) are laser diode devices wherein the optical cavity is orthogonal to the epitaxial growth direction. These structures have very short cavity lengths dictated by the epitaxial growth thickness wherein high reflectivity distributed bragg reflectors (DBR) terminating each end of the cavity. The extremely small cavity length and hence cavity area of VCSELs makes them ideal for high speed modulation, wherein modulation bandwidths of greater than 10 GHz, greater than 20 GHz, and greater than 30 GHz are possible. In some embodiments of the present invention VCSELs can be included. Such VCSELs may be based on GaN and related materials, InP and related material, or GaAs and related materials.

Low RC time constant can be achieved by keeping the diode area small, the thickness of the depletion or intrinsic region large, and minimized capacitance contribution from the device structure. Laser diode and other diode devices are comprised of two primary sources of capacitance that can be modeled as a simple parallel plate capacitor. The first is the active region itself wherein the active area defines the area of the capacitor and the depletion width dictates the parallel plate spacing. Thus, reducing the diode area both improves modulation response by reducing photon lifetime and by reducing the capacitance. The second major capacitance contribution comes from electrical bond pad area such as the anode and/or the cathode. To minimize this parasitic capacitance, bond pads and other electrical features should be design carefully to minimize area and increase the spacing of the two charged plates. Along with using small bond pad areas thick dielectrics (of about 200 nm to 10,000 nm) or low k dielectrics such as benzocyclobutene (BCB), polymethyl methacrylate (PMMA) can be employed below the metal bond pad to reduce the capacitance. Or more simply, thickness of conventional dielectric materials such as $SiO_2$ or $Si_xN_y$ can be designed for minimized capacitance. In a preferred embodiment, the epitaxial transfer method is used to form a GaN based laser diode on a carrier wafer, wherein the carrier wafer is a semi-insulating substrate. Since a majority of the bond pad area is formed on semi-insulating substrate, the capacitance is minimized and should enable increased modulation rates relative to laser diodes formed using conventional fabrication technology.

The above description focuses primarily on the direct modulation of the laser diode source itself, but in other embodiments of the present invention separate elements are included to perform the modulation of the carrier signal generated by the laser diode. These separate elements include electroabsorption modulators (EAMs), which rely on the preferential absorption of the carrier signal with reverse bias, or Mach-Zhender Interferometers (MZI). The benefits of EAM and MZI modulators include higher modulation rates and negative chirp. The separate modulation elements could be monolithically integrated on the same chip as the laser diode connected by a waveguide using any number of integration schemes or discretely included as separated chip where the optical output of the laser diode would need to be coupled to the modulator. This could be accomplished with free-spacing coupling, with fiber coupling, or with using optics. In some preferred embodiments, the laser diode and modulator are formed on the same carrier wafer using the epitaxial transfer technology described in this invention to form GaN laser diodes.

The carrier signal from the laser based light source in this smart lighting invention can be modulated in any available modulation format to transmit data with visible light communication or LiFi. For example, the modulation can be amplitude modulation (AM) or frequency modulation (FM). Common AM modulation schemes include, double-sideband modulation (DSB), double-sideband modulation with carrier (DSB-WC) (used on the AM radio broadcasting band), double-sideband suppressed-carrier transmission (DSB-SC), double-sideband reduced carrier transmission (DSB-RC), single-sideband modulation (SSB, or SSB-AM), single-sideband modulation with carrier (SSB-WC), single-sideband modulation suppressed carrier modulation (SSB-SC), vestigial sideband modulation (VSB, or VSB-AM), quadrature amplitude modulation (QAM), pulse amplitude modulation (PAM). Similarly, common digital FM modulation techniques are based on keying including PSK (phase-shift keying) where a finite number of phases are used, FSK (frequency-shift keying) where a finite number of frequencies are used, ASK (amplitude-shift keying) where a finite number of amplitudes are used, and QAM (quadrature amplitude modulation) where a finite number of at least two phases and at least two amplitudes are used. There are several variations of each of these listed digital modulation techniques, which can be included in the invention. The most common variant of ASK is simple on-off keying (OOK). Additional modulation schemes include continuous phase modulation (CPM) methods, minimum-shift keying (MSK), Gaussian minimum-shift keying (GMSK), continuous-phase frequency-shift keying (CPFSK), orthogonal frequency-division multiplexing (OFDM) modulation, discrete multitone (DMT), including adaptive modulation and bit-loading, and wavelet modulation.

Digital encoding is common encoding scheme where the data to be transmitted is represented as numerical information and then varying the LD or SLED intensity in a way that corresponds to the various values of the information. As an example, the LD or SLED could be turned fully on and off with the on and off states correlated to binary values or could be turned to a high intensity state and a low intensity state that represent binary values. The latter would enable higher modulation rates as the turn-on delay of the laser diode would be avoided. The LD or SLED could be operated at some base level of output with a small variation in the output representing the transmitted data superimposed on the base level of output. This is analogous to having a DC offset or bias on a radio-frequency or audio signal. The small variation may be in the form of discrete changes in output that represent one or more bits of data, though this encoding scheme is prone to error when many levels of output are used to more efficiently encode bits. For example two levels may be used, representing a single binary digit or bit. The levels would be separated by some difference in light output. A more efficient encoding would use 4 discrete light output levels relative to the base level, enabling one value of light output to represent any combination of two binary digits or bits. The separation between light output levels is proportional to n−1, where n is the number of light output levels. Increasing the efficiency of the encoding in this way results in smaller differences in the signal differentiating encoded values and thus to a higher rate of error in measuring encoded values.

Return to zero (RZ) and non return to zero (NRZ) protocols are common variants of OOK digital encoding formats. Another encoding scheme is to encode binary values into the rising for falling edge of a change in the light intensity between a low and high value. For example, Manchester phase encoding (MPE) could be used, where binary values are represented by a rising or falling of the signal intensity between two levels at a particular point in the cycle of a master clock or timing signal. This can be extended to differential MPE where a binary value is transmitted by either leaving the signal at the beginning of the nth clock cycle the same as the previous cycle or changing the signal level. There is, then, only one signal level change per clock cycle such that the average period of the signal change can be used to keep in sync with the master clock. Another example encoding scheme is non-return-to-zero inverted (NRZI), where the signal levels representing ones and zeros will switch to be opposite that of the previous cycle. This ensures a signal level change occurs only at the edges of master clock cycles. Of course, any of these encoding schemes could be expanded to include multiple amplitude levels as in for example pulsed amplitude modulation where various combinations of the timing of a signal transition in the master clock cycle as well as the signal amplitude are used to encode multiple bits of data.

An alternative is to superimpose a periodic signal on the base level, a sine or cosine for example, and then encode binary values by shifting one or more of the amplitude, frequency or phase of the signal. This would be equivalent of amplitude modulation (AM), frequency modulation (FM) and phase modulation in radio transmission encoding schemes. Another possibility is to combine multiple periodic signals of the same period but out of phase and vary both the amplitude and phase shift between the two signals such that combinations of amplitude and phase shift represent various combinations of bit values. For example a system with two values of amplitude and phase shift could encode a two-bit, binary sequence; i.e. 00, 01, 10, 11. Other encoding schemes are possible. Superimposing a small signal on a base level of output has the advantage that the time average power of the small signal relative to the base level can be kept near or at zero such that the apparent brightness to the eye of the emitter will be dominated by the base level of output rather than the signal. In the PWM encoding scheme or any scheme where the emitter is modulated over a significant portion of its output range the apparent brightness of the device will vary depending on the data transmitted; e.g. transmitting all zeros or all ones will lead to an emitter that is either mostly on or off. In other embodiments, coherent detection schemes are used to detect the data stream from the laser diode based VLC systems.

Multiplexing, or combining of multiple analog message signals or digital data streams into a single signal over a shared medium. It is possible to combine laser or SLED light sources in an embodiment of this invention such that the individual signals from the plurality of light sources can be differentiated at the receiver. One method of this would be wavelength division multiplexing (WDM). As mentioned in previously described embodiments, multiple laser or SLED light sources could be combined in a single light engine with center wavelengths chosen to be separated sufficiently that narrow, optical band-pass or "notch" filters could be used at the VLC receiver to filter out the majority of light at wavelengths not corresponding to an individual laser or SLED device.

In an example embodiment, a light engine contains 3 blue lasers acting as pump light sources emitting spectra with FWHMs of 2 nm and center wavelengths of 440, 450 and 460 nm. These pump light sources illuminate a wavelength converting element which absorbs part of the pump light and reemits a broader spectrum of longer wavelength light. The light engine is configured such that both light from the wavelength converting element and the plurality of light sources are emitted from the light-engine. Each pump light source is independently addressable, and is controlled by a laser driver module configured to generate pulse-modulated light signal at a modulation frequency range of about 50 to 500 MHz, 500 MHz to 5 GHz, 5 GHz to 20 GHz, or greater than 20 GHz. The data transfer bandwidth of the light engine is three times larger than that of a light engine with one laser pump light source. A properly configured VLC receiver would be able to receive data independently and simultaneously on the 440, 450 and 460 nm communication channels. For example, a VLC receiver may detect VLC signals using three photodetectors capable of measuring pulse-modulated light signals at a modulation frequency range of about 50 MHz to 300 MHz, 300 MHz to 5 GHz, 5 GHz to 20 GHz, or greater than 20 GHz. The light entering each photodetector is filtered by a narrow band-pass filter (band pass width less than 10 nm) and center wavelength centered on the emitted wavelength of either 440, 450 or 460 nm. It should be understood that this example embodiment should not be limiting of the number of blue pump laser devices or their distribution of center point wavelengths. For example, in a specific embodiment the device may have 2, 3, 4, 5 or more pump light sources with center point wavelengths spanning the range of 400 nm to 470 nm. In alternative preferred embodiments, the device may have 6 or more, 12 or more, 100 or more, or 1000 or more laser diode or SLED pump light sources, where some or all of the laser diode or SLED devices could be operated as a discrete communication channel to scale the aggregate bandwidth of the communication system.

In an embodiment, multiplexing is achieved by varying the polarization direction of light emitted from two or more laser or SLED light sources. Light emitted from a laser or SLED can be highly polarized, such that multiple lasers or SLEDs in a light engine could be configured such that when emitted from the light engine separate data communication channels have different polarization directions. A VLC receiver with polarization filters could distinguish signals from the two channels and thereby increase the bandwidth of the VLC transmission.

Figure 21A:
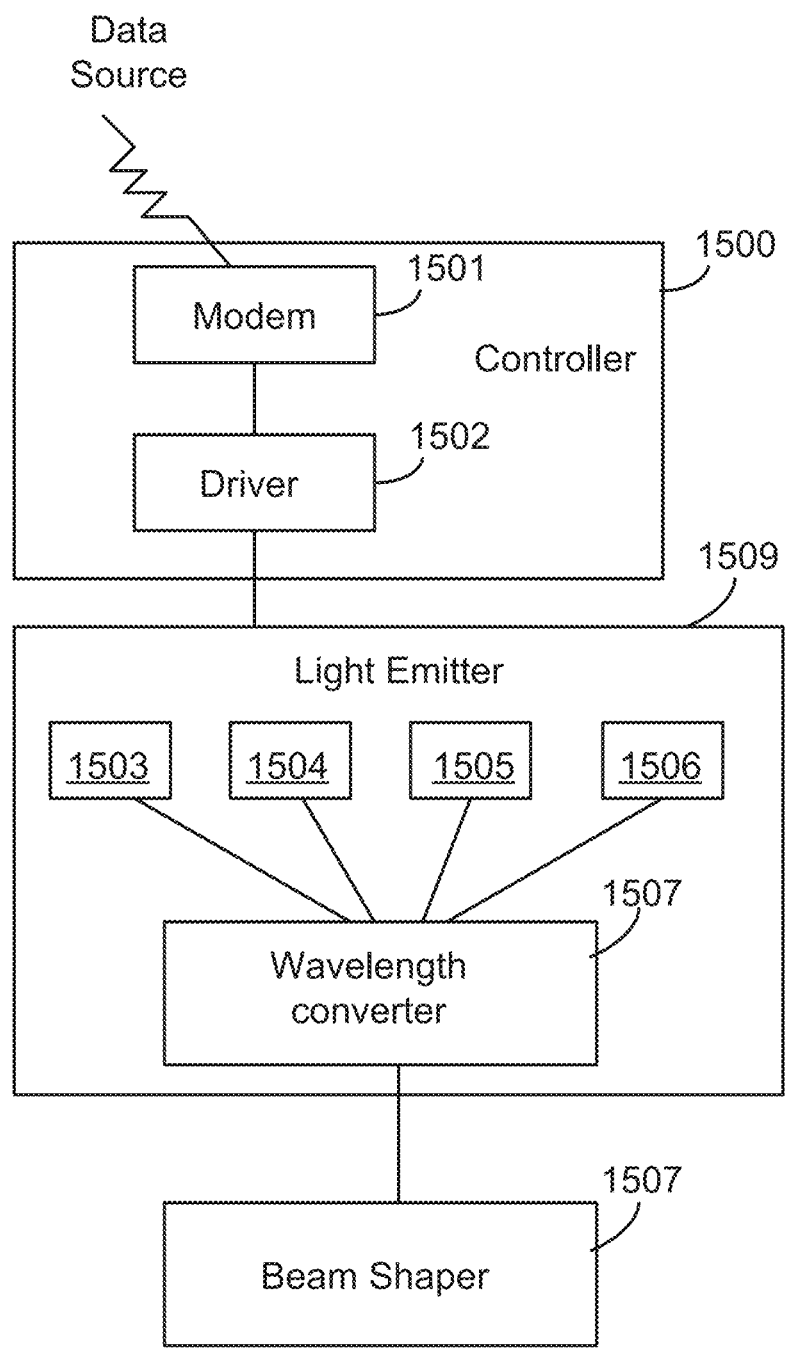
FIG. 21A is a functional block diagram of a laser based white light source enabled for visible light communication according to an embodiment of the present invention.

FIG. 21A shows a functional block diagram for a basic laser diode based VLC-enabled laser light source or "light engine" that can function as a white light source for general lighting and display applications and also as a transmitter for visible light communication such as LiFi. Referring to FIG. 21A, the white light source includes three subsystems. The first subsystem is the light emitter 1509, which consists of either a single laser device or a plurality of laser devices (1503, 1504, 1505 and 1506). The laser devices are configured such that the laser light from each laser device is incident on a wavelength converting element 1507 such as a phosphor which absorbs part or the entirety of the laser light from one or more laser devices and converts it into a broader spectrum of lower energy photons. The second subsystem is the control unit 1510, which includes at least a laser driver 1502 and a VLC modem 1501. The laser driver

1502 powers and modulates the all laser devices (1503, 1504, 1505 and 1506) to enable them for visible light communications. Optionally, the laser driver 1502 at least can drive one laser device independently of the rest. The VLC modem 1501 is configured to receive digitally encoded data from one or more data sources (wired or wirelessly) and convert the digitally encoded data into analog signals which determine the output of the laser driver 1502. The modulation of the laser light by the laser driver based on the encoded data can be either digital, with the emitted power of the laser being varied between two or more discrete levels, or it can be based on the variation of the laser intensity with a time-varying pattern where data is encoded in the signal by way of changes in the amplitude, frequency, phase, phase-shift between two or more sinusoidal variations that are summed together, and the like.

In an example, as used herein, the term "modem" refers to a communication device. The device can also include a variety of other data receiving and transferring devices for wireless, wired, cable, or optical communication links, and any combination thereof. In an example, the device can include a receiver with a transmitter, or a transceiver, with suitable filters and analog front ends. In an example, the device can be coupled to a wireless network such as a meshed network, including Zigbee, Zeewave, and others. In an example, the wireless network can be based upon a 802.11 wireless standard or equivalents. In an example, the wireless device can also interface to telecommunication networks, such as 3G, LTE, 5G, and others. In an example, the device can interface into a physical layer such as Ethernet or others. The device can also interface with an optical communication including a laser coupled to a drive device or an amplifier. Of course, there can be other variations, modifications, and alternatives.

In some preferred embodiments the output of the laser driver is configured for a digital signal. The third subsystem is an optional beam shaper 1508. The light emitted from the wavelength converting element 1507 (which absorbed the incident laser light) as well as unabsorbed, scattered laser light passes through the beam shaper 1508 which directs, collimates, focuses or otherwise modifies the angular distribution of the light. After the beam shaper 1508 the light is formulated as a communication signal to propagate either through free-space or via a waveguide such as an optical fiber. The light engine, i.e., the laser-based white light source is provided as a VLC-enabled light source. Optionally, the beam shaper 1508 may be disposed prior to the light incident to the wavelength converting element 1507. Optionally, alternate beam shapers are disposed at optical paths both before and after the wavelength converting element 1507.

In some embodiments, additional beam shapers would be included between the laser diode members and the wavelength converter element to precondition the pump beam before it is incident on the phosphor. For example, in a preferred embodiment the laser or SLED emission would be collimated prior to incidence with the wavelength converter such that the laser light excitation spot would have a specified and controlled size and location.

For a single laser based VLC light source, this configuration offers the advantage that white light can be created from combination of a laser-pumped phosphor and the residual, unconverted blue light from the laser. When the laser is significantly scattered it will have a Lambertian distribution similar to the light emitted by the wavelength converting element, such that the projected spot of light has uniform color over angle and position as well as power of delivered laser light that scales proportionally to the white light intensity. For wavelength converting elements that do not strongly scatter laser light, the beam shaping element can be configured such that the pump and down converted are collected over similar areas and divergence angles resulting in a projected spot of light with uniform color over angle, color over position within the spot, as well as power of delivered laser light that scales proportionally to the white light intensity. This embodiment is also advantageous when implemented in a configuration provided with multiple pump lasers in that it allows for the pump laser light from the plurality of lasers to be overlapped spatially on the wavelength converting element to form a spot of minimal size. This embodiment is also advantageous in that all lasers can be used to pump the wavelength converting element-assuming the lasers provided emit at wavelengths which are effective at pumping the wavelength converting element-such that power required from any one laser is low and thus allowing for either use of less-expensive lower-power lasers to achieve the same total white light output or allowing for under-driving of higher-power lasers to improve system reliability and lifetime.

Figure 21B:
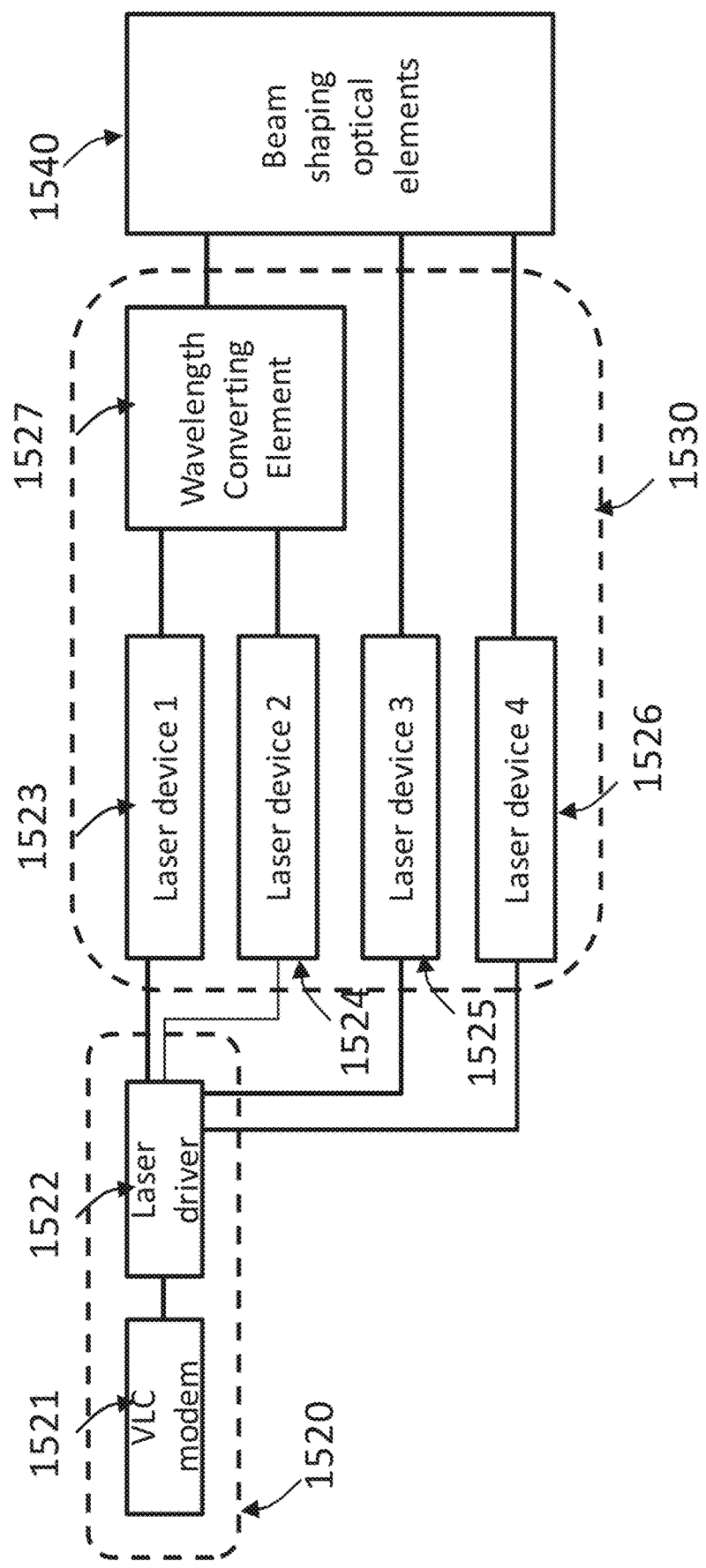
FIG. 21B is a functional block diagram of a laser based white light source enabled for visible light communication according to another embodiment of the present invention.

FIG. 21B shows another functional diagram for a basic laser diode based VLC-enabled light source for general lighting and display applications and also as a transmitter for visible light communication. Referring to FIG. 21B, the white light source includes three subsystems. The first subsystem is the light emitter 1530, which consists of a wavelength converting element 1527 and either a single laser device or a plurality of laser devices 1523, 1524, 1525 and 1526. The laser devices are configured such that the laser light from a subset of the laser devices 1523 and 1524 is partially or fully converted by the wavelength converting element 1527 into a broader spectrum of lower energy photons. Another subset of the laser devices 1525 and 1526 is not converted, though they may be incident on the wavelength converting element. The second subsystem is the control unit 1520 including at least a laser driver 1522 and a VLC modem 1521. The laser driver 1522 is configured to power and modulate the laser devices. Optionally, the laser driver 1522 is configured to driver at least one laser device independently of the rest among the plurality of laser devices (e.g., 1523, 1524, 1525 and 1526). The VLC modem 1521 is configured to couple (wired or wirelessly) with a digital data source and to convert digitally encoded data into analog signals which determine the output of the laser driver 1522. The third subsystem is an optional beam shaping optical element 1540. The light emitted from the wavelength converting element 1527 as well as unabsorbed, scattered laser light passes through the beam shaping optical element 1540 which directs, collimates, focuses or otherwise modifies the angular distribution of the light into a formulated visible light signal.

In some embodiments, additional beam shapers would be included between the laser diode members and the wavelength converter element to precondition the pump light beam before it is incident on the phosphor. For example, in a preferred embodiment the laser or SLED emission would be collimated prior to incidence with the wavelength converter such that the laser light excitation spot would have a specified and controlled size and location. The light signal then leaves the light engine and propagates either through free-space or via a waveguide such as an optical fiber. In an embodiment, the non-converted laser light is incident on the wavelength converting element 1527, however the non-converted laser light is efficiently scattered or reflected by the wavelength converting element 1527 such that less than 10% of the incident light is lost to absorption by the wavelength converting element 1527.

This embodiment has the advantage that one or more of the data transmitting lasers is not converted by the wavelength converting element. This could be because the one or more lasers are configured such that they are not incident on the element or because the lasers do not emit at a wavelength that is efficiently converted by the wavelength converting element. In some examples, the non-converted light might be cyan, green or red in color and may be used to improve the color rendering index of the white light spectrum while still providing a channel for the transmission of data. Because the light from these lasers is not converted by the wavelength converting element, lower power lasers can be used, which allows for lower device costs as well as enabling single lateral optical mode devices which have even narrower spectra than multi-mode lasers. Narrower laser spectra would allow for more efficient wavelength-division multiplexing in VLC light sources.

Another advantage is that the lasers that bypass the wavelength converting element may be configured to allow for highly saturated spectra to be emitted from the VLC capable light source. For example, depending on the wavelength converting element material and configuration, it may not be possible to have a blue laser incident on the wavelength converting element that is not partially converted to longer wavelength light. This means that it would be impossible to use such a source to produce a highly saturated blue spectrum as there would always be a significant component of the emitted spectrum consisting of longer wavelength light. By having an additional blue laser source, which is not incident on the wavelength converting element, such a source could emit both a white light spectrum as well as a saturated blue spectrum. Addition of green and red emitting lasers would allow the light source to emit a white light spectrum by down conversion of a blue or violet pump laser as well as saturated, color-tunable spectra able to produce multiple spectra with color points ranging over a wide area of the color gamut.

Referring back to FIGS. 19A, 19B, 20A, 20B, and 20C, showing several embodiments of the VLC-enabled solid-state white light source in a SMD type package. Optionally, the wedge-shaped members 1401, 1604, 1614, and 1616 in the SMD package are configured such that the laser light from each of multiple laser devices is incident on the wavelength converting element 1406 or 1602 with an angle of 10 to 45 degrees from the plane of the wavelength converting element's upper. Optionally, the wavelength converting element 1602 is bonded to the common substrate 1601 using a solder material. Optionally, the bonded surface of the wavelength converting element 1602 is provided with an adhesion promoting layer such as a Ti/Pt/Au metal stack. Optionally, the adhesion promoting layer includes as first layer that is highly reflective. Optionally, the adhesion promoting layers could be Ag/Ti/Pt/Au, where Ag is adjacent to the wavelength converting element and provides a highly-reflective surface below the wavelength converting element. The laser devices are connected electrically to the backside solder pads using wire bonding between electrical contact pads on the laser device chips and the top-side wire-bond pads on the common substrate. Optionally, only one of the multiple laser devices in the SMD packaged white light source is a blue pump light source with a center wavelength of between 405 and 470 nm. Optionally, the wavelength converting element is a YAG-based phosphor plate which absorbs the pump light and emits a broader spectrum of yellow-green light such that the combination of the pump light spectra and phosphor light spectra produces a white light spectrum. The color point of the white light is preferably located within du'v' of less than 0.03 of the Planckian blackbody locus of points. Optionally, one of the multiple laser devices is a green light emitting laser diode with a center wavelength between 500 and 540 nm and one of the multiple laser devices is a red light emitting laser diode with a center wavelength ranging between 600 and 650 nm. Addition of diffusely reflected red and green laser light to the spectrum of the phosphor-based wavelength converting element and the blue pump laser device results in a white light source with dynamically adjustable color point as well as the capacity to transmit data simultaneously and independently by wavelength division multiplexing of the three laser sources of different center wavelengths.

Use of multiple lasers of same wavelength allows for running each laser at a lower power than what one would do with only one pump laser for a fixed power of emitted white light spectrum. Addition of red and green lasers which are not converted allow for adjusting the color point of the emitted spectrum. Given a single blue emitter, so long as the conversion efficiency of the wavelength converting element does not saturate with pump laser intensity, the color point of the white light spectrum is fixed at a single point in the color space which is determined by the color of the blue laser, the down-converted spectrum emitted by the wavelength converting element, and the ratio of the power of the two spectra, which is determined by the downconversion efficiency and the amount of pump laser light scattered by the wavelength converting element. By the addition of an independently controlled green laser, the final color point of the spectrum can be pulled above the Planckian blackbody locus of points. By addition of an independently controlled red laser, the final color point of the spectrum can be pulled below the Planckian blackbody locus of points. By the addition of independently controlled violet or cyan colored lasers, with wavelengths not efficiently absorbed by the wavelength converting element, the color point can be adjusted back towards the blue side of the color gamut. Since each laser is independently driven, the time-average transmitted power of each laser can be tailored to allow for fine adjustment of the color point and CRI of the final white light spectrum.

Optionally, multiple blue pump lasers might be used with respective center wavelengths of 420, 430, and 440 nm while non-converted green and red laser devices are used to adjust the color point of the devices spectrum. Optionally, the non-converted laser devices need not have center wavelengths corresponding to red and green light. For example, the non-converted laser device might emit in the infra-red region at wavelengths between 800 nm and 2 microns. Such a light engine would be advantageous for communication as the infra-red device, while not adding to the luminous efficacy of the white light source, or as a visible light source with a non-visible channel for communications. This allows for data transfer to continue under a broader range of conditions and could enable for higher data rates if the non-visible laser configured for data transmission was more optimally suited for high speed modulation such as a telecom laser or vertical cavity surface emitting laser (VCSEL). Another benefit of using a non-visible laser diode for communication allows the VLC-enabled white light source to use a non-visible emitter capable of effectively transmitting data even when the visible light source is turned off for any reason in applications.

In some embodiments, specialized gallium and nitrogen containing laser diodes may be included for more optimal VLC functionality. In one example a lower power or single lateral mode laser may be included to provide a higher modulation rate and hence a higher data transmission capability. Lower power lasers typically require a reduced active region volume and hence shorter photon lifetime and lower parasitic capacitance enabling higher modulation frequencies. Additional measures can be taken such as the use of low k dielectrics to reduce capacitance or the electrodes, the addition of traveling wave type of electrodes, and electrodes configured for high speed. In one embodiment one or more gallium and nitrogen containing laser diodes configured for data transmission are included in addition to the primary phosphor excitation laser diode. The data transmission laser diode is capable of 3 dB modulation rates higher than 5 GHz, higher than 10 GHz, or higher than 20 GHz.

In some embodiments, the white light source is configured to be a smart light source having a beam shaping optical element. Optionally, the beam shaping optical element provides an optical beam where greater than 80% of the emitted light is contained within an emission angle of 30 degrees. Optionally, the beam shaping element provides an optical beam where greater than 80% of the emitted light is contained within an emission angle of 10 degrees. Optionally, the white light source can be formed within the commonly accepted standard shape and size of existing MR, PAR, and AR111 lamps. Optionally, the white light source further contains an integrated electronic power supply to electrically energize the laser-based light module. Optionally, the white light source further contains an integrated electronic power supply with input power within the commonly accepted standards. Of course, there can be other variations, modifications, and alternatives.

In some embodiments, the smart light source containing at least a laser-based light module has one or more beam steering elements to enable communication. Optionally, the beam steering element provides a reflective element that can dynamically control the direction of propagation of the emitted laser light. Optionally, the beam steering element provides a reflective element that can dynamically control the direction of propagation of the emitted laser light and the light emitted from the wavelength converting element. Optionally, the smart light white light source further contains an integrated electronic power supply to electrically energize the beam steering elements. Optionally, the smart light white light source further contains an integrated electronic controller to dynamically control the function of the beam steering elements.

Smart lighting requires spatial control of the light beam in order to achieve a variety of illumination effects that can be shone in a static fashion upon demand, or that can be varied with time to produce dynamic light patterns. The ideal smart lighting spatial beam patterns include basic matrix light beam illumination capability of 25 pixels, to a higher resolution of pixels such as VGA 640×480 pixels, to HD 1920×1080 pixels, to UHD such as 3840×2160 and 7680×4320. The illumination pattern should be adaptable from a broad high angle floodlight to narrow beam angle spotlight. The illumination module should be highly compact, and highly efficient by passing more than 50% of the light. The illumination module should be robust, so as to withstand typical mechanical shock and vibration associated with consumer and automotive products.

According to an embodiment, the present invention provides a dynamic laser-based light source or light projection apparatus including a micro-display element to provide a dynamic beam steering, beam patterning, or beam pixelating affect. Micro-displays such as a microelectromechanical system (MEMS) scanning mirror, or "flying mirror", a digital light processing (DLP) chip or digital mirror device (DMD), or a liquid crystal on silicon (LCOS) can be included to dynamically modify the spatial pattern and/or color of the emitted light. In one embodiment the light is pixelated to activate certain pixels and not activate other pixels to form a spatial pattern or image of white light. In another example, the dynamic light source is configured for steering or pointing the light beam. The steering or pointing can be accomplished by a user input configured from a dial, switch, or joystick mechanism or can be directed by a feedback loop including sensors.

One approach to achieve dynamic light beam control is with a scanning MEMS mirror that actively steers the laser beam so that the reflected beam is incident on different points of the same phosphor assembly, or on different phosphor assemblies. This approach has the advantage of high optical efficiency, with more than 80% of the light being reflected off of the MEMS mirror and onto the phosphor for efficient downconversion. The downconverted light from the phosphor is then captured with optics, forming a spatial beam pattern after the optics that is varied as the deflection of the MEMS mirror changes. The scanning MEMS mirror can be based on actuators that are electromagnetic, electrostatic, piezoelectric, or electrothermal, pneumatic, and shape memory alloy. Optionally, the MEMS mirrors for smart lighting would produce high deflection angles more than 10 degrees. Optionally, the MEMS mirrors for smart lighting would be low in power consumption less than 100 mW, or even less than 1 mW, with a low driving voltage <5V. Optionally, the MEMS mirrors for smart lighting would have high scan frequencies capable of producing HD resolution. Optionally, the MEMS mirrors for smart lighting would be robust under shock and vibration that are greater than 2000 g. Optionally, the MEMS mirrors for smart lighting would be capable of performing resonant operation for vector pointing. Optionally, the MEMS mirrors for smart lighting would be capable of providing high reflectivity, i.e., >80% and ideally >99%, for high power operation. Optionally, the MEMS mirrors for smart lighting would be produced by simple fabrication techniques for low cost. For example, single biaxial 2D mirror design (instead of 1D mirror design) can be achieved for low cost and simple architecture.

In an embodiment, a MEMS scanning mirror microdisplay is included in the device and is configured to steer a beam of light by reflecting the light at a predetermined angle that can be dynamically modulated. In one example, the MEMS scanning mirror is configured to steer a collimated beam of laser excitation light from the one or more laser diodes to generate a predetermined spatial and/or temporal pattern of excitation light on the phosphor member. In this example the micro-display is upstream of the wavelength converter member in the optical pathway. At least a portion of the wavelength converted light from the phosphor member could then be recollimated or shaped using a beam shaping element such as an optical lens. In a second example the MEMS is configured to steer a collimated beam of at least a partially wavelength converted light to generate a predetermined spatial and/or temporal pattern of converted light onto a target surface or into a target space. In this example the micro-display is downstream of the wavelength converter member in the optical pathway. MEMS scanning mirrors or microscanners are configured for dynamic spatial modulation wherein the modulatory movement of a single mirror can be either translatory or rotational, on one or two axes. For translation modulation a phase shifting effect to the light takes place. For rotational modulation the MEMS scanning mirror is deflected at an angle determined by the rotational angular position of the mirror upon deflection. The deflecting scanning mirror causes an incident light beam to be reflected at an angle based on the degree of deflection. Such scanning mirror technology is capable of providing a high definition video such as 1080P or 4K resolution to enable crisply defined spatial patterning of a white light source based on laser diodes and a wavelength converter.

The MEMS microscanning chips included in this invention can have dimensions of less than 1 mm×1 mm, equal to or greater than 1 mm×1 mm, greater than about 3 mm×3 mm, greater than about 5 mm×5 mm, or greater than about 10 mm×10 mm wherein the optimum size will be selected based on the application including the optical power and diameter of the collimated beam the microscanner is configured to reflect. In some embodiments specialized high reflectivity coatings are used on the MEMS microscanner chips to prevent absorption of the light beam within the chip, which can cause heating and failure of the MEMS chip if the power is too high. For example, the coating material could have a reflectivity greater than about 95%, greater than about 99%, greater than about 99.9%, or greater. The scan frequencies range between from about less than 0.1 to greater than 50 kHz wherein deflection movement is either resonant or quasi-static. Mechanical deflection angles of the microscanning devices reach greater than about ±30°, wherein the tilting movement can dynamically direct the collimated light over a projection plane or into a space. The forces used to initiate the microscanner deflection can include electromagnetic forces, electrostatic forces, thermoelectric forces, and piezo-electric forces.

In the case of electrothermal actuated MEMS mirrors, typically, a voltage is applied to the device, and current flows through it causing heating. When heating occurs to two materials with different coefficients of thermal expansion such as a bimetallic device, one material expands more than the other, and the actuator bends to accommodate different deflections depending on the voltage and current provided. Another approach is to electrically activate two similar or identical materials that have different geometrical properties and therefore different electrical resistances, causing different heating for each portion of the device, and resulting in actuator deflection. Such devices can be driven in both resonant and non resonant mode. While such approaches are rugged and insensitive to shock and vibration and can be quite simple and elegant to manufacture, they suffer from limited bandwidth, high power consumption, and inadequate scanning angles.

Another approach is piezoelectric MEMS mirrors, which operate on the principle that stress can be induced in a material by an electric field that is applied to the actuator. While such approaches can have fast response and high bandwidth and robust operation over shock and vibration, they require high driving voltage and the actuator deflection angle is difficult to control.

A common MEMS mirror design uses electrostatic actuators which rely on a change in stationary electric fields to generate mechanical motion. These have the advantage of low complexity fabrication, reliable operation, and low power consumption. However, they have relatively low torque and limited bandwidth, are sensitive to shock and vibration, and require high driving voltages. Parallel plate approaches are common, but result in resonant operation and are not capable of vector scanning. Non-resonant mode designs are possible using vertical or rotary comb designs.

Another common MEMS mirror design uses electromagnetic actuators, which typically include coils on the backs of the mirrors interact with permanent magnetic fields to provide actuation. These designs offer low voltage, high bandwidth, and insensitivity to shock and vibration, and provide large deflection angles, but require higher power consumption than other approaches such as electrostatic. A common approach is to utilize resonant mode designs for low complexity fabrication, but this constrains the operating mode to be scanned continuously, without the potential for static beam pointing or vector scanning. Non-resonant mode designs are used for applications requiring vector scanning, and challenges include complex fabrication.

According to an embodiment, the present invention provides a dynamic laser-based light source or light projection apparatus including a housing having an aperture. The apparatus can include an input interface for receiving a signal to activate the dynamic feature of the light source. The apparatus can include a video or signal processing module. Additionally, the apparatus includes a light source based on a laser source. The laser source includes a violet laser diode or blue laser diode. The dynamic light feature output comprised from a phosphor emission excited by the output beam of a laser diode, or a combination of a laser diode and a phosphor member. The violet or blue laser diode is fabricated on a polar, nonpolar, or semipolar oriented Ga-containing substrate. The apparatus can include a microelectromechanical system (MEMS) scanning mirror, or "flying mirror", configured to project the laser light or laser pumped phosphor white light to a specific location to the outside world. By rastering the laser beam using the MEMS mirror a pixel in two dimensions can be formed to create a pattern or image.

According to another embodiment, the present invention includes a housing having an aperture and an input interface for receiving signals such as frames of images. The dynamic light system also includes a processing module. In an embodiment, the processing module is electrically coupled to an ASIC for driving the laser diode and the MEMS scanning mirrors.

In an embodiment, a laser driver module is provided. Among other things, the laser driver module is adapted to adjust the amount of power to be provided to the laser diode. For example, the laser driver module generates a drive current based on pixels from digital signals such as frames of images, the drive currents being adapted to drive a laser diode. In a specific embodiment, the laser driver module is configured to generate pulse-modulated light signal at a frequency range of about 50 MHz to 100 GHz.

In an alternative embodiment, DLP or DMD micro-display chip is included in the device and is configured to steer, pattern, and/or pixelate a beam of light by reflecting the light from a 2-dimensional array of micro-mirrors corresponding to pixels at a predetermined angle to turn each pixel on or off. In one example, the DLP or DMD chip is configured to steer a collimated beam of laser excitation light from the one or more laser diodes to generate a predetermined spatial and/or temporal pattern of excitation light on the wavelength conversion or phosphor member. At least a portion of the wavelength converted light from the phosphor member could then be recollimated or shaped using a beam shaping element such as an optic. In this example the micro-display is upstream of the wavelength converter member in the optical pathway. In a second example the DLP or DMD micro-display chip is configured to steer a collimated beam of at least a partially wavelength converted light to generate a predetermined spatial and/or temporal pattern of converted light onto a target surface or into a target space. In this example the micro-display is downstream of the wavelength converter member in the optical pathway. DLP or DMD micro-display chips are configured for dynamic spatial modulation wherein the image is created by tiny mirrors laid out in an array on a semiconductor chip such as a silicon chip. The mirrors can be positionally modulated at rapid rates to reflect light either through an optical beam shaping element such as a lens or into a beam dump. Each of the tiny mirrors represents one or more pixels wherein the pitch may be 5.4 µm or less. The number of mirrors corresponds or correlates to the resolution of the projected image. Common resolutions for such DLP micro-display chips include 800×600, 1024×768, 1280×720, and 1920×1080 (HDTV), and even greater.

According to an embodiment, the present invention provides a dynamic laser-based light source or light projection apparatus including a housing having an aperture. The apparatus can include an input interface for receiving a signal to activate the dynamic feature of the light source. The apparatus can include a video or signal processing module. Additionally, the apparatus includes a light source based on a laser source. The laser source includes a violet laser diode or a blue laser diode. The dynamic light feature output comprised from a phosphor emission excited by the output beam of a laser diode, or a combination of a laser diode and a phosphor member. The violet or blue laser diode is fabricated on a polar, nonpolar, or semipolar oriented Ga-containing substrate. The apparatus can include a laser driver module coupled to the laser source. The apparatus can include a digital light processing (DLP) chip comprising a digital mirror device. The digital mirror device includes a plurality of mirrors, each of the mirrors corresponding to pixels of the frames of images. The apparatus includes a power source electrically coupled to the laser source and the digital light processing chip.

The apparatus can include a laser driver module coupled to the laser source. The apparatus includes an optical member provided within proximity of the laser source, the optical member being adapted to direct the laser beam to the digital light processing chip. The apparatus includes a power source electrically coupled to the laser source and the digital light processing chip. In one embodiment, the dynamic properties of the light source may be initiated by the user of the apparatus. For example, the user may activate a switch, dial, joystick, or trigger to modify the light output from a static to a dynamic mode, from one dynamic mode to a different dynamic mode, or from one static mode to a different static mode.

In an alternative embodiment, a liquid crystal on silicon (LCOS) micro-display chip is included in the device and is configured to steer, pattern, and/or pixelate a beam of light by reflecting or absorbing the light from a 2-dimensional array of liquid crystal mirrors corresponding to pixels at a predetermined angle to turn each pixel on or off. In one example, the LCOS chip is configured to steer a collimated beam of laser excitation light from the one or more laser diodes to generate a predetermined spatial and/or temporal pattern of excitation light on the wavelength conversion or phosphor member. At least a portion of the wavelength converted light from the phosphor member could then be recollimated or shaped using a beam shaping element such as an optic. In this example the micro-display is upstream of the wavelength converter member in the optical pathway. In a second example the LCOS micro-display chip is configured to steer a collimated beam of at least a partially wavelength converted light to generate a predetermined spatial and/or temporal pattern of converted light onto a target surface or into a target space. In this example the micro-display is downstream of the wavelength converter member in the optical pathway. The former example is the preferred example since LCOS chips are polarization sensitive and the output of laser diodes is often highly polarized, for example greater than 70%, 80%, 90%, or greater than 95% polarized. This high polarization ratio of the direct emission from the laser source enables high optical throughput efficiencies for the laser excitation light compared to LEDs or legacy light sources that are unpolarized, which wastes about half of the light.

LCOS micro-display chips are configured spatial light modulation wherein the image is created by tiny active elements laid out in an array on a silicon chip. The elements reflectivity is modulated at rapid rates to selectively reflect light through an optical beam shaping element such as a lens. The number of elements corresponds or correlates to the resolution of the projected image. Common resolutions for such LCOS micro-display chips include 800×600, 1024×768, 1280×720, and 1920×1080 (HDTV), and even greater.

Optionally, the partially converted light emitted from the wavelength conversion element results in a color point, which is white in appearance. Optionally, the color point of the white light is located on the Planckian blackbody locus of points. Optionally, the color point of the white light is located within du'v' of less than 0.010 of the Planckian blackbody locus of points. Optionally, the color point of the white light is preferably located within du'v' of less than 0.03 of the Planckian blackbody locus of points. Optionally, the pump light sources are operated independently, with their relative intensities varied to dynamically alter the color point and color rendering index (CRI) of the white light.

In several preferred embodiments one or more beam shaping elements are included in the present invention. Such beam shaping elements could be included to configure the one or more laser diode excitation beams in the optical pathway prior to incidence on the phosphor or wavelength conversion member. In some embodiments the beam shaping elements are included in the optical pathway after at least a portion of the laser diode excitation light is converted by the phosphor or wavelength conversion member. In additional embodiments the beam shaping elements are included in the optical pathway of the non-converted laser diode light. Of course, in many preferred embodiments, a combination of one or more of each of the beam shaping elements is included in the present invention.

In some embodiments, a laser diode output beam must be configured to be incident on the phosphor material to excite the phosphor. In some embodiments, the laser beam may be directly incident on the phosphor and in other embodiments the laser beam may interact with an optic, reflector, or other object to manipulate or shape the beam prior to incidence on the phosphor. Examples of such optics include, but are not limited to ball lenses, aspheric collimator, aspheric lens, fast or slow axis collimators, dichroic mirrors, turning mirrors, optical isolators, but could be others. In some embodiments, other optics can be included in various combinations for the shaping, collimating, directing, filtering, or manipulating of the optical beam. Examples of such optics include, but are not limited to re-imaging reflectors, ball lenses, aspheric collimator, dichroic mirrors, turning mirrors, optical isolators, but could be others.

In some embodiments, the converted light such as a white light source is combined with one or more optical members to manipulate the generated white light. In an example the converted light source such as the white light source could serve in a spot light system such as a flashlight, spotlight, automobile headlamp or any direction light applications where the light must be directed or projected to a specified location or area. In one embodiment a reflector is coupled to the white light source. Specifically, a parabolic (or paraboloid or paraboloidal) reflector is deployed to project the white light. By positioning the white light source in the focus of a parabolic reflector, the plane waves will be reflected and propagate as a collimated beam along the axis of the parabolic reflector. In another example a lens is used to collimate the white light into a projected beam. In one example a simple aspheric lens would be positioned in front of the phosphor to collimate the white light. In another example, a total internal reflector optic is used for collimation. In other embodiments other types of collimating optics may be used such as spherical lenses or aspherical lenses. In several embodiments, a combination of optics is used.

In some embodiments, the smart white light source containing at least a laser-based light module includes a beam shaping element. Optionally, the beam shaping element provides an optical beam where greater than 80% of the emitted light is contained within an emission angle of 30 degrees. Optionally, the beam shaping element provides an optical beam where greater than 80% of the emitted light is preferably contained within an emission angle of 10 degrees. Optionally, the beam shaping element provides an optical beam where greater than 80% of the emitted light is preferably contained within an emission angle of 5 degrees. In some embodiments collimating optics are used such as parabolic reflectors, total internal reflector (TIR) optics, diffractive optics, other types of optics, and combinations of optics.

Optionally, the smart white light source can be formed within the commonly accepted standard shape and size of existing MR, PAR, and AR111 lamps. Optionally, the solid-state white light source further contains an integrated electronic power supply to electrically energize the laser-based light module. Optionally, the solid-state white light source further contains an integrated electronic power supply with input power within the commonly accepted standards. Of course, there can be other variations, modifications, and alternatives.

In an embodiment, a laser or SLED driver module is provided. For example, the laser driver module generates a drive current, with the drive currents being adapted to drive a laser diode to transmit one or more signals such as digitally encoded frames of images, digital or analog encodings of audio and video recordings or any sequences of binary values. In a specific embodiment, the laser driver module is configured to generate pulse-modulated light signals at a modulation frequency range of about 50 MHz to 300 MHz, 300 MHz to 1 GHz or 1 GHz to 100 GHz. In another embodiment the laser driver module is configured to generate multiple, independent pulse-modulated light signal at a modulation frequency range of about 50 MHz to 300 MHz, 300 MHz to 1 GHz or 1 GHz to 100 GHz. In an embodiment, the laser driver signal can be modulated by a low-power analog voltage or current signal.

In an embodiment, the apparatus is capable of conveying information to the user or another observer through the means of dynamically adjusting certain qualities of the projected light. Such qualities include spot size, shape, hue, and color-point as well as through independent motion of the spot. As an example the apparatus may convey information by dynamically changing the shape of the spot. In an example, the apparatus is used as a flash-light or bicycle light, and while illuminating the path in front of the user it may convey directions or information received from a paired smart phone application. Changes in the shape of the spot which could convey information include, among others: forming the spot into the shape of an arrow that indicates which direction the user should walk along to follow a predetermined path and forming the spot into an icon to indicate the receipt of an email, text message, phone call or other push notification. The white light spot may also be used to convey information by rendering text in the spot. For example, text messages received by the user may be displayed in the spot. As another example, embodiments of the apparatus including mechanisms for altering the hue or color point of the emitted light spectrum could convey information to the user via a change in these qualities. For example, the aforementioned bike light providing directions to the user might change the hue of the emitted light spectrum from white to red rapidly to signal that the user is nearing an intersection or stop-sign that is beyond the range of the lamp.

In an embodiment, a modem circuit is provided. The modem circuit encodes binary data into a control signal that is routed to the pump light driver.

In an embodiment, the apparatus is capable of conveying information to the user or another observer both through the means of dynamically adjusting certain qualities of the projected light. Such qualities include spot size, shape, hue, and color-point as well as through independent motion of the spot as well as via visible light communication or LiFi. In an example, the apparatus might be used as a bike-light which conveys information about directions to the user for travelling along a predetermined path by dynamically adjusting the shape or color of the emitted light spot. The apparatus may then also convey information about the user to objects illuminated by the spot using VLC or LiFi. Such data may be used by autonomous vehicles to better predict the actions or path of the user.

In a second group of embodiments, the present invention covers dynamic gallium and nitrogen based laser light sources coupled to one or more sensors with a feedback loop or control circuit to trigger the light source to react with one or more predetermined responses such as a light movement response, a light color response, a light brightness response, a spatial light pattern response, a communication response, or other responses.

In a specific embodiment of the present invention including a dynamic light source, the dynamic feature is activated by a feedback loop including a sensor. Such sensors may be selected from, but not limited to a microphone, geophone, hydrophone, a chemical sensor such as a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video sensor, transducer, image sensor, infrared sensor, radar, SONAR, LIDAR, or others.

In one example, a dynamic light feature including a feedback loop with a sensor, a motion sensor, is included. The dynamic light source is configured to illuminate a location where the motion is detected by sensing the spatial position of the motion and steering the output beam to that location. In another example of a dynamic light feature including a feedback loop with a sensor, an accelerometer, is included. The accelerometer is configured to anticipate where the laser light source apparatus is moving toward and steer the output beam to that location even before the user of the apparatus can move the light source to be pointing at the desired location. Of course, these are merely examples of implementations of dynamic light sources with feedback loops including sensors. There can be many other implementations of this invention concept that includes combining dynamic light sources with sensors.

In some embodiments, the invention may be applicable as a visible light communication transceiver for bi-directional communication. Optionally, the transceiver also contains a detector including a photodiode, avalanche photodiode, photomultiplier tube or other means of converting a light signal to electrical energy. The detector is connected to the modem. In this embodiment the modem is also capable of decoding detected light signals into binary data and relaying that data to a control system such as a computer, cell-phone, wristwatch, or other electronic device.

In some embodiments, the present invention provides a smart white light-source to be used on automotive vehicles for illumination of the exterior environment of the vehicle. An exemplary usage would be as a parking light, headlight, fog-light, signal-light or spot-light. In an embodiment, a lighting apparatus is provided including a housing having an aperture. Additionally, the lighting apparatus includes one or more pump light sources including one or more blue lasers or blue SLED sources. The individual blue lasers or SLEDs have an emission spectrum with center wavelength within the range 400 to 480 nm. The one or more of the pump light sources emitting in the blue range of wavelengths illuminates a wavelength converting element which absorbs part of the pump light and reemits a broader spectrum of longer wavelength light. Each pump light source is configured such that both light from the wavelength converting element and light directly emitted from the one or more light sources being combined as a white light spectrum. The lighting apparatus further includes optical elements for focusing and collimating the white light and shaping the white light spot.

In this smart lighting apparatus, each pump light source is independently addressable, and is controlled by a laser driver module configured to generate pulse-modulated light signal at a frequency range of between 10 MHz and 100 GHz. The laser driver includes an input interface for receiving digital or analog signals from sensors and electronic controllers in order to control the modulation of the pump laser sources for the transmission of data. The lighting apparatus can transmit data about the vehicle or fixture to which it is attached via the modulation of the blue or violet lasers or SLED sources to other vehicles which have appropriately configured VLC receivers. For example, the white light source could illuminate oncoming vehicles. Optionally, it could illuminate from behind or sides vehicles travelling in the same direction. As an example the lighting apparatus could illuminate VLC-receiver enabled road signs, road markings, and traffic signals, as well as dedicated VLC receivers installed on or near the highway. The lighting apparatus would then broadcast information to the receiving vehicles and infrastructure about the broadcasting vehicle. Optionally, the lighting apparatus could transmit information on the vehicle's location, speed and heading as well as, in the case of autonomous or semiautonomous vehicles, information about the vehicle's destination or route for purposes of efficiently scheduling signal light changes or coordinating cooperative behavior, such as convoying, between autonomous vehicles.

In some embodiments, the present invention provides a communication device which can be intuitively aimed. An example use of the communication device would be for creation of temporary networks with high bandwidth in remote areas such as across a canyon, in a ravine, between mountain peaks, between buildings separated by a large distance and under water. In these locations, distances may be too large for a standard wireless network or, as in the case of being under water, radio frequency communications may be challenging due to the absorption of radio waves by water. The communication device includes a housing having an aperture. Additionally, the communication device includes one or more blue laser or blue SLED source. The individual blue lasers or SLEDs have an emission spectrum with center wavelength within the range 400 to 480 nm. One or more of the light sources emitting in the blue range of wavelengths illuminates a wavelength converting element which absorbs part of the pump light and reemits a broader spectrum of longer wavelength light. The light source is configured such that both light from the wavelength converting element and the plurality of light sources are emitted as a white light spectrum. The communication device includes optical elements for focusing and collimating the white light and shaping the white light spot. Optionally, each light source in the communication device is independently addressable, and is controlled by a driver module configured to generate pulse-modulated light signal at a modulation frequency range of between 10 MHz and 100 GHz. The driver module includes an input interface for receiving digital or analog signals from sensors and electronic controllers in order to control the modulation of the laser sources for the transmission of data.

The communication device includes one or more optical detectors to act as VLC-receivers and one or more band-pass filters for differentiating between two or more of the laser or SLED sources. Optionally, a VLC-receiver may detect VLC signals using multiple avalanche photodiodes capable of measuring pulse-modulated light signals at a frequency range of about 50 MHz to 100 GHz. Optionally, the communication device contains one or more optical elements, such as mirrors or lenses to focus and collimate the light into a beam with a divergence of less than 5 degrees in a less preferred case and less than 2 degrees in a most preferred case. Two such apparatuses would yield a spot size of between roughly 3 and 10 meters in diameter at a distance of 100 to 300 meters, respectively, and the focused white light spot would enable operators to aim the VLC-transceivers at each other even over long distances simply by illuminating their counterpart as if with a search light.

In some embodiments, the communication device disclosed in the present invention can be applied as flash sources such as camera flashes that carrying data information. Data could be transmitted through the flash to convey information about the image taken. For example, an individual may take a picture in a venue using a camera phone configured with a VLC-enabled solid-state light-source in accordance with an embodiment of this invention. The phone transmits a reference number to VLC-receivers installed in the bar, with the reference number providing a method for identifying images on social media websites taken at a particular time and venue.

In some embodiments, the present invention provides a projection apparatus. The projection apparatus includes a housing having an aperture. The apparatus also includes an input interface for receiving one or more frames of images. The apparatus includes a video processing module. Additionally, the apparatus includes one or more blue laser or blue SLED sources disposed in the housing. The individual blue lasers or SLEDs have an emission spectrum with center wavelength within the range 400 to 480 nm. One or more of the light sources emitting in the blue range of wavelengths illuminates a wavelength converting element which absorbs part of the pump light and reemits a broader spectrum of longer wavelength light. The light source is configured such that both light from the wavelength converting element and the plurality of light sources are emitted as a white light spectrum. Additionally, the apparatus includes optical elements for focusing and collimating the white light and shaping the white light spot. In this apparatus, each light source is independently addressable, and is controlled by a laser driver module configured to generate pulse-modulated light signal at a modulation frequency range of between 10 MHz and 100 GHz. The laser driver also includes an input interface for receiving digital or analog signals from sensors and electronic controllers in order to control the modulation of the laser sources for the transmission of data. Furthermore, the apparatus includes a power source electrically coupled to the laser source and the digital light processing chip. Many variations of this embodiment could exist, such as an embodiment where the green and blue laser diode share the same substrate or two or more of the different color lasers could be housed in the same packaged. The outputs from the blue, green, and red laser diodes would be combined into a single beam.

In an embodiment, the present invention provides a lighting apparatus enabling visible light communication with various appliances, electronic devices and sensors within an area illuminated by artificial lighting such as in a home, office building, factory, store or shop, warehouse, parking deck, theater, grocery store, parking lot, and street or road among other places. The apparatus includes a housing holding one or more blue laser sources or blue SLED sources and having an aperture. The individual blue lasers or SLEDs have an emission spectrum with center wavelength within the range 400 to 480 nm. One or more of the blue light sources emitting in the range of blue light wavelengths illuminates a wavelength converting element which absorbs part of the blue light and reemits a broader spectrum of longer wavelength light. The apparatus is configured such that both light from the wavelength converting element and the plurality of light sources are emitted as a white light spectrum. The apparatus may include optical elements for focusing and collimating the white light and shaping the white light spot. In this apparatus, one or more of the blue laser devices is independently addressable, and is controlled by a laser driver module configured to generate a modulated current at a frequency range of between 10 MHz and 100 GHz. The laser driver also includes an input interface for receiving digital or analog signals. For example, the apparatus may be provided with a FM or AM radio receiver, a short-range radio frequency transceiver for communication over a wireless local area network or personal area network. For example, the apparatus may be provided with a receiver or transceiver for communication using the IEEE 802.11 communication standard, the Bluetooth communication protocol, or similar radio frequency bases communication standard. In another example, the apparatus is provided with a receiver or transceiver enabling communication over power lines providing electrical power to the apparatus. In an example, the apparatus is provided with a receiver for visible light communication, making the apparatus a VLC-transceiver. In an example, the apparatus is provided with a receiver or transceiver for a wired local area network protocol such as Ethernet or fiber optic communication among others. The apparatus receives data from the provided RF, wired or VLC-based communication channel and retransmits the data via the modulation of the blue lasers or SLED sources.

Merely by way of example, such an apparatus would be advantageous in transmitting data to distributed sensors and appliances. For example, a printer could be positioned anywhere in a room without regard to reception of wireless networks or access to wired networks. A request to print a document along with the data describing the document could then be sent to the printer regardless of the printer's location within the building so long as the printer is illuminated by the apparatus. Other appliances which could be communicated to include: televisions, refrigerators, toaster ovens, ovens, dishwashers, clothes washers and driers, thermostats, microwave ovens, smoke detectors, fire detectors, carbon monoxide detectors, humidifiers, light sources, emergency exit signs and emergency lighting fixtures among others. In the case of such an apparatus provided with an Ethernet or fiber-optic-based transceiver, the apparatus could provide wireless transmission over VLC protocols to a plurality of electronic devices at transfer rates much higher than those achievable with a WiFi based technology.

Figure 22A:
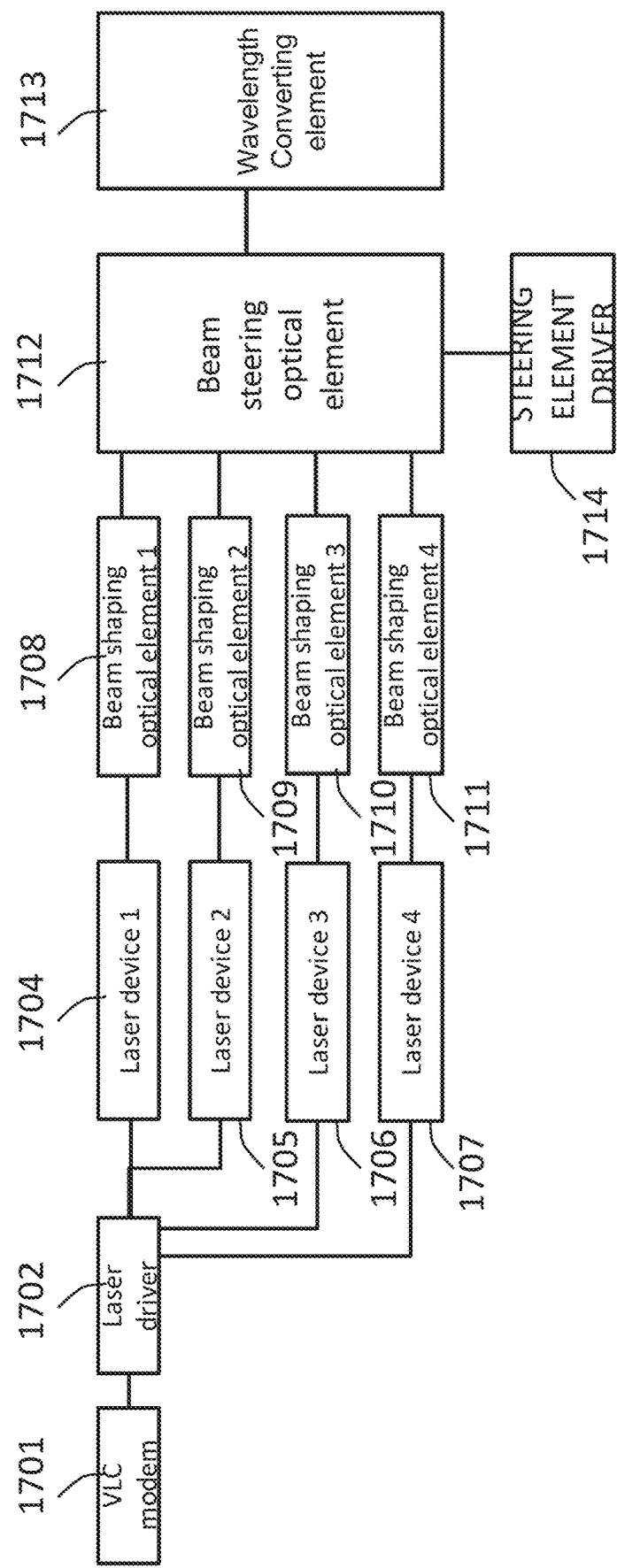
FIG. 22A is a functional block diagram for a dynamic light source according to some embodiments of the present invention.

FIG. 22A is a functional block diagram for a dynamic light source according to some embodiments of the present invention. This diagram is merely an example, which should not unduly limit the scope of the claims. One of ordinary skill in the art would recognize many variations, alternatives, and modifications. As shown, the dynamic light source includes one or more violet or blue laser devices 1704, 1705, 1706 and 1707. Each individual violet or blue laser device emits a spectrum with a center wavelength in the range of 380-480 nm. Optionally, the dynamic light source includes one or more beam shaping optical elements 1708, 1709, 1710 and 1711. The laser devices 1704, 1705, 1706 and 1707 are configured such that their emitting facets are aimed at the one or more beam shaping optical elements 1708, 1709, 1710 and 1711, respectively for collimating, focusing or otherwise shaping the beams emitted by the one or more blue laser devices. The beam shaping optical elements may be comprised of lenses or mirrors, and provide functions such as beam collimation and focusing as well as control of the propagation direction of the laser light. The laser light from each blue laser device is incident on a wavelength converting element 1713. The beam steering optical element 1712 directs the laser light onto a wavelength converting element 1713. The position of the laser light on the wavelength converting element 1713 is dynamically controlled by a beam steering optical element 1712 which is controlled by a steering element driver 1714. Optionally, the beam steering optical element 1712 can one or a combination of many of a mirror galvanometer, a MEMs scanning mirror, a rotating polygon mirror, a DLP chip, an LCOS chip, a fiber scanner, or the like. The steering element driver 1714 is configured to take input from an external system such as a microcontroller or analog circuit to control the positioning of the beam steering optical element 1712 so as to dynamically control how laser light illuminates the wavelength converting element 1713 such that a white light spot with dynamically controllable shape and intensity profile can be formed on the wavelength converting element 1713.

Fiber scanner has certain performance advantages and disadvantages over scanning mirror as the beam steering optical element in the dynamic light source. Scanning mirror appears to have significantly more advantages for display and imaging applications. For example, the scanning frequency can be achieved much higher for scanning mirror than for fiber scanner. Mirror scanner may raster at near 1000 kHz with higher resolution (<1 µm) but without 2D scanning limitation while fiber scanner may only scan at up to 50 kHz with 2D scanning limitation. Additionally, mirror scanner can handle much higher light intensity than fiber scanner. Mirror scanner is easier to be physically set up with light optimization for white light or RGB light and incorporated with photodetector for image, and is less sensitive to shock and vibration than fiber scanner. Since light beam itself is directly scanned in mirror scanner, no collimation loss, AR loss, and turns limitation exist, unlike the fiber itself is scanned in fiber scanner which carries certain collimation loss and AR loss over curved surfaces. Of course, fiber scanner indeed is advantageous in providing much larger angular displacement (near 80 degrees) over that (about +/−20 degrees) provided by mirror scanner.

A VLC modem 1701 is provided in the dynamic light source. The VLC modem 1701 is capable of receiving digital control data from a data source via a wired or wireless link to provide control signal for a laser driver 1702. The laser driver 1702 supplies controlled current at a controlled voltage to the one or more laser devices 1704, 1705, 1706 and 1707. Optionally, the laser driver 1702 can individually control/modulate the one or more of the violet or blue laser devices 1704, 1705, 1706 and 1707.

Optionally, one or more optical elements are provided for imaging the combined light of each blue laser device and the light emitted by the wavelength converting element 1713 onto a projection surface. One optical element for projecting image includes a color wheel. As an example, the color wheel may include phosphor material that modifies the color of light emitted from the light source. Optionally, the color wheel includes multiple regions, each of the regions corresponding to a specific color (e.g., red, green, blue, etc.). Optionally, the color wheel includes a slot or transparent section for the blue color light and a phosphor containing region for converting blue light to green light. In operation, the blue light source (e.g., blue laser diode or blue LED) provides blue light through the slot and excites green light from the phosphor containing region; the red light source provides red light separately. The green light from the phosphor may be transmitted through the color wheel, or reflected back from it. In either case the green light is collected by optics and redirected to the microdisplay. The blue light passed through the slot is also directed to the microdisplay. The blue light source may be a laser diode or LED fabricated on non-polar or semi-polar oriented GaN. Alternatively, a green laser diode may be used, instead of a blue laser diode with phosphor, to emit green light. It is to be appreciated that can be other combinations of colored light sources and color wheels thereof.

Figure 22B:
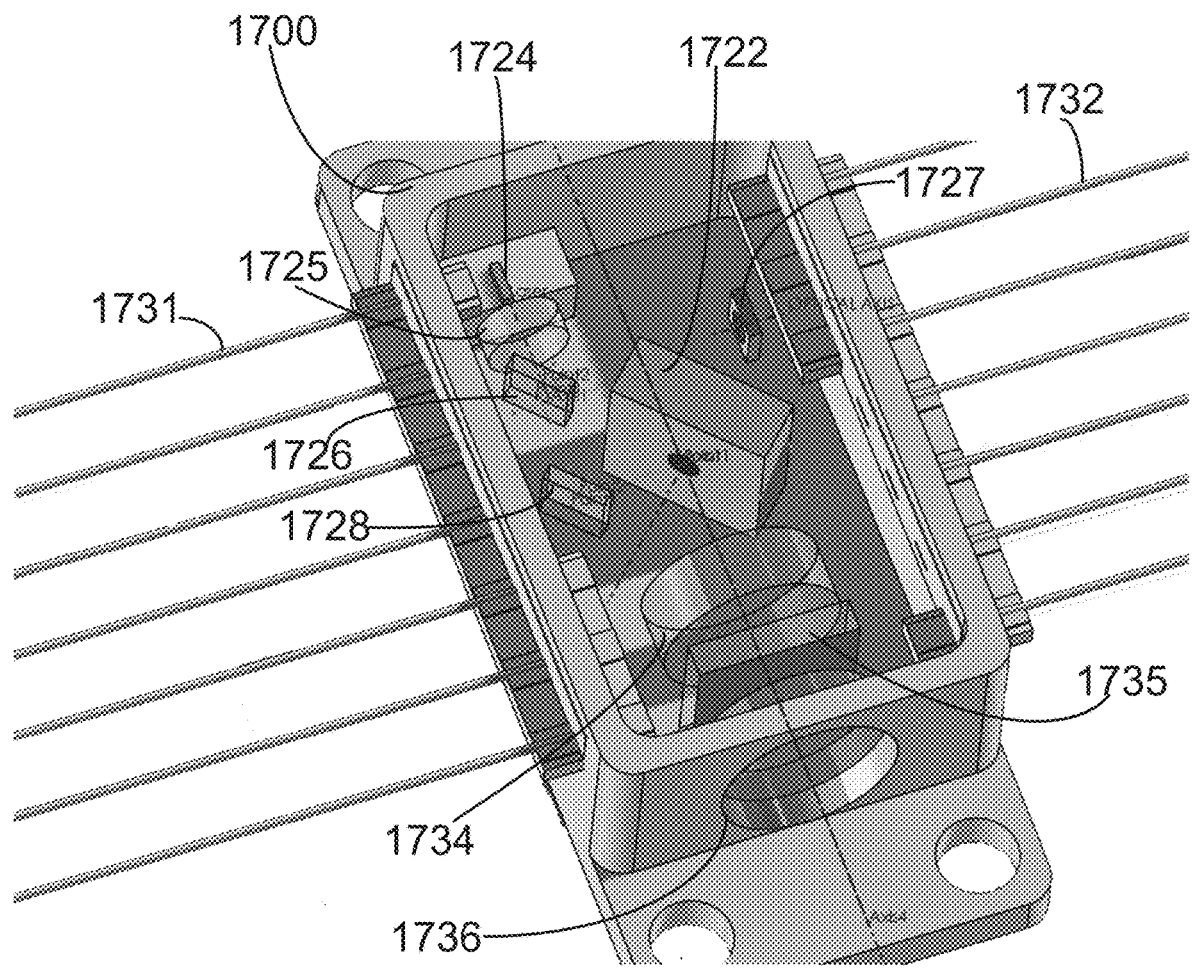
FIG. 22B is a schematic of an enclosed dynamic light source with a beam steering element according to an example of the present invention.

FIG. 22B is a diagram of a dynamic light source with beam steering element according to an example of some embodiments of FIG. 22A of the present invention. This diagram is merely an example, which should not unduly limit the scope of the claims. One of ordinary skill in the art would recognize many variations, alternatives, and modifications. As shown, the light source is a laser-based smart light source assembled in a case 1700. The laser diode 1724 is one of violet or blue laser devices according to the invention. Laser light firstly passes through a collimation lens 1725 and is split by a beamsplitter 1726. One portion of laser light is directed to a photodetector 1727 for intensity monitoring. Another portion of laser light is further guided to a mirror 1728 which re-directs the light to a beam steering/scanning device 1722 which can be controlled by a servo controller to dynamically change the beam direction based on certain feedback signals. The laser light coming out of the beam steering/scanning device 1722 firstly passes through a re-imaging lens 1734 for focusing the beam to a light converting element 1735 to convert the violet or blue laser to white light, then is guided out of a window 1736 of the case 1700. Optionally, the beam steering/scanning device 1722 is made of a plurality of MEMS scanning mirrors. Optionally, the beam steering/scanning device 1722 is a rotating polygonal mirror, LCOS, DLP, or the like. Optionally, the light converting element 1735 is a phosphor material.

This white light or multi-colored dynamic image projection technology according to this invention enables smart lighting benefits to the users or observers. This embodiment of the present invention is configured for the laser-based light source to communicate with users, items, or objects in two different methods wherein the first is through VLC technology such as LiFi that uses high-speed analog or digital modulation of a electromagnetic carrier wave within the system, and the second is by the dynamic spatial patterning of the light to create visual signage and messages for the viewers to see. These two methods of data communication can be used separately to perform two distinct communication functions such as in a coffee shop or office setting where the VLC/LiFi function provides data to users' smart phones and computers to assist in their work or internet exploration while the projected signage or dynamic light function communicates information such as menus, lists, directions, or preferential lighting to inform, assist, or enhance users experience in their venue.

This white light or multi-colored dynamic image projection technology according to this invention enables smart lighting benefits to the users or observers. This embodiment of the present invention is configured for the laser-based light source to communicate with users, items, or objects in two different methods wherein the first is through VLC technology such as LiFi that uses high-speed analog or digital modulation of an electromagnetic carrier wave within the system, and the second is by the dynamic spatial patterning of the light to create visual signage and messages for the viewers to see. These two methods of data communication can be used separately to perform two distinct communication functions such as in a coffee shop or office setting where the VLC/LiFi function provides data to users' smart phones and computers to assist in their work or internet exploration while the projected signage or dynamic light function communicates information such as menus, lists, directions, or preferential lighting to inform, assist, or enhance users experience in their venue.

Figure 23A:
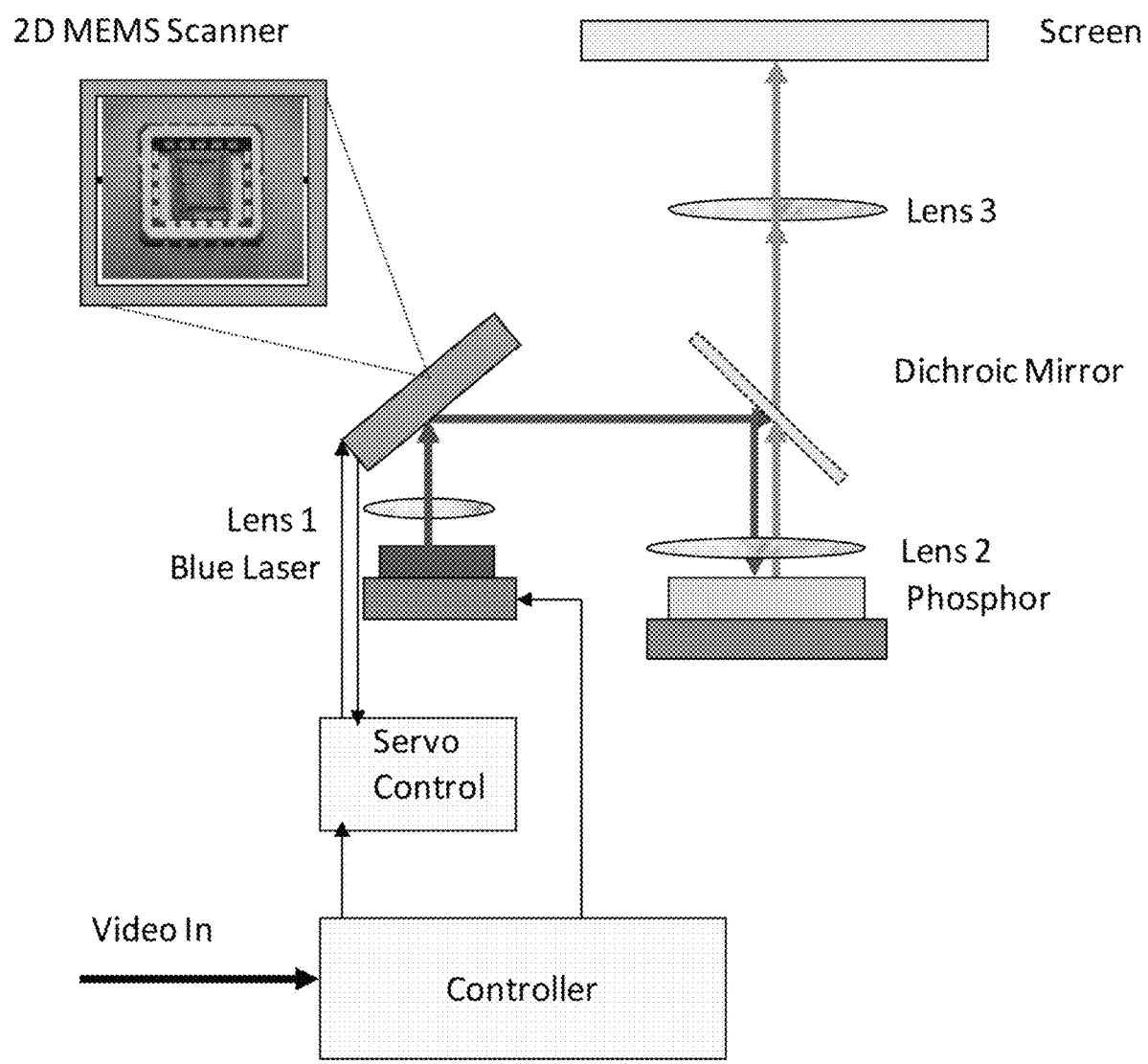
FIG. 23A is a schematic diagram of a scanned phosphor display with reflection architecture according to an embodiment of the present invention.

FIG. 23A is a schematic diagram of a scanned phosphor display with reflection architecture according to an embodiment of the present invention. This diagram is merely an example, which should not unduly limit the scope of the claims. One of ordinary skill in the art would recognize many variations, alternatives, and modifications. As shown, a controller is configured to receive video data and convert the data to real-time driving signals for the laser devices (in violet or blue wavelength ranges) to produce laser beams based on the driving signals. The laser beams are passing through a collimation lens before hitting a MEMS scanner. The MEMS scanner is controlled by a servo control unit which is also controlled by the controller. The MEMS scanner is configured to controllably guide the laser beams to respective spots of a dichronic mirror which reflects the laser beams to a phosphor material. The MEMS scanner is dynamically changing the laser spot positions based on the received video signal. The phosphor material acts as a light converting material to convert the violet or blue laser to white light. The phosphor material is set up as a reflective film to guide the white light back passing through the dichroic mirror. A re-imaging lens is inserted between the dichronic mirror and a screen which displays a patterned image dynamically controlled by the MEMS scanner.

Figure 23B:
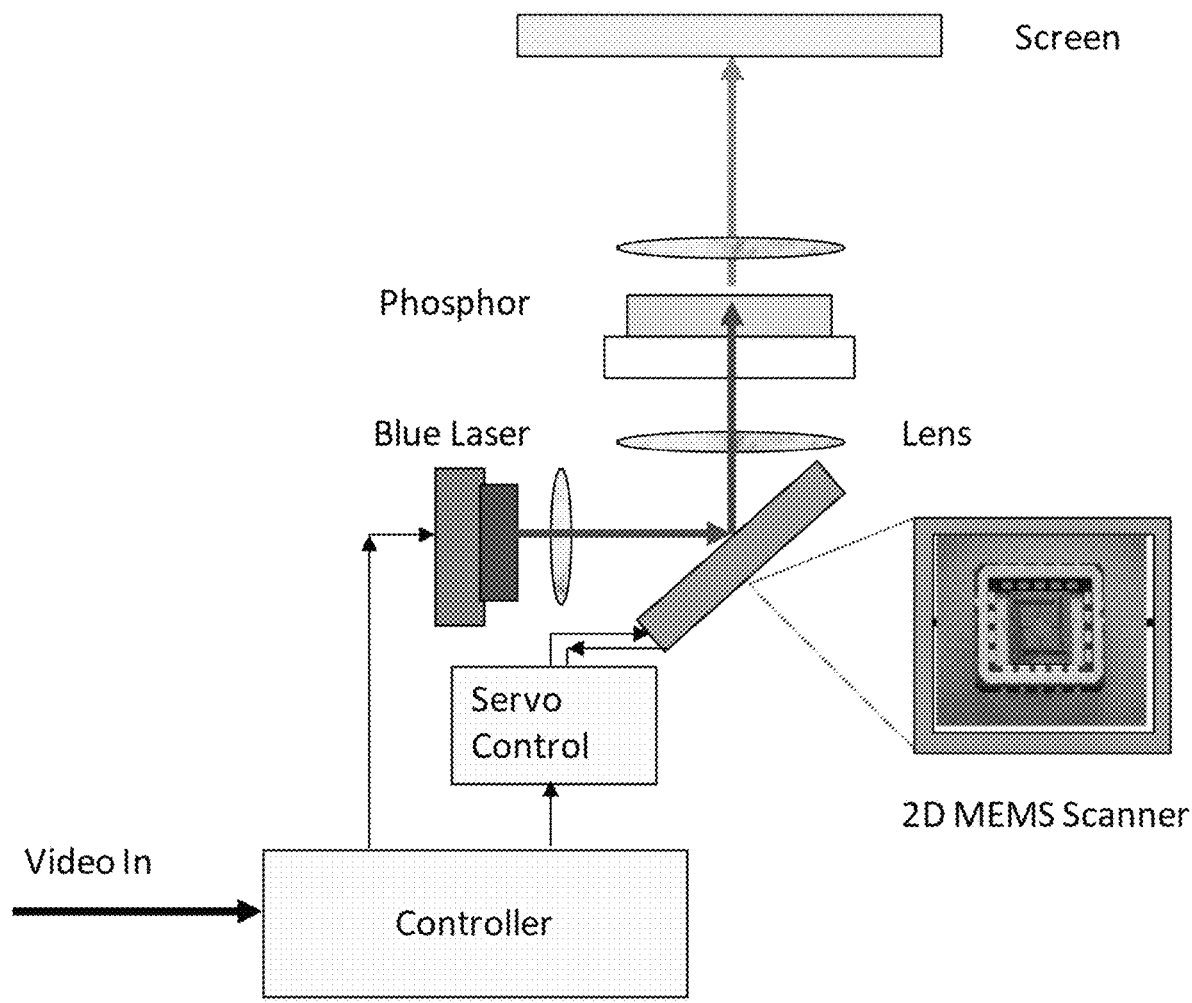
FIG. 23B is a schematic diagram of a scanned phosphor display with transmission architecture according to an embodiment of the present invention.

FIG. 23B is a schematic diagram of a scanned phosphor display with transmission architecture according to an embodiment of the present invention. This diagram is merely an example, which should not unduly limit the scope of the claims. One of ordinary skill in the art would recognize many variations, alternatives, and modifications. As shown, this scanned phosphor display is substantially similar to that shown in FIG. 23A. Optionally, the phosphor material is set up as a transmission film to allow the incoming laser light to pass through and convert to white light.

Figure 23C:
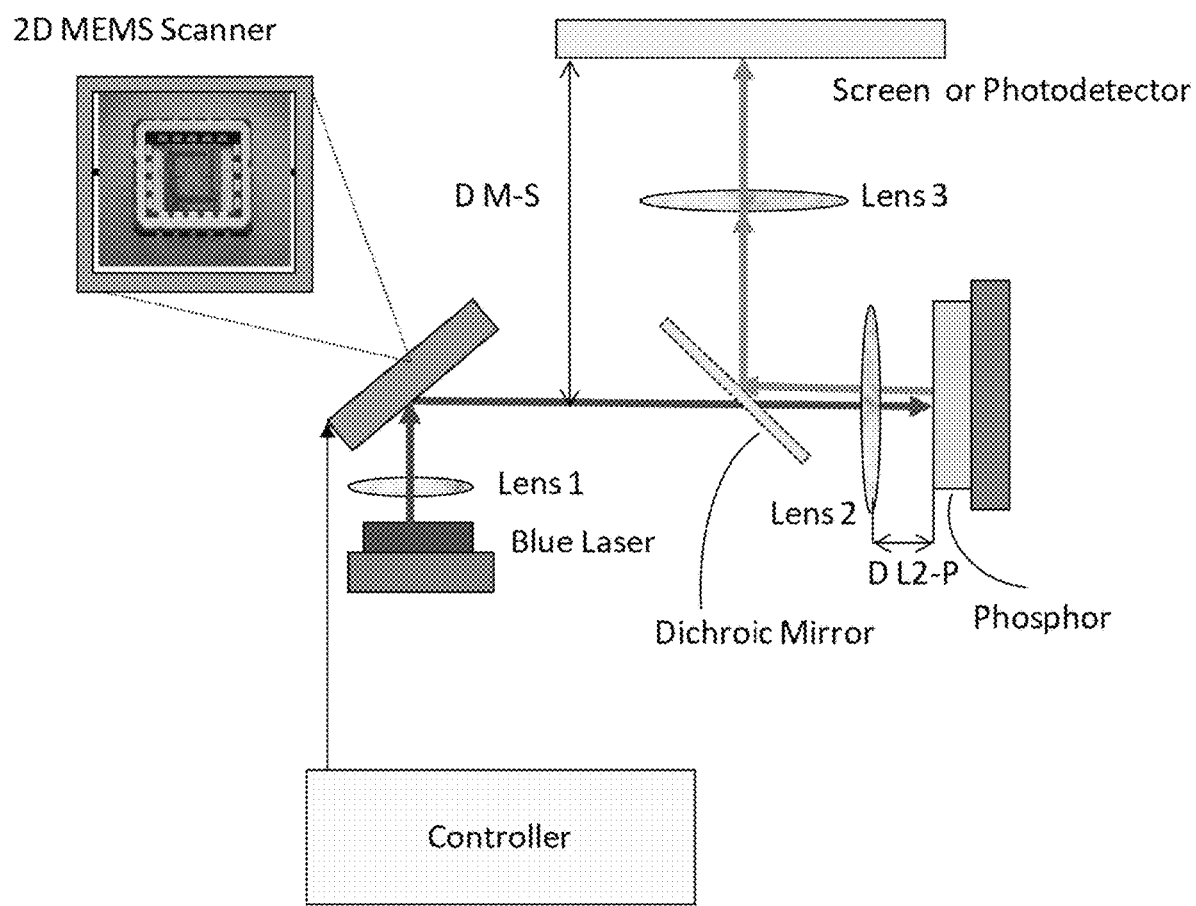
FIG. 23C is a schematic diagram of a scanned phosphor display with reflection architecture according to an alternative embodiment of the present invention.

FIG. 23C is a schematic diagram of a scanned phosphor display with reflection architecture according to an alternative embodiment of the present invention. This diagram is merely an example, which should not unduly limit the scope of the claims. One of ordinary skill in the art would recognize many variations, alternatives, and modifications. As shown, this scanned phosphor display is another alternative variation of that shown in FIG. 23A. Optionally, the dichronic mirror is configured to allow the blue light first passing through to reach the phosphor material. The phosphor material is configured to be in reflection mode to reflect the white light generated by converting the incoming blue light. The white light beam is then reflected by the dichronic mirror and guided toward, passing a re-imaging lens, the screen or photodetectors. Note, the white light spots are displayed directly on screen or detected by the photodetectors, and no visible light communication is required for this scanned phosphor display.

Figure 24:
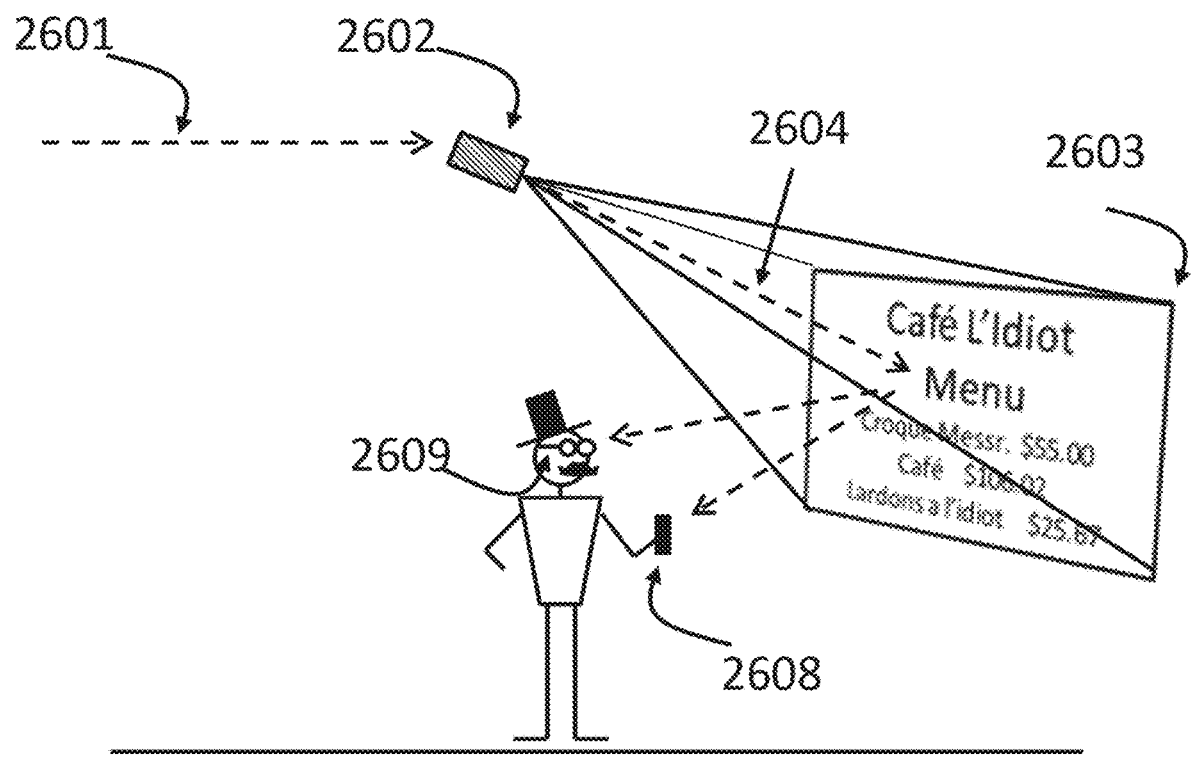
FIG. 24 is a schematic diagram of using a white laser light source based on blue laser as projected light for visible light communication according to some embodiments of the present invention.

FIG. 24 is a schematic representation of a use case for an apparatus in accordance with an embodiment of this invention. The apparatus 2602 is used to project an image 2603 containing information in the form of text, pictograms, moving shapes, variation in hue and the like. Encoded in the projected light using VLC encoding schemes is a data stream 2604. The data stream can be received by multiple smart devices carried or worn by the user to provide more information to the user. For example, the digital data stream may provide more detailed information about a restaurant's menu or may provide the address to a website containing more information. In this case, the user receives the VLC data using a wearable device such as smart glasses 2609 as well as a smart phone 2608, though it should be obvious to one skilled in the art that other devices may receive and process this data. For example, one could receive and process data using smart watches, virtual and augmented reality headsets, tablet computers and laptop computers among others. Data can be provided to the apparatus either as a digital information provided through RF transmission, WiFi, LiFi or VLC, or via transmission along wires. The apparatus may use VLC to transmit data that is stored in the apparatus and not received from an external source. In this case, the data may be stored in volatile or non-volatile memory formats as either an integrated part of the apparatus or in a removable format such as a card, hard-disk, compact disk read only memory (CD-ROM) or any other optical or magnetic storage medium.

In another aspect, the present invention provides a dynamic light source or "light-engine" that can function as a white light source for general lighting applications with tunable colors.

In an embodiment, the light-engine consists of two or more lasers or SLED light sources. At least one of the light sources emits a spectrum with a center wavelength in the range of 380-450 nm. At least one of the light sources emits a spectrum with a center wavelength in the range of 450-520 nm. This embodiment is advantageous in that for many phosphors in order to achieve a particular color point, there will be a significant gap between the wavelength of the laser light source and the shortest wavelength of the spectrum emitted by the phosphor. By including multiple blue lasers of significantly different wavelengths, this gap can be filled, resulting in a similar color point with improved color rendering.

In an embodiment, the green and red laser light beams are incident on the wavelength converting element in a transmission mode and are scattered by the wavelength converting element. In this embodiment the red and green laser light is not strongly absorbed by the wavelength converting element.

In and embodiment, the wavelength converting element consists of a plurality of regions comprised of varying composition or color conversion properties. For example, the wavelength converting element may be comprised by a plurality of regions of alternating compositions of phosphor. One composition absorbs blue or violet laser light in the range of wavelengths of 385 to 450 nm and converts it to a longer wavelength of blue light in the wavelength range of 430 nm to 480 nm. A second composition absorbs blue or violet laser light and converts it to green light in the range of wavelengths of 480-550 nm. A third composition absorbs blue or violet laser light and converts it to red light in the range of wavelengths of 550 to 670 nm. Between the laser light source and the wavelength converting element is a beam steering mechanism such as a MEMS mirror, rotating polygonal mirror, mirror galvanometer, or the like. The beam steering element scans a violet or blue laser spot across the array of regions on the wavelength converting element and the intensity of the laser is synced to the position of the spot on the wavelength converting element such that red, green and blue light emitted or scattered by the wavelength converting element can be varied across the area of the wavelength converting element.

In an embodiment, the phosphor elements are single crystal phosphor platelets.

In an embodiment, the phosphor elements are regions of phosphor powder sintered into platelets or encapsulated by a polymer or glassy binder.

In another embodiment, the plurality of wavelength converting regions comprising the wavelength converting element are composed of an array of semiconductor elements such as InGaN, GaN single or multi-quantum wells for the production of blue or green light and single and multi-quantum-well structures composed of various compositions of AlInGaAsP for production of yellow and red light, although this is merely an example, which should not unduly limit the scope of the claims. One of ordinary skill in the art would recognize other alternative semiconductor materials or light-converting structures.

In another embodiment, the plurality of wavelength converting regions comprising the wavelength converting element are composed of an array of semiconductor elements such as InGaN GaN quantum dots for the production of blue, red or green light and quantum dots composed of various compositions of AlInGaAsP for production of yellow and red light, although this is merely an example, which should not unduly limit the scope of the claims. One of ordinary skill in the art would recognize other alternative semiconductor materials or light-converting structures.

Figure 25A:
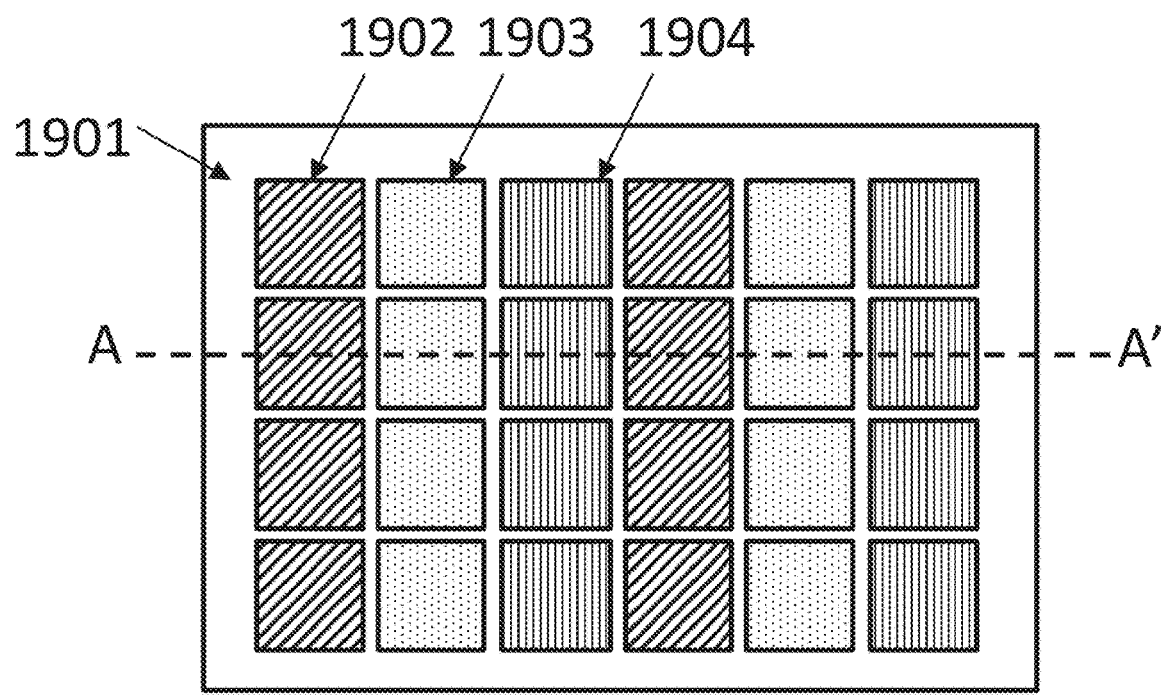
FIG. 25A is a schematic of a composite wavelength converting element enabling dynamic spatial control of light spot intensity and spectrum according to an embodiment of the present invention.

FIG. 25A is a schematic representation of a wavelength converting element including a plurality of wavelength converting regions in accordance with an embodiment. The plurality of wavelength converting regions are comprised of regions 1902 that converts blue or violet laser light to a predominantly red spectrum, regions 1903 that converts blue or violet laser light to a predominantly green spectrum, and regions 1904 that converts violet laser light into a predominantly blue spectrum or blue laser light into a spectrum predominantly of a longer wavelength of blue light than the blue laser. The plurality of wavelength converting regions are surrounded by a matrix 1901 which can be either a polymer, metal, ceramic, glass or composite material. To one skilled in the art, it should be obvious that there are many configurations for the shape and relative positions of the regions 1902, 1903, and 1904. In general, the lateral dimensions should be at a minimum the same as the spot size of the blue or violet pump laser when projected onto the wavelength converting region.

In another embodiment, the wavelength converting element also contains regions of non-wavelength converting material that scatters the laser light. The advantage of this configuration is that the blue laser light is diffusely scattered without conversion losses, thereby improving the efficiency of the overall light source. Examples of such non-converting but scattering materials are: granules of wide-bandgap ceramics or dielectric materials suspended in a polymer or glassy matrix, wide-bandgap ceramics or dielectric materials with a roughened surface, a dichroic mirror coating overlaid on a roughened or patterned surface, or a metallic mirror or metallic-dielectric hybrid mirror deposited on a rough surface.

Figure 25B:
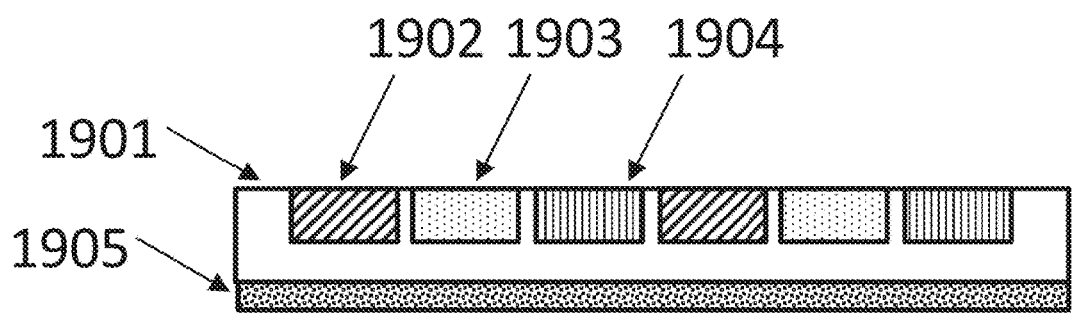
FIG. 25B is a schematic of the cross-section of the composite wavelength converting element according to an embodiment of the present invention.

FIG. 25B is a schematic representation of the cross-section AA from FIG. 25A in accordance with an embodiment. The cross section shows a plurality of wavelength converting or scattering regions 1902, 1903 and 1904 embedded in a matrix 1901 that provides physical support as well as a path for conduction of heat away from the regions. The matrix surrounds the edges of the regions 1902, 1903, and 1904 as well as the back of the regions. A bonding layer 1905 is provided. The bonding layer can be composed of polymers such as epoxies or glues or one or more metals such as gold, copper, aluminum, silver, gold-tin solder or other solders, eutectic solders, and the like.

Figure 25C:
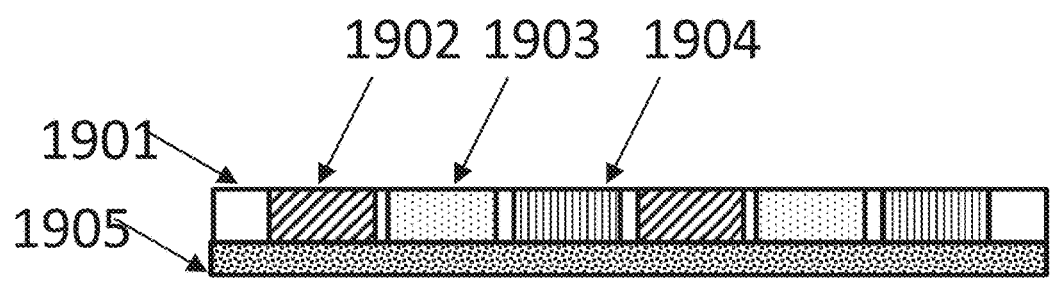
FIG. 25C is a schematic of the cross-section of the composite wavelength converting element according to an embodiment of the present invention.

FIG. 25C is a schematic representation of the cross-section AA from FIG. 25A in accordance with another embodiment. The cross section shows a plurality of wavelength converting or scattering regions 1902, 1903 and 1904 embedded in a matrix 1901 that provides physical support as well as a path for conduction of heat away from the regions. The matrix surrounds the edges of the regions 1902, 1903, and 1904 but does not overlay the backsides of the regions. A bonding layer 1905 is provided. The bonding layer can be composed of polymers such as epoxies or glues or one or more metals such as gold, copper, aluminum, silver, gold-tin solder or other solders, eutectic solders, and the like. This configuration is advantageous when the matrix material is not highly thermally conductive. By contacting the wavelength converting regions directly with a highly thermally conductive bonding layer, a highly thermally conductive path can be formed to a heat-sink in order to efficiently remove heat from the wavelength converting elements.

In some embodiments, the apparatus dynamically adjusts the spatial variation of the white light spot or spatially varies the brightness of area within the spot based on preprogrammed responses to various inputs or on control by a smart device.

In an example embodiment, the apparatus may adjust the shape of the white light spot as well as spatially vary the brightness of the spot in response to the time of day. The dynamic control of the spot may be preprogrammed into the apparatus. As an example, the apparatus may be programmed to adjust the emitted white light to form a wide spot of maximum uniform brightness during mid-morning to afternoon hours. The apparatus may be programmed to progressively narrow the dimensions of the spot and reduce the brightness across the late afternoon such that by nighttime, the spot is at a minimum diameter and brightness such that the room in which the apparatus is located is ascetically lit for the nighttime.

Such an apparatus could also have preprogrammed responses to other inputs such as room temperature, ambient lighting from windows or other light sources, day of the year or week, among others.

In another example embodiment, the apparatus is paired with a smart device through which commands can be given to the apparatus to control the shape of and spatial variation of brightness within illuminated area of the light. In this context, smart devices include tablet computers, laptop and desktop computers, smart watches and smart phones which are capable of executing arbitrary software applications, among others. Commands from the smart-device may include continuous adjustment of the output of the apparatus by the user, or predetermined configurations of spot shape, size and brightness variation.

The smart-device may also be able to command the apparatus to adopt more than one configuration in a sequence in order to convey some information to a user. As an example, the smart-device may command the apparatus to repeatedly narrow and then enlarge the spot size at some fixed cadence in order to signal the arrival of a telephone call. Other changes of light spot configuration as well as other triggers causing a command to be sent to the apparatus from the smart device are possible.

Figure 26A:
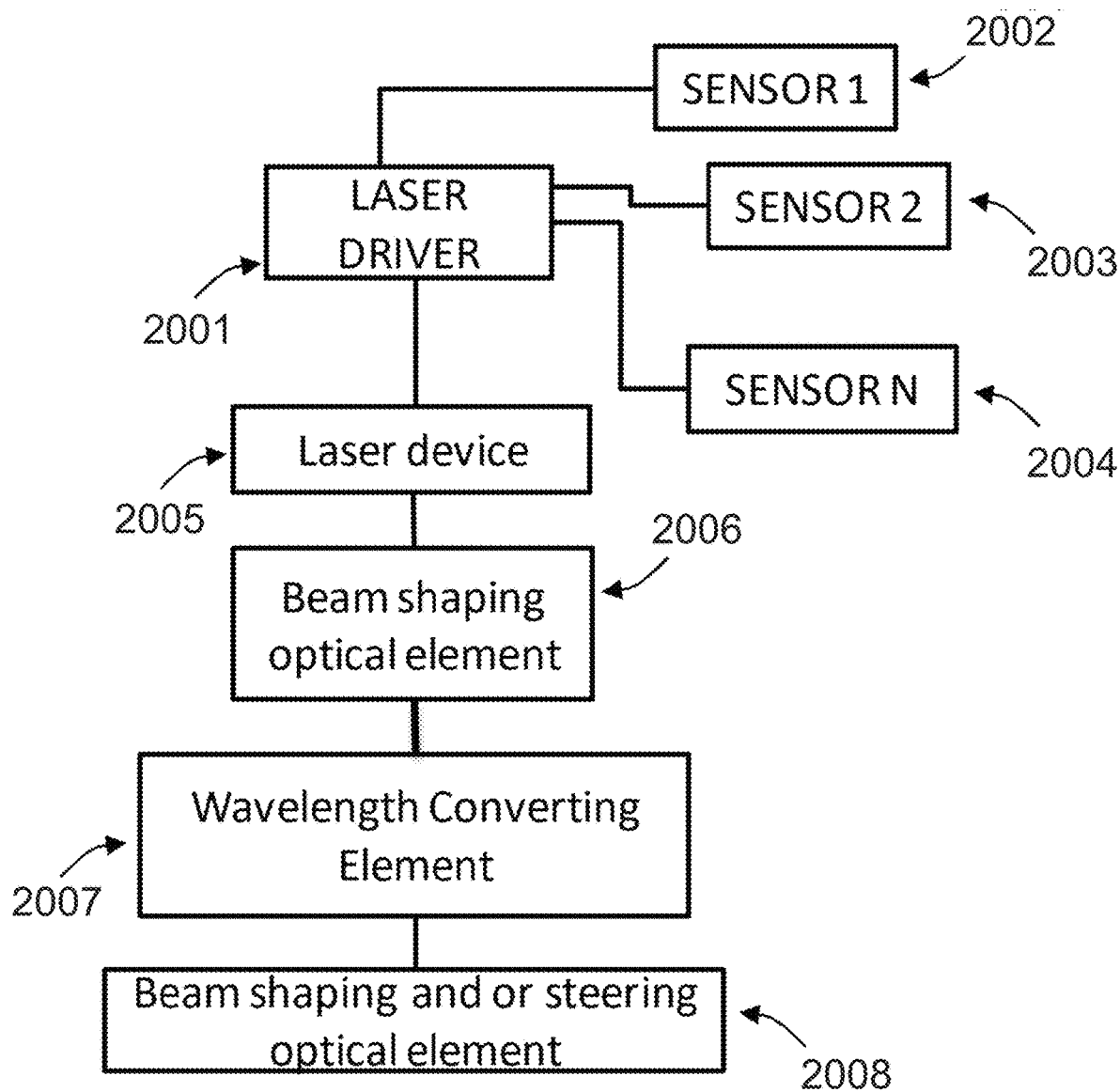
FIG. 26A is a functional block diagram for a laser-based smart-lighting system according to some embodiments of the present invention.

FIG. 26A is a functional block diagram for a laser-based smart-lighting system according to some embodiments of the present invention. This diagram is merely an example, which should not unduly limit the scope of the claims. One of ordinary skill in the art would recognize many variations, alternatives, and modifications. As shown, the smarting-lighting system includes a laser-based dynamic white light source including a blue laser device 2005 emitting a spectrum with a center wavelength in the range of 380-480 nm. The system includes an optional beam shaping optical element 2006 provided for collimating, focusing or otherwise shaping the beam emitted by the laser device 2005. The laser light from the laser device 2005 is incident onto a wavelength converting element 2007. The system additionally includes an element 2008 for shaping and steering the white light out of the wavelength converting element 2007. One or more sensors, Sensor1 2002, Sensor2 2002, up to SensorN 2004, are provided with the digital or analog output of the sensor being received by the laser driver 2001 and a mechanism provided whereby the laser driver output is modulated by the input from the sensors.

In a specific embodiment, the input to the laser driver is a digital or analog signal provided by one or more sensors.

In a specific embodiment, the output from the sensors is measured or read by a microcontroller or other digital circuit which outputs a digital or analog signal which directs the modulation of the laser driver output based on the input signal from the sensors.

In a specific embodiment, the input to the driver is a digital or analog signal provided by a microcontroller or other digital circuit based on input to the microcontroller or digital circuit from one or more sensors.

Optionally, sensors used in the smart-lighting system may include sensors measuring atmospheric and environmental conditions such as pressure sensors, thermocouples, thermistors, resistance thermometers, chronometers or real-time clocks, humidity sensor, ambient light meters, pH sensors, infra-red thermometers, dissolved oxygen meters, magnetometers and hall-effect sensors, colorimeters, soil moister sensors, and microphones among others.

Optionally, sensors used in the smart-lighting system may include sensors for measuring non-visible light and electromagnetic radiation such as UV light sensors, infra-red light sensors, infra-red cameras, infra-red motion detectors, RFID sensors, and infra-red proximity sensors among others.

Optionally, sensors used in the smart-lighting system may include sensors for measuring forces such as strain gages, load cells, force sensitive resistors and piezoelectric transducers among others.

Optionally, sensors used in the smart-lighting system may include sensors for measuring aspects of living organisms such as fingerprint scanner, pulse oximeter, heart-rate monitors, electrocardiography sensors, electroencephalography sensors and electromyography sensors among others.

In an embodiment, the dynamic properties of the light source may be initiated by the user of the apparatus. For example, the user may activate a switch, dial, joystick, or trigger to modify the light output from a static to a dynamic mode, from one dynamic mode to a different dynamic mode, or from one static mode to a different static mode.

In one example of the smart-lighting system, it includes a dynamic light source configured in a feedback loop with a sensor, for example, a motion sensor, being provided. The dynamic light source is configured to illuminate specific locations by steering the output of the white light beam in the direction of detected motion. In another example of a dynamic light feature including a feedback loop with a sensor, an accelerometer is provided. The accelerometer is configured to measure the direction of motion of the light source. The system then steers the output beam towards the direction of motion. Such a system could be used as, for example, a flashlight or hand-held spot-light. Of course, these are merely examples of implementations of dynamic light sources with feedback loops including sensors. There can be many other implementations of this invention concept that includes combining dynamic light sources with sensors.

According to an embodiment, the present invention provides a dynamic laser-based light source or light projection apparatus that is spatially tunable. The apparatus includes a housing with an aperture to hold a light source having an input interface for receiving a signal to activate the dynamic feature of the light source. Optionally, the apparatus can include a video or signal processing module. Additionally, the apparatus includes a laser source disposed in the housing with an aperture. The laser source includes one or more of a violet laser diode or blue laser diode. The dynamic light source features output comprised from the laser diode light spectrum and a phosphor emission excited by the output beam of a laser diode. The violet or blue laser diode is fabricated on a polar, nonpolar, or semipolar oriented Ga-containing substrate. The apparatus can include mirror galvanometer or a microelectromechanical system (MEMS) scanning mirror, or "flying mirror", configured to project the laser light or laser pumped phosphor white light to a specific location in the outside world. By rastering the laser beam using the MEMS mirror a pixel in two dimensions can be formed to create a pattern or image. The apparatus can also include an actuator for dynamically orienting the apparatus to project the laser light or laser pumped phosphor white light to a specific location in the outside world.

According to an embodiment, the present invention provides a dynamic light source or "light-engine" that can function as a white light source for general lighting applications with tunable colors. The light-engine consists of three or more laser or SLED light sources. At least one light source emits a spectrum with a center wavelength in the range of 380-480 nm and acts as a blue light source. At least one light emits a spectrum with a center wavelength in the range of 480-550 nm and acts as a green light source. At least one light emits a spectrum with a center wavelength in the range 600-670 nm and acts as a red light source. Each light source is individually addressable, such that they may be operated independently of one another and act as independent communication channels, or in the case of multiple emitters in the red, green or blue wavelength ranges the plurality of light sources in each range may be addressed collectively, though the plurality of sources in each range are addressable independently of the sources in the other wavelength ranges. One or more of the light sources emitting in the blue range of wavelengths illuminates a wavelength converting element which absorbs part of the pump light and reemits a broader spectrum of longer wavelength light. The light engine is configured such that both light from the wavelength converting element and the plurality of light sources are emitted from the light-engine. A laser or SLED driver module is provided which can dynamically control the light engine based on input from an external source. For example, the laser driver module generates a drive current, with the drive currents being adapted to drive one or more laser diodes, based on one or more signals.

Optionally, the quality of the light emitted by the white light source may be adjusted based on input from one or more sensors. Qualities of the light that can be adjusted in response to a signal include but are not limited to: the total luminous flux of the light source, the relative fraction of long and short wavelength blue light as controlled by adjusting relative intensities of more than one blue laser sources characterized by different center wavelengths and the color point of the white light source by adjusting the relative intensities of red and green laser sources. Such dynamic adjustments of light quality may improve productivity and health of workers by matching light quality to work conditions.

Optionally, the quality of the white light emitted by the white light source is adjusted based on input from sensors detecting the number of individuals in a room. Such sensors may include motion sensors such as infra-red motion sensors, microphones, video cameras, radio-frequency identification (RFID) receivers monitoring RFID enabled badges on individuals, among others.

Optionally, the color point of the spectrum emitted by the light source is adjusted by dynamically adjusting the intensities of the blue "pump" laser sources relative to the intensities of the green and red sources. The relative proportions are controlled by input from sensors detecting radio frequency identification (RFID) badges worn by occupants of the room such that room lighting color point and brightness levels match the preferences of the occupants.

Optionally, the color point of the spectrum emitted by the white light source is adjusted by dynamically adjusting the intensities of the blue "pump" laser sources relative to the intensities of the green and red sources. The total luminous flux of the light source and the relative proportions are controlled by input from a chronometer, temperature sensor and ambient light sensor measuring to adjust the color point to match the apparent color of the sun during daylight hours and to adjust the brightness of the light source to compensate for changes in ambient light intensity during daylight hours. The ambient light sensor would either be configured by its position or orientation to measure input predominantly from windows, or it would measure ambient light during short periods when the light source output is reduced or halted, with the measurement period being too short for human eyes to notice.

Optionally, the color point of the spectrum emitted by the white light source is adjusted by dynamically adjusting the intensities of the blue "pump" laser sources relative to the intensities of the green and red sources. The total luminous flux of the light source and the relative proportions are controlled by input from a chronometer, temperature sensor and ambient light sensor measuring to adjust the color point to compensate for deficiencies in the ambient environmental lighting. For example, the white light source may automatically adjust total luminous flux to compensate for a reduction in ambient light from the sun due to cloudy skies. In another example, the white light source may add an excess of blue light to the emitted spectrum to compensate for reduced sunlight on cloudy days. The ambient light sensor would either be configured by its position or orientation to measure input predominantly from windows, or it would measure ambient light during short periods when the light source output is reduced or halted, with the measurement period being too short for human eyes to notice.

In a specific embodiment, the white light source contains a plurality of blue laser devices emitting spectra with different center wavelengths spanning a range from 420 nm to 470 nm. For example, the source may contain three blue laser devices emitting at approximately 420, 440 and 460 nm. In another example, the source may contain five blue laser devices emitting at approximately 420, 440, 450, 460 and 470 nm. The total luminous flux of the light source and the relative fraction of long and short wavelength blue light is controlled by input from a chronometer and ambient light sensor such that the emitted white light spectra contains a larger fraction of intermediate wavelength blue light between 440 and 470 nm during the morning or during overcast days in order to promote a healthy circadian rhythm and promote a productive work environment. The ambient light sensor would either be configured by its position or orientation to measure input predominantly from windows, or it would measure ambient light during short periods when the light source output is reduced or halted, with the measurement period being too short for human eyes to notice.

Optionally, the white light source would be provided with a VLC-receiver such that a plurality of such white light sources could form a VLC mesh network. Such a network would enable the white light sources to broadcast measurements from various sensors. In an example, a VLC mesh-network comprised of VLC-enabled white light sources could monitor ambient light conditions using photo sensors and room occupancy using motion detectors throughout a workspace or building as well as coordinate measurement of ambient light intensity such that adjacent light sources do not interfere with these measurements. In an example, such fixtures could monitor local temperatures using temperature sensors such as RTDs and thermistors among others.

In an embodiment, the white light source is provided with a computer controlled video camera. The white light source contains a plurality of blue laser devices emitting spectra with different center wavelengths spanning a range from 420 nm to 470 nm. For example, the white light source may contain three blue laser devices emitting at approximately 420, 440 and 460 nm. In another example, the white light source may contain five blue laser devices emitting at approximately 420, 440, 450, 460 and 470 nm. The total luminous flux of the white light source and the relative fraction of long and short wavelength blue light is controlled by input from facial recognition and machine learning based algorithms that are utilized by the computer control to determine qualities of individuals occupying the room. In an example, number of occupants is measured. In another example, occupants may be categorized by type; for example by sex, size and color of clothing among other differentiable physical features. In another example, mood and activity level of occupants may be quantified by the amount and types of motion of occupants.

Figure 26B:
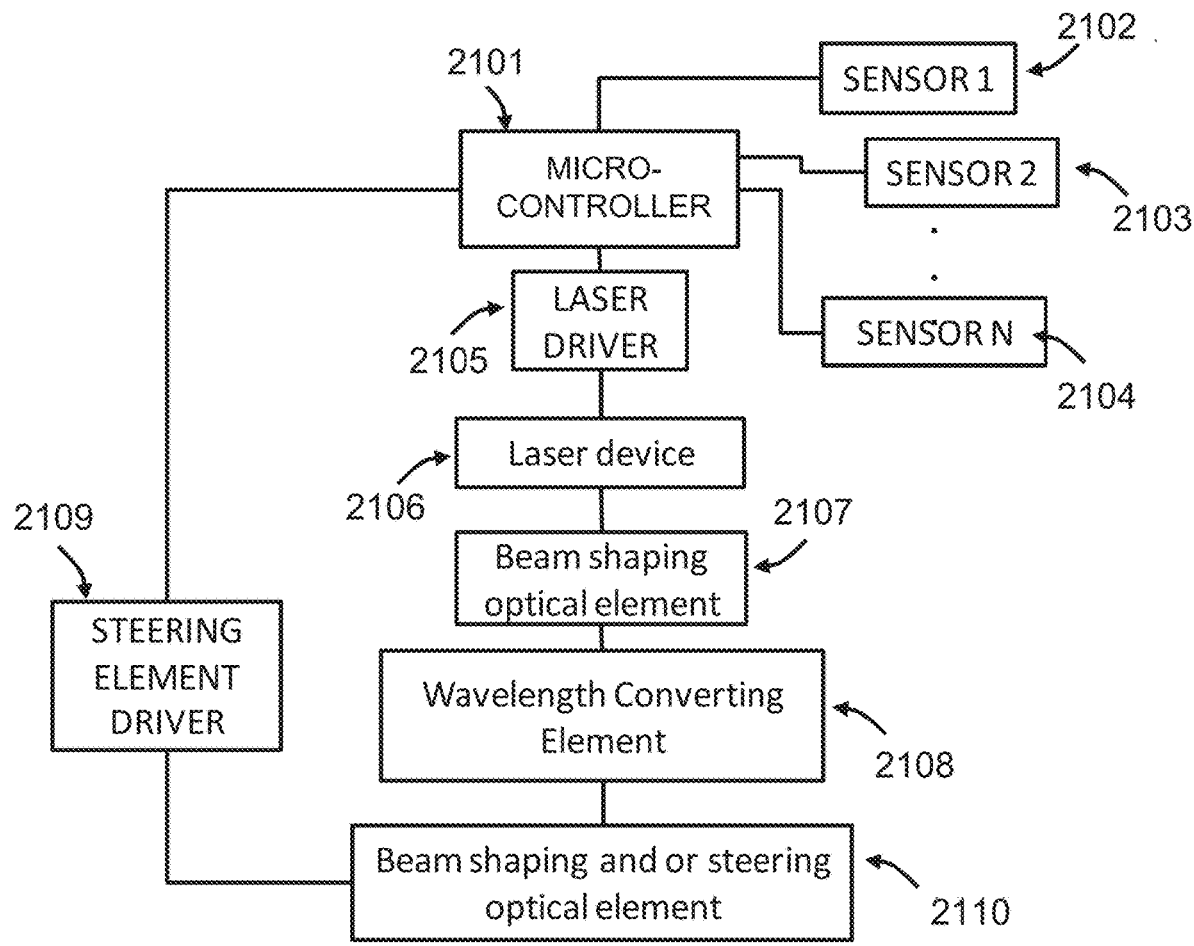
FIG. 26B is a functional diagram for a dynamic, laser-based smart-lighting system according to some embodiments of the present invention.

FIG. 26B is a functional diagram for a dynamic, laser-based smart-lighting system according to some embodiments of the present invention. This diagram is merely an example, which should not unduly limit the scope of the claims. One of ordinary skill in the art would recognize many variations, alternatives, and modifications. As shown, one or more laser devices 2106 are provided along with beam shaping optical elements 2107. The laser devices 2106 and beam shaping optical elements 2107 are configured such that the laser light is incident on a wavelength converting element 2108 that absorbs part or all laser light and emits a longer wavelength spectrum of light. Beam shaping and steering elements 2110 are provided which collect light from the wavelength converting element 2008 along with remaining laser light and direct it out of the light source. The light source is provided with a laser driver 2005 that provides controlled current and voltage to the one or more laser devices 2006. The output of the laser driver 2105 is determined by the digital or analog output of a microcontroller (or other digital or analog control circuit) 2101. The light source is also provided with a steering element driver 2109 which controls the beam steering optical element 2110. The output of the steering element driver 2109 is determined by input from the control circuit. One or more sensors 2102, 2103 and 2104 are provided. A digital or analog output of the sensors is read by the microcontroller 2101 and then converted into a predetermined change or modulation of the output from the control circuit to the laser driver 2105 and steering element driver 2109 such that the output of the light source is dynamically controlled by the output of the sensors.

In some embodiments, the beam steering optical elements include a scanning mirror. In an example, among the one or more laser devices, at least one laser device emits a spectrum with a center wavelength in the range of 380-480 nm and acts as a violet or blue light source. The blue range of wavelengths illuminates the wavelength converting element which absorbs part of the pump light and reemits a broader spectrum of longer wavelength light. Both light from the wavelength converting element and the one or more laser devices are emitted as a white light. Optionally, a laser or SLED driver module is provided for dynamically controlling the one or more laser devices based on input from an external source to form a dynamic light source. For example, the laser driver module generates a drive current, with the drive current being adapted to drive one or more laser diodes, based on one or more signals. The dynamic light source has a scanning mirror and other optical elements for beam steering which collect the emitted white light spectrum, direct them towards the scanning mirror and either collimate or focus the light. A scanning mirror driver is provided which can dynamically control the scanning mirror based on input from an external source. For example, the scanning mirror driver generates either a drive current or a drive voltage, with the drive current or drive voltage adapted to drive the scanning mirror to a specific orientation or through a specific range of motion, based on one or more signals.

Applications for such an embodiment include any where there is aesthetic, informational or artistic value in the color point, position or shape of a spot light being dynamically controlled based on the input from one or more sensors. The primary advantage of the apparatus to such applications is that the apparatus may transition between several configurations, with each configuration providing optimal lighting for different possible contexts. Some example contexts that may require different quality of lighting include: general lighting, highlighting specific objects in a room, spot lighting that follows a moving person or object, lighting that changes color point to match time of day or exterior or ambient lighting, among others.

As an example use case, the apparatus could be used as a light source for illuminating works of art in a museum or art gallery. Motion sensors would trigger the change in the shape and intensity of the emitted spot of light from a spatial and color configuration intended for general lighting to a configuration that highlights in an ascetically pleasing way the work of art corresponding to the triggering motion sensor. Such a configuration would also be advantageous in stores, where the apparatus could provide general illumination until a triggering input causes it to preferentially illuminate one or more items for sale.

FIG. 27A shows a schematic representation of a use case for the embodiment described above. An object of interest 2504 is illuminated by an apparatus 2503 configured in accordance with the present invention. The apparatus provides a spot 2505 configured for general illumination of the area containing the object of interest. A sensor 2501 is provided, which is configured to determine if the observer 2502 is near or looking at the object of interest based on the sensor input 2506. It would be obvious to one skilled in the art that the sensor can be of one or more of a number of types. For example, the sensor could be an infra-red motion detector or a detector based on measuring the occlusion of an infra-red or visible light beam. The sensor could also be a computer vision system based on a video or still camera, which detects the presence of humans within its field of view. A computer vision based system could also be used to determine if an observer's attention is likely to be applied to a particular object based on the tracking of body, head, facial and eye positions and motion.

FIG. 27B shows a schematic representation of the use case from FIG. 27A where the observer has approached the object of interest. The signal 2507 measured by the sensor meets the predetermined criteria for triggering a change in the output of the apparatus and the triggering signal 2508 is received by the apparatus. The trigger induces the apparatus to change the spatial distribution of the emitted white light spot 2509 such that it accentuates the object of interest or otherwise produces the aesthetic conditions of the environment of the object such that it is more attractive and likely to be admired or purchased. To one skilled in the art, it should be obvious that the sensor and apparatus may interact in a number of ways, with either the sensor applying a digital or analog signal or communication to the apparatus or the apparatus requesting the status of the sensor using a digital or analog signal or communication.

FIG. 27C shows a schematic representation of the use case from FIG. 27A where the observer has approached the object of interest. The signal 2510 measured by the sensor meets the predetermined criteria for triggering a change in the output of the apparatus and the triggering signal 2511 is received by the apparatus. The trigger induces the apparatus to change the spatial distribution of the color or spectrum of the emitted white light spot 2512 such that it accentuates the object of interest or otherwise produces the aesthetic conditions of the environment of the object such that it is more attractive and likely to be admired or purchased. In this case, the apparatus changes the spatial color distribution to have a central spot of a different hue, but it should be obvious that other changes to the spatial distribution are possible. To one skilled in the art, it should be obvious that the sensor and apparatus may interact in a number of ways, with either the sensor applying a digital or analog signal or communication to the apparatus or the apparatus requesting the status of the sensor using a digital or analog signal or communication.

As another example use case, the apparatus might be used to illuminate a large building such as an office space filled with cubicles, a warehouse or a factory floor, a retail location such as a grocery store or department store, and the like. Motion sensors distributed throughout the space would detect motion and the apparatus would direct the light spot towards the triggered sensors to provide local lighting for any moving people. The advantage of such a system would be the ability to provide lighting tailored to location and context within the space using a minimal number of light sources.

Optionally, the beam steering optical element is a mirror galvanometer or could be a DLP chip, an LCOS chip, or a scanning fiber. Optionally, the beam steering optical elements are two or more mirror galvanometers. Optionally, the beam steering optical element is one or more MEMS scanning mirror with one or more axis of rotation. The MEMS mirror is preferred due to the small size, shock resistance and cost. FIG. 22B shows an example of a dynamic smart light source using MEMS scanning device as the beam steering optical element.

Optionally, the beam steering optical element is a polygonal scanning mirror driven by compressed air, stepper motors, servo-motors, a brushless DC motor or other source of rotational motion, though a preferred embodiment would use a stepper motor or other means of motion enabling open-loop control of the mirror position.

Optionally, the beam steering optical elements for dynamically controlling the position of the white light spot will include one or more lenses for collimating the white light or focusing the white light on the scanning mirror. Optionally, the scanning mirror includes a discrete component voice coil scanners or solenoids.

Applications include any need for triggered high speed data connections such as oncoming traffic or pedestrians, presence of objects or people, changes to environment, dangerous or notable impending situations that need to be communicated. One example application would be as a lighting source in buildings, where safety systems such as fire detection systems could be used to trigger the apparatus to transmit evacuation instructions and maps to the smart-devices such as phones, tablets, media-players and the like, of occupants.

The apparatus would be advantageous in lighting applications where one needs to trigger transmission of information based on the input of sensors. As an example application, one may utilize the apparatus as a car head-light. Measurements from a LIDAR or image recognition system would detect the presence of other vehicles in front of the car and trigger the transmission of the cars location, heading and velocity to the other vehicles via VLC.

Applications include selective area VLC as to only transmit data to certain locations within a space or to a certain object which is determined by sensors—spatially selective WiFi/LiFi that can track the recipients location and continuously provide data. You could even do spacetime division multiplexing where convoluted data streams are sent to different users or objects sequentially through modulation of the beam steering device. This could provide for very secure end user data links that could track user's location.

In an embodiment, the apparatus is provided with information about the location of a user based on input from sensors or other electronic systems for determining the location of individuals in the field of the view of the apparatus. The sensors might be motion detectors, digital cameras, ultrasonic range finders or even RF receivers that triangulate the position of people by detecting radio frequency emissions from their electronics. The apparatus provides visible light communication through the dynamically controllable white light spot, while also being able to control the size and location of the white light spot as well as raster the white light spot quickly enough to appear to form a wide spot of constant illumination. The determined location of a user with respect to the apparatus can be used to localize the VLC data transmission intended for a specific user to only in the region of the field of view occupied by the specific user. Such a configuration is advantageous because it provides a beam steering mechanism for multiple VLC transmitters to be used in a room with reduced interference. For example, two conventional LED-light bulb based VLC transmitters placed adjacent to one another in a room would produce a region of high interference in the region of the room where the emitted power from both VLC transmitters incident on a user's VLC receiver is similar or equal. Such an embodiment is advantageous in that when two such light sources are adjacent to one another the region containing VLC data transmission of the first apparatus is more likely to overlap a region from the second apparatus where no VLC data is being transmitted. Since DC offsets in received optical power are easy to filter out of VLC transmissions, this allows multiple VLC enabled light sources to be more closely packed while still providing high transmission rates to multiple users.

In some embodiments, the apparatus received information about where the user is from RF receivers. For example, a user may receive data using VLC but transmits it using a lower-bandwidth WiFi connection. Triangulation and beam-forming techniques can be used to pinpoint the location of the user within a room by analyzing the strength of the user's WiFi transmission at multiple WiFi transmitter antennas.

In some embodiments, the user transmits data either by VLC or WiFi, and the location of the user is determined by measuring the intensity of the VLC signal from the apparatus at the user and then transmitting that data back to the apparatus via WiFi or VLC from the user's VLC enabled device. This allows the apparatus to scan the room with a VLC communication spot and the time when a user detects maximum VLC signal is correlated to the spot position to aim the VLC beam at the user.

In an embodiment, the apparatus is attached to radio-controlled or autonomous unmanned aircraft. The unmanned aircraft could be drones, i.e. small scale vehicles such as miniature helicopters, quad-copters or other multi-rotor or single-rotor vertical takeoff and landing craft, airplanes and the like that were not constructed to carry a pilot or other person. The unmanned aircraft could be full-scale aircraft retrofitted with radio-controls or autopilot systems. The unmanned aircraft could be a craft where lift is provided by buoyancy such as blimps, dirigibles, helium and hydrogen balloons and the like.

Addition of VLC enabled, laser-based dynamic white-light sources to unmanned aircraft is a highly advantageous configuration for applications where targeted lighting must be provided to areas with little or no infrastructure. As an example embodiment, one or more of the apparatuses are provided on an unmanned aircraft. Power for the apparatuses is provided through one or more means such as internal power from batteries, a generator, solar panels provided on the aircraft, wind turbines provided on the aircraft and the like or external power provided by tethers including power lines. Data transmission to the aircraft can be provided either by a dedicated wireless connection to the craft or via transmission lines contained within the tether. Such a configuration is advantageous for applications where lighting must be provided in areas with little or no infrastructure and where the lighting needs to be directional and where the ability to modify the direction of the lighting is important. The small size of the apparatus, combined with the ability of the apparatus to change the shape and size of the white light spot dynamically as well as the ability of the unmanned aircraft to alter its position either through remote control by a user or due to internal programming allow for one or more of these aircraft to provide lighting as well as VLC communications to a location without the need for installation of fixed infrastructure. Situations where this would be advantageous include but are not limited to construction and road-work sites, event sites where people will gather at night, stadiums, coliseums, parking lots, etc. By combining a highly directional light source on an unmanned aircraft, fewer light sources can be used to provide illumination for larger areas with less infrastructures. Such an apparatus could be combined with infra-red imaging and image recognition algorithms, which allow the unmanned aircraft to identify pedestrians or moving vehicles and selectively illuminate them and provide general lighting as well as network connectivity via VLC in their vicinity.

Figure 28A:
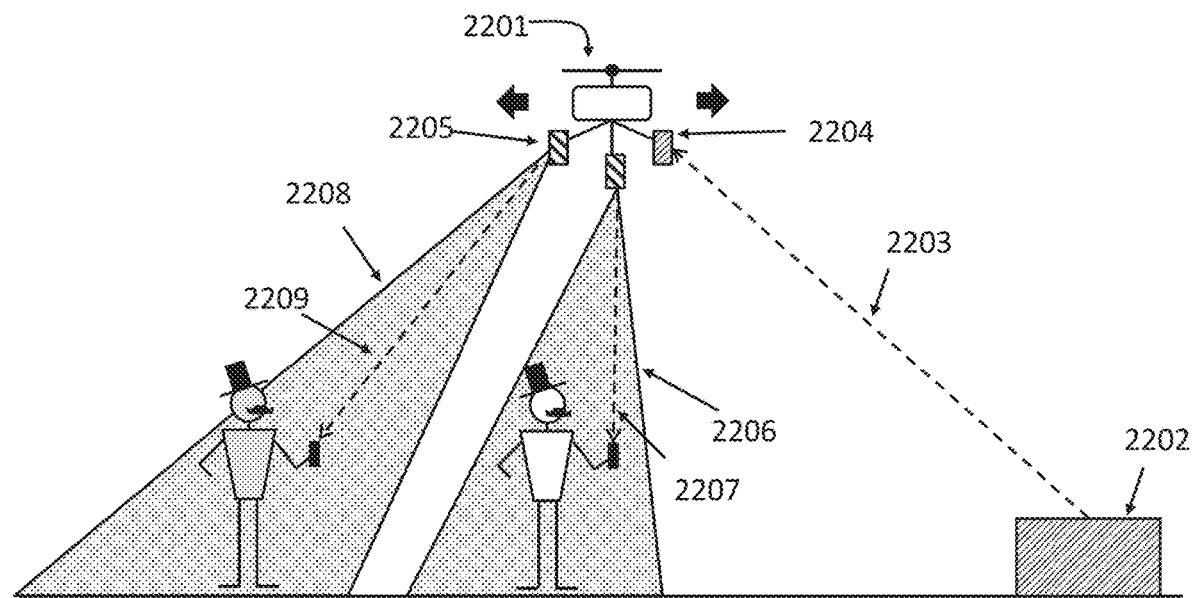
FIG. 28A is a schematic representation of a use case for some embodiments of the present invention where the apparatus is integrated with an untethered, unmanned aerial vehicle or drone.

FIG. 28A shows a schematic representation of a use case for one or more apparatuses in accordance with an embodiment of the invention. An unmanned drone vehicle 2201 is provided with one or more of the dynamic white light apparatuses 2205 along with a visible light communication (VLC) or radio-frequency receiver 2204. The apparatuses emit light spots 2208 and 2206 that illuminate users on the ground. A terrestrial base station 2202 transmits digital data to the drone using a radio frequency or visible light communication channel 2203. This digital data is relayed to the plurality of users via visible light communication streams 2207 and 2209 using modulation of the laser light in the white light beams 2206 and 2208. The VLC data is received by the user using a smart system such as a smart watch, smart phone, a computerized wearable device, a table computer, a laptop computer or the like. The drone 2201 is able to change position vertically and horizontally to optimize its ability to illuminate and provide VLC communication to individual beneath it. The drone can be a propeller driven craft such as a helicopter or multiroter, it can be a lighter than air-craft such as a blimp or dirigible or it could be a fixed wing craft.

Figure 28B:
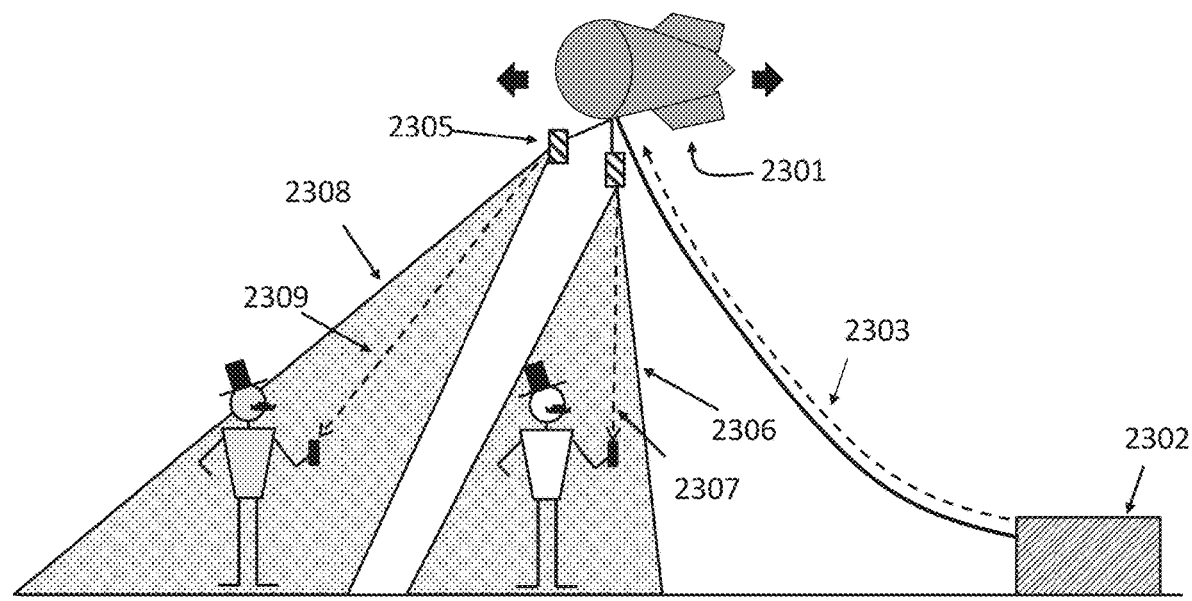
FIG. 28B is a schematic representation of a use case for some embodiments of the present invention where the apparatus is integrated with a tethered balloon, tethered lighter than air craft, or tethered unmanned aerial vehicle or drone.

FIG. 28B shows a schematic representation of a use case for one or more apparatuses in accordance with an embodiment of the invention. An unmanned drone vehicle 2301 is provided with one or more of the dynamic white light apparatuses 2305. The apparatuses emit light spots 2308 and 2306 that illuminate users on the ground. A terrestrial base station 2302 is provided along with a tether 2303 that connects the base-station to the drone. Digital data is transmitted to the drone through the tether along with electrical power for running the drone and providing power for the white light emitting apparatuses. This digital data is relayed to the plurality of users via visible light communication streams 2307 and 2309 using modulation of the laser light in the white light beams 2306 and 2308. The VLC data is received by the user using a smart system such as a smart watch, smart phone, a computerized wearable device, a table computer, a laptop computer or the like.

In some embodiments, the drone 2301 is able to change position vertically and horizontally to optimize its ability to illuminate and provide VLC communication to individual beneath it. The drone can be a propeller driven craft such as a helicopter or multiroter, it can be a lighter than air-craft such as a blimp or dirigible or it could be a fixed wing craft.

In other embodiments, the drone is not capable of independent control of its position. In this case, the drone can be a propeller driven craft such as a helicopter, multirotor or the like. The drone can also be a lighter than air-craft such as a blimp or dirigible or the like.

Figure 28C:
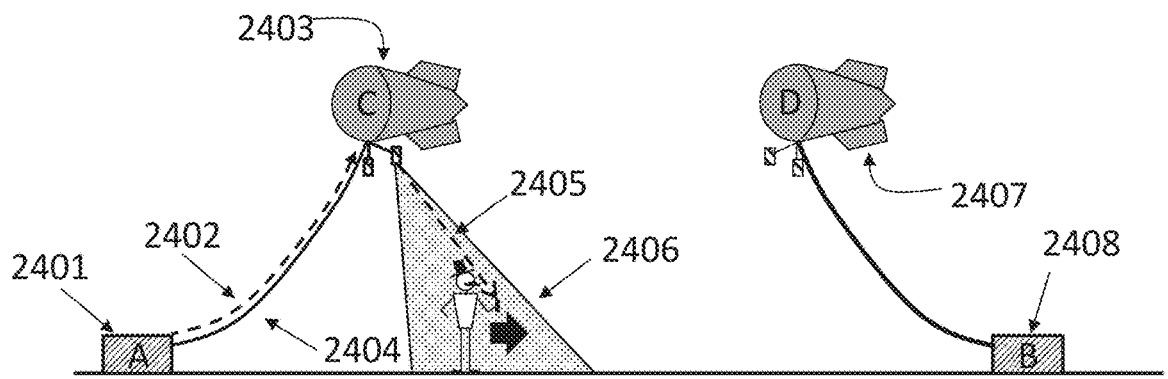
FIG. 28C and FIG. 28D show a schematic representation of a use case for some embodiments of the present invention where the apparatus is integrated with a tethered balloon, tethered or untethered lighter than air craft, or tethered or untethered unmanned aerial vehicle or drone. Multiple aerial platforms are used to provide continuous lighting and visible light communication over an area.
Figure 28D:
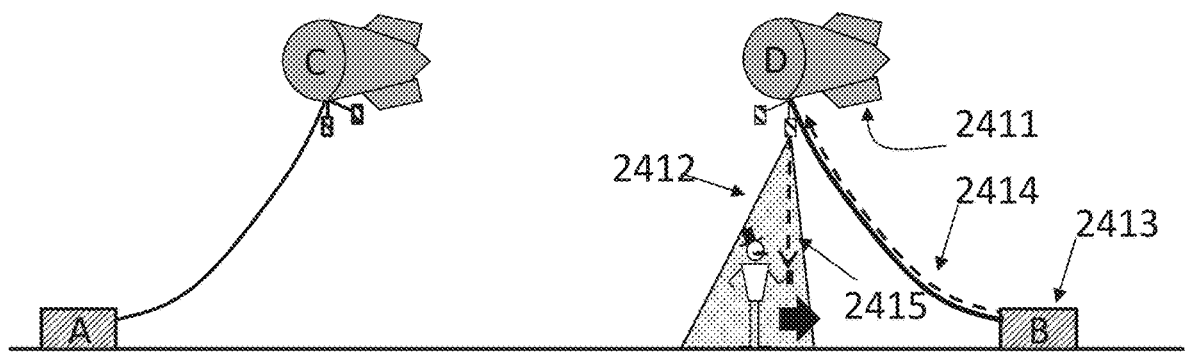

FIG. 28C and FIG. 28D show a schematic representation of a use case for apparatuses in accordance with an embodiment of the invention. In this case, two dirigible drones 2403 and 2407 are provided. In FIG. 28C, the first drone is provided with a base-station 2401 and tether. The second drone is provided with an independent base station 2408 and tether 2404. Each drone is provided with one or more of the VLC-capable, white light emitters in accordance with an embodiment of this invention. A data stream 2402 is transmitted to a user via VLC communication 2405 using modulation of the laser component of a white light spot 2406 emitted by the first drone. As the user moves, the drone provides continuous illumination of the user and VLC coverage to the user by a combination of the drone actively altering its position relative to the user and dynamically controlling the shape and direction of the white light spot. In FIG. 28D, as the user continues to move they will eventually exceed the range of coverage of the first drone, which is limited by the length of the tether and the throw distance of the apparatus. At this point, a handover must be made to the second drone. The second drone 2411 now provides a white light spot 2412 for illumination as well as a VLC data stream 2415 provided from a second base station 2413 along a tether 2414. It should be obvious to one knowledgeable in the art that more than two drones can be used to provide coverage to an even larger area. Moreover, communication channels can be provided between base-stations, between drones or between remote control systems such that the locations and motions of drones can be coordinated to provide superior coverage for both illumination and data transmission.

In an embodiment, the apparatus is attached to an autonomous vehicle such as an autonomous car, truck, boat or ship.

In some preferred embodiments the smart light source is used in Internet of Things (IoT), wherein the laser based smart light is used to communicate with objects such as household appliances (i.e., refrigerator, ovens, stove, etc), lighting, heating and cooling systems, electronics, furniture such as couches, chairs, tables, beds, dressers, etc., irrigation systems, security systems, audio systems, video systems, etc. Clearly, the laser based smart lights can be configured to communicate with computers, smart phones, tablets, smart watches, augmented reality (AR) components, virtual reality (VR) components, games including game consoles, televisions, and any other electronic devices.

In some embodiments, the apparatus is used for augmented reality applications. One such application is as a light source that is able to provide a dynamic light source that can interact with augmented reality glasses or headsets to provide more information about the environment of the user. For example, the apparatus may be able to communicate with the augmented reality headset via visible light communication (LiFi) as well as rapidly scan a spot of light or project a pattern of light onto objects in the room. This dynamically adjusted pattern or spot of light would be adjusted too quickly for the human eye to perceive as an independent spot. The augmented reality head-set would contain cameras that image the light pattern as they are projected onto objects and infer information about the shape and positioning of objects in the room. The augmented reality system would then be able to provide images from the system display that are designed to better integrate with objects in the room and thus provide a more immersive experience for the user.

For spatially dynamic embodiments, the laser light or the resulting white light must be dynamically aimed. A MEMS mirror is the smallest and most versatile way to do this, but this text covers others such as DLP and LCOS that could be used. A rotating polygon mirror was common in the past, but requires a large system with motors and multiple mirrors to scan in two or more directions. In general, the scanning mirror will be coated to produce a highly reflective surface. Coatings may include metallic coatings such as silver, aluminum and gold among others. Silver and Aluminum are preferred metallic coatings due to their relatively high reflectivity across a broad range of wavelengths. Coatings may also include dichroic coatings consisting of layers of differing refractive index. Such coatings can provide exceptionally high reflectivity across relatively narrow wavelength ranges. By combining multiple dichroic film stacks targeting several wavelength ranges a broad spectrum reflective film can be formed. In some embodiments, both a dichroic film and a metal reflector are utilized. For example, an aluminum film may be deposited first on a mirror surface and then overlaid with a dichroic film that is highly reflective in the range of 650-750 nm. Since aluminum is less reflective at these wavelengths, the combined film stack will produce a surface with relatively constant reflectivity for all wavelengths in the visible spectrum. In an example, a scanning mirror is coated with a silver film. The silver film is overlaid with a dichroic film stack which is greater than 50% reflective in the wavelength range of 400-500 nm.

In some embodiments, the signal from one or more sensors is input directly into the steering element driver, which is provided with circuits that adapt sensor input signals into drive currents or voltages for the one or more scanning mirrors. In other embodiments, a computer, microcontroller, application specific integrated circuit (ASIC) or other control circuit external to the steering element driver is provided and adapts sensor signals into control signals that direct the steering element driver in controlling the one or more scanning mirrors.

In some embodiments, the scanning mirror driver responds to input from motion sensors such as a gyroscope or an accelerometer. In an example embodiment, the white light source acts as a spot-light, providing a narrowly diverging beam of white light. The scanning mirror driver responds to input from one or more accelerometers by angling the beam of light such that it leads the motion of the light source. In an example, the light source is used as a hand-held flash-light. As the flash-light is swept in an arc the scanning mirror directs the output of the light source in a direction that is angled towards the direction of motion of the flash light. In an example embodiment, the white light source acts as a spot-light, providing a narrowly diverging beam of white light. The scanning mirror driver responds to input from one or more accelerometers and gyroscopes by directing the beam such that it illuminates the same spot regardless of the position of the light source. An application for such a device would be self-aiming spot-lights on vehicles such as helicopters or automobiles.

In an embodiment, the dynamic white light source could be used to provide dynamic head-lights for automobiles. Shape, intensity, and color point of the projected beam are modified depending on inputs from various sensors in the vehicle. In an example, a speedometer is used to determine the vehicle speed while in motion. Above a critical threshold speed, the headlamp projected beam brightness and shape are altered to emphasize illumination at distances that increase with increasing speed. In another example, sensors are used to detect the presence of street signs or pedestrians adjacent to the path of travel of the vehicle. Such sensor may include: forward looking infra-red, infra-red cameras, CCD cameras, cameras, Light detection and ranging (LIDAR) systems, and ultrasonic rangefinders among others.

In an example, sensors are used to detect the presence of front, rear or side windows on nearby vehicles. Shape, intensity, and color point of the projected beam are modified to reduce how much of the headlight beam shines on passengers and operators of other vehicles. Such glare-reducing technology would be advantageous in night-time applications where compromises must be made between placement of lamps on vehicles optimized for how well an area is illuminated and placement of the beam to improve safety of other drivers by reducing glare.

At present, the high and low beams are used with headlights and the driver has to switch manually between them with all known disadvantages. The headlight horizontal swivel is used in some vehicles, but it is currently implemented with the mechanical rotation of the whole assembly. Based on the dynamic light source disclosed in this invention, it is possible to move the beam gradually and automatically from the high beam to low beam based on simple sensor(s) sensitive to the distance of the approaching vehicle, pedestrian, bicyclist or obstacle. The feedback from such sensors would move the beam automatically to maintain the best visibility and at the same time prevent blinding of the driver going in the opposite direction. With 2D scanners and the simple sensors, the scanned laser based headlights with horizontal and vertical scanning capability can be implemented.

Optionally, the distance to the incoming vehicles, obstacles, etc. or level of fog can be sensed by a number of ways. The sensors could include the simple cameras, including infrared one for sensing in dark, optical distance sensors, simple radars, light scattering sensor, etc. The distance would provide the signal for the vertical beam positioning, thus resulting in the optimum beam height that provides best visibility and does not blind drivers of the incoming vehicles.

In an alternative embodiment, the dynamic white light source could be used to provide dynamic lighting in restaurants based on machine vision. An infra-red or visible light camera is used to image a table with diners. The number and positions or diners at the table are identified by a computer, microcontroller, ASIC or other computing device. The microcontroller then outputs coordinated signals to the laser driver and the scanning mirror to achieve spatially localized lighting effects that change dynamically throughout the meal. By scanning the white light spot quickly enough the light would appear to the human eye to be a static illumination. For example, the white light source might be provided with red and green lasers which can be used to modulate the color point of the white light illuminating individual diners to complement their clothing color. The dynamic white light source could preferentially illuminate food dishes and drinks. The dynamic white light source could be provided with near-UV laser sources that could be used to highlight certain objects at the table by via fluorescence by preferentially illuminating them with near-UV light. The white light source could measure time of occupancy of the table as well as number of food items on the table to tailor the lighting brightness and color point for individual segments of the meal.

Such a white light source would also have applications in other venues. In another example use, the dynamic white light source could be used to preferentially illuminate people moving through darkened rooms such as theaters or warehouses.

In another alternative embodiment, the dynamic white light source could be used to illuminate work spaces. In an example, human machine interaction may be aided in a factory by using dynamically changing spatial distributions of light as well as light color point to provide information cues to workers about their work environments and tasks. For example, dangerous pieces of equipment could be highlighted in a light spot with a predetermined color point when workers approach. As another example, emergency egress directions customized for individual occupants based on their locations could be projected onto the floor or other surfaces of a building.

In other embodiments, individuals would be tracked using triangulation of RFID badges or triangulation of Wi-Fi transmissions or other means that could be included in devices such as cell phones, smart watches, laptop computers, or any type of device.

In an alternative aspect, the present disclosure provides a smart light system with color and brightness dynamic control. The smart light system includes a microcontroller configured to receive input information for generating one or more control signals. Further, the smart light system includes a laser device configured to be driven by at least one of the one or more control signals to emit at lease a first laser beam with a first peak wavelength in a color range of violet or blue spectrum and a second laser beam with a second peak wavelength longer than the first peak wavelength. Additionally, the smart light system includes a pathway configured to dynamically guide the first laser beam and the second laser beam. The smart light system further includes a wavelength converting member configured to receive either the first laser beam or the second laser beam from the pathway and configured to convert a first fraction of the first laser beam with the first peak wavelength to a first spectrum with a third peak wavelength longer than the first peak wavelength or convert a second fraction of the second laser beam with the second peak wavelength to a second spectrum with a fourth peak wavelength longer than the second peak wavelength. The first spectrum and the second spectrum respectively combine with remaining fraction of the first laser beam with the first peak wavelength and the second laser beam with the second peak wavelength to reemit an output light beam of a broader spectrum dynamically varied from a first color point to a second color point. Furthermore, the smart light system includes a beam shaping optical element configured to collimate and focus the output light beam and a beam steering optical element configured to direct the output light beam. The smart light system further includes a beam steering driver coupled to the microcontroller to receive some of the one or more control signals based on input information for the beam steering optical element to dynamically scan the output light beam substantially in white color to provide spatially modulated illumination and selectively direct one or more of the multiple laser beams with the first peak wavelengths in different color ranges onto one or more of multiple target areas or into one or more of multiple target directions in one or more selected periods. Moreover, the smart light system includes one or more sensors configured in a feedback loop circuit coupled to the controller. The one or more sensors are configured to provide one or more feedback currents or voltages based on the various parameters associated with the target of interest detected in real time to the controller with one or more of light movement response, light color response, light brightness response, spatial light pattern response, and data signal communication response being triggered.

Optionally, the laser device includes one or more first laser diodes for emitting the first laser beam with the first peak wavelength in violet spectrum ranging from 380 to 420 nm or blue spectrum ranging from 420 to 480 nm.

Optionally, the laser device includes one or more second laser diodes for emitting the second laser beam with the second peak wavelength in red spectrum ranging from 600 to 670 nm, or in green spectrum ranging from 480 nm to 550 nm, or in another blue spectrum with the second peak wavelength longer than the first peak wavelength.

Optionally, the one or more first laser diodes include an active region including a gallium and nitrogen containing material configured to be driven by the one or more driving currents.

Optionally, the gallium and nitrogen containing material includes one or more of GaN, AlN, InN, InGaN, AlGaN, InAlN, InAlGaN.

Optionally, the one or more second laser diodes include an active region including a gallium and arsenic containing material configured to be driven by the one or more driving currents.

Optionally, the wavelength converting member includes a first phosphor material selected for absorbing a first ratio of the first laser beam with the first peak wavelength in the violet spectrum and converting to a first spectrum with the third peak wavelength longer than the first peak wavelength to emit a first output light beam with a first color point, a second phosphor material selected for absorbing a second ratio of the first laser beam with the first peak wavelength in the blue spectrum and converting to a second spectrum with the third peak wavelength longer than the first peak wavelength to emit a second output light beam with a second color point, a third phosphor material selected for absorbing a third ratio of the second laser beam with the second peak wavelength and converting to a third spectrum with the fourth wavelength longer than the second peak wavelength to emit a third output light beam with a third color point.

Optionally, the pathway includes an optical fiber to guide either the first laser beam or the second laser beam to the wavelength converter member disposed remotely as a remote light source.

Optionally, the pathway includes a waveguide for guiding either the first laser beam or the second laser beam to the wavelength converter member to generate the output light beam with a dynamically varying color point.

Optionally, the pathway includes free-space optics devices.

Optionally, the beam shaping optical element includes one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus the output light beam with modified angular distribution thereof.

Optionally, beam steering optical element is selected from one of a micro-electromechanical system (MEMS) mirror, a digital light processing (DLP) chip, a digital mirror device (DMD), and a liquid crystal on silicon (LCOS) chip.

Optionally, the beam steering optical element includes a 2-dimensional array of micro-mirrors to steer, pattern, and/or pixelate the multiple output light beams with varying color points by reflecting from corresponding pixels at a predetermined angle to turn each pixel on or off.

Optionally, the 2-dimensional array of micro-mirrors are configured to be activated by some of the one or more control signals received by the beam steering driver from the microcontroller based on the input information to manipulate the multiple output light beams with respective color points being dynamically adjusted to provide a pattern of color and brightness onto a surface of a target area or into a direction of a target space.

Optionally, the microcontroller includes an interface configured as a user input dial, switch, or joystick mechanism or a feedback loop module for receiving the input information that is updated in real time via the one or more sensors.

Optionally, the pattern of color and brightness is a text, a picture, a video projected as holography image or onto a screen.

Optionally, the microcontroller is disposed in a smart phone, a smart watch, a computerized wearable device, a tablet computer, a laptop computer, a vehicle-built-in computer, a drone.

Optionally, the one or more sensors includes one or a combination of multiple of sensors selected from microphone, geophone, motion sensor, radio-frequency identification (RFID) receivers, hydrophone, chemical sensors including a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video cameras, transducer, image sensor, infrared sensor, radar, SONAR, LIDAR.

Optionally, the one or more sensors is configured in the feedback loop circuit to provide a feedback current or voltage to the microcontroller to tune at least one of the one or more control signals to adjust brightness of either the first laser beam with a first peak wavelength or the second laser beam with the second peak wavelength.

Optionally, the one or more sensors is configured in the feedback loop circuit to provide a feedback current or voltage to the microcontroller to tune at least one of the one or more control signals for operating the beam steering optical element to adjust a spatial position illuminated by the output light beam.

Optionally, the one or more sensors is configured in the feedback loop circuit to provide a feedback current or voltage to the microcontroller to tune at least one of the one or more control signals for adjusting the beam shaping optical element to adjust incident angles of either the first laser beam or the second laser beam to tune respective ratios being converted by respective phosphor materials of the wavelength converting member for tuning color points of respective output light beams.

Summaries of some of the inventive concepts described herein are outlined below. This list is provided by way of example and is not intended to be complete or exhaustive.

Summary of an inventive concept:

1. A light source configured for visible light communication, comprising:
   a controller comprising a modem and a driver, the modem being configured to receive a data signal, wherein the controller is configured to generate one or more control signals to operate the driver to generate a driving current and a modulation signal based on the data signal;
   a light emitter configured as a pump-light device comprised of a gallium and nitrogen containing material and an optical cavity; the optical cavity comprising an optical waveguide region and one or more facet regions, wherein the optical cavity is configured with electrodes to supply the driving current based on at least one of the one or more control signals to the gallium and nitrogen containing material, wherein the driving current provides an optical gain to an electromagnetic radiation propagating in the optical waveguide region, wherein the electromagnetic radiation is outputted through at least one of the one or more facet regions as a directional electromagnetic radiation characterized by a first peak wavelength in the ultra-violet or blue wavelength regime, wherein the directional electromagnetic radiation is modulated to carry the data signal using the modulation signal provided by the driver;
   a pathway configured to direct, filter, or split the directional electromagnetic radiation;
   a wavelength converter optically coupled to the pathway to receive the directional electromagnetic radiation from the pump-light device, wherein the wavelength converter is configured to convert at least a fraction of the directional electromagnetic radiation with the first peak wavelength to at least a second peak wavelength that is longer than the first peak wavelength and to output a white-color spectrum comprising at least the second peak wavelength and partially the first peak wavelength; and
   a beam shaper configured to direct the white-color spectrum for illuminating a target of interest and transmitting the data signal through at least the fraction of the directional electromagnetic radiation with the first peak wavelength to a receiver at the target of interest.

2. The light source of claim 1, wherein the pump-light device comprises a laser diode device.

3. The light source of claim 1, wherein the pump-light device comprises a superluminescent diode (SLED) device.

4. The light source of claim 2, wherein the laser diode device comprises:
   a carrier chip singulated from a carrier substrate;
   one or more epitaxial material die transferred to the carrier substrate from a substrate, the epitaxial material comprising an n-type cladding region, an active region comprising at least one active layer overlying the n-type cladding region, and a p-type cladding region overlying the active layer region; and
   one or more laser diode stripe regions formed in the epitaxial material die.

5. The light source of claim 1, wherein the directional electromagnetic radiation with the first peak wavelength comprises a violet spectrum with the first peak wavelength in a range of 380-420 nm, and/or a blue spectrum with the first peak wavelength in a range of 420-480 nm.

6. The light source of claim 1, wherein the modem is configured to receive the data signal from a data source coupled in wire or wirelessly and to convert the data signal into an analog signal for determining an output of the driver.

7. The light source of claim 6, wherein the output of the driver comprises at least a driving current for controlling an intensity of the directional electromagnetic radiation emitted from the pump-light device and a modulation signal of a pre-defined format based on either amplitude modulation or frequency modulation based on the data signal.

8. The light source of claim 1, wherein the directional electromagnetic radiation comprises multiple pulse-modulated light signals at a modulation frequency range selected from about 50 MHz to 300 MHz, 300 MHz to 1 GHz, and 1 GHz to 100 GHz based on the data signal.

9. The light source of claim 8, wherein the white-color spectrum comprises the multiple pulse-modulated light signals modulated based on the data signal carried by at least a fraction of the directional electromagnetic radiation from the light emitter.

10. The light source of claim 1, wherein the wavelength converter comprises a phosphor material configured as in a reflection mode to have a surface receiving the directional electromagnetic radiation in an incident angle, wherein the white-color spectrum is a combination of a spectrum of the second peak wavelength converted by the phosphor material, a fraction of the directional electromagnetic radiation with the first peak wavelength reflected from the surface of the phosphor material, and a fraction of the directional electromagnetic radiation scattered from interior of the phosphor material.

11. The light source of claim 1, wherein the wavelength converter comprises a phosphor material configured as in a transmission mode to receive the directional electromagnetic radiation passed through, wherein the white-color spectrum is a combination of a fraction of the directional electromagnetic radiation not absorbed by the phosphor material and a spectrum of the second peak wavelength converted by the phosphor material.

12. The light source of claim 1, wherein the wavelength converter comprises a plurality of wavelength converting regions that respectively convert blue or violet wavelength regime to a predominantly red spectrum, or a predominantly green spectrum, and/or a predominantly blue spectrum with a longer peak wavelength than the first peak wavelength of the directional electromagnetic radiation.

13. The light source of claim 12, wherein the beam shaper comprises a plurality of color-specific optical elements for independently manipulating the predominantly red spectrum, the predominantly green spectrum, and the predominantly blue spectrum for transmitting to different targets of interests carrying different streams of the data signal for different receivers.

14. The light source of claim 1, wherein the beam shaper comprises one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus the white-color spectrum to at least modify an angular distribution thereof.

15. The light source of claim 1, wherein the beam shaper is configured to direct the white-color spectrum as an illumination source for illuminating the target of interest along a preferred direction.

16. The light source of claim 1, including a beam steering device wherein the beam steering device is configured to direct the white-color spectrum for dynamically scanning a spatial range around the target of interest.

17. The light source of claim 1, wherein the pathway comprises an optical fiber to guide the directional electromagnetic radiation to the wavelength converter member disposed remotely to generate the white-color spectrum.

18. The light source of claim 1, wherein the pathway comprises a waveguide for guide the directional electromagnetic radiation to the wavelength converter member.

19. The light source of claim 1, wherein the pathway comprises free-space optics devices.

20. The light source of claim 1, wherein the receiver at the target of interest comprises a photodiode, avalanche photodiode, photomultiplier tube, and one or more band-pass filters to detect pulse-modulated light signals at a modulation frequency range of about 50 MHz to 100 GHz, the receiver being coupled to a modem configured to decode the light signals into binary data.

Summary of another inventive concept:

1. An integrated light source for communication and dynamic spatial illumination comprising:
a modem configured for receiving data signals;
a laser modulation driver coupled to the modem to generate a driving current and provide a modulation format based on the data signals;
a laser device driven by the driving current to emit a laser light with a first peak wavelength modulated according to the modulation format;
an optical pathway for guiding the laser light;
a wavelength converting element configured to couple with the optical pathway to receive the laser light with a first peak wavelength and reemit a white-color light excited by converting a fraction of the laser light with the first peak wavelength to a spectrum with a second peak wavelength longer than the first peak wavelength and combining the fraction of fraction of the laser light with a first peak wavelength and the spectrum with the second peak wavelength, wherein the white-color light carries the data signal in the modulation format;
a beam shaping optical element configured to collimate the white-color light;
a beam steering optical element configured to receive one or more voltage and current signals generated by a beam steering driver based on input information to dynamically scan the white-color light to provide patterned illuminations to multiple areas and simultaneously transmit the data signals to different receivers at the multiple areas.

2. The integrated light source of claim 1, wherein the modem is configured to receive the data signal digitally encoded from a data source and to convert the digitally encoded data signal into an analog signal for determining an output of the laser driver.

3. The integrated light source of claim 1, wherein the modulation format based on the data signal comprises one selected from double-sideband modulation (DSB), double-sideband modulation with carrier (DSB-WC), double-sideband suppressed-carrier transmission (DSB-SC), double-sideband reduced carrier transmission (DSB-RC), single-sideband modulation (SSB, or SSB-AM), single-sideband modulation with carrier (SSB-WC), single-sideband modulation suppressed carrier modulation (SSB-SC), vestigial sideband modulation (VSB, or VSB-AM), quadrature amplitude modulation (QAM), pulse amplitude modulation (PAM), phase-shift keying (PSK), frequency-shift keying (FSK), continuous phase modulation (CPM), minimum-shift keying (MSK), Gaussian minimum-shift keying (GMSK), continuous-phase frequency-shift keying (CPFSK), orthogonal frequency-division multiplexing (OFDM), and discrete multitone (DMT).

4. The integrated light source of claim 2, wherein the output of the laser driver includes at least an electric current as the driving signal supplied to a gallium and nitrogen containing material in an active region of the laser device.

5. The integrated light source of claim 3, wherein the laser light emitted from the laser device is a laser pulse modulated with a rate in a range selected from 50 MHz to 300 MHz, 300 MHz to 1 GHz, and 1 GHz to 100 GHz based on the modulation format.

6. The integrated light source of claim 4, wherein the gallium and nitrogen containing material comprises one or more of GaN, AlN, InN, InGaN, AlGaN, InAlN, InAlGaN.

7. The integrated light source of claim 4, wherein the laser device comprises one or more laser diodes for emitting a violet spectrum in a wavelength range of 380-420 nm, one or more laser diodes for emitting a blue spectrum in a wavelength range of 420-480 nm, one or more laser diodes for emitting a green spectrum in a wavelength range of 480-550 nm, and one or more laser diodes for emitting a red spectrum in a wavelength range of 600-670 nm.

8. The integrated light source of claim 1, wherein the optical pathway comprises one optics selected from free-space optics, waveguide, and optical fiber configured to guide, filter, collimate, focus, combine, and split the laser light.

9. The integrated light source of claim 1, wherein the wavelength converting element is disposed via a thermal conductor material on a submount structure commonly supporting the laser device, wherein the wavelength converting element comprises a phosphor material selected for absorbing at least partially one of the violet spectrum, the blue spectrum, the green spectrum, and the red spectrum to reemit a broader spectrum with a peak wavelength respectively longer than the peak wavelength of the wavelength ranges of violet spectrum, the blue spectrum, the green spectrum, and the red spectrum.

10. The integrated light source of claim 1, wherein the beam shaping optical element comprises one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus the white-color light to at least modify an angular distribution thereof.

11. The integrated light source of claim 1, wherein the beam steering optical element further is selected from one of a micro-electromechanical system (MEMS) mirror, a digital light processing (DLP) chip, a digital mirror device (DMD), and a liquid crystal on silicon (LCOS) chip for steering, patterning, or pixelating the white-color light.

12. The integrated light source of claim 11, wherein the MEMS mirror is based on actuators that are electromagnetic, electrostatic, piezoelectric, or electrothermal, pneumatic, and shape memory alloy.

13. The integrated light source of claim 11, wherein the MEMS mirror is configured to produce high deflection angles more than 10 degrees, low in power consumption of less than 100 mW, and high scan frequencies capable of producing HD resolution.

14. The integrated light source of claim 11, wherein the MEMS mirror is configured to perform resonant operation for vector pointing and provide high reflectivity of >80% for high power operation.

15. The integrated light source of claim 11, wherein the DLP chip or DMD or LCOS chip comprises a 2-dimensional array of micro-mirrors to steer, pattern, and/or pixelate a beam of the white-color light by reflecting from corresponding pixels at a predetermined angle to turn each pixel on or off.

16. The integrated light source of claim 15, wherein the 2-dimensional array of micro-mirrors is formed on a silicon chip configured for providing dynamic spatial modulation of the beam of white-color light.

17. The integrated light source of claim 11, further comprising a controller having an interface configured as a user input dial, switch, or joystick mechanism or a feedback loop module for receiving input information to activate the MEMS mirror, or DLP chip, or DMD, or LCOS chip.

18. The integrated light source of claim 17, wherein the input information comprises an illumination spatial pattern inputted by user or a dynamically varying illumination spatial pattern updated from sensor feedback.

19. The integrated light source of claim 18, wherein the beam steering optical element further is configured to spatially modulate and dynamically direct the white-color light based on the input information to provide spatially modulated illumination onto a first area of a target surface or into first direction of a target space in a first period and onto a second area of the target surface or into a second direction of a target space in a second period, and to independently transmit the data signals to a first receiver at the first area or downstream in the first direction in the first period and to a second receiver at the second area or downstream in the second direction in the second period.

20. The integrated light source of claim 1, wherein the spatially modulated illumination is configured as a spot light system such as a flashlight, spotlight, automobile headlamp or any direction light applications where the light must be directed or projected to a specified location or area.

21. The integrated light source of claim 1, further comprising a reflector disposed at downstream of the white-color light, the reflector being a parabolic reflector to reflect and propagate a collimated beam along an axis thereof.

22. The integrated light source of claim 1, further comprises a lens used to collimate the white-color light into a projected beam, the lens including an aspheric lens positioned the wavelength converting element to collimate the white-color light.

23. The integrated light source of claim 1, further comprising a housing having an aperture for dynamically outputting the white-color light, the housing being configured to have a common submount to support at least the laser device, the wavelength converting element, and the beam steering optical element.

24. The integrated light source of claim 23, wherein the housing comprises one of a TO canister package, a butterfly package, a chip and phosphor on submount (CPoS) package, a surface mount device (SMD) type package.

25. The integrated light source of claim 1, wherein each of the different receivers at the multiple areas comprises a photodiode, avalanche photodiode, photomultiplier tube, and one or more band-pass filters to detect pulse-modulated light signals and is coupled to a modem configured to decode the light signals into binary data.

Summary of another inventive concept:

1. A dynamic light source with color and brightness control for visible light communication comprising:

a modem configured to receive digital information for communication;

a laser driver configured to generate a driving current and at least one modulation signal based on the digital information;

a laser device configured to be driven by the driving current to emit a laser beam with a first peak wavelength in a color range of violet or blue spectrum, wherein the laser beam is modulated by the at least one modulation signal to carry the digital information;

a beam shaping optical element configured to dynamically direct the laser beam with a varying angle through an aperture into a pathway;

a wavelength converting member comprising at least two color phosphor regions spatially distributed to respectively receive the laser beam with different angle outputted from the pathway and configured to convert a fraction of the laser beam with the first peak wavelength to at least two color spectra respectively by the at least two color phosphor regions, wherein each of the at least two color spectra comprises a second peak wavelength longer than the first peak wavelength but varying with the fraction of the laser beam being absorbed by each of the at least two color phosphor regions, wherein the at least two color spectra are respectively combined with remaining fraction of the laser beam with the first peak wavelength to reemit an output light beam of a broader spectrum with a dynamically varied color point;

a beam steering optical element configured to spatially direct the output light beam; and a beam steering driver configured to generate control signals based on input information for the beam steering optical element to dynamically scan the output light beam to provide spatially modulated illumination with dynamically varied color point onto one or more of multiple target areas or into one or more of multiple target directions in one or more selected periods while simultaneously transmit digital information to a receiver in one or more of multiple target areas or one or more of multiple target directions in one or more selected periods.

2. The dynamic light source of claim 1, wherein the modem is configured to receive the digital information encoded from a data source and to convert the encoded digital information into an analog signal for determining the driving current and at least one modulation signal of the laser driver.

3. The dynamic light source of claim 2, wherein the at least one modulation signal is provided with a modulation format selected from double-sideband modulation (DSB), double-sideband modulation with carrier (DSB-WC), double-sideband suppressed-carrier transmission (DSB-SC), double-sideband reduced carrier transmission (DSB-RC), single-sideband modulation (SSB, or SSB-AM), single-sideband modulation with carrier (SSB-WC), single-sideband modulation suppressed carrier modulation (SSB-SC), vestigial sideband modulation (VSB, or VSB-AM), quadrature amplitude modulation (QAM), pulse amplitude modulation (PAM), phase-shift keying (PSK), frequency-shift keying (FSK), continuous phase modulation (CPM), minimum-shift keying (MSK), Gaussian minimum-shift keying (GMSK), continuous-phase frequency-shift keying (CPFSK), orthogonal frequency-division multiplexing (OFDM), and discrete multitone (DMT).

4. The dynamic light source of claim 1, wherein the driving current is supplied to a gallium and nitrogen containing material in an active region of the laser device.

5. The dynamic light source of claim 4, wherein the gallium and nitrogen containing material comprises one or more of GaN, AlN, InN, InGaN, AlGaN, InAlN, InAlGaN.

6. The dynamic light source of claim 1, wherein the laser device comprises one or more laser diodes for emitting the laser beam with the first peak wavelength in violet spectrum ranging from 380 to 420 nm or in blue spectrum ranging from 420 to 480 nm.

7. The dynamic light source of claim 1, wherein the at least two color phosphor regions of the wavelength converting member comprise a first phosphor material configured to absorb a first ratio of the laser beam with the first peak wavelength in the violet spectrum and convert to a first color spectrum with a second wavelength longer than the first peak wavelength to emit the output light beam with a first color point, a second phosphor material configured to absorb a second ratio of the laser beam with the first peak wavelength in the blue spectrum and convert to a second color spectrum with a second wavelength longer than the first peak wavelength to emit the output light beam with a second color point, a third phosphor material configured to absorb a third ratio of the laser beam with the first peak wavelength in the violet or blue spectrum and convert to a third color spectrum with a second wavelength longer than the first peak wavelength to emit the output light beam with a third color point.

8. The dynamic light source of claim 7, wherein the beam shaping optical element comprises one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus each of the laser beam with modified angular distributions into corresponding first, second, third phosphor material in varying incident angles for tuning the first, second, third ratio of the laser beam being converted thereof for dynamically adjusting the first, second, third color point of the output light beam.

9. The dynamic light source of claim 1, wherein the beam steering optical element comprises array of and micro-electromechanical system (MEMS) mirrors or a liquid crystal on silicon (LCOS) chip.

10. The dynamic light source of claim 9, wherein the beam steering driver comprises an interface configured as a user input dial, switch, or joystick mechanism or a feedback loop module for receiving input information to activate the micro-electromechanical system (MEMS) mirrors or LCOS chip.

11. The dynamic light source of claim 9, wherein the input information comprises a pattern of color and brightness inputted by user or a dynamically varying pattern of color and brightness updated from sensor feedback, based on which the micro-electromechanical system (MEMS) mirrors or LCOS chip tunes the output light beam and/or one of the multiple laser beams in real time.

12. The dynamic light source of claim 11, wherein the pattern of color and brightness is a digital video projected onto a screen by steering the output light beam and/or one of the multiple laser beams by the micro-electromechanical system (MEMS) mirrors or LCOS chip.

13. The dynamic light source of claim 1, further comprising a second beam shaping optical element configured to collimate and direct the output light beam by at least modifying an angular distribution thereof, the second beam shaping optical element comprising one or a combination of several optical devices including slow axis collimating lens, fast axis collimating lens, aspheric lens, ball lens, total internal reflector (TIR) optics, parabolic lens optics, refractive optics, and micro-electromechanical system (MEMS) mirrors.

14. The dynamic light source of claim 1, wherein the receiver comprises a photodiode, avalanche photodiode, photomultiplier tube, and one or more band-pass filters to detect pulse-modulated light signals and is coupled to a modem configured to decode the light signals into binary data.

Summary of another inventive concept:

1. A dynamic light source with color and brightness control for visible light communication comprising:

a modem configured to receive digital information for communication;

a laser driver configured to generate one or more driving currents and a modulation signal based on the digital information;

a laser device configured to be driven by the one or more driving currents to emit at lease a first laser beam with a first peak wavelength in a color range of violet or blue spectrum and a second laser beam with a second peak wavelength longer than the first peak wavelength, wherein at least one of the first laser beam and the second laser beam is modulated by the modulation signal to carry the digital information;

a beam shaping optical element configured to collimate, focus, and dynamically direct the first laser beam and the second laser beam respectively through a pathway;

a wavelength converting member configured to receive either the first laser beam or the second laser beam from the pathway and configured to convert a first fraction of the first laser beam with the first peak wavelength to a first spectrum with a third peak wavelength longer than the first peak wavelength or convert a second fraction of the second laser beam with the second peak wavelength to a second spectrum with a fourth peak wavelength longer than the second peak wavelength, wherein the first spectrum and the second spectrum respectively combine with remaining fraction of the first laser beam with the first peak wavelength and the second laser beam with the second peak wavelength to reemit an output light beam of a broader spectrum dynamically varied from a first color point to a second color point;

a beam steering optical element configured to spatially direct the output light beam; and a beam steering driver configured to generate control signals based on input information for the beam steering optical element to dynamically scan the output light beam to provide spatially modulated illumination with dynamically varied color point onto one or more of multiple target areas or into one or more of multiple target directions in one or more selected periods while simultaneously transmit digital information to a receiver in one or more of multiple target areas or one or more of multiple target directions in one or more selected periods.

2. The dynamic light source of claim 1, wherein the modem is configured to receive the digital information encoded from a data source and to convert the encoded digital information into an analog signal for determining the one or more driving currents and the modulation signal of the laser driver.

3. The dynamic light source of claim 1, wherein the modulation signal is provided with a modulation format selected from double-sideband modulation (DSB), double-sideband modulation with carrier (DSB-WC), double-sideband suppressed-carrier transmission (DSB-SC), double-sideband reduced carrier transmission (DSB-RC), single-sideband modulation (SSB, or SSB-AM), single-sideband modulation with carrier (SSB-WC), single-sideband modulation suppressed carrier modulation (SSB-SC), vestigial sideband modulation (VSB, or VSB-AM), quadrature amplitude modulation (QAM), pulse amplitude modulation (PAM), phase-shift keying (PSK), frequency-shift keying (FSK), continuous phase modulation (CPM), minimum-shift keying (MSK), Gaussian minimum-shift keying (GMSK), continuous-phase frequency-shift keying (CPFSK), orthogonal frequency-division multiplexing (OFDM), and discrete multitone (DMT).

4. The dynamic light source of claim 1, wherein the laser device comprises one or more first laser diodes for emitting the first laser beam with the first peak wavelength in violet spectrum ranging from 380 to 420 nm or blue spectrum ranging from 420 to 480 nm.

5. The dynamic light source of claim 1, wherein the laser device comprises one or more second laser diodes for emitting the second laser beam with the second peak wavelength in red spectrum ranging from 600 nm to 670 nm, or in green spectrum ranging from 480 nm to 550 nm, or a blue spectrum with a longer wavelength than that of the first peak wavelength.

6. The dynamic light source of claim 4, wherein the one or more first laser diodes comprise an active region including a gallium and nitrogen containing material configured to be driven by the one or more driving currents.

7. The dynamic light source of claim 6, wherein the gallium and nitrogen containing material comprises one or more of GaN, AlN, InN, InGaN, AlGaN, InAlN, InAlGaN.

8. The dynamic light source of claim 5, wherein the one or more second laser diodes comprise an active region including a gallium and arsenic containing material configured to be driven by the one or more driving currents.

9. The dynamic light source of claim 1, wherein the first laser beam and the second laser beam are independently modulated by the modulation signal to act as independent channels to communicate the digital information.

10. The dynamic light source of claim 1, wherein the wavelength converting member comprises a first phosphor material selected for absorbing a first ratio of the first laser beam with the first peak wavelength in the violet spectrum and converting to a first spectrum with a second wavelength longer than the first peak wavelength to emit a first output light beam with a first color point, a second phosphor material selected for absorbing partially second ratio of the first laser beam with the first peak wavelength in the blue spectrum and converting to a second spectrum with a second wavelength longer than the first peak wavelength to emit a second output light beam with a second color point, a third phosphor material selected for absorbing a third ratio of the second laser beam with the first peak wavelength in the red spectrum and converting to a third spectrum with a second wavelength longer than the first peak wavelength to emit a third output light beam with a third color point.

11. The dynamic light source of claim 1, wherein the beam shaping optical element comprises one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus each of the first laser beam and second laser beam with modified angular distributions as incident beams into corresponding first, second, third phosphor material for tuning the first, second, third ratio of the first and second laser beams being converted thereof for dynamically adjusting the first, second, third color point of the respective first, second, third output light beam.

12. The dynamic light source of claim 1, wherein the beam steering optical element comprises an array of micro-electromechanical system (MEMS) mirrors and a liquid crystal on silicon (LCOS) chip.

13. The dynamic light source of claim 12, wherein the beam steering driver comprises an interface configured as a user input dial, switch, or joystick mechanism or a feedback loop module for receiving input information to activate the micro-electromechanical system (MEMS) mirrors and LCOS chip.

14. The dynamic light source of claim 12, wherein the input information comprises a dynamic pattern of color and brightness inputted by user or a dynamically varying pattern of color and brightness updated from sensor feedback, based on which the micro-electromechanical system (MEMS) mirrors and LCOS chip tunes the output light beam and/or one of the multiple laser beams in real time.

15. The dynamic light source of claim 14, wherein the dynamic pattern of color and brightness is a digital video projected onto a screen by steering the output light beam and/or one of the multiple laser beams by the LCOS chip.

16. The dynamic light source of claim 1, further comprising a second beam shaping optical element configured to collimate and direct the output light beam by at least modifying an angular distribution thereof, the second beam shaping optical element comprising one or a combination of several optical devices including slow axis collimating lens, fast axis collimating lens, aspheric lens, ball lens, total internal reflector (TIR) optics, parabolic lens optics, refractive optics, and micro-electromechanical system (MEMS) mirrors.

17. The dynamic light source of claim 1, wherein the receiver comprises a photodiode, avalanche photodiode, photomultiplier tube, and one or more band-pass filters to detect pulse-modulated light signals and is coupled to a modem configured to decode the light signals into binary data.

Summary of another inventive concept:

1. A smart light source configured for visible light communication comprising:
a controller comprising a modem and a driver, the modem being configured to receive data signal and operate the driver to generate a driving current and a modulation signal;
a light emitter configured as a pump-light device comprised of a gallium and nitrogen containing material and an optical cavity comprising an optical waveguide region and one or more facet regions, wherein the optical cavity is configured with electrodes to supply the driving current from the driver to the gallium and nitrogen containing material to provide optical gain to an electromagnetic radiation propagating in the optical waveguide region and output a directional electromagnetic radiation through at least one of the one or more facet regions, wherein the directional electromagnetic radiation is characterized by a first peak wavelength in the ultra-violet or blue wavelength regime and modulated to carry the data signal using the modulation signal by the controller;
a wavelength converter optically coupled to the directional electromagnetic radiation from the pump-light device, wherein the wavelength converter is configured to convert at least a fraction of the directional electromagnetic radiation with the first peak wavelength to at least a second peak wavelength that is longer than the first peak wavelength and to output a white-color spectrum comprising at least the second peak wavelength and partially the first peak wavelength;
a beam shaper configured to collimate and focus a beam of the white-color spectrum to a certain direction or a certain focal point;
a beam steering element configured to manipulate the beam of the white-color spectrum for illuminating a target of interest and transmitting the data signal through at least the fraction of the directional electromagnetic radiation with the first peak wavelength to a receiver at the target of interest; and
one or more sensors configured in a feedback loop circuit coupled to the controller, wherein the one or more sensors are configured to provide one or more feedback currents or voltages based on the various parameters associated with the target of interest detected in real time to the controller with one or more of light movement response, light color response, light brightness response, spatial light pattern response, and data signal communication response being triggered.

2. The smart light source of claim 1, wherein the pump-light device comprises a laser diode device.

3. The smart light source of claim 1, wherein the pump-light device comprises a superluminescent diode (SLED) device.

4. The smart light source of claim 1, wherein the directional electromagnetic radiation with the first peak wavelength comprises a violet spectrum with the first peak wavelength in a range of 380-420 nm, and/or a blue spectrum with the first peak wavelength in a range of 420-480 nm.

5. The smart light source of claim 4, wherein the directional electromagnetic radiation further comprises multiple pulse-modulated light signals at a modulation frequency range selected from about 50 MHz to 300 MHz, 300 MHz to 1 GHz, and 1 GHz to 100 GHz based on the data signal.

6. The smart light source of claim 4, wherein the white-color spectrum comprises the multiple pulse-modulated light signals modulated based on the data signal carried by at least a fraction of the directional electromagnetic radiation from the light emitter.

7. The smart light source of claim 1, wherein the wavelength converter comprises a phosphor material configured as in a reflection mode to have a surface receiving the directional electromagnetic radiation in an incident angle, wherein the white-color spectrum is a combination of a spectrum of the second peak wavelength converted by the phosphor material, a fraction of the directional electromagnetic radiation with the first peak wavelength reflected from the surface of the phosphor material, and a fraction of the directional electromagnetic radiation scattered from interior of the phosphor material.

8. The smart light source of claim 1, wherein the wavelength converter comprises a phosphor material configured as in a transmission mode to receive the directional electromagnetic radiation passed through, wherein the white-color spectrum is a combination of a fraction of the directional electromagnetic radiation not absorbed by the phosphor material and a spectrum of the second peak wavelength converted by the phosphor material.

9. The smart light source of claim 1, wherein the wavelength converter comprises a plurality of wavelength converting regions that respectively convert blue or violet wavelength regime to a predominantly red spectrum, or a predominantly green spectrum, and/or a predominantly blue spectrum with a longer peak wavelength than the first peak wavelength of the directional electromagnetic radiation.

10. The smart light source of claim 1, wherein the beam steering element comprises a plurality of color-specific optical elements for independently manipulating the predominantly red spectrum, the predominantly green spectrum, and the predominantly blue spectrum for transmitting to different targets of interests carrying different streams of the data signal for different receivers.

11. The smart light source of claim 1, wherein the beam shaper comprises one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus the beam of the white-color spectrum to at least modify an angular distribution thereof.

12. The smart light source of claim 1, wherein the beam steering element is configured to manipulate and direct the beam of the white-color spectrum as an illumination source with spatial modulation for illuminating a surface at the target of interest along a preferred direction.

13. The smart light source of claim 12, wherein the beam steering element further is configured to direct the white-color spectrum for dynamically scanning a spatial range around the target of interest.

14. The smart light source of claim 1, wherein the one or more sensors comprise one or a combination of multiple of sensors selected from microphone, geophone, motion sensor, radio-frequency identification (RFID) receivers, hydrophone, chemical sensors including a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video cameras, transducer, image sensor, infrared sensor, radar, SONAR, LIDAR.

15. The smart light source of claim 14, wherein the one or more sensors is configured in the feedback loop circuit to provide a feedback current or voltage to tune a control signal for operating the driver to adjust brightness and color of the directional electromagnetic radiation from the light-emitter.

16. The smart light source of claim 14, wherein the one or more sensors is configured in the feedback loop circuit to provide a feedback current or voltage to tune a control signal for operating the beam steering optical element to adjust a spatial position and pattern illuminated by the beam of the white-color spectrum.

17. The smart light source of claim 14, wherein the one or more sensors is configured in the feedback loop circuit to send a feedback current or voltage back to the controller to change the driving current and the modulation signal for changing the data signal to be communicated through at least a fraction of the directional electromagnetic radiation modulated by the modulation signal.

18. The smart light source of claim 1, wherein the controller further is configured to provide control signals to tune the beam shaper for dynamically modulating the white-color spectrum based on feedback from the one or more sensors.

19. The smart light source of claim 1, wherein the controller is a microprocessor disposed in a smart phone, a smart watch, a computerized wearable device, a tablet computer, a laptop computer, a vehicle-built-in computer, a drone.

20. The smart light source of claim 12, wherein the beam steering element further is configured to independently transmit the data signal to different receivers in different direction in different period synchronized with the spatial modulation of the white-color spectrum illuminated into the particular direction.

21. The smart light source of claim 20, wherein the beam steering element comprises an optical device selected from one of a micro-electromechanical system (MEMS) mirror, a digital light processing (DLP) chip, a digital mirror device (DMD), and a liquid crystal on silicon (LCOS) chip for steering, patterning, or pixelating the white-color spectrum.

22. The smart light source of claim 21, wherein the MEMS mirror is configured to produce high deflection angles more than 10 degrees, low in power consumption of less than 100 mW, and high scan frequencies capable of producing HD resolution.

23. The smart light source of claim 21, wherein the MEMS mirror is configured to perform resonant operation for vector pointing and provide high reflectivity of >80% for high power operation.

24. The smart light source of claim 21, wherein the beam steering element comprises a 2-dimensional array of micro-mirrors to steer, pattern, and/or pixelate a beam of the white-color light by reflecting from corresponding pixels at a predetermined angle to turn each pixel on or off.

25. The smart light source of claim 24, wherein the 2-dimensional array of micro-mirrors is formed on a silicon chip configured for providing dynamic spatial modulation of the beam of white-color spectrum.

26. The smart light source of claim 21, wherein the beam steering element further is configured to spatially modulate and dynamically direct the white-color light based on the input information to provide spatially modulated illumination onto a first area of a target surface or into first direction of a target space in a first period and onto a second area of the target surface or into a second direction of a target space in a second period, and to independently transmit the data signals to a first receiver at the first area or downstream in the first direction in the first period and to a second receiver at the second area or downstream in the second direction in the second period.

27. The smart light source of claim 26, wherein each of the first receiver and the second receiver comprises a photodiode, avalanche photodiode, photomultiplier tube, and one or more band-pass filters to detect pulse-modulated light signals, and is coupled to a modem configured to decode the light signals into binary data.

Summary of another inventive concept:

1. A smart light source with spatial illumination and color dynamic control comprising:
   a microcontroller for generating one or more control signals;

a laser device configured to be driven by at least one of the one or more control signals to emit a laser beam with a first peak wavelength in a color range of violet or blue spectrum, wherein the laser beam is modulated by the at least one modulation signal to carry the digital information;

a beam shaping optical element configured to dynamically direct the laser beam with a varying angle through an aperture into a pathway;

a wavelength converting member comprising at least two color phosphor regions spatially distributed to respectively receive the laser beam with different angle outputted from the pathway and configured to convert a fraction of the laser beam with the first peak wavelength to at least two color spectra respectively by the at least two color phosphor regions, wherein each of the at least two color spectra comprises a second peak wavelength longer than the first peak wavelength but varying with the fraction of the laser beam being absorbed by each of the at least two color phosphor regions, wherein the at least two color spectra are respectively combined with remaining fraction of the laser beam with the first peak wavelength to reemit an output light beam of a broader spectrum with a dynamically varied color point;

a beam steering optical element configured to spatially direct the output light beam; and a beam steering driver coupled to the microcontroller to receive some of the one or more control signals based on input information for the beam steering optical element to dynamically scan the output light beam substantially in white color to provide spatially modulated illumination and selectively direct one or more of the multiple laser beams with the first peak wavelengths in different color ranges onto one or more of multiple target areas or into one or more of multiple target directions in one or more selected periods.

2. The smart light source of claim 1, wherein each of the multiple laser devices comprises an active region made by the gallium and nitrogen containing material selected from GaN, AlN, InN, InGaN, AlGaN, InAlN, InAlGaN.

3. The smart light source of claim 1, wherein the laser device comprises one or more laser diodes for emitting the laser beam with the first peak wavelength in violet spectrum ranging from 380 to 420 nm or in blue spectrum ranging from 420 to 480 nm.

4. The smart light source of claim 3, wherein the at least two color phosphor regions of the wavelength converting member comprise a first phosphor material configured to absorb a first ratio of the laser beam with the first peak wavelength in the violet spectrum and convert to a first color spectrum with a second wavelength longer than the first peak wavelength to emit the output light beam with a first color point, a second phosphor material configured to absorb a second ratio of the laser beam with the first peak wavelength in the blue spectrum and convert to a second color spectrum with a second wavelength longer than the first peak wavelength to emit the output light beam with a second color point, a third phosphor material configured to absorb a third ratio of the laser beam with the first peak wavelength in the violet or blue spectrum and convert to a third color spectrum with a second wavelength longer than the first peak wavelength to emit the output light beam with a third color point.

5. The smart light source of claim 4, wherein the beam shaping optical element comprises one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus each of the laser beam with modified angular distributions into corresponding first, second, third phosphor material in varying incident angles for tuning the first, second, third ratio of the laser beam being converted thereof for dynamically adjusting the first, second, third color point of the output light beam.

6. The smart light source of claim 1, further comprising a second beam shaper disposed downstream of the output light beam configured to direct, collimate, focus each of the output light beam to at least modify respective angular distribution thereof to form a light source with dynamically tunable color point.

7. The smart light source of claim 1, wherein the beam steering optical element further is selected from one of a micro-electromechanical system (MEMS) mirror, a digital light processing (DLP) chip, a digital mirror device (DMD), and a liquid crystal on silicon (LCOS) chip for steering, patterning, or pixelating the output light beam with varying color points.

8. The smart light source of claim 7, wherein the MEMS mirror is based on actuators that are electromagnetic, electrostatic, piezoelectric, or electrothermal, pneumatic, and shape memory alloy.

9. The smart light source of claim 7, wherein the MEMS mirror is configured to produce high deflection angles more than 10 degrees, low in power consumption of less than 100 mW, and high scan frequencies capable of producing HD resolution.

10. The smart light source of claim 7, wherein the MEMS mirror is configured to perform resonant operation for vector pointing and provide high reflectivity of >80% for high power operation.

11. The smart light source of claim 7, wherein the DLP chip or DMD or LCOS chip comprises a 2-dimensional array of micro-mirrors to steer, pattern, and/or pixelate the multiple output light beams with varying color points by reflecting from corresponding pixels at a predetermined angle to turn each pixel on or off.

12. The smart light source of claim 11, wherein the 2-dimensional array of micro-mirrors is formed on a silicon chip configured for providing dynamic spatial modulation of the multiple output light beams with varying color points.

13. The smart light source of claim 1, wherein the beam steering optical element further comprises an optical fiber respectively to guide the output light beam flexibly as a spot light source.

14. The smart light source of claim 7, wherein the microcontroller comprises an interface configured as a user input dial, switch, or joystick mechanism or a feedback loop module for receiving input information to generating some of the one or more control signals for the beam steering driver to activate the MEMS mirror, or DLP chip, or DMD, or LCOS chip.

15. The smart light source of claim 14, wherein the input information comprises an illumination spatial pattern, a color pattern, and a brightness pattern inputted by user or a varying illumination spatial pattern, color pattern, and brightness pattern dynamically updated from feedback information detected by one or more sensors.

16. The smart light source of claim 15, wherein the one or more sensors comprise one or a combination of multiple of sensors selected from microphone, geophone, motion sensor, radio-frequency identification (RFID) receivers, hydrophone, chemical sensors including a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video cameras, transducer, image sensor, infrared sensor, radar, SONAR, LIDAR.

17. The smart light source of claim 1, wherein the beam steering optical element further is configured to modulate and direct the output light beam based on the input information to provide a spatially modulated illumination onto a first area of a target surface or into first direction of a target space in a first period and onto a second area of the target surface or into a second direction of a target space in a second period.

18. The smart light source of claim 16, wherein the spatially modulated illumination is configured as a spot light system such as a flashlight, spotlight, automobile headlamp or any direction light applications where the light must be directed or projected to a specified location or area.

19. The smart light source of claim 15, wherein the color pattern and brightness pattern are dynamically provided as a digital video projected onto a screen dynamically by steering the multiple output light beams and/or the multiple laser beams.

20. The smart light source of claim 1, wherein the microcontroller is disposed in a smart phone, a smart watch, a computerized wearable device, a tablet computer, a laptop computer, a vehicle-built-in computer, a drone.

Summary of another inventive concept:

1. A smart light source with spatially modulated illumination comprising:
a controller configured to receive input information for generating one or more control signals;
a light emitter configured as a pump-light device comprised of a gallium and nitrogen containing material and an optical cavity; the optical cavity comprising an optical waveguide region and one or more facet regions, wherein the optical cavity is configured with electrodes to supply a driving current based on at least one of the one or more control signals to the gallium and nitrogen containing material, wherein the driving current provides an optical gain to an electromagnetic radiation propagating in the optical waveguide region, wherein the electromagnetic radiation is outputted through at least one of the one or more facet regions as a directional electromagnetic radiation characterized by a first peak wavelength in the ultra-violet or blue wavelength regime;
a beam shaper configured to collimate and focus the directional electromagnetic radiation to a certain direction and focal point;
a wavelength converter optically coupled to the directional electromagnetic radiation from the pump-light device, wherein the wavelength converter is configured to absorb at least a fraction of the directional electromagnetic radiation with the first peak wavelength to excite a spectrum with a second peak wavelength that is longer than the first peak wavelength and to reemit an output electromagnetic radiation with a broader spectrum comprising at least the second peak wavelength and partially the first peak wavelength;
a beam steering optical element configured to manipulate the output electromagnetic radiation for providing spatially modulated illuminations onto a target area or into a target direction; and
one or more sensors configured in a feedback loop circuit coupled to the controller, wherein the one or more sensors are configured to provide one or more feedback currents or voltages based on the various parameters associated with the target of interest detected in real time to the controller with one or more of light movement response, light color response, light brightness response, spatial light pattern response, and data signal communication response being triggered.

2. The smart light source of claim 1, wherein the pump-light device comprises a laser diode device.

3. The smart light source of claim 1, wherein the pump-light device comprises a superluminescent diode (SLED) device.

4. The smart light source of claim 1, wherein the controller is disposed in a smart phone, a smart watch, a computerized wearable device, a tablet computer, a laptop computer, a vehicle-built-in computer, a drone.

5. The smart light source of claim 4, wherein the controller comprises an interface configured as a user input dial, switch, or joystick mechanism or a feedback loop module for receiving the input information.

6. The smart light source of claim 4, wherein the input information comprises a spatial pattern of brightness inputted by a user or dynamically adjusted based on sensor feedback, based on which the smart light source is driven to generate and manipulate the output electromagnetic radiation to provide the spatially modulated illumination corresponding to the spatial pattern of brightness onto the target area or into target direction.

7. The smart light source of claim 6, wherein the spatially modulated illumination is text message.

8. The smart light source of claim 7, wherein the spatially modulated illumination is a picture.

9. The smart light source of claim 7, wherein the spatially modulated illumination is a video.

10. The smart light source of claim 7, wherein the spatially modulated illumination is configured as a spot light system such as a flashlight, spotlight, automobile headlamp or any direction light applications where the light must be directed or projected to a specified location or area.

11. The smart light source of claim 1, wherein the wavelength converter comprises a phosphor material configured as in a reflection mode to have a surface receiving the directional electromagnetic radiation in an incident angle, wherein the output electromagnetic radiation is a combination of a spectrum of the second peak wavelength converted by the phosphor material, a fraction of the directional electromagnetic radiation with the first peak wavelength reflected from the surface of the phosphor material, and a fraction of the directional electromagnetic radiation scattered from interior of the phosphor material.
12. The smart light source of claim 1, wherein the wavelength converter comprises a phosphor material configured as in a transmission mode to receive the directional electromagnetic radiation passed through, wherein the output electromagnetic radiation is a combination of a fraction of the directional electromagnetic radiation not absorbed by the phosphor material and a spectrum of the second peak wavelength converted by the phosphor material.
13. The smart light source of claim 1, wherein the wavelength converter comprises a plurality of wavelength converting regions that respectively convert blue or violet wavelength regime to a predominantly red spectrum, or a predominantly green spectrum, and/or a predominantly blue spectrum with a longer peak wavelength than the first peak wavelength of the directional electromagnetic radiation.
14. The smart light source of claim 13, wherein the beam steering optical element comprises a plurality of color-specific optical elements for independently manipulating the predominantly red spectrum, the predominantly green spectrum, and the predominantly blue spectrum for directing onto different target areas or into different target directions.
15. The smart light source of claim 1, wherein the beam shaper comprises one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus the directional electromagnetic radiation to at least modify angular distribution thereof as being an incidence beam into the wavelength converter.
16. The smart light source of claim 1, further comprising a second beam shaper disposed after the wavelength converter and configured to collimate and focus the output electromagnetic radiation by at least modifying an angular distribution thereof, wherein the second beam shaper comprises one or a combination of several optical devices including slow axis collimating lens, fast axis collimating lens, aspheric lens, ball lens, total internal reflector (TIR) optics, parabolic lens optics, refractive optics, and micro-electromechanical system (MEMS) mirrors.
17. The smart light source of claim 1, wherein the beam steering optical element is selected from one of a micro-electromechanical system (MEMS) mirror, a digital light processing (DLP) chip, a digital mirror device (DMD), and a liquid crystal on silicon (LCOS) chip for steering, patterning, or pixelating the output electromagnetic radiation.
18. The smart light source of claim 1, wherein the beam steering optical element is configured to be activated by some of the one or more control signals from the controller based on the input information including real time feedbacks from the one or more sensors.
19. The smart light source of claim 1, wherein the beam steering optical element further comprises an optical fiber respectively to guide the output electromagnetic radiation flexibly as a spot light source.
20. The smart light source of claim 1, wherein the one or more sensors comprise one or a combination of multiple of sensors selected from microphone, geophone, motion sensor, radio-frequency identification (RFID) receivers, hydrophone, chemical sensors including a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video cameras, transducer, image sensor, infrared sensor, radar, SONAR, LIDAR.
21. The smart light source of claim 20, wherein the one or more sensors is configured in the feedback loop circuit to provide a feedback current or voltage to the controller to tune at least one of the one or more control signals to adjust brightness of the directional electromagnetic radiation from the light-emitter.
22. The smart light source of claim 20, wherein the one or more sensors is configured in the feedback loop circuit to provide a feedback current or voltage to the controller to tune at least one of the one or more control signals for operating the beam steering optical element to adjust a spatial position illuminated by the output electromagnetic radiation.
23. The smart light source of claim 20, wherein the one or more sensors is configured in the feedback loop circuit to provide a feedback current or voltage to the controller to tune at least one of the one or more control signals for adjusting the beam shaper to adjust an incident angle of the directional electromagnetic radiation to tune the fraction of the directional electromagnetic radiation with the first peak wavelength being converted to the second peak wavelength.

Summary of another inventive concept:
1. A smart light system with color and brightness dynamic control comprising:
a microcontroller configured to receive input information for generating one or more control signals;
a laser device configured to be driven by at least one of the one or more control signals to emit at lease a first laser beam with a first peak wavelength in a color range of violet or blue spectrum and a second laser beam with a second peak wavelength longer than the first peak wavelength;
a pathway configured to dynamically guide the first laser beam and the second laser beam;
a wavelength converting member configured to receive either the first laser beam or the second laser beam from the pathway and configured to convert a first fraction of the first laser beam with the first peak wavelength to a first spectrum with a third peak wavelength longer than the first peak wavelength or convert a second fraction of the second laser beam with the second peak wavelength to a second spectrum with a fourth peak wavelength longer than the second peak wavelength, wherein the first spectrum and the second spectrum respectively combine with remaining fraction of the first laser beam with the first peak wavelength and the second laser beam with the second peak wavelength to reemit an output light beam of a broader spectrum dynamically varied from a first color point to a second color point;
a beam shaping optical element configured to collimate and focus the output light beam;

a beam steering optical element configured to direct the output light beam;

a beam steering driver coupled to the microcontroller to receive some of the one or more control signals based on input information for the beam steering optical element to dynamically scan the output light beam substantially in white color to provide spatially modulated illumination and selectively direct one or more of the multiple laser beams with the first peak wavelengths in different color ranges onto one or more of multiple target areas or into one or more of multiple target directions in one or more selected periods; and one or more sensors configured in a feedback loop circuit coupled to the controller, wherein the one or more sensors are configured to provide one or more feedback currents or voltages based on the various parameters associated with the target of interest detected in real time to the controller with one or more of light movement response, light color response, light brightness response, spatial light pattern response, and data signal communication response being triggered.

2. The smart light system of claim 1, wherein the laser device comprises one or more first laser diodes for emitting the first laser beam with the first peak wavelength in violet spectrum ranging from 380 to 420 nm or blue spectrum ranging from 420 to 480 nm.

3. The smart light system of claim 1, wherein the laser device comprises one or more second laser diodes for emitting the second laser beam with the second peak wavelength in red spectrum ranging from 600 to 670 nm, or in green spectrum ranging from 480 nm to 550 nm, or in another blue spectrum with the second peak wavelength longer than the first peak wavelength.

4. The smart light system of claim 2, wherein the one or more first laser diodes comprise an active region including a gallium and nitrogen containing material configured to be driven by the one or more driving currents.

5. The smart light system of claim 4, wherein the gallium and nitrogen containing material comprises one or more of GaN, AlN, InN, InGaN, AlGaN, InAlN, InAlGaN.

6. The smart light system of claim 4, wherein the one or more second laser diodes comprise an active region including a gallium and arsenic containing material configured to be driven by the one or more driving currents.

7. The smart light system of claim 1, wherein the wavelength converting member comprises a first phosphor material selected for absorbing a first ratio of the first laser beam with the first peak wavelength in the violet spectrum and converting to a first spectrum with the third peak wavelength longer than the first peak wavelength to emit a first output light beam with a first color point, a second phosphor material selected for absorbing a second ratio of the first laser beam with the first peak wavelength in the blue spectrum and converting to a second spectrum with the third peak wavelength longer than the first peak wavelength to emit a second output light beam with a second color point, a third phosphor material selected for absorbing a third ratio of the second laser beam with the second peak wavelength and converting to a third spectrum with the fourth wavelength longer than the second peak wavelength to emit a third output light beam with a third color point.

8. The smart light system of claim 1, wherein the pathway comprises an optical fiber to guide either the first laser beam or the second laser beam to the wavelength converter member disposed remotely as a remote light source.

9. The smart light system of claim 1, wherein the pathway comprises a waveguide for guiding either the first laser beam or the second laser beam to the wavelength converter member to generate the output light beam with a dynamically varying color point.

10. The smart light system of claim 1, wherein the pathway comprises free-space optics devices.

11. The smart light system of claim 1, wherein the beam shaping optical element comprises one or a combination of more optical elements selected a list of slow axis collimating lens, fast axis collimating lens, aspheric lens, ball lens, total internal reflector (TIR) optics, parabolic lens optics, refractive optics, and micro-electromechanical system (MEMS) mirrors configured to direct, collimate, focus the output light beam with modified angular distribution thereof.

12. The smart light system of claim 1, wherein the beam steering optical element is selected from one of a micro-electromechanical system (MEMS) mirror, a digital light processing (DLP) chip, a digital mirror device (DMD), and a liquid crystal on silicon (LCOS) chip.

13. The smart light system of claim 12, wherein the beam steering optical element comprises a 2-dimensional array of micro-mirrors to steer, pattern, and/or pixelate the multiple output light beams with varying color points by reflecting from corresponding pixels at a predetermined angle to turn each pixel on or off.

14. The smart light system of claim 12, wherein the 2-dimensional array of micro-mirrors are configured to be activated by some of the one or more control signals received by the beam steering driver from the microcontroller based on the input information to manipulate the multiple output light beams with respective color points being dynamically adjusted to provide a pattern of color and brightness onto a surface of a target area or into a direction of a target space.

15. The smart light system of claim 14, wherein the microcontroller comprises an interface configured as a user input dial, switch, or joystick mechanism or a feedback loop module for receiving the input information that is updated in real time via the one or more sensors.

16. The smart light system of claim 14, wherein the pattern of color and brightness is a text, a picture, a video projected as holography image or onto a screen.

17. The smart light system of claim 14, wherein the microcontroller is disposed in a smart phone, a smart watch, a computerized wearable device, a tablet computer, a laptop computer, a vehicle-built-in computer, a drone.

18. The smart light system of claim 1, wherein the one or more sensors comprise one or a combination of multiple of sensors selected from microphone, geophone, motion sensor, radio-frequency identification (RFID) receivers, hydrophone, chemical sensors including a hydrogen sensor, $CO_2$ sensor, or electronic nose sensor, flow sensor, water meter, gas meter, Geiger counter, altimeter, airspeed sensor, speed sensor, range finder, piezoelectric sensor, gyroscope, inertial sensor, accelerometer, MEMS sensor, Hall effect sensor, metal detector, voltage detector, photoelectric sensor, photodetector, photoresistor, pressure sensor, strain gauge, thermistor, thermocouple, pyrometer, temperature gauge, motion detector, passive infrared sensor, Doppler sensor, biosensor, capacitance sensor, video cameras, transducer, image sensor, infrared sensor, radar, SONAR, LIDAR.

19. The smart light system of claim 18, wherein the one or more sensors is configured in the feedback loop circuit to provide a feedback current or voltage to the microcontroller to tune at least one of the one or more control signals to adjust brightness of either the first laser beam with a first peak wavelength or the second laser beam with the second peak wavelength 20. The smart light system of claim 181, wherein the one or more sensors is configured in the feedback loop circuit to provide a feedback current or voltage to the microcontroller to tune at least one of the one or more control signals for operating the beam steering optical element to adjust a spatial position illuminated by the output light beam.

21. The smart light system of claim 18, wherein the one or more sensors is configured in the feedback loop circuit to provide a feedback current or voltage to the microcontroller to tune at least one of the one or more control signals for adjusting the beam shaping optical element to adjust incident angles of either the first laser beam or the second laser beam to tune respective ratios being converted by respective phosphor materials of the wavelength converting member for tuning color points of respective output light beams.

While the above is a full description of the specific embodiments, various modifications, alternative constructions and equivalents may be used. As an example, the packaged device can include any combination of elements described above, as well as outside of the present specification. Although the embodiments above have been described in terms of a laser diode, the methods and device structures can also be applied to other stimulated light emitting devices. Therefore, the above description and illustrations should not be taken as limiting the scope of the present invention which is defined by the appended claims.

What is claimed is:

1. A packaged integrated white light source configured for illumination and communication or sensing comprising:
    a first laser diode device comprising a gallium and nitrogen containing material and configured as an excitation source, the first laser diode device comprising a p-electrode and an n-electrode;
    a package member configured with a base member;
    a wavelength converting member; the wavelength converting member arranged to be optically coupled to the first laser diode device;
    a first electrical connection configured from the p-electrode to a first internal feedthrough on the package member;
    a second electrical connection configured from the n-electrode to a second internal feedthrough on the package member;
    an output facet on the first laser diode device configured to output a first laser beam; the first laser beam selected from a violet and/or a blue emission with a first peak wavelength ranging from 380 nm to 480 nm;
    a free space between the output facet on the first laser diode device and the wavelength converting member, with a non-guided characteristic capable of transmitting the first laser beam from the first laser diode device to the wavelength converting member; wherein the first laser beam forms an excitation spot on an excitation surface of the wavelength converting member;
    the wavelength converting member configured to convert at least a fraction of the first laser beam to a second electromagnetic radiation with a second wavelength that is longer than the first peak wavelength;
    a white light emitted from one or more surfaces of the wavelength converting member, the white light comprised of a mixture of wavelengths characterized by at least the second wavelength from the wavelength converting member;
    a lid member configured on the package member such that the lid member forms a seal around the wavelength converting member;
    an electrical coupling configured with the first and second internal feedthroughs configured to supply power from a laser driver module to the first laser diode device; wherein the supplied power induces the laser diode device to emit the first laser beam incident on the wavelength converting member to generate the white light;
    a second laser diode device configured to output a second laser beam of infra-red radiation with a second peak wavelength between 800 nm and 2000 nm, an electrical coupling configured to supply power from the laser driver module to the second laser diode device; wherein the supplied power is configured to provide a data signal or sensing signal to the second laser diode device; and
    the data signal or sensing signal provided by the laser driver module is comprised of at least a modulated signal.

2. The integrated white light source of claim 1, further comprising a beam shaper configured to direct, collimate, focus or otherwise modify an angular distribution of the white light and/or the data signal or sensing signal.

3. The integrated white light source of claim 2, wherein the beam shaper includes a microelectromechanical system (MEMS) scanning mirror, a flying mirror, a digital light processing (DLP) chip, a digital mirror device (DMD), or a liquid crystal on silicon (LCOS) chip, and wherein the beam shaper is further configured to place the white light and/or the data signal or sensing signal in a predetermined spatial and/or temporal pattern onto a target surface or into a target space.

4. The integrated white light source of claim 1, wherein the first laser diode device and/or the second laser diode device are configured to enable modulation rates from about 0.1 to about 30 GHz; wherein the first laser beam with the first peak wavelength and/or the second laser beam with the second peak wavelength provide at least a first carrier channel for the data signal or sensing signal.

5. The integrated white light source of claim 1, wherein the package member is a surface mount device (SMD) package and wherein the base member is a common support member of the SMD package.

6. The integrated white light source of claim 1, wherein the wavelength converting member is configured from a phosphor member having a reflective mode characterizing the phosphor member such that the white light is substantially emitted from the excitation surface of the phosphor member; wherein an angle of incidence between the first laser beam and the excitation surface of the phosphor member is comprised of an incidence angle with respect to a fast axis and an incidence angle with respect to a slow axis; and wherein at least one of the incidence angle with respect to the fast axis or the incidence angle with respect to the slow axis is between 0 degrees and 89 degrees relative to the surface of the phosphor member.

7. The integrated white light source of claim 6, wherein the angle of incidence between the first laser beam and the excitation surface of the phosphor member is comprised of an incidence angle with respect to the fast axis and is characterized by an angle ranging between 25 degrees and 40 degrees.

8. The integrated white light source of claim 1, wherein the wavelength converting member is configured from a phosphor member having a transmissive mode such that the white light is substantially emitted from a surface on the wavelength converting member other than the excitation surface.

9. The integrated white light source of claim 1, wherein the first laser diode device is comprised of 2 laser diodes, 3 laser diodes, 4 laser diodes, or more laser diodes to generate 2 laser beams, 3 laser beams, 4 laser beams, or more laser beams respectively; and wherein the multiple laser beams form the excitation spot on the wavelength converting member.

10. The integrated white light source of claim 9, wherein the 2 laser diodes, 3 laser diodes, or 4 laser diodes are configured to operate with different peak electromagnetic radiations wavelengths to form a second carrier channel, or a second and a third carrier channel, or a second, third, and a fourth carrier channel, respectively, for the data signal or sensing signal, wherein the laser diodes are characterized with peak spectral wavelengths separated in wavelength by at least 5 nm.

11. The integrated white light source of claim 1, wherein the data signal or sensing signal provided by the laser driver module is formed by modulation in a time domain of a voltage or current applied to the second laser diode device; and the modulation is comprised of at least one of amplitude modulation, frequency modulation, or phase modulation; and wherein the modulation is selected from double-sideband modulation, double-sideband modulation with carrier, double-sideband suppressed-carrier transmission, double-sideband reduced carrier transmission, single-sideband modulation, single-sideband modulation with carrier, single-sideband modulation suppressed carrier modulation, vestigial sideband modulation, quadrature amplitude modulation, pulse amplitude modulation, phase-shift keying, frequency-shift keying, amplitude-shift keying, quadrature amplitude modulation, on-off keying, continuous phase, minimum-shift keying, gaussian minimum-shift keying, continuous-phase frequency-shift keying, orthogonal frequency-division multiplexing, discrete multitone including adaptive modulation and bit-loading, or wavelet modulation.

12. The integrated white light source of claim 1, wherein the first laser diode device comprises multiple laser diodes, wherein the multiple laser diodes are characterized by multiple violet and/or blue wavelengths in the 400 nm to 480 nm range; and wherein the multiple violet and/or blue wavelengths are separated by at least 5 nm.

13. The integrated white light source of claim 1, wherein the first laser diode device is characterized by a first blue wavelength range of 425 nm to 480 nm, the wavelength converting member comprises a phosphor member with emission of a spectrum characterized by a second wavelength of light in a second yellow wavelength range, and wherein the white light is comprised of the first blue wavelength range and the second yellow wavelength range.

14. The integrated white light source of claim 1, wherein the package member is selected from a can type, a flat package type, a surface mount type, a butterfly type, a C-mount type, a Q-mount type, a package adapted from an LED package type, or a flash package.

15. A packaged integrated white light source configured for illumination and communication or sensing comprising:
a first laser diode device comprising a gallium and nitrogen containing material and configured as an excitation source, the first laser diode device comprising a p-electrode and an n-electrode;
an output facet configured on the first laser diode device to output a first laser beam; the first laser beam being selected from a violet and/or a blue emission with a first peak wavelength selected from a wavelength range of 380 nm to 480 nm;
a second laser diode device, wherein an output facet is configured on the second laser diode device to output a second laser beam; the second laser beam being characterized as infra-red radiation with a second peak wavelength selected from a wavelength range of 800 nm to 2000 nm;
a package member configured with a base member;
a wavelength converting member optically coupled to the first laser diode device;
a free space, between the output facet of the first laser device and the wavelength converting member, with a non-guided characteristic capable of transmitting the first laser beam from the first laser diode device to the wavelength converting member; wherein the first laser beam forms an excitation spot on the wavelength converting member;
a free space, between the output facet of the second laser device and the wavelength converting member, with a non-guided characteristic capable of transmitting the second laser beam from the second laser diode device to the wavelength converting member; wherein the second laser beam forms an excitation spot on the wavelength converting member;
the wavelength converting member configured to convert at least a fraction of the first laser beam to third electromagnetic radiation with a third wavelength that is longer than the first peak wavelength;
a white light emitted from the excitation surface of the wavelength converting member, the white light comprised of a mixture of wavelengths characterized by at least the third wavelength from the wavelength converting member;
first and second internal leads provided on the package, a first internal feedthrough and a second internal feedthrough being configured with an electrical coupling to the first and second external leads, respectively;
a lid member configured on the package member such that the lid member forms a seal around the wavelength converting member;
a first electrical coupling configured to supply power from a first laser driver module to the first laser diode device; and
a second electrical coupling configured to supply power from a second laser driver module to the second laser diode device.

16. The integrated white light source of claim 15, further comprising a beam shaper configured to direct, collimate, focus or otherwise modify an angular distribution of the white light; wherein the beam shaper includes a microelectromechanical system (MEMS) scanning mirror, a flying mirror, a digital light processing (DLP) chip, a digital mirror device (DMD), or a liquid crystal on silicon (LCOS) chip, and wherein the beam shaper is further configured to place the white light in a predetermined spatial and/or temporal pattern onto a target surface or into a target space.

17. The integrated white light source of claim 15, wherein the package member is a surface mount device (SMD) package and wherein the base member is a common support member of the SMD package.

18. The integrated white light source of claim 15, wherein the wavelength converting member is configured from a phosphor member having a reflective mode such that the white light is substantially emitted from an excitation surface of the phosphor member; wherein an angle of incidence between the first laser beam and the excitation surface of the phosphor member is comprised of an incidence angle with respect to a fast axis and an incidence angle with respect to a slow axis; and wherein at least one of the incidence angle with respect to the fast axis or the incidence angle with respect to the slow axis is between 0 degrees and 89 degrees relative to the surface of the phosphor member.

19. The integrated white light source of claim 15, wherein an angle of incidence between the first and second laser beams and the wavelength converting member are comprised of an incidence angle with respect to a fast axis of the respective laser beams and is characterized by an angle ranging between 25 degrees and 40 degrees.

20. The integrated white light source of claim 15, wherein the first laser diode device is comprised of 3 laser diodes, or 4 laser diodes to generate 3 laser beams, or 4 laser beams, respectively; wherein the multiple laser beams form an illuminated spot on the wavelength converting member; and wherein the 3 laser diodes, or 4 laser diodes are configured to operate with different peak electromagnetic radiations wavelengths to form a third carrier channel, or third and a fourth carrier channel, respectively, for the communication or sensing signal, wherein the laser diodes are characterized with peak spectral wavelengths separated in wavelength by at least 5 nm.

21. The integrated white light source of claim 15, wherein at least one of the first and second laser beams form an independent carrier channel for the communication or sensing signal, and wherein the communication or sensing signal is provided by modulated output of the first laser diode or the second laser diode, and where the modulated output enables modulation rates in a GHz range.

22. The integrated white light source of claim 15, wherein the communication or sensing signal is formed by modulation in a time domain of a voltage or current applied to the second laser device; and wherein the modulation is comprised of at least one of amplitude modulation, frequency modulation, or phase modulation; and wherein the modulation is selected from double-sideband modulation, double-sideband modulation with carrier, double-sideband suppressed-carrier transmission, double-sideband reduced carrier transmission, single-sideband modulation, single-sideband modulation with carrier, single-sideband modulation suppressed carrier modulation, vestigial sideband modulation, quadrature amplitude modulation, pulse amplitude modulation, phase-shift keying, frequency-shift keying, amplitude-shift keying, quadrature amplitude modulation, on-off keying, continuous phase, minimum-shift keying, gaussian minimum-shift keying, continuous-phase frequency-shift keying, orthogonal frequency-division multiplexing, discrete multitone including adaptive modulation and bit-loading, or wavelet modulation.

* * * * *